(12) United States Patent
Gomi et al.

(10) Patent No.: US 9,888,199 B2
(45) Date of Patent: Feb. 6, 2018

(54) SOLID-STATE IMAGING DEVICE, IMAGING DEVICE, AND SIGNAL READING METHOD

(71) Applicant: OLYMPUS CORPORATION, Tokyo (JP)

(72) Inventors: Yuichi Gomi, Tokyo (JP); Hideki Kato, Tokyo (JP); Naofumi Sakaguchi, Tokyo (JP); Naoto Fukuoka, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/997,112

(22) Filed: Jan. 15, 2016

(65) Prior Publication Data

US 2016/0134824 A1    May 12, 2016

Related U.S. Application Data

(62) Division of application No. 13/683,687, filed on Nov. 21, 2012, now Pat. No. 9,257,468.

(51) Int. Cl.
*H04N 3/14* (2006.01)
*H04N 5/335* (2011.01)
(Continued)

(52) U.S. Cl.
CPC ............ *H04N 5/378* (2013.01); *H01L 24/14* (2013.01); *H01L 27/14618* (2013.01);
(Continued)

(58) Field of Classification Search
CPC .... H04N 5/347; H04N 5/378; H04N 5/37457; H04N 5/3741; H04N 5/3745; H04N 5/37452
(Continued)

(56) References Cited

U.S. PATENT DOCUMENTS 5,742,047 A    4/1998  Buhler et al.
6,882,367 B1   4/2005  Merrill et al.
(Continued)

FOREIGN PATENT DOCUMENTS

JP    2002-344809 A    11/2002
JP    2002345797 A     12/2002
(Continued)

OTHER PUBLICATIONS

U.S. Office Action dated Feb. 12, 2015, issued in U.S. Appl. No. 13/680,492 (28 pages).
(Continued)

*Primary Examiner* — Kelly L Jerabek
(74) *Attorney, Agent, or Firm* — Westerman, Hattori, Daniels & Adrian, LLP

(57) ABSTRACT

This solid-state imaging device includes a first substrate and a second substrate which have circuit elements constituting pixels disposed therein are electrically connected to each other. The pixels includes: a photoelectric conversion element disposed in the first substrate; an amplifier circuit that amplifies a signal generated in the photoelectric conversion element to output the amplified signal; a signal accumulation circuit which is disposed in the second substrate and accumulates the amplified signal which is output from the amplifier circuit; and an output circuit that outputs the amplified signal accumulated in the signal accumulation circuit from the pixel.

4 Claims, 47 Drawing Sheets

(51) Int. Cl.

| | | |
|---|---|---|
| *H04N 5/378* | (2011.01) | |
| *H04N 5/345* | (2011.01) | |
| *H04N 5/353* | (2011.01) | |
| *H04N 5/359* | (2011.01) | |
| *H04N 5/369* | (2011.01) | |
| *H04N 5/3745* | (2011.01) | |
| *H01L 27/146* | (2006.01) | |
| *H01L 23/00* | (2006.01) | |
| *H04N 5/363* | (2011.01) | |
| *H01L 27/00* | (2006.01) | |
| *H01L 31/062* | (2012.01) | |
| *H01L 31/113* | (2006.01) | |

(52) U.S. Cl.
CPC ............ *H04N 5/345* (2013.01); *H04N 5/353* (2013.01); *H04N 5/3598* (2013.01); *H04N 5/363* (2013.01); *H04N 5/3698* (2013.01); *H04N 5/37457* (2013.01); *H01L 2224/16225* (2013.01); *H01L 2224/32225* (2013.01); *H01L 2224/73204* (2013.01)

(58) Field of Classification Search
USPC .................................. 348/294, 300–302, 308
See application file for complete search history.

(56) References Cited

U.S. PATENT DOCUMENTS

| | | | |
|---|---|---|---|
| 7,664,220 | B2 | 2/2010 | Ajioka |
| 8,174,598 | B2 | 5/2012 | Ebihara |
| 8,476,567 | B2 | 7/2013 | De Wit et al. |
| 2006/0023109 | A1 | 2/2006 | Mabuchi et al. |
| 2007/0096238 | A1 | 5/2007 | Oike et al. |
| 2007/0285544 | A1 | 12/2007 | Yamada et al. |
| 2008/0278614 | A1 | 11/2008 | Ohtsuki et al. |
| 2008/0284888 | A1 | 11/2008 | Kobayashi |
| 2010/0073537 | A1 | 3/2010 | Kato et al. |
| 2010/0079648 | A1 | 4/2010 | Totsuka et al. |
| 2010/0097508 | A1* | 4/2010 | Yanagita ........... H01L 27/14603 348/301 |
| 2010/0309340 | A1 | 12/2010 | Border et al. |
| 2011/0155893 | A1 | 6/2011 | Endo et al. |
| 2012/0026371 | A1 | 2/2012 | Itano et al. |
| 2012/0050598 | A1 | 3/2012 | Kinugasa et al. |
| 2012/0057056 | A1 | 3/2012 | Oike |
| 2012/0086841 | A1 | 4/2012 | Ono et al. |
| 2012/0307030 | A1 | 12/2012 | Blanquart |
| 2013/0092820 | A1 | 4/2013 | Takemoto |

FOREIGN PATENT DOCUMENTS

| | | |
|---|---|---|
| JP | 2003-046864 A | 2/2003 |
| JP | 2003-134396 A | 5/2003 |
| JP | 2004-172228 A | 6/2004 |
| JP | 2005-101442 A | 4/2005 |
| JP | 2006-049361 A | 2/2006 |
| JP | 2006-203775 A | 8/2006 |
| JP | 2007-020156 A | 1/2007 |
| JP | 2007228460 A | 9/2007 |
| JP | 2008-258498 A | 10/2008 |
| JP | 2010-183195 A | 8/2010 |
| JP | 2010-219339 A | 9/2010 |
| JP | 2011-061270 A | 3/2011 |

OTHER PUBLICATIONS

Office Action dated Feb. 3, 2015, issued in Japanese Patent Applicaion No. 2011-117170, with English translation (11 pages).

Office Action dated Mar. 3, 2015, issued in counterpart Japanese Patent Application No. 2011-117168, with Eglish translation (10 pages).

Notice of Reasons for Rejection dated Apr. 14, 2015, issued in counterpart Japanese Patent Aoolication No. 2011-128267 with English translation (8 pages).

Office Action dated Nov. 17, 2015, issued in counterpart Japanese Application No. 2011-264940, with English translation. (10 pages).

Office Action dated Jun. 7, 2016, issued in counterpart Japanese Patent Application No. 2012-026418, with English translation. (18 pages).

Office Action dated Jul. 6, 2016, issued in counterpart Japanese Patent Application No. 2012-026418, with English translation. (18 pages).

* cited by examiner

: GROUP UNIT

: GROUP UNIT

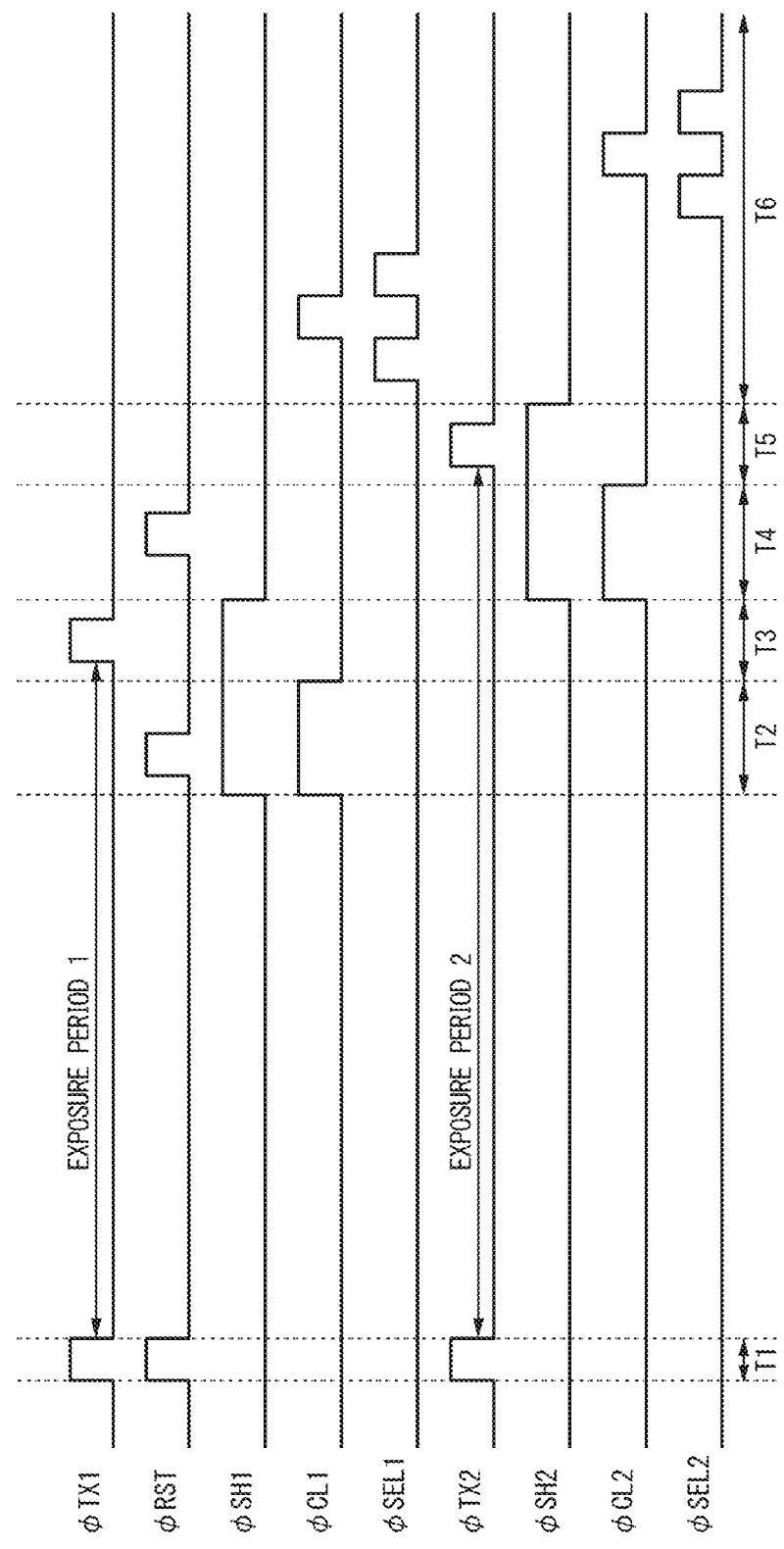

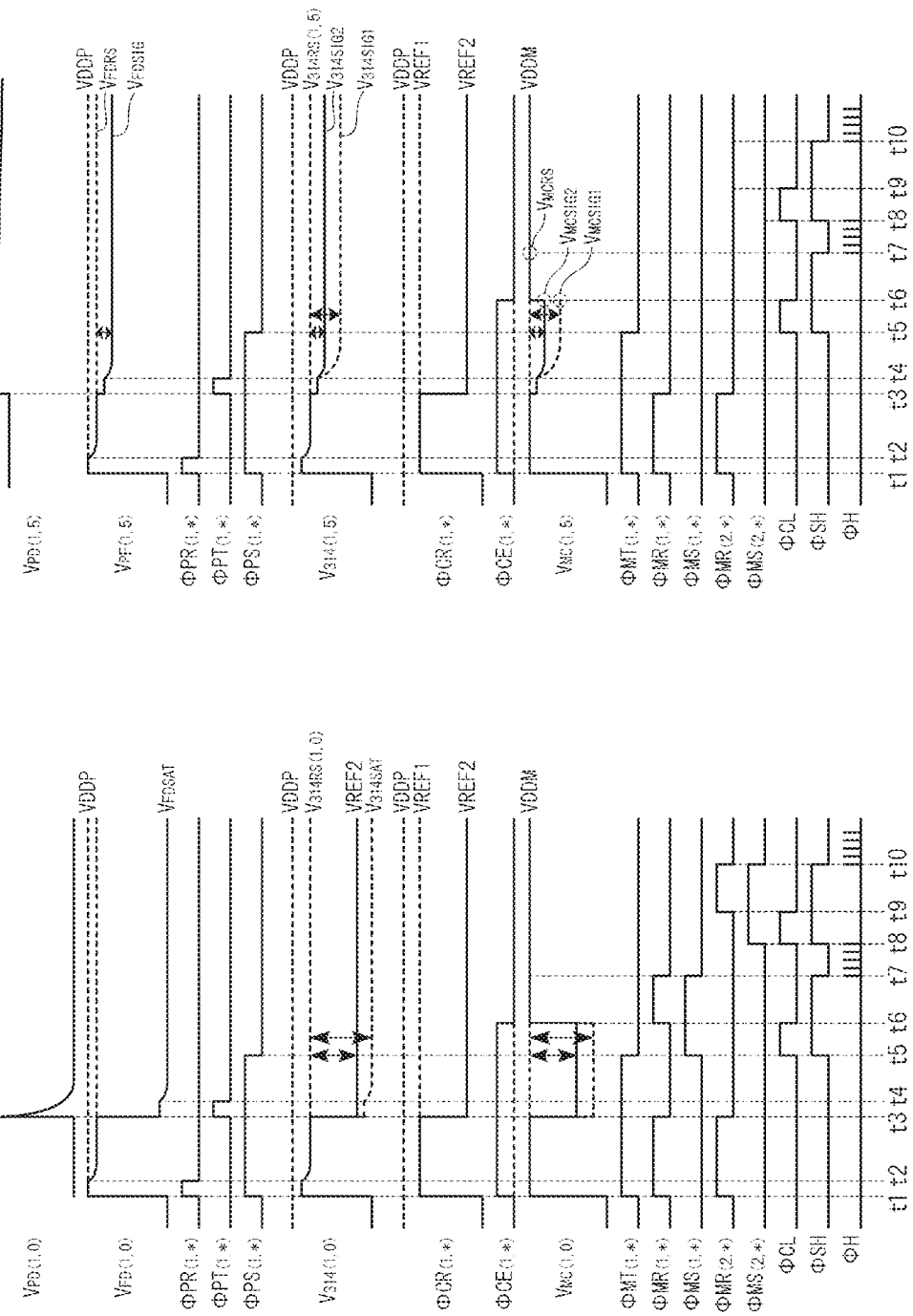

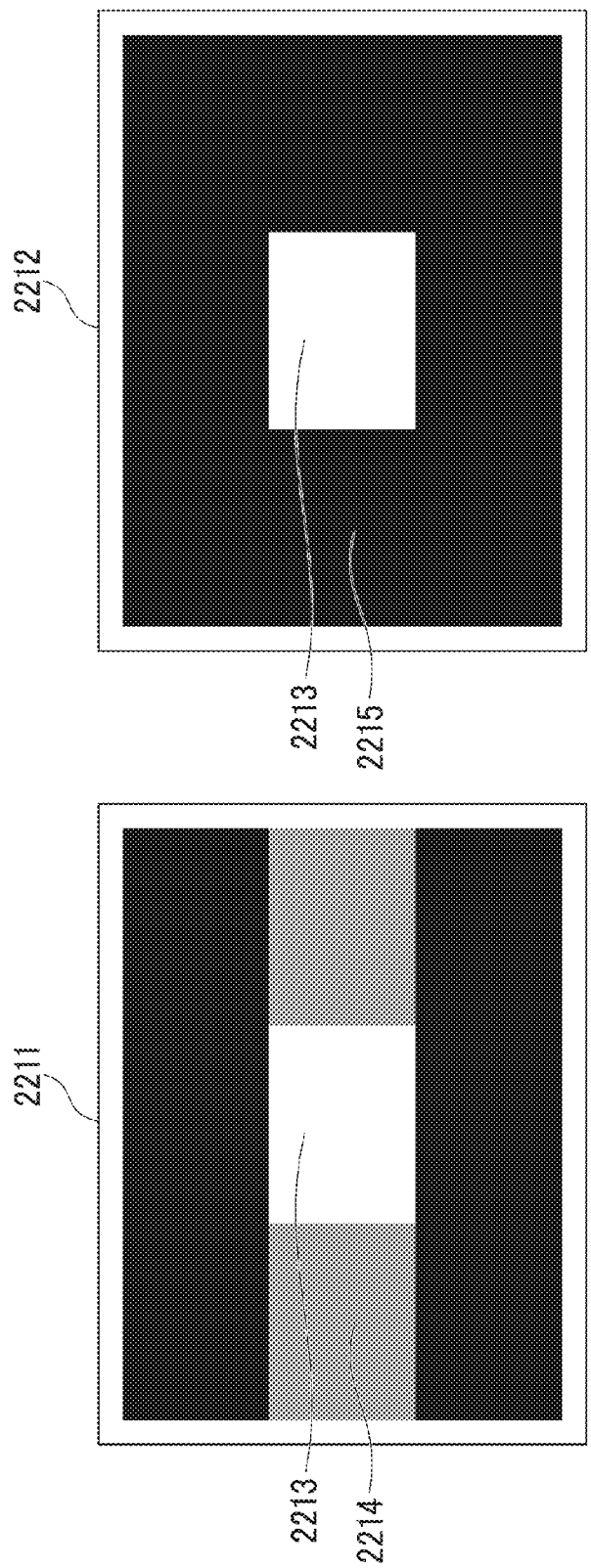

SOLID-STATE IMAGING DEVICE, IMAGING DEVICE, AND SIGNAL READING METHOD

CROSS-REFERENCE TO RELATED APPLICATION

This application is a divisional of U.S. application Ser. No. 13/683,687 filed on Nov. 21, 2012, the entire contents of which are hereby incorporated by reference in its entirety.

BACKGROUND OF THE INVENTION

Field of the Invention

The present invention relates to a solid-state imaging device, an imaging device, and a signal reading method. Particularly relates to a solid-state imaging device and an imaging device in which a first substrate and a second substrate which have circuit elements constituting pixels disposed therein are electrically connected to each other. In addition, the present invention relates to a signal reading method of reading a signal from a pixel.

Description of Related Art

In recent years, video cameras, electronic still cameras and the like have generally been in widespread use. CCD (Charge Coupled Device)-type or amplification-type solid-state imaging devices are used in these cameras. Amplification-type solid-state imaging devices guide signal charge, generated and accumulated by a photoelectric conversion section of a pixel on which light is incident, to an amplification section provided in the pixel, and output a signal amplified by the amplification section from the pixel. In the amplification-type solid-state imaging devices, a plurality of such pixels is arranged in a two-dimensional matrix. The amplification-type solid-state imaging devices include, for example, a CMOS-type solid-state imaging device using a CMOS (Complementary Metal Oxide Semiconductor) transistor, and the like.

In recent years, CMOS (Complementary Metal Oxide Semiconductor)-type solid-state imaging devices (hereinafter, referred to as "MOS-type solid-state imaging devices") have attracted attention as a solid-state imaging device, and have been put to practical use.

Such a MOS-type solid-state imaging device can be driven with a single power supply unlike the CCD (Charge Coupled Device)-type solid-state imaging device. In addition, the CCD-type solid-state imaging device requires dedicated manufacturing processes, whereas the MOS-type solid-state imaging device can be manufactured using the same manufacturing processes as those of other LSIs. For this reason, the MOS-type solid-state imaging device easily deals with an SOC (System On Chip), and can realize the multi-functionalization of the solid-state imaging device.

In addition, the MOS-type solid-state imaging device includes an amplifier circuit in each pixel and thus amplifies signal charge within the pixel. For this reason, the MOS-type solid-state imaging device has a configuration which is hardly influenced by noise from a signal transmission path. Further, the MOS-type solid-state imaging device is characterized in that the signal charge of each pixel can be selected and extracted (selection scheme), and the accumulation time or the reading order of signals can be freely controlled for each pixel in principle.

Previously, in the general CMOS-type solid-state imaging devices, a scheme in which signal charge generated by a photoelectric conversion section of each of the pixels arrayed in a two-dimensional matrix is sequentially read for each row, has been adopted. In this scheme, the exposure timing in the photoelectric conversion section of each pixel is determined by the start and termination of the reading of signal charge, and thus the exposure timing is different for each row. For this reason, when an image of a fast-moving subject is captured using such a CMOS-type solid-state imaging device, the subject is distorted with a captured image.

Previously, as exposure types of general MOS-type solid-state imaging devices (hereinafter, referred to as a "solid-state imaging devices"), a line exposure type and a global exposure type have been known. In the line exposure type, a large number of pixels arrayed two-dimensionally within the solid-state imaging device are exposed at the timing different for each row. The line exposure type is a type in which a video signal of a subject is obtained by sequentially reading signal charge generated after performing exposure of a row of a certain unit by the photoelectric conversion element within pixels in the row. In the case of the line exposure type, exposure and reading can be continuously performed in row units. For this reason, it is possible to obtain a video signal of a subject in a state in which the influence of noise generated in an accumulation section that accumulates the signal charge generated by the photoelectric conversion element is suppressed to a minimum. However, when an image of a moving subject is captured in the line exposure type, an image of the subject cannot be correctly captured due to the exposure timing different for each row.

On the other hand, the global exposure type is a type in which all the pixels arrayed two-dimensionally within the solid-state imaging device are exposed at a synchronous timing. In the case of the global exposure type, since all the pixels are exposed at a synchronous timing, a distorted video is never obtained even at the time of capturing an image of the moving subject. However, in the global exposure type, since the signal charge generated by the photoelectric conversion element within the pixel is sequentially read after all of the pixels are exposed, it is difficult to suppress the influence of noise generated in the accumulation section in the pixels that require a long time until the reading of the signal charge is started after terminating exposure. For this reason, in the global exposure-type solid-state imaging device, a video signal having large noise is obtained more often than in the line exposure-type solid-state imaging device.

In the global exposure-type solid-state imaging device, a circuit for suppressing the influence of noise generated in the accumulation section as mentioned above is added to the solid-state imaging device, thereby allowing a video signal in which the influence of noise is suppressed to a minimum to be obtained even in the solid-state imaging device in which the global exposure type is adopted.

In order to eliminate the distortion of a subject, a simultaneous imaging function (global shutter function) of realizing the simultaneity of the accumulation of signal charge is proposed. In addition, the CMOS-type solid-state imaging device having a global shutter function is increasingly being used. In the CMOS-type solid-state imaging device having a global shutter function, generally, it is necessary to include an accumulation capacitance section having a light-shielding property in order to accumulate the signal charge generated by the photoelectric conversion section until reading is performed. In such a CMOS-type solid-state imaging device in the related art, after all the pixels are simultaneously exposed, the signal charge generated by each photoelectric conversion section is simultaneously transferred to each accumulation capacitance section in all the pixels and is temporarily accumulated. The signal charge is then converted sequentially into a pixel signal at a predetermined reading timing and is read.

Japanese Unexamined Patent Application, First Publication No. 2006-49361 discloses a solid-state imaging device in which a MOS image sensor chip having a micro-pad formed on a wiring layer side for each unit cell and a signal processing chip having a micro-pad formed on the wiring layer side of a position corresponding to the micro-pad of the MOS image sensor chip are connected to each other by a micro-bump. In addition, Japanese Unexamined Patent Application, First Publication No. 2010-219339 discloses a method of preventing an increase in a chip area using a solid-state imaging device in which a first substrate having a photoelectric conversion section formed therein and a second substrate having a plurality of MOS transistors formed therein is bonded to each other.

Japanese Unexamined Patent Application, First Publication No. 2006-49361 discloses a method of which creating a pixel circuit section of a MOS-type solid-state imaging device as a pixel circuit chip; creating a signal processing section as a signal processing chip; and superimposing the chips which are separately created. In the art disclosed in Japanese Unexamined Patent Application, First Publication No. 2006-49361, the pixel circuit chip and the signal processing chip which are separately created are connected to each other through a bump.

Japanese Unexamined Patent Application, First Publication No. 2006-49361 is configured such that a cell of the MOS image sensor chip includes a photoelectric conversion element, an amplifying transistor and the like (FIGS. 5 and 12 of Japanese Unexamined Patent Application, First Publication No. 2006-49361), and a cell of the signal processing chip digitizes a signal which is output from the cell of the MOS image sensor chip and then stores the signal in a memory (FIGS. 8 and 9 of Japanese Unexamined Patent Application, First Publication No. 2006-49361).

In Japanese Unexamined Patent Application, First Publication No. 2010-219339, circuit elements constituting pixels having a global shutter function in the related art are separately disposed in two substrates (FIG. 9 of Japanese Unexamined Patent Application, First Publication No. 2010-219339). In addition, a phenomenon, in which noise caused by light incident on the pixel during a waiting period until signal charge accumulated in an accumulation capacitance section of a MOS image sensor chip is read moves from a MOS image sensor chip to a signal processing chip, is suppressed.

SUMMARY OF THE INVENTION

According to a first aspect of the present invention, a solid-state imaging device in which a first substrate and a second substrate which have circuit elements constituting pixels disposed therein are electrically connected to each other. The pixels includes: a photoelectric conversion element disposed in the first substrate; an amplifier circuit that amplifies a signal generated in the photoelectric conversion element and outputs the amplified signal; a signal accumulation circuit which is disposed in the second substrate and accumulates the amplified signal which is output from the amplifier circuit; and an output circuit that outputs the amplified signal accumulated in the signal accumulation circuit from the pixel.

According to a second aspect of the present invention, a solid-state imaging device in which a first substrate and a second substrate which have circuit elements constituting pixels disposed therein are electrically connected. The pixels includes: a photoelectric conversion element disposed in the first substrate; an amplifying transistor that receives a signal generated in the photoelectric conversion element in a gate, and amplifies the signal received in the gate, and outputs the amplified signal from one of a source and a drain; a memory circuit which is disposed in the second substrate and accumulates the amplified signal which is output from the amplifying transistor; and an output transistor that receives the amplified signal accumulated in the memory circuit in one of the source and the drain, and outputs the signal received in the one of the source and the drain from the other of the source and the drain to a signal line outside of the pixel.

According to a third aspect of the present invention, an imaging device in which a first substrate and a second substrate which have circuit elements constituting pixels disposed therein are electrically connected to each other. The pixels includes: a photoelectric conversion element disposed in the first substrate; an amplifier circuit that amplifies a signal generated in the photoelectric conversion element and outputs the amplified signal; a signal accumulation circuit which is disposed in the second substrate and accumulates the amplified signal which is output from the amplifier circuit; and an output circuit that outputs the amplified signal accumulated in the signal accumulation circuit from the pixel.

According to a forth aspect of the present invention, an imaging device in which a first substrate and a second substrate which have circuit elements constituting pixels disposed therein are electrically connected to each other. The pixels includes: a photoelectric conversion element disposed in the first substrate; an amplifying transistor that receives a signal generated in the photoelectric conversion element in a gate, and amplifies the signal received in the gate and outputs the amplified signal from one of a source and a drain; a memory circuit, disposed in the second substrate, which accumulates the amplified signal which is output from the amplifying transistor; and an output transistor that receives the amplified signal accumulated in the memory circuit in one of the source and the drain, and outputs the signal received in the one of the source and the drain from the other of the source and the drain to a signal line outside of the pixel.

According to a fifth aspect of the present invention, a signal reading method of reading a signal from pixels of a solid-state imaging device in which a first substrate and a second substrate which have circuit elements constituting the pixels disposed therein are electrically connected to each other. The signal reading method includes: a step of amplifying a signal generated in a photoelectric conversion element disposed in the first substrate using an amplifier circuit to output the amplified signal; a step of accumulating the amplified signal which is output from the amplifier circuit in a signal accumulation circuit disposed in the second substrate; and a step of outputting the amplified signal accumulated in the signal accumulation circuit from the pixel.

BRIEF DESCRIPTION OF THE DRAWINGS

FIG. 16 is a timing diagram illustrating operations of the pixel in the imaging device according to the fourth embodiment of the present invention.

FIG. 45A is a timing diagram illustrating each driving timing at which the high-brightness light is incident in a transfer period of the image sensor according to the ninth embodiment of the present invention.

FIG. 45B is a timing diagram illustrating each driving timing at which the high-brightness light is incident in the transfer period of the image sensor according to the ninth embodiment of the present invention.

FIG. 46A is a diagram illustrating an effect when the high-brightness light is incident in the transfer period of the image sensor according to the ninth embodiment of the present invention.

FIG. 46B is a diagram illustrating an effect when the high-brightness light is incident in the transfer period of the image sensor according to the ninth embodiment of the present invention.

DETAILED DESCRIPTION OF THE INVENTION

Hereinafter, embodiments of the present invention will be described with reference to the accompanying drawings. The following detailed description includes specific details as an example. Although various variations and modifications may be added to the following details, those having ordinary skill in the art will appreciate that the details to which the variations and modifications are added are within the scope of the present invention. Therefore, various types of embodiments described below are set forth without any loss of generality to, and without imposing limitations upon, the claimed invention.

First Embodiment

Figure 1:
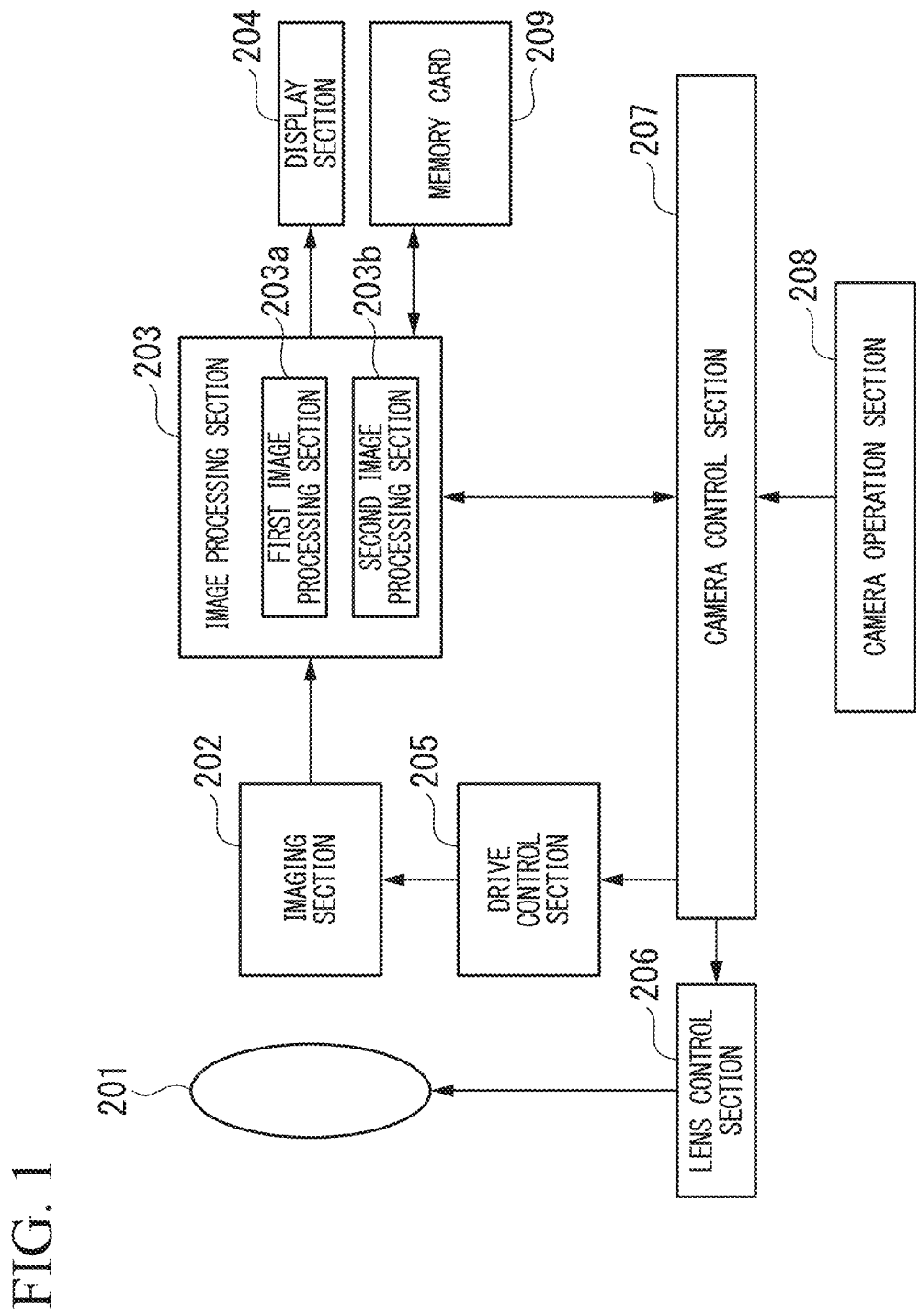
FIG. 1 is a block diagram illustrating a configuration of an imaging device according to a first embodiment of the present invention.

First, a first embodiment of the present invention will be described. FIG. 1 shows a configuration of an imaging device according to the present embodiment. The imaging device according to an aspect of the present invention may be an electronic device having an imaging function, and may be a digital video camera, an endoscope or the like besides a digital camera.

The imaging device shown in FIG. 1 includes a lens 201, an imaging section 202, an image processing section 203, a display section 204, a drive control section 205, a lens control section 206, a camera control section 207, and a camera operation section 208. Although a memory card 209 is also shown in FIG. 1, the memory card 209 may not be a configuration specific to the imaging device by that the memory card 209 is configured to be attachable and detachable to and from the imaging device.

Each block shown in FIG. 1 can be realized by various types of components constituted by electrical circuit components such as a CPU of a computer and a memory, or an optical component of a lens, and operating components such as a button and a switch, in a hardware manner. In addition, each block shown in FIG. 1 can be realized by a computer program or the like in a software manner. In the present embodiment, the blocks are described as functional blocks realized by cooperation thereof. Therefore, those having ordinary skill in the art will appreciate that these functional blocks can be realized in various forms by a combination of hardware and software.

The lens 201 is an image capture lens for forming an optical image of a subject on the imaging surface of the imaging section 202 constituting a solid-state imaging device. The imaging section 202 converts an optical image of a subject formed by the lens 201 into a digital image signal through photoelectric conversion and outputs the converted signal. The image processing section 203 performs various digital image processes on the image signal which is output from the imaging section 202. The image processing section 203 includes a first image processing section 203a that processes an image signal for the purpose of recording; and a second image processing section 203b that processes the image signal for the purpose of display.

The display section 204 displays an image on the basis of the image signal on which image processing is performed for the purpose of display by the second image processing section 203b of the image processing section 203. The display section 204 can reproduce and display a still image, and can perform a moving image (live view) display for displaying an image in a range to be captured in real time. The drive control section 205 controls an operation of the imaging section 202 on the basis of instructions from the camera control section 207. The lens control section 206 controls an aperture diaphragm or a focal position of the lens 201 on the basis of the instructions from the camera control section 207.

The camera control section 207 controls the entire imaging device. The operation of the camera control section 207 is specified by a program stored in a ROM which is built in the imaging device. The camera control section 207 reads this program, and performs various types of control in accordance with contents specified by the program. The camera operation section 208 includes various types of operating members for a user to perform various types of operation inputs on the imaging device, and outputs a signal based on the result of the operation input to the camera control section 207. Specific example of the camera operation section 208 include a power switch for turning on and turning off power of the imaging device; a release button for giving instructions of still image capture; a still image capture mode switch for switching a still image capture mode between a single shooting mode and a continuous shooting mode, and the like. The memory card 209 is a recording medium for storing an image signal processed for the purpose of recording by the first image processing section 203a.

Figure 2:
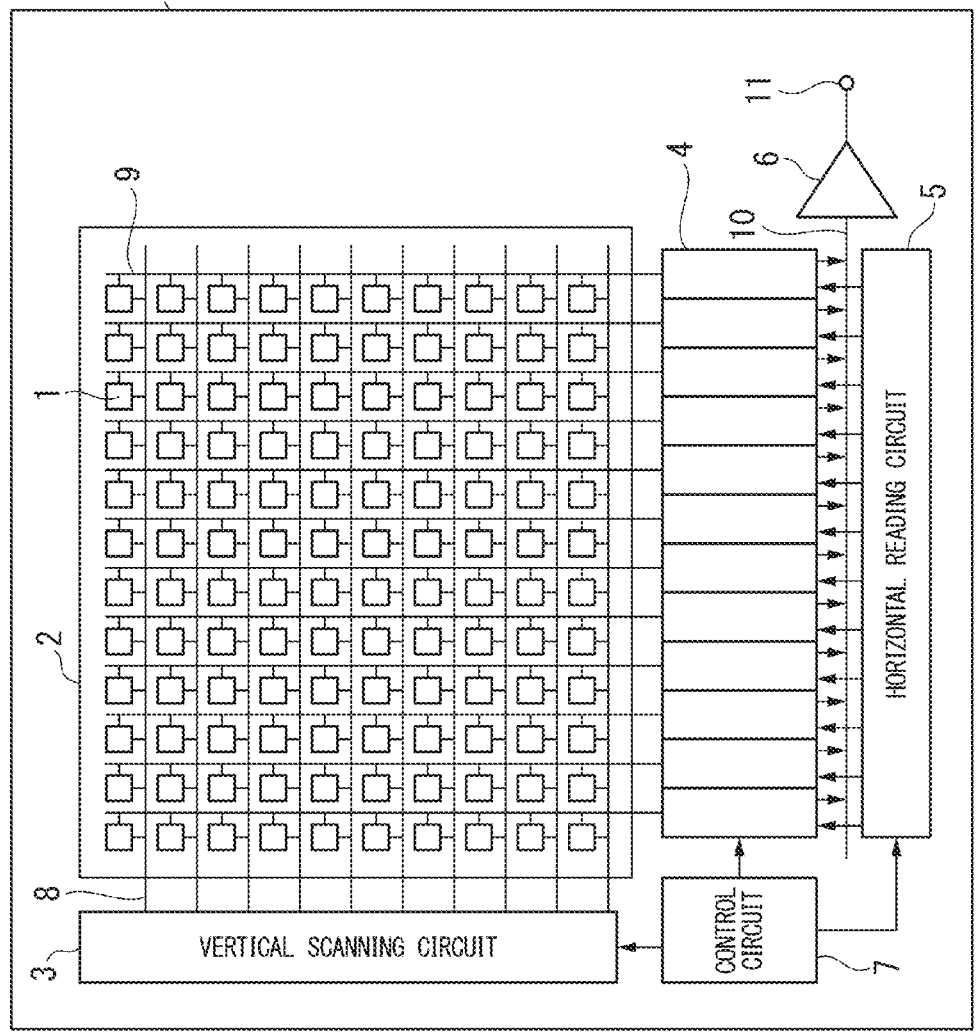
FIG. 2 is a block diagram illustrating a configuration of an imaging section in the imaging device according to the first embodiment of the present invention.

FIG. 2 shows a configuration of the imaging section 202. The imaging section 202 includes a pixel section 2 having a plurality of pixels 1; a vertical scanning circuit 3; column processing circuits 4; a horizontal reading circuit 5; an output amplifier 6; and a control circuit 7. The position at which each circuit element is disposed as shown in FIG. 2 may not necessarily be identical with the actual position of disposition thereof.

In the pixel section 2, the plurality of pixels 1 is arrayed in a two-dimensional matrix. In FIG. 2, 120 pixels 1 of 10 rows×12 columns are arrayed, but the array of pixels shown in FIG. 2 is illustrative of an example, and the row number and the column number may be equal to or greater than 2. In the present embodiment, the region constituted by all the pixels which has the imaging section 202 is set to a region for pixel signals to be read in the pixel section 2 shown in FIG. 2, but a part of the region constituted by all the pixels which has the imaging section 202 may be set to a region to be read. The region to be read preferably includes at least all the pixels in an effective pixel region. In addition, the region to be read may include optical black pixels (pixels in which light is shielded at all times) disposed in the outside of the effective pixel region. The pixel signals which are read from the optical black pixels are used in correcting, for example, dark current components.

The vertical scanning circuit 3 is constituted by, for example, shift registers. The vertical scanning circuit 3 performs driving control of the pixels 1 in row units. The driving control includes a reset operation, an accumulation operation, a signal reading operation and the like of the pixels 1. In order to perform the driving control, the vertical scanning circuit 3 outputs a control signal (control pulse) to each of the pixels 1 through a control signal line 8 provided for each row, and independently controls the pixels 1 for each row. A pixel signal is output from the pixels 1 to a vertical signal line 9 provided for each column by that the vertical scanning circuit 3 performs the driving control.

The column processing circuit 4 is connected to the vertical signal line 9 for each column. The column processing circuit 4 performs signal processing such as noise removal or amplification on the pixel signal which is output from the pixels 1. The horizontal reading circuit 5 is constituted by, for example, shift registers. The horizontal reading circuit 5 reads the pixel signal by selecting a pixel column for reading the pixel signal, sequentially selecting the column processing circuits 4 relevant to the select pixel column, and sequentially outputting the pixel signal from the column processing circuits 4 to a horizontal signal line 10. The output amplifier 6 performs signal processing on the pixel signal which is output to the horizontal signal line 10, and outputs the pixel signal through an output terminal 11 to the outside. The control circuit 7 generates clock signals, control signals and the like which serving as a reference of operations of the vertical scanning circuit 3; the column processing circuits 4; the horizontal reading circuit 5 and the like, and outputs these signals to the vertical scanning circuit 3; the column processing circuits 4; the horizontal reading circuit 5 and the like.

Figure 3:
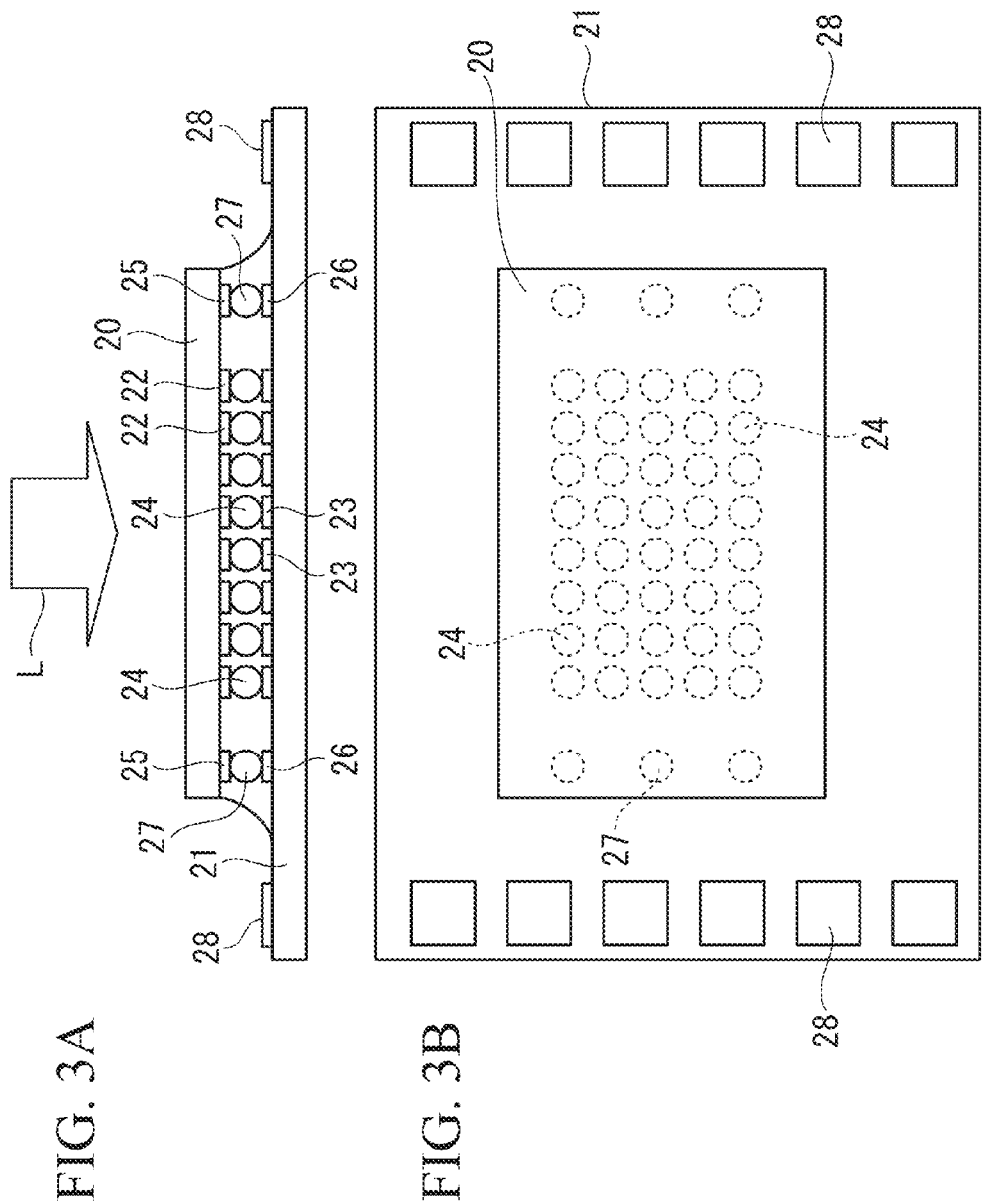
FIG. 3A is a cross-sectional view of the imaging section in the imaging device according to the first embodiment of the present invention.
FIG. 3B is a plan view of the imaging section in the imaging device according to the first embodiment of the present invention.

FIG. 3A shows a cross-sectional structure of the imaging section 202. FIG. 3B shows a planar structure of the imaging section 202. The imaging section 202 has a structure of two superimposed substrates (first substrate 20 and second substrate 21) on which circuit elements (photoelectric conversion elements, transistors, capacitors and the like) constituting the pixel 1 are disposed. The circuit elements constituting the pixel 1 are disposed to be distributed to the first substrate 20 and the second substrate 21. The first substrate 20 and the second substrate 21 are electrically connected to each other so as to be capable of transferring an electrical signal between the two substrates at the time of the driving of the pixel 1.

A photoelectric conversion element is formed on the main surface side irradiated with light L out of two main surfaces (surfaces of which the surface area is relatively larger than the lateral side) of the first substrate 20. Light with which the first substrate 20 is irradiated is incident on the photoelectric conversion element. A large number of micro-pads 22 which are electrodes for connection to the second substrate 21 are formed on the main surface on the opposite side to the main surface irradiated with the light L out of the two main surfaces of the first substrate 20. One micro-pad 22 is disposed for each one pixel or for each of the plurality of pixels. In addition, on the main surface facing the first substrate 20 out of two main surfaces of the second substrate 21, a large number of micro-pads 23 which are electrodes for connection to the first substrate 20 are formed at positions corresponding to the micro-pads 22.

Micro-bumps 24 are formed between the micro-pads 22 and the micro-pads 23. The first substrate 20 and the second substrate 21 are superimposed so that the micro-pads 22 and the micro-pads 23 face each other, and are integrally formed so that the micro-pads 22 and the micro-pads 23 are electrically connected to each other by the micro-bumps 24. The micro-pads 22, the micro-bumps 24, and the micro-pads 23 constitute connection portions for connecting the first substrate 20 and the second substrate 21. A signal based on signal charge generated in the photoelectric conversion element disposed in the first substrate 20 is output to the second substrate 21 through the micro-pads 22, the micro-bumps 24, and the micro-pads 23.

Micro-pads 25 having the similar structure as that of the micro-pads 22 are formed on the peripheral portion of the main surface on the opposite side to the main surface irradiated with the light L out of the two main surface of the first substrate 20. On the main surface facing the first substrate 20 out of the two main surfaces of the second substrate 21, micro-pads 26 having the similar structure as that of the micro-pads 23 are formed at positions corresponding to the micro-pads 25. Micro-bumps 27 are formed between the micro-pads 25 and the micro-pads 26. A power supply voltage and the like for driving the circuit elements disposed in the first substrate 20 or the circuit elements disposed in the second substrate 21 are supplied through the micro-pads 25, the micro-bumps 27, and the micro-pads 26, from the first substrate 20 to the second substrate 21, or from the second substrate 21 to the first substrate 20.

Pads 28 used as an interface with systems other than the first substrate 20 and the second substrate 21 are formed on the peripheral portion of one main surface out of the two main surface of the second substrate 21. A through-electrode passing through the second substrate 21 may be provided instead of the pad 28, and the through-electrode may be used as an electrode for external connection. In the example shown in FIGS. 3A and 3B, the areas of the main surfaces of the first substrate 20 and the second substrate 21 are different from each other, but the areas of the main surfaces of the first substrate 20 and the second substrate 21 may be the same as each other. In addition, the first substrate 20 and the second substrate 21 may be connected to each other by directly bonding the micro-pad (first electrode) provided on the surface of the first substrate 20 and the micro-pad (second electrode) provided on the surface of the second substrate 21 to each other, without providing the micro-bumps.

The circuit elements constituting the pixel 1 are dispersedly disposed in the first substrate 20 and the second substrate 21. The vertical scanning circuit 3, the column processing circuits 4, the horizontal reading circuit 5, and the output amplifier 6, control circuit 7, except for the pixel 1, may be disposed in any of the first substrate 20 and the second substrate 21. In addition, the circuit elements constituting the vertical scanning circuit 3, the column processing circuits 4, the horizontal reading circuit 5, the output amplifier 6, and the control circuit 7, respectively, may be dispersedly disposed in the first substrate 20 and the second substrate 21. The configurations other than the pixel 1 may also require transferring a signal between the first substrate 20 and the second substrate 21, but the first substrate 20 and the second substrate 21 can be connected to each other using the micro-pads and the micro-bumps similarly to the pixel 1, or the first substrate 20 and the second substrate 21 can be connected to each other by directly connecting the micro-pads to each other.

Figure 13:
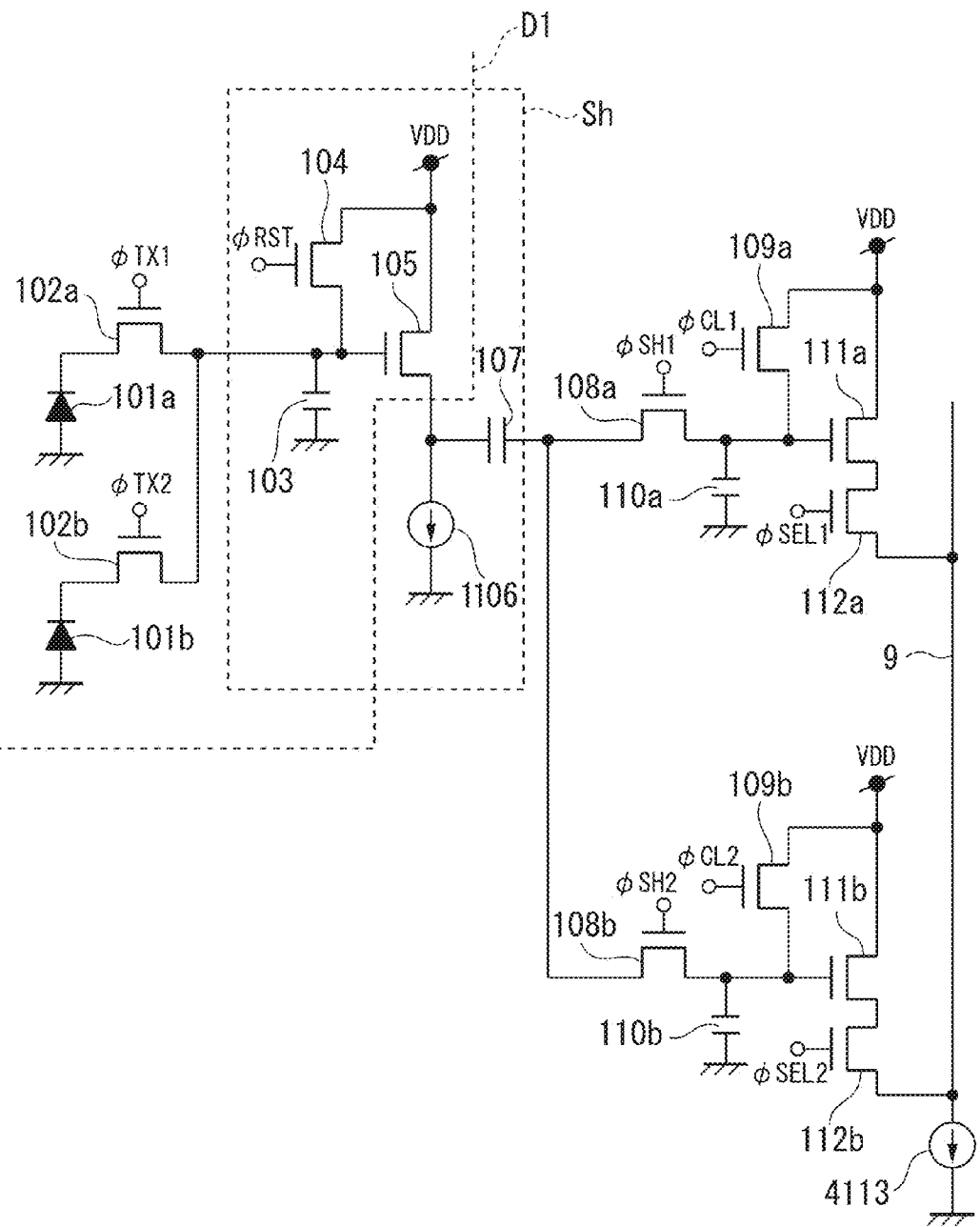
FIG. 13 is a circuit diagram illustrating a circuit configuration of a pixel in an imaging device according to a fourth embodiment of the present invention.

The pixel 1 includes a photoelectric conversion element 101, a transfer transistor 102, an FD (floating diffusion) 103, an FD reset transistor 104, a first amplifying transistor 105, a load transistor 4106, a clamp capacitor 107, a sampling transistor 108, an analog memory reset transistor 109, an analog memory 110, a second amplifying transistor 111, a selection transistor 112, and a switching transistor 113. The position at which each circuit element is disposed as shown in FIG. 13 may not necessarily be identical with the actual position of disposition thereof.

One end of the photoelectric conversion element 101 is grounded. A drain terminal of the transfer transistor 102 is connected to the other end of the photoelectric conversion element 101. A gate terminal of the transfer transistor 102 is connected to the vertical scanning circuit 3, and is supplied with a transfer pulse ΦTX. One end of the FD 103 is connected to a source terminal of the transfer transistor 102, and the other end of the FD 103 is grounded. A drain terminal of the FD reset transistor 104 is connected to a power supply voltage VDD, and a source terminal of the FD reset transistor 104 is connected to the source terminal of the transfer transistor 102. A gate terminal of the FD reset transistor 104 is connected to the vertical scanning circuit 3, and is supplied with an FD reset pulse ΦRST.

A drain terminal of the first amplifying transistor 105 is connected to the power supply voltage VDD. A gate terminal which is an input section of the first amplifying transistor 105 is connected to a source terminal of the transfer transistor 102. A drain terminal of the load transistor 4106 is connected to a source terminal of the first amplifying transistor 105. A source terminal of the load transistor 4106 is grounded. A gate terminal of the load transistor 4106 is connected to the vertical scanning circuit 3, and is supplied with a current control pulse ΦBias.

One end of the clamp capacitor 107 is connected to the source terminal of the first amplifying transistor 105 and the drain terminal of the load transistor 4106. A drain terminal of the sampling transistor 108 is connected to the other end of the clamp capacitor 107. A gate terminal of the sampling transistor 108 is connected to the vertical scanning circuit 3, and is supplied with a sampling pulse ΦSH.

One end of the analog memory 110 is connected to a source terminal of the sampling transistor 108. The other end of the analog memory 110 is grounded. A drain terminal of the second amplifying transistor 111 is connected to the power supply voltage VDD. A gate terminal constituting an input section of the second amplifying transistor 111 is connected to the source terminal of the sampling transistor 108. A drain terminal of the selection transistor 112 is connected to a source terminal of the second amplifying transistor 111. A source terminal of the selection transistor 112 is connected to the vertical signal line 9. A gate terminal of the selection transistor 112 is connected to the vertical scanning circuit 3, and is supplied with a selection pulse ΦSEL. Each transistor mentioned above may have a reverse polarity, and the source terminal and the drain terminal thereof may be set to be reverse to the above.

A drain terminal of the analog memory reset transistor 109 is connected to the power supply voltage VDD. A source terminal of the analog memory reset transistor 109 is connected to a source terminal of the sampling transistor 108. A gate terminal of the analog memory reset transistor 109 is connected to the vertical scanning circuit 3, and is supplied with a clamp & memory reset pulse ΦCL.

The photoelectric conversion element 101 generates (produces) signal charge based on incident light, and holds and accumulates the generated (produced) signal charge. The photoelectric conversion element 101 is, for example, a photodiode. The transfer transistor 102 transfers the signal charge accumulated in the photoelectric conversion element 101 to the FD 103. ON/OFF of the transfer transistor 102 are controlled by the transfer pulse ΦTX from the vertical scanning circuit 3. The FD 103 is a capacitor that temporarily holds and accumulates the signal charge transferred from the photoelectric conversion element 101.

The FD reset transistor 104 resets the FD 103. ON/OFF of the FD reset transistor 104 are controlled by the FD reset pulse ΦRST from the vertical scanning circuit 3. The photoelectric conversion element 101 can also be reset by simultaneously turning on the FD reset transistor 104 and the transfer transistor 102. The reset of the FD 103 and the photoelectric conversion element 101 is an operation for controlling the amount of electric charge accumulated in the FD 103 and the photoelectric conversion element 101 and setting the state (potential) of the FD 103 and the photoelectric conversion element 101 to a reference state (reference potential, or reset level).

The first amplifying transistor 105 is a transistor that outputs an amplified signal, obtained by amplifying a signal based on the signal charge accumulated in the FD 103 which is input to the gate terminal, from the source terminal. The load transistor 4106 is a transistor that functions as a load of the first amplifying transistor 105, and supplies a current for driving the first amplifying transistor 105 to the first amplifying transistor 105. ON/OFF of the load transistor 4106 are controlled by the current control pulse ΦBias from the vertical scanning circuit 3. The first amplifying transistor 105 and the load transistor 4106 constitute a source-follower circuit.

The clamp capacitor 107 is a capacitor that clamps (fixes) a voltage level of the amplified signal which is output from the first amplifying transistor 105. The sampling transistor 108 samples and holds a voltage level of the other end of the clamp capacitor 107, and accumulates the voltage level in the analog memory 110. ON/OFF of the sampling transistor 108 are controlled by the sampling pulse ΦSH from the vertical scanning circuit 3.

The analog memory reset transistor 109 resets the analog memory 110. ON/OFF of the analog memory reset transistor 109 are controlled by the clamp & memory reset pulse ΦCL from the vertical scanning circuit 3. The reset of the analog memory 110 is an operation for controlling the amount of electric charge accumulated in the analog memory 110 and setting the state (potential) of the analog memory 110 to a reference state (reference potential, or reset level). The analog memory 110 holds and accumulates an analog signal sampled and held by the sampling transistor 108.

The capacitance of the analog memory 110 is set to be larger than the capacitance of the FD 103. A MIM (Metal Insulator Metal) capacitor or a MOS (Metal Oxide Semiconductor) capacitor which is a capacitor having a small leakage current (dark current) per unit area is more preferably used in the analog memory 110. Thereby, resistance to noise is improved, and a high-quality signal is obtained.

The second amplifying transistor 111 outputs an amplified signal, obtained by amplifying a signal based on the signal charge accumulated in the analog memory 110 which is input to the gate terminal, from the source terminal. The second amplifying transistor 111 and a current source (not shown), which is connected to the vertical signal line 9 and serves as a load constitute a source-follower circuit. The selection transistor 112 selects the pixel 1, and transmits an output of the second amplifying transistor 111 to the vertical signal line 9. ON/OFF of the selection transistor 112 are controlled by the selection pulse ΦSEL from the vertical scanning circuit 3.

Figure 4:
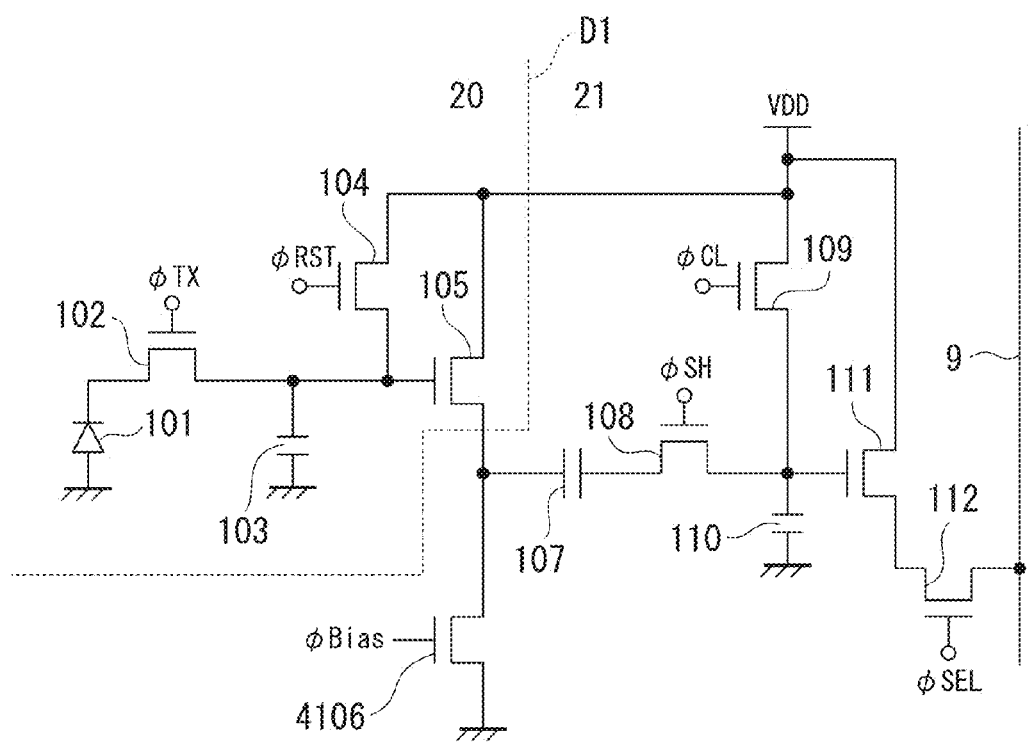
FIG. 4 is a circuit diagram illustrating a circuit configuration of a pixel in an imaging device according to a first embodiment of the present invention.

Among the circuit elements shown in FIG. 4, the photoelectric conversion element 101 is disposed in the first substrate 20. The analog memory 110 is disposed in the second substrate 21. Other circuit elements are disposed in any of the first substrate 20 and the second substrate 21. The broken line D1 of FIG. 4 represents a boundary line between the first substrate 20 and the second substrate 21. The photoelectric conversion element 101, the transfer transistor 102, the FD 103, the FD reset transistor 104, and the first amplifying transistor 105 are disposed in the first substrate 20. The load transistor 4106, the clamp capacitor 107, the sampling transistor 108, the analog memory reset transistor 109, the analog memory 110, the second amplifying transistor 111, and the selection transistor 112 are disposed in the second substrate 21.

The amplified signal which is output from the first amplifying transistor 105 of the first substrate 20 is output to the second substrate 21 through the micro-pad 22, the micro-bump 24, and the micro-pad 23. The power supply voltage VDD is transferred between the first substrate 20 and the second substrate 21 through the micro-pad 25, the micro-bump 27, and the micro-pad 26.

In FIG. 4, the connection portion including the micro-pad 22, the micro-bump 24, and the micro-pad 23 is disposed in a path between the source terminal of the first amplifying transistor 105, and the drain terminal of the load transistor 4106 and one end of the clamp capacitor 107. However, the embodiment of the present invention is not limited thereto. The connection portion may be disposed for each path electrically connected from the photoelectric conversion element 101 to the analog memory 110.

Figure 5:
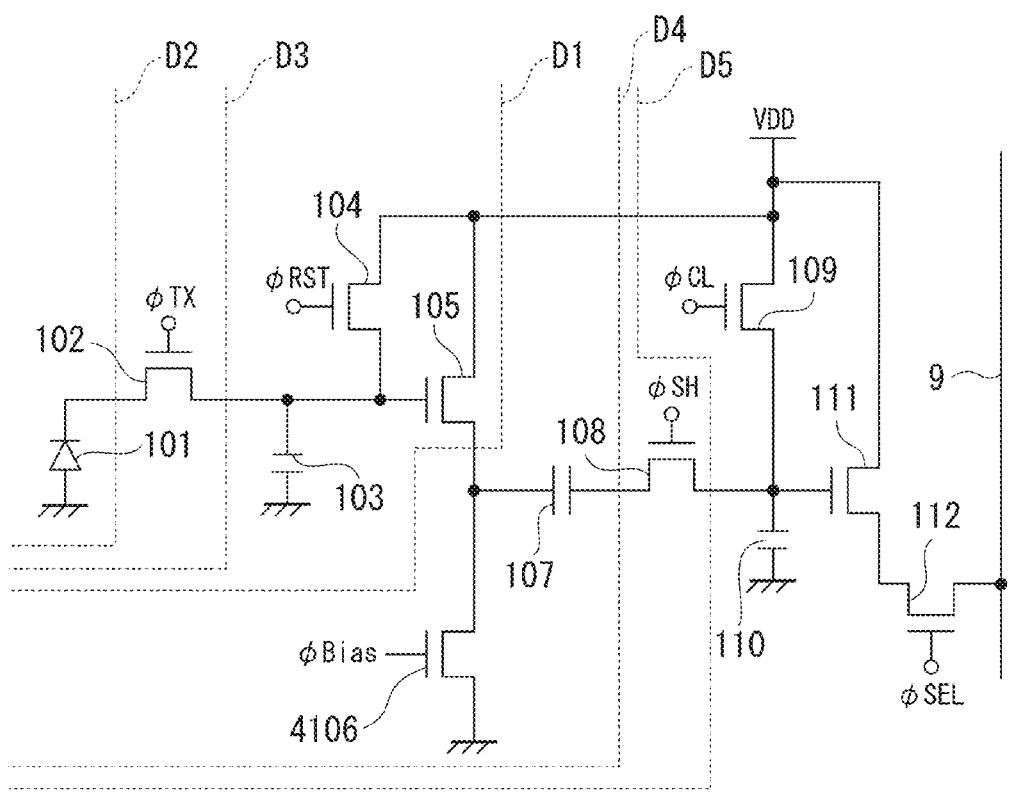
FIG. 5 is a circuit diagram illustrating a circuit configuration of the pixel in the imaging device according to the first embodiment of the present invention.

FIG. 5 shows an example of boundary lines between the first substrate 20 and the second substrate 21. The broken lines D1 to D5 show an example in which these lines can be used as the boundary lines between the first substrate 20 and the second substrate 21. The boundary lines between the first substrate 20 and the second substrate 21 may be any of the broken lines D1 to D5, and may be lines other than the above. The broken line D1 is as described above. In the example shown by the broken line D2, the connection portion is disposed in a path between the other end of the photoelectric conversion element 101 and the drain terminal of the transfer transistor 102. In the example shown by the broken line D3, the connection portion is disposed in a path between the source terminal of the transfer transistor 102, and one end of the FD 103, the source terminal of the FD reset transistor 104, and a gate terminal of the first amplifying transistor 105.

In the example shown by the broken line D4, the connection portion is disposed in a path between the other end of the clamp capacitor 107 and the drain terminal of the sampling transistor 108. In the example shown by the broken line D5, the connection portion is disposed in a path between the source terminal of the sampling transistor 108, and a source terminal of the analog memory reset transistor 109, one end of the analog memory 110, and a gate terminal of the second amplifying transistor 111.

Figure 6:
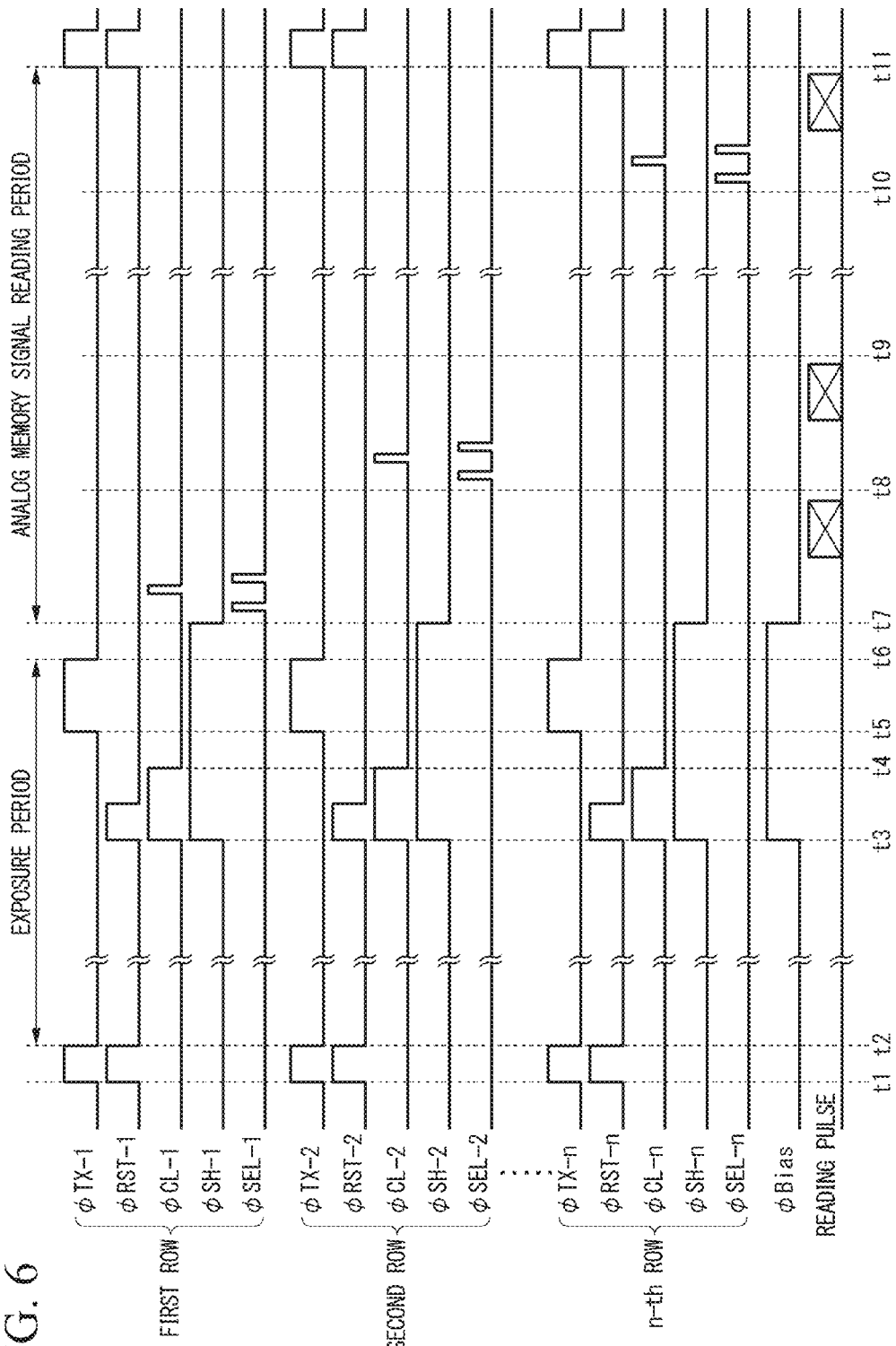
FIG. 6 is a timing diagram illustrating operations of the pixel in the imaging device according to the first embodiment of the present invention.

Next, operations of the pixel 1 will be described with reference to FIG. 6. FIG. 6 shows control signals which are supplied from the vertical scanning circuit 3 to the pixels 1 for each row, and shows the current control pulse ΦBias which is collectively (simultaneously) supplied to the pixels 1 of all the rows and reading pulses for reading signals from the horizontal reading circuit 5 to the horizontal signal line 10. Hereinafter, the control signals are added to a suffix indicating the row number and a description thereof will be made. For example, a transfer pulse ΦTX which is output to the pixels 1 in the first row is denoted by ΦTX-1. In addition, when the control signal in an arbitrary row is indicated, i is added thereto as a suffix indicating the row number and a description thereof will be made.

For example, the transfer pulse ΦTX which is output to the pixels 1 in all the rows, that is, all the pixels 1 (hereinafter, referred to as all the pixels) is denoted by ΦTX-i on behalf thereof.

At time t1, the transfer pulse ΦTX-i which is output to all the pixels is changed from an "L" (Low) level to an "H" (High) level, so that the transfer transistors 102 of all the pixels are turned on. Simultaneously, a FD reset pulse ΦRST-i which is output to all the pixels is changed from an "L" level to an "H" level, the FD reset transistors 104 of all the pixels are turned on. Thereby, the photoelectric conversion elements 101 are reset.

Subsequently, at time t2, the transfer pulse ΦTX-i and the FD reset pulse ΦRST-i which are output to all the pixels are changed from an "H" level to an "L" level, so that the transfer transistors 102 and the FD reset transistors 104 of all the pixels are turned off. Thereby, the reset of photoelectric conversion elements 101 of all the pixels is terminated, and the exposure (accumulation of signal charge) of all the pixels is collectively (simultaneously) started.

At time t3 within the exposure period, the FD reset pulse ΦRST-i which is output to all the pixels is changed from an "L" level to an "H" level, so that the FD reset transistors 104 of all the pixels are turned on. Thereby, the FDs 103 of all the pixels are reset. Simultaneously, the current control pulse ΦBias which is output to all the pixels is changed from an "L" level to an "H" level, so that the load transistors 4106 of all the pixels are turned on. Thereby, a driving current is supplied to the first amplifying transistor 105, and an amplification operation of the first amplifying transistor 105 is started.

Simultaneously, a clamp & memory reset pulse ΦCL-i which is output to all the pixels is changed from an "L" level to an "H" level, so that the analog memory reset transistors 109 of all the pixels are turned on. Thereby, the analog memories 110 of all the pixels are reset. Simultaneously, the sampling pulse ΦSH-i which is output to all the pixels is changed from an "L" level to an "H" level, so that the sampling transistors 108 of all the pixels are turned on. Thereby, the potential of the other end of the clamp capacitor 107 is reset to the power supply voltage VDD, and the sampling transistor 108 starts sampling and holding of the potential of the other end of the clamp capacitor 107.

Subsequently, the FD reset pulse ΦRST-i which is output to all the pixels is changed from an "H" level to an "L" level, so that the FD reset transistors 104 of all the pixels is turned off. Thereby, the reset of FDs 103 of all the pixels is terminated. The reset of the FDs 103 may be performed at the timing during the exposure period, but the reset of the FD 103 is performed at the timing immediately before the termination of the exposure period, thereby allowing noise due to a leakage current of the FD 103 to be further reduced.

Subsequently, at time t4 within the exposure period, the clamp & memory reset pulse ΦCL-i which is output to all the pixels is changed from an "H" level to an "L" level, so that the analog memory reset transistors 109 of all the pixels are turned off. Thereby, the reset of the analog memories 110 of all the pixels is terminated. At this point in time, the clamp capacitor 107 clamps an amplified signal (amplified signal after the reset of the FD 103) which is output from the first amplifying transistor 105.

Subsequently, at time t5, the transfer pulse ΦTX-i which is output to all the pixels is changed from an "L" level to an "H" level, so that the transfer transistors 102 of all the pixels are turned on. Thereby, signal charge accumulated in the photoelectric conversion elements 101 of all the pixels is transferred to the FD 103 through the transfer transistor 102, and is accumulated in the FD 103.

Subsequently, at time t6, the transfer pulse ΦTX-i which is output to all the pixels is changed from an "H" level to an "L" level, so that the transfer transistors 102 of all the pixels are turned off. Thereby, the exposure (accumulation of signal charge) of all the pixels is collectively (simultaneously) terminated. As shown in FIG. 6, the period from time t2 to time t6 is an exposure period (signal accumulation period).

Subsequently, at time t7, the sampling pulse ΦSH-i which is output to all the pixels is changed from an "H" level to an "L" level, so that the sampling transistors 108 of all the pixels are turned off. Thereby, the sampling transistor 108 terminates sample-and-hold of the potential of the other end of the clamp capacitor 107. Simultaneously, the current control pulse ΦBias which is output to all the pixels is changed from an "H" level to an "L" level, so that the load transistors 4106 of all the pixels are turned off. Thereby, the supply of the driving current to the first amplifying transistor 105 is stopped, and the first amplifying transistor 105 stops the amplification operation.

Figure 7:
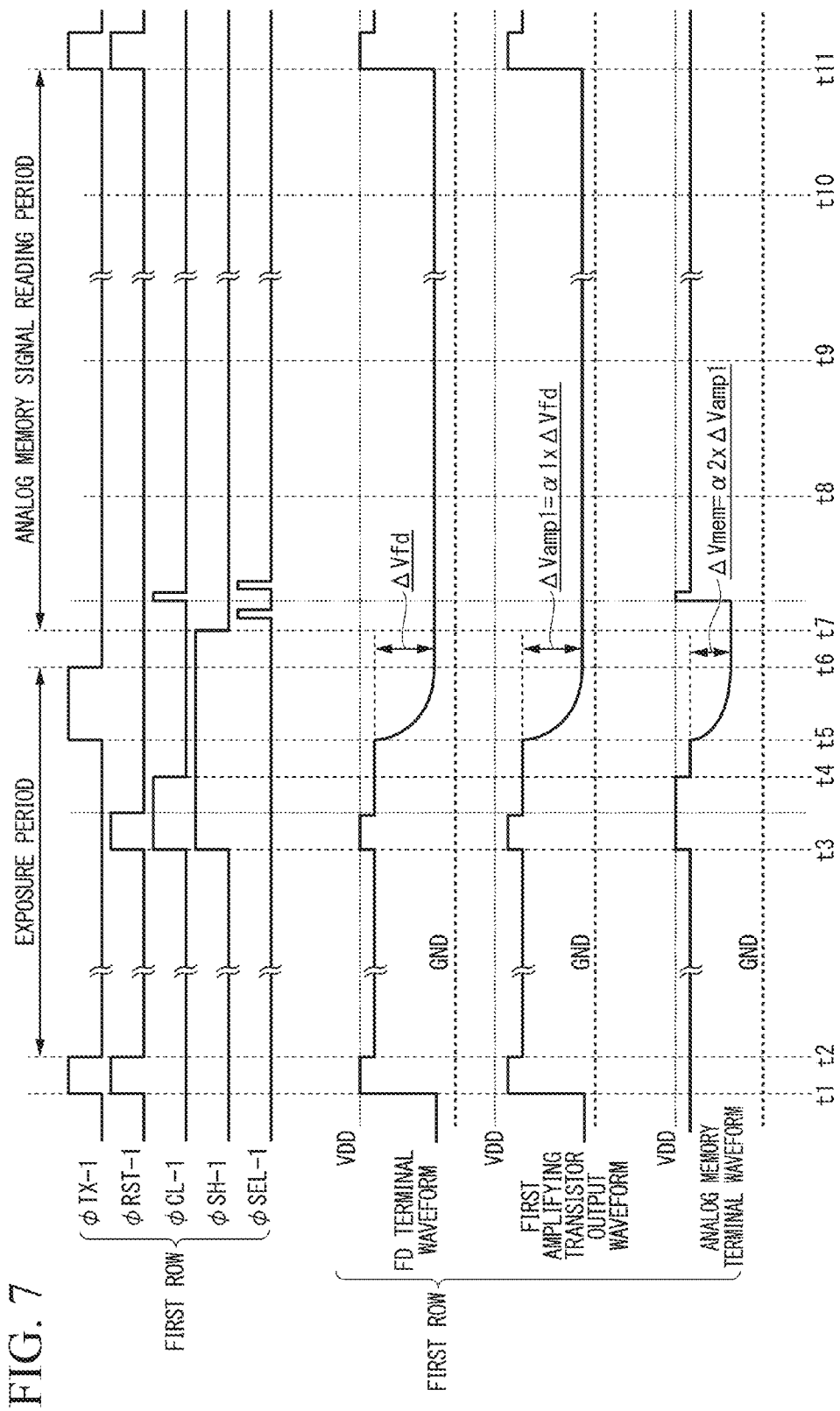
FIG. 7 is a timing diagram illustrating operations of the pixel in the imaging device according to the first embodiment of the present invention.

FIG. 7 shows control signals which are supplied from the vertical scanning circuit 3 to the pixels 1 in the first row, and shows a potential of one end of the FD 103, a potential of the source terminal of the first amplifying transistor 105, and a potential of one end of the analog memory 110. A change ΔVmem in the potential of one end of the analog memory 110 in the present embodiment is obtained similarly to Expression (1) and Expression (2) in the first embodiment. However, in the present embodiment, ΔVfd is the amount of change in the potential of one end of the FD 103 due to the transfer of the signal charge, and does not include reset noise generated by resetting the FD 103. Therefore, the sampling transistor 108 performs the sample-and-hold, thereby allowing the influence of noise generated in the photoelectric conversion element 101 to be reduced.

When a change in the potential of one end of the FD 103 by transferring the signal charge from the photoelectric conversion element 101 to the FD 103 after the reset of the FD 103 is terminated is set to ΔVfd, and a gain of the first amplifying transistor 105 is set to α1, a change ΔVamp1 of the potential of the source terminal of the first amplifying transistor 105 by transferring the signal charge from the photoelectric conversion element 101 to the FD 103 is equal to α1×ΔVfd.

When the sum of gains of the analog memory 110 and the sampling transistor 108 is set to α2, a change ΔVmem in the potential of one end of the analog memory 110 by the sample-and-hold of the sampling transistor 108 after the signal charge is transferred from the photoelectric conversion element 101 to the FD 103 is equal to α2×ΔVamp1, that is, α1×α2×ΔVfd. The potential of one end of the analog memory 110 at the point in time when the reset of the analog memory 110 is terminated is equal to the power supply voltage VDD. For this reason, after the signal charge is transferred from the photoelectric conversion element 101 to the FD 103, a potential Vmem of one end of the analog memory 110 sampled and held by the sampling transistor 108 is expressed as the following Expression (1). In Expression (1), the relationships of ΔVmem<0 and ΔVfd<0 are satisfied.

$$Vmem = VDD + \Delta Vmem \quad (1)$$
$$= VDD + \alpha 1 + \alpha 2 \times \Delta Vfd$$

In addition, α2 is expressed as the following Expression (2). In Expression (2), CL is a capacitance value of the clamp capacitor 107, and CSH is a capacitance value of the analog memory 110. Since a decrease in the gain is made smaller, it is more preferable that the capacitance value CL of the clamp capacitor 107 be larger than the capacitance value CSH of the analog memory 110.

$$\alpha 2 = \frac{CL}{CL + CSH} \quad (2)$$

After time t7, a signal based on the signal charge accumulated in the analog memory 110 is sequentially read for each row. In the period of times t7 to t8, a signal is read from the pixels 1 in the first row. First, the selection pulse ΦSEL-1 which is output to the pixels 1 in the first row is changed from an "L" level to an "H" level, so that the selection transistors 112 of the pixels 1 in the first row are turned on. Thereby, a signal based on the potential Vmem shown in Expression (1) is output to the vertical signal line 9 through the selection transistor 112. Subsequently, the selection pulse ΦSEL-1 which is output to the pixels 1 in the first row is changed from an "H" level to an "L" level, so that the selection transistors 112 of the pixels 1 in the first row are turned off.

Subsequently, the clamp & memory reset pulse ΦCL-1 which is output to the pixels 1 in the first row is changed from an "L" level to an "H" level, so that the analog memory reset transistors 109 of the pixels 1 in the first row are turned on. Thereby, the analog memories 110 of the pixels 1 in the first row are reset. Subsequently, the clamp & memory reset pulse ΦCL-1 which is output to the pixels 1 in the first row is changed from an "H" level to an "L" level, so that the analog memory reset transistors 109 of the pixels 1 in the first row are turned off.

Subsequently, the selection pulse ΦSEL-1 which is output to the pixels 1 in the first row is changed from an "L" level to an "H" level, so that the selection transistors 112 of the pixels 1 in the first row are turned on. Thereby, a signal based on the potential of one end of the analog memory 110 when the analog memory 110 is reset is output to the vertical signal line 9 through the selection transistor 112. Subsequently, the selection pulse ΦSEL-1 is changed from an "H" level to an "L" level, so that the selection transistors 112 are turned off.

The column processing circuit 4 generates a differential signal obtained by taking the difference between the signal based on the potential Vmem shown in Expression (1) and the signal based on the potential of one end of the analog memory 110 when the analog memory 110 is reset. This differential signal is a signal based on the difference between the potential Vmem shown in Expression (1) and the power supply voltage VDD, and is a signal based on the difference ΔVfd between the potential of one end of the FD 103 immediately after the signal charge accumulated in the photoelectric conversion element 101 is transferred to the FD 103 and the potential of the FD 103 immediately after one end of the FD 103 is reset. Therefore, it is possible to obtain signal components based on the signal charge accumulated in the photoelectric conversion element 101 in which noise components due to the reset of the analog memory 110 and noise components due to the reset of the FD 103 are suppressed.

A signal which is output from the column processing circuit 4 is output to the horizontal signal line 10 by the horizontal reading circuit 5. The output amplifier 6 processes a signal which is output to the horizontal signal line 10, and outputs the signal as a pixel signal from the output terminal 11. In this way, the reading of signals from the pixels 1 in the row to be read is terminated.

In the period of times t8 to t9, a signal is read from the pixels 1 in the second row. Operations of reading a signal from the pixels 1 in the second row are the same as the operations of reading a signal from the pixels 1 in the first row, and thus a description thereof will be omitted. Similar operations are also performed for each row with respect to the pixels 1 after the second row. In the period of times t10 to t11, a signal is read from the pixels 1 in the final row (n-th row). The operations are the same as the operations of reading a signal from the pixels 1 in the first row, and thus a description thereof will be omitted. After the operations of reading signals from all the pixels are terminated, the operations from time t1 are performed again. In FIG. 6, after the operations of reading signals from all the pixels are terminated, the operations from time t1 are performed again. However, after the operations of reading signals from all the pixels are terminated, the operations relevant to the pixels 1 may be terminated.

The operations shown in FIG. 6 are operations using the global shutter for performing the exposure of the photoelectric conversion element 101 collectively with respect to all the pixels. In the global shutter operation, the signal charge transferred from the photoelectric conversion element 101 to the FD 103 collectively with respect to all the pixels has to be held by the FD 103 until the reading timing of each of the pixels 1. When noise is generated during the period in which the FD 103 holds the signal charge, noise is superimposed on the signal charge held by the FD 103, and thus the signal quality (S/N) is deteriorated.

A main factor of the noise generated during the period in which the FD 103 holds the signal charge (hereinafter, referred to as the holding period) is charge (hereinafter, referred to as the leakage charge) due to a leakage current of the FD 103 and charge (hereinafter, referred to as the photoelectric charge) caused by light which is incident on portions other than the photoelectric conversion element 101. When the leakage charge and the photoelectric charge which are generated in a unit time are set to qid and qpn, respectively, and the length of the holding period is set to tc, noise charge Qn generated during the holding period is equal to (qid+qpn)tc.

The capacitance of the FD 103 is set to Cfd, the capacitance of the analog memory 110 is set to Cmem, and the ratio of Cfd to Cmem (Cmem/Cfd) is set to A. In addition, as mentioned above, the gain of the first amplifying transistor 105 is set to α1, and the sum of the gains of the analog memory 110 and the sampling transistor 108 is set to α2. When the signal charge generated in the photoelectric conversion element 101 during the exposure period is set to Qph, the signal charge held by the analog memory 110 after the termination of the exposure period is equal to A×α1×α2×Qph.

The signal based on the signal charge transferred from the photoelectric conversion element 101 to the FD 103 is sampled and held until time t7 by the sampling transistor 108, and is stored in the analog memory 110. Therefore, the time until the signal charge is stored in the analog memory 110 after the signal charge is transferred to the FD 103 is shortened, and thus noise generated in the FD 103 can be ignored. When the noise generated in the period in which the analog memory 110 holds the signal charge is assumed to be Qn as stated above, S/N is equal to A×α1×α2×Qph/Qn.

On the other hand, as the related art disclosed in Japanese Unexamined Patent Application, First Publication No. 2010-219339, the S/N in the case where the signal charge held by the accumulation capacitance section is read from the pixel through the amplifying transistor is equal to Qph/Qn. Therefore, the S/N of the present embodiment is equal to A×α1×α2 times the S/N of the related art. The capacitance value of the analog memory 110 is set so that A×α1×α2 becomes larger than 1 (for example, the capacitance value of the analog memory 110 is set to be sufficiently larger than the capacitance value of the FD 103), thereby allowing the deterioration of the signal quality to be reduced.

As mentioned above, according to the present embodiment, circuit elements constituting a pixel are disposed in each of two substrates, and an amplified signal which is output from the amplifier circuit (first amplifying transistor 105) is accumulated in the signal accumulation circuit (analog memory 110) without digitization thereof, thereby allowing an increase in the chip area to be suppressed. That is, according to the present embodiment, multi-pixel formation also is capable of being easily made. Further, it is possible to reduce the deterioration of the signal quality by providing the signal accumulation circuit (analog memory 110).

In addition, since the area of the photoelectric conversion element of the first substrate can be increased as compared with the case where all the circuit elements of a pixel are disposed in one substrate, sensitivity is improved. Further, the analog memory is used, thereby allowing the area of a region for signal accumulation provided in the second substrate to be reduced.

In addition, the exposure (accumulation of signal charge) of the photoelectric conversion elements 101 of all the pixels is started collectively, thereby allowing the distortion of a subject within an image to be reduced. Further, it is possible to realize a global shutter in which the exposure (accumulation of signal charge) of the photoelectric conversion elements 101 of all the pixels is started and terminated collectively.

In the operations shown in FIG. 6, although the current control pulse ΦBias is set to an "H" level only in the period in which an amplification operation of the first amplifying transistor 105 is required, and the load transistor 4106 is activated, the load transistor 4106 may be activated not only for the period in which the amplification operation of the first amplifying transistor 105 is required, but also for the period in which the amplification operation of the first amplifying transistor 105 is not required. The load transistor 4106 is activated only for a portion of the period as in the present embodiment, thereby allowing power consumption to be reduced.

In addition, the capacitance value of the analog memory 110 is set to be larger than the capacitance value of the FD 103 (for example, the capacitance value of the analog memory 110 is set to be five times or more the capacitance value of the FD 103), and thus the signal charge held by the analog memory 110 becomes larger than the signal charge held by the FD 103. For this reason, it is possible to reduce the influence of signal deterioration due to the leakage current of the analog memory 110.

In addition, it is possible to reduce noise generated in the first substrate 20 by providing the clamp capacitor 107 and the sampling transistor 108. The noise generated in the first substrate 20 includes noise (for example, reset noise) generated in the input section of the first amplifying transistor 105 resulting from an operation of the circuit (for example, FD reset transistor 104) connected to the first amplifying transistor 105, noise resulting from the operating characteristics of the first amplifying transistor 105 (for example, noise due to the variation of a circuit threshold of the first amplifying transistor 105), and the like.

In addition, a signal when the analog memory 110 is reset and a signal based on a fluctuation in the output of the first amplifying transistor 105 which is generated by transferring the signal charge from the photoelectric conversion element 101 to the FD 103 are output from the pixel 1 in a time-division manner, and differential processing of each signal is performed in the outside of the pixel 1, thereby allowing noise generated in the second substrate 21 to be reduced. The noise generated in the second substrate 21 includes noise (for example, reset noise) generated in the input section of the second amplifying transistor 111 resulting from an operation of the circuit (for example, analog memory reset transistor 109) connected to the second amplifying transistor 111, and the like.

Second Embodiment

Figure 8:
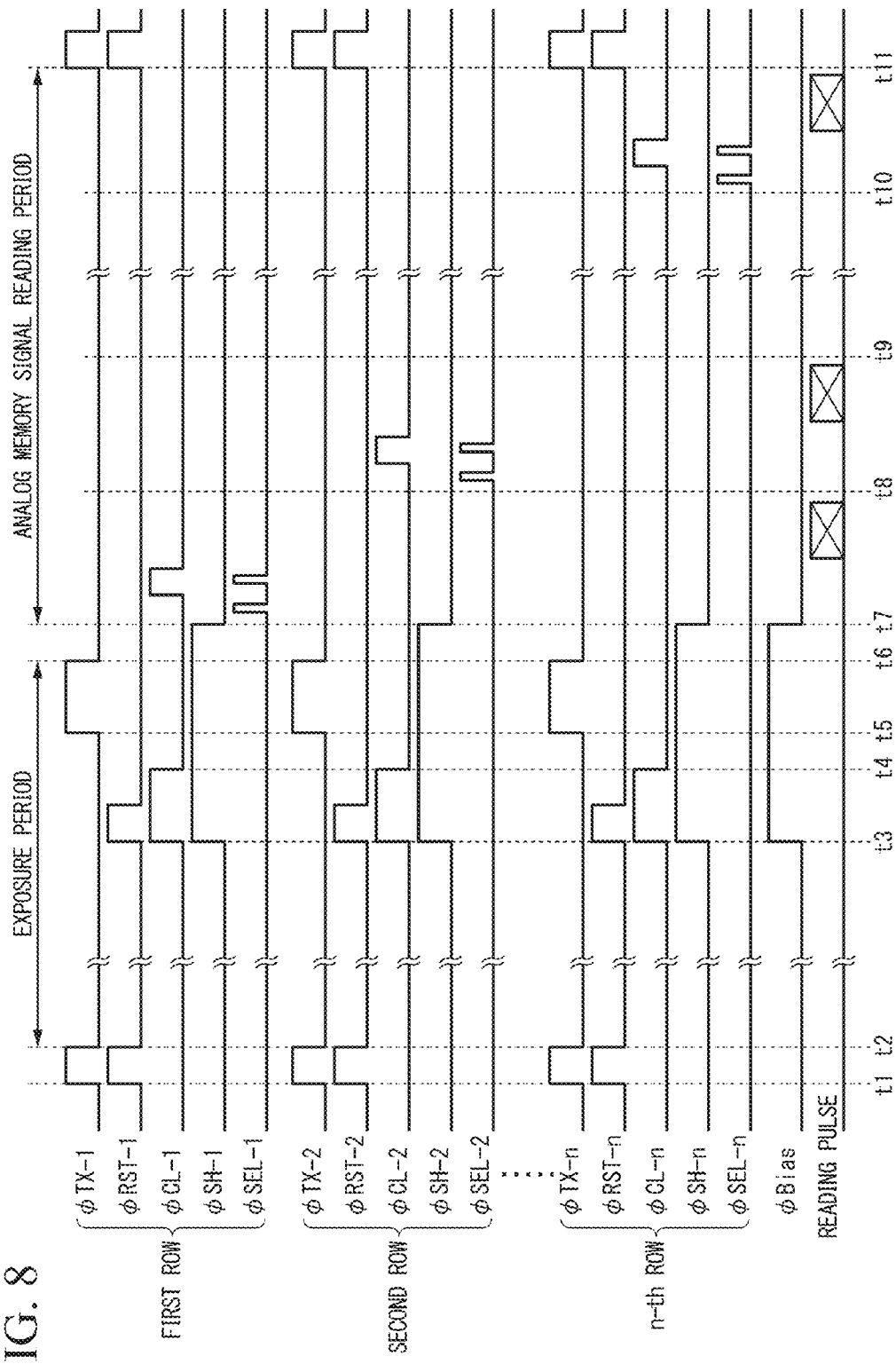
FIG. 8 is a timing diagram illustrating operations of a pixel in an imaging device according to a second embodiment of the present invention.

Next, a second embodiment of the present invention will be described. A configuration of an imaging section according to the present embodiment is the same as the configuration of the first embodiment, and thus a description of the configuration will be omitted. Hereinafter, operations of the pixel 1 will be described with reference to FIG. 8. FIG. 8 shows control signals which are supplied from the vertical scanning circuit 3 to the pixels 1 for each row, and shows the current control pulse ΦBias which is collectively (simultaneously) supplied to the pixels 1 of all the rows and reading pulses for reading signals from the horizontal reading circuit 5 to the horizontal signal line 10. The denotation of ΦTX-1 and the like is the same as the denotation in FIG. 6.

The difference from FIG. 6 is driving timing of the clamp & memory reset pulse ΦCL-i in the analog memory signal reading period after time t7. Hereinafter, only operations after time t7 will be described.

After time t7, a signal based on the signal charge accumulated in the analog memory 110 is sequentially read for each row. In the period of times t7 to t8, a signal is read from the pixels 1 in the first row. First, the selection pulse ΦSEL-1 which is output to the pixels 1 in the first row is changed from an "L" level to an "H" level, so that the selection transistors 112 of the pixels 1 in the first row are turned on. Thereby, a signal based on the potential Vmem of the first embodiment is output to the vertical signal line 9 through the selection transistor 112. Subsequently, the selection pulse ΦSEL-1 which is output to the pixels 1 in the first row is changed from an "H" level to an "L" level, so that the selection transistors 112 the pixels 1 in the first row are turned off.

Subsequently, the clamp & memory reset pulse ΦCL-1 which is output to the pixels 1 in the first row is changed from an "L" level to an "H" level, so that the analog memory reset transistors 109 of the pixels 1 in the first row are turned on. Thereby, the analog memories 110 of the pixels 1 in the first row are reset.

In the state where the analog memories 110 are reset, the selection pulse ΦSEL-1 which is output to the pixels 1 in the first row is changed from an "L" level to an "H" level, so that the selection transistors 112 of the pixels 1 in the first row are turned on. Thereby, a signal based on the potential of one end of the analog memory 110 in the state where the analog memory 110 is reset is output to the vertical signal line 9 through the selection transistor 112. Subsequently, the selection pulse ΦSEL-1 is changed from an "H" level to an "L" level, so that selection transistors 112a are turned off. Subsequently, the clamp & memory reset pulse ΦCL-1 which is output to the pixels 1 in the first row is changed from an "H" level to an "L" level, so that the analog memory reset transistors 109 of the pixels 1 in the first row are turned off.

Figure 9:
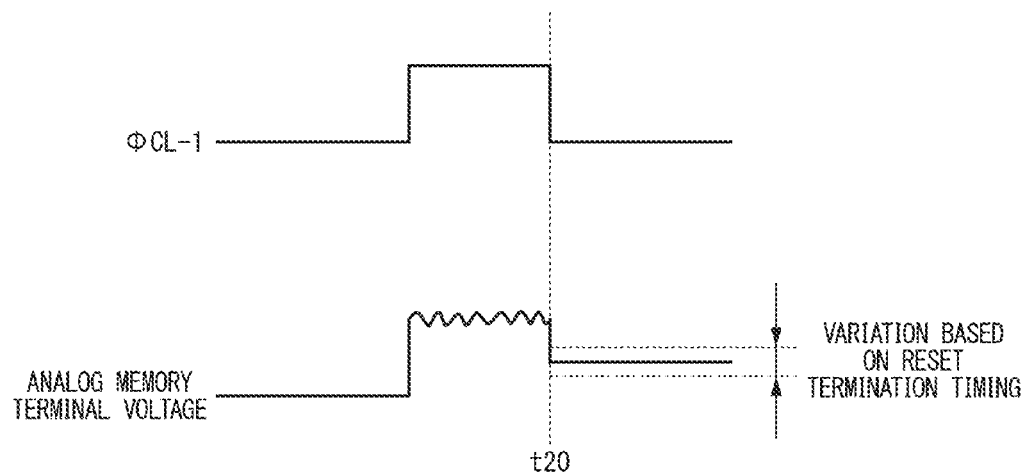
FIG. 9 is a timing diagram illustrating a noise reduction effect according to the second embodiment of the present invention.

FIG. 9 shows the clamp & memory reset pulse ΦCL-1 after time t7 and the potential (analog memory terminal voltage) of one end of the analog memory 110. The clamp & memory reset pulse ΦCL-1 is changed to an "H" level, and reset noise is superimposed on the potential of one end of the analog memory 110 while the analog memory 110 is reset by the analog memory reset transistor 109. When the clamp & memory reset pulse ΦCL-1 is changed to an "L" level, and the reset of the analog memory 110 is terminated, the potential of one end of the analog memory 110 is changed due to the influence of parasitic capacitance or the like.

The potential of one end of the analog memory 110 is changed with reference to the potential at the time (time t20 in FIG. 9) of the reset termination of the analog memory 110. The potential of one end the analog memory 110 during the reset fluctuates due to reset noise. For this reason, the potential of one end of the analog memory 110 after the reset termination varies in accordance with the reset timing of the analog memory 110. When a signal based on the potential of one end of the analog memory 110 after the reset termination is output to the vertical signal line 9 as in the operations of FIG. 6, a signal including components based on the above-mentioned variation is output to the vertical signal line 9.

On the other hand, in the operations of FIG. 8, a signal based on the potential of one end of the analog memory 110 during the reset is output to the vertical signal line 9. The potential of one end of the analog memory 110 during the reset fluctuates due to reset noise. However, since the second amplifying transistor 111 has also a function as a so-called low-pass filter in addition to the amplification function, the variation in the signal based on the potential of one end of the analog memory 110 during the reset is limited by the band of the second amplifying transistor 111. For this reason, noise in the signal can be further reduced as compared with the operations of FIG. 6.

Third Embodiment

Figure 10:
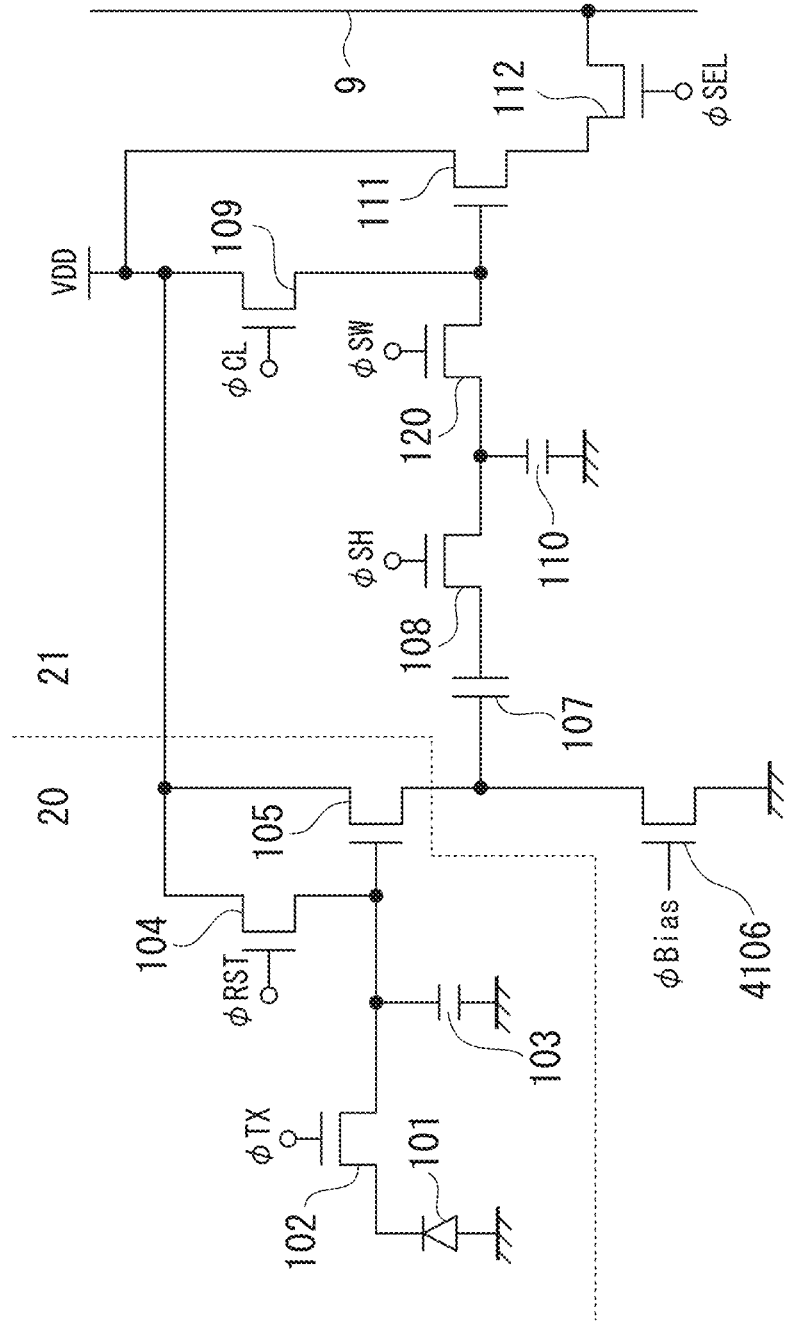
FIG. 10 is a circuit diagram illustrating a circuit configuration of a pixel in an imaging device according to a third embodiment of the present invention.

Next, a third embodiment of the present invention will be described. A configuration of an imaging section according to the present embodiment is the same as the configuration of the first embodiment, except for the configuration of the pixel 1. FIG. 10 shows a circuit configuration of the pixel 1 according to the present embodiment. The difference from the configuration of FIG. 4 is that a switching transistor 120 is provided between the sampling transistor 108 and the second amplifying transistor 111. Other configurations are the same as those in FIG. 4, and thus a description thereof will be omitted.

A drain terminal of the switching transistor 120 is connected to the source terminal of the sampling transistor 108 and one end of the analog memory 110. A source terminal of the switching transistor 120 is connected to the gate terminal constituting an input section of the second amplifying transistor 111 and the source terminal of the analog memory reset transistor 109. A gate terminal of the switching transistor 120 is connected to the vertical scanning circuit 3, and is supplied with a switching pulse ΦSW. The switching transistor may have a reverse polarity, and the source terminal and the drain terminal thereof may be set to be reverse to the above.

The switching transistor 120 transmits a signal of the analog memory 110 to the second amplifying transistor 111. ON/OFF of the switching transistor 120 are controlled by the switching pulse ΦSW from the vertical scanning circuit 3. In FIG. 10, the switching transistor 120 is disposed in the second substrate 21.

Figure 11:
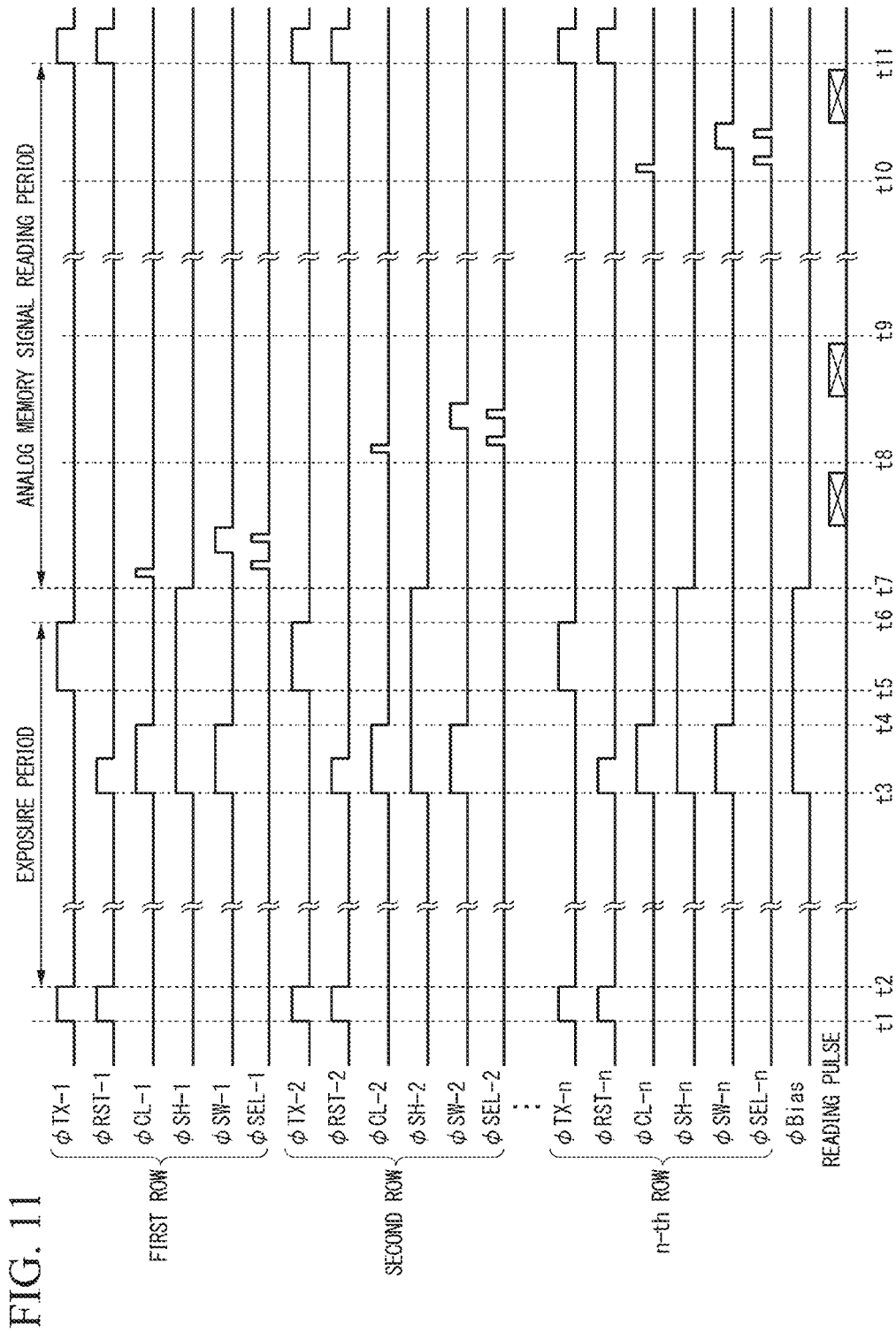
FIG. 11 is a timing diagram illustrating operations of the pixel in the imaging device according to the third embodiment of the present invention.

Hereinafter, operations of the pixel 1 will be described with reference to FIG. 11. FIG. 11 shows control signals which are supplied from the vertical scanning circuit 3 to the pixels 1 for each row, and shows the current control pulse ΦBias which is collectively (simultaneously) supplied to the pixels 1 of all the rows and reading pulses for reading signals from the horizontal reading circuit 5 to the horizontal signal line 10. The denotation of ΦTX-1 and the like is the same as the denotation in FIG. 6. The difference from FIG. 6 is an addition of the switching pulse ΦSW-i for controlling ON/OFF of the switching transistor 120, and driving timings of the clamp & memory reset pulse ΦCL-i and the selection pulse ΦSEL-i in the analog memory signal reading period after time t7.

At time t3 within the exposure period, the clamp & memory reset pulse ΦCL-i and the switching pulse ΦSW-i which are output to all the pixels are changed from an "L" level to an "H" level, so that the analog memory reset transistors 109 and the switching transistors 120 of all the pixels are turned on. Thereby, the analog memories 110 of all the pixels are reset. Other operations are the same as the operations of FIG. 6 except that the clamp & memory reset pulse ΦCL-i is changed to an "H" level to an "L" level and simultaneously the switching pulse ΦSW-i is changed from an "H" level to an "L" level, and thus a description thereof will be omitted.

After time t7, a signal based on the signal charge accumulated in the analog memory 110 is sequentially read for each row. In the period of times t7 to t8, a signal is read from the pixels 1 in the first row. First, the clamp & memory reset pulse ΦCL-1 which is output to the pixels 1 in the first row is changed from an "L" level to an "H" level, so that the analog memory reset transistors 109 of the pixels 1 in the first row are turned on. Thereby, the input sections of the analog memory reset transistors 109 of the pixels 1 in the first row are reset. At this time, the switching transistors 120 are turned off, and thus the analog memories 110 are not reset.

Subsequently, the selection pulse ΦSEL-1 which is output to the pixels 1 in the first row is changed from an "L" level to an "H" level, so that the selection transistors 112 of the pixels 1 in the first row are turned on. Thereby, a signal when the input section of the second amplifying transistor 111 is reset is output to the vertical signal line 9 through the selection transistor 112. Subsequently, the selection pulse ΦSEL-1 which is output to the pixels 1 in the first row is changed from an "H" level to an "L" level, so that the selection transistors 112 of the pixels 1 in the first row are turned off.

Subsequently, the switching pulse ΦSW-1 which is output to the pixels 1 in the first row is changed from an "L" level to an "H" level, the switching transistors 120 of the pixels 1 in the first row are turned on.

Subsequently, the selection pulse ΦSEL-1 which is output to the pixels 1 in the first row is changed from an "L" level to an "H" level, so that the selection transistors 112 of the pixels 1 in the first row are turned on. Thereby, the signal based on the potential Vmem shown in Expression (1) is output to the vertical signal line 9 through the selection transistor 112. Subsequently, the selection pulse ΦSEL-1 is changed from an "H" level to an "L" level, the selection transistors 112 are turned off.

Figure 12:
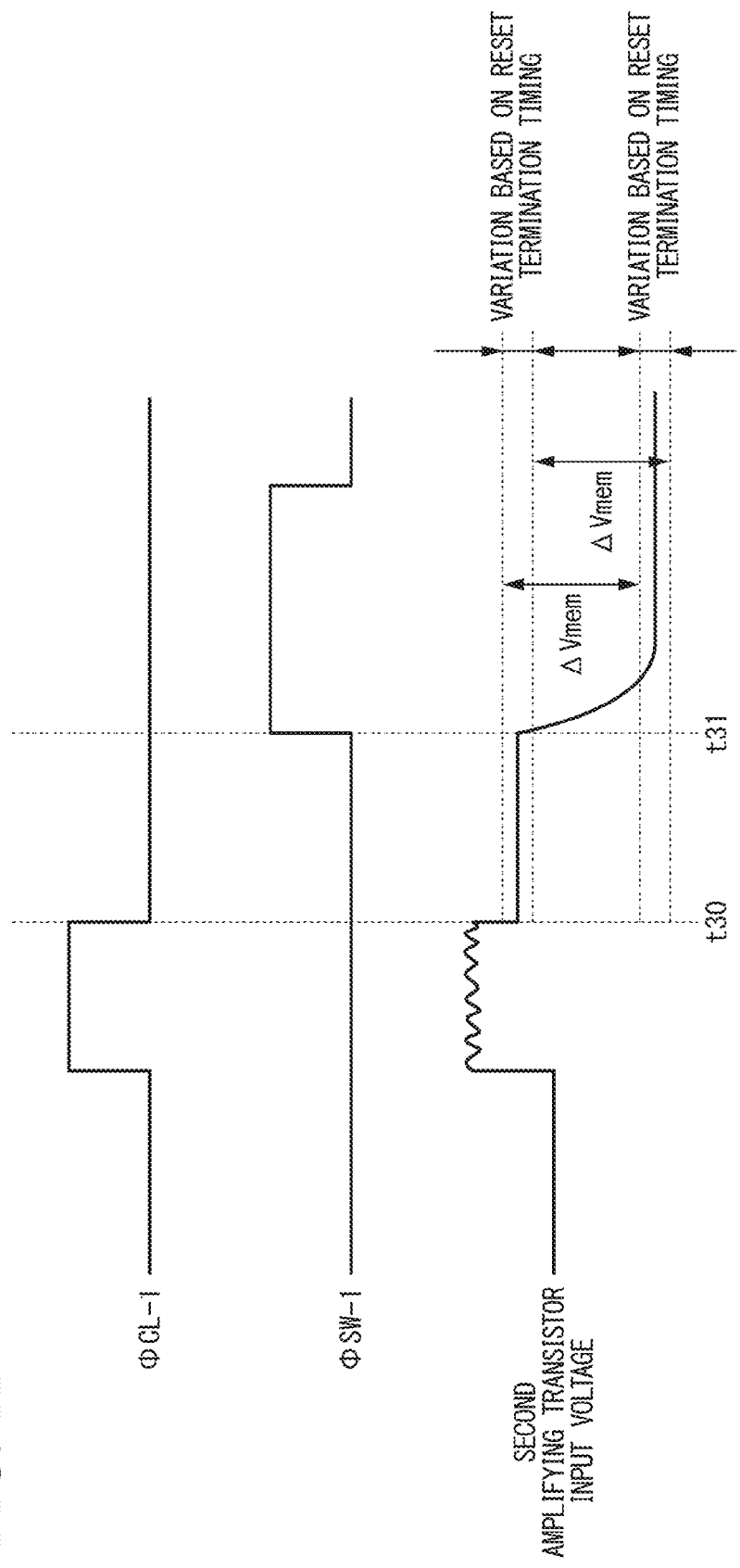
FIG. 12 is a timing diagram illustrating a noise reduction effect according to the third embodiment of the present invention.

FIG. 12 shows the clamp & memory reset pulse ΦCL-1, the switching pulse ΦSW-1, and the potential (input voltage of the second amplifying transistor) of the input section of the second amplifying transistor 111 after time t7. The clamp & memory reset pulse ΦCL-1 is changed to an "H" level, and reset noise is superimposed on the potential of the input section of the second amplifying transistor 111 while the input section of the second amplifying transistor 111 is reset by the analog memory reset transistor 109. When the clamp & memory reset pulse ΦCL-1 is changed to an "L" level, and the reset of the input section of the second amplifying transistor 111 is terminated, the potential of the input section of the second amplifying transistor 111 is changed due to the influence of parasitic capacitance or the like.

The potential of the input section of the second amplifying transistor 111 is changed with reference to the potential at the time of the reset termination (time t30 in FIG. 12) of the input section of the second amplifying transistor 111. The potential of the input section of the second amplifying transistor 111 during the reset fluctuates due to reset noise. For this reason, the potential of the input section of the second amplifying transistor 111 after the reset termination varies in accordance with the reset timing of the input section of the second amplifying transistor 111. Further, when the switching pulse ΦSW-1 is changed to an "H" level, and one end of the analog memory 110 and the input section of the second amplifying transistor 111 are connected to each other, the potential of the input section of the second amplifying transistor 111 is changed.

The potential of the input section of the second amplifying transistor 111 is changed by $\Delta Vmem$ ($=\alpha_1 \times \alpha_2 \times \Delta Vfd$) described in the first embodiment, with reference to the potential at time t31 of FIG. 12. The potential of the input section of the second amplifying transistor 111 at time t31 fluctuates due to reset noise. However, in a signal after taking the difference between the signal based on the potential of the input section of the second amplifying transistor 111 when the input section of the second amplifying transistor 111 is reset and the signal based on the potential of the input section of the second amplifying transistor 111 after one end of the analog memory 110 and the input section of the second amplifying transistor 111 are connected to each other, the variation in the potential of the input section of the second amplifying transistor 111 based on the reset timing is canceled.

In the operations of FIG. 6 using the configuration of FIG. 4, after the signal charge is transferred from the photoelectric conversion element 101 to the FD 103, a signal based on the potential of one end of the analog memory 110 sampled and held by the sampling transistor 108 is output to the vertical signal line 9. Thereafter, a signal based on the potential of one end of the analog memory 110 when the analog memory 110 is reset is output to the vertical signal line 9. The potential of one end of the analog memory 110 when the analog memory 110 is reset fluctuates due to reset noise. For this reason, the variation due to reset noise is included in a signal obtained by taking the difference between two kinds of signals which are output to the vertical signal line 9.

On the other hand, in the operations of FIG. 8 using the configuration of FIG. 10, a signal based on the potential of the input section of the second amplifying transistor 111 when the input section of the second amplifying transistor 111 is reset is output to the vertical signal line 9. Thereafter, a signal based on the potential of the input section of the second amplifying transistor 111 after one end of the analog memory 110 and the input section of the second amplifying transistor 111 are connected to each other is output to the vertical signal line 9. In the signal obtained by taking the difference between two kinds of signals which are output to the vertical signal line 9, as mentioned above, the variation in the potential of the input section of the second amplifying transistor 111 corresponding to the reset timing is reduced. For this reason, noise in the signal can be further reduced as compared with the operations of FIG. 6 using the configuration of FIG. 4.

An amplifier circuit (amplifying transistor) according to the present invention corresponds to, for example, the first amplifying transistor 105. A signal accumulation circuit (memory circuit) according to the present invention corresponds to, for example, the analog memory 110. An output circuit (output transistor) according to the present invention corresponds to, for example, the selection transistor 112. In addition, a reset circuit according to the present invention corresponds to, for example, the FD reset transistor 104. A load circuit according to the present invention corresponds to, for example, the load transistor 4106. In addition, a noise reduction circuit according to the present invention corresponds to, for example, the clamp capacitor 107 and the sampling transistor 108. A clamp section (clamp capacitor) according to the present invention corresponds to, for example, the clamp capacitor 107. A sample-and-hold section (transistor) according to the present invention corresponds to, for example, the sampling transistor 108.

In addition, a first reset circuit according to the present invention corresponds to, for example, the transfer transistor 102 and the FD reset transistor 104. A second reset circuit according to the present invention corresponds to, for example, the FD reset transistor 104. A transfer circuit according to the present invention corresponds to, for example, the transfer transistor 102. A second amplifier circuit according to the present invention corresponds to, for example, the second amplifying transistor 111. A third reset circuit according to the present invention corresponds to, for example, the analog memory reset transistor 109. A differential processing circuit according to the present invention corresponds to, for example, the column processing circuit 4. A switching circuit according to the present invention corresponds to, for example, the switching transistor 120.

Fourth Embodiment

Next, a forth embodiment of the present invention will be described. A configuration of an imaging section according to the present embodiment is the same as the configuration according to the first to third embodiments. In the present embodiment, the region constituted by all the pixels which has the imaging section 202 is set to a region for pixel signals to be read, but a portion of the region constituted by all the pixels which has the imaging section 202 may be set to a region to be read. The region to be read preferably includes at least all the pixels in an effective pixel region. In addition, the region to be read may include optical black pixels (pixels in which light is shielded at all times) disposed in the outside of the effective pixel region. The pixel signals which are read from the optical black pixels are used in correcting, for example, dark current components.

Other configurations are the same as those in the first to third embodiments, and thus a description thereof will be omitted.

FIG. 13 shows a circuit configuration of the pixel 1 having two pixels according to the present embodiment. The pixel 1 (two pixels) includes photoelectric conversion elements 101a and 101b, transfer transistors 102a and 102b, an FD (floating diffusion) 103, an FD reset transistor 104, a first amplifying transistor 105, a current source 1106, a clamp capacitor 107, sampling transistors 108a and 108b, analog memory reset transistors 109a and 109b, analog memories 110a and 110b, second amplifying transistors 111a and 111b, and selection transistors 112a and 112b. The position at which each circuit element is disposed as shown in FIG. 13 may not necessarily be identical with the actual position of disposition thereof.

Circuit elements of a first pixel and circuit elements of a second pixel are included in the configuration of FIG. 13. The first pixel includes the photoelectric conversion element 101a, the transfer transistor 102a, the FD 103, the FD reset transistor 104, the first amplifying transistor 105, the current source 1106, the clamp capacitor 107, the sampling transistor 108a, the analog memory reset transistor 109a, the analog memory 110a, the second amplifying transistor 111a, and the selection transistor 112a. The second pixel includes the photoelectric conversion element 101b, the transfer transistor 102b, the FD 103, the FD reset transistor 104, the first amplifying transistor 105, a current source 106, the clamp capacitor 107, the sampling transistor 108b, the analog memory reset transistor 109b, the analog memory 110b, the second amplifying transistor 111b, and the selection transistor 112b. The FD 103, the FD reset transistor 104, the first amplifying transistor 105, the current source 106, and the clamp capacitor 107 which are disposed in a shared region Sh shown in FIG. 13 are shared by each of the first pixel and the second pixel.

One end of the photoelectric conversion element 101a is grounded. A drain terminal of the transfer transistor 102a is connected to the other end of the photoelectric conversion element 101a. A gate terminal of the transfer transistor 102a is connected to the vertical scanning circuit 3, and is supplied with a transfer pulse ΦTX1.

One end of the photoelectric conversion element 101b is grounded. A drain terminal of the transfer transistor 102b is connected to the other end of the photoelectric conversion element 101b. A gate terminal of the transfer transistor 102b is connected to the vertical scanning circuit 3, and is supplied with a transfer pulse ΦTX2.

One end of the FD 103 is connected to source terminals of the transfer transistors 102a and 102b. The other end of the FD 103 is grounded. A drain terminal of the FD reset transistor 104 is connected to the power supply voltage VDD, and a source terminal of the FD reset transistor 104 is connected to the source terminals of the transfer transistors 102a and 102b. A gate terminal of the FD reset transistor 104 is connected to the vertical scanning circuit 3, and is supplied with the FD reset pulse ΦRST.

A drain terminal of the first amplifying transistor 105 is connected to the power supply voltage VDD. A gate terminal which is an input section of the first amplifying transistor 105 is connected to the source terminals of the transfer transistors 102a and 102b. One end of the current source 1106 is connected to a source terminal of the first amplifying transistor 105. The other end of the current source 1106 is grounded. As an example, the current source 1106 may be formed by a transistor in which a drain terminal is connected to the source terminal of the first amplifying transistor 105, a source terminal is grounded, and a gate terminal is connected to the vertical scanning circuit 3. One end of the clamp capacitor 107 is connected to the source terminal of the first amplifying transistor 105 and one end of the current source 1106.

A drain terminal of the sampling transistor 108a is connected to the other end of the clamp capacitor 107. A gate terminal of the sampling transistor 108a is connected to the vertical scanning circuit 3, and is supplied with a sampling pulse ΦSH1.

A drain terminal of the sampling transistor 108b is connected to the other end of the clamp capacitor 107. A gate terminal of the sampling transistor 108b is connected to the vertical scanning circuit 3, and is supplied with a sampling pulse ΦSH2.

A drain terminal of the analog memory reset transistor 109a is connected to the power supply voltage VDD. A source terminal of the analog memory reset transistor 109a is connected to a source terminal of the sampling transistor 108a. A gate terminal of the analog memory reset transistor 109a is connected to the vertical scanning circuit 3, and is supplied with a clamp & memory reset pulse ΦCL1.

A drain terminal of the analog memory reset transistor 109b is connected to the power supply voltage VDD. A source terminal of the analog memory reset transistor 109b is connected to a source terminal of the sampling transistor 108b. A gate terminal of the analog memory reset transistor 109b is connected to the vertical scanning circuit 3, and is supplied with a clamp & memory reset pulse ΦCL2.

One end of the analog memory 110a is connected to the source terminal of the sampling transistor 108a. The other end of the analog memory 110a is grounded. A drain terminal of the second amplifying transistor 111a is connected to the power supply voltage VDD. A gate terminal constituting an input section of the second amplifying transistor 111a is connected to the source terminal of the sampling transistor 108a. A drain terminal of the selection transistor 112a is connected to a source terminal of the second amplifying transistor 111a. A source terminal of the selection transistor 112a is connected to the vertical signal line 9. A gate terminal of the selection transistor 112a is connected to the vertical scanning circuit 3, and is supplied with a selection pulse ΦSEL1.

One end of the analog memory 110b is connected to the source terminal of the sampling transistor 108b. The other end of the analog memory 110b is grounded. A drain terminal of the second amplifying transistor 111b is connected to the power supply voltage VDD. A gate terminal constituting an input section of the second amplifying transistor 111b is connected to the source terminal of the sampling transistor 108b. A drain terminal of the selection transistor 112b is connected to a source terminal of the second amplifying transistor 111b. A source terminal of the selection transistor 112b is connected to the vertical signal line 9. A gate terminal of the selection transistor 112b is connected to the vertical scanning circuit 3, and is supplied with a selection pulse ΦSEL2. Each transistor mentioned above may have a reverse polarity, and the source terminal and the drain terminal thereof may be set to be reverse to the above.

The photoelectric conversion elements 101a and 101b generate (produce) signal charge based on incident light, and hold and accumulate the generated (produced) signal charge. The photoelectric conversion elements 101a and 101b are, for example, photodiodes. The transfer transistors 102a and 102b transfer signal charge accumulated in the photoelectric conversion elements 101a and 101b to the FD 103. ON/OFF of the transfer transistor 102a are controlled by the transfer pulse ΦTX1 from the vertical scanning circuit 3. ON/OFF of the transfer transistor 102b are controlled by the transfer pulse ΦTX2 from the vertical scanning circuit 3. The FD 103 is a capacitor that temporarily holds and accumulates the signal charge transferred from the photoelectric conversion elements 101a and 101b.

The FD reset transistor 104 is a transistor that resets the FD 103. ON/OFF of the FD reset transistor 104 are controlled by the FD reset pulse ΦRST from the vertical scanning circuit 3. It is also possible to reset the photoelectric conversion elements 101a and 101b by simultaneously turning on the FD reset transistor 104 and the transfer transistors 102a and 102b. The reset of the FD 103 and the photoelectric conversion elements 101a and 101b is an operation for controlling the amount of electric charge accumulated in the FD 103 and the photoelectric conversion elements 101a and 101b and setting the state (potential) of the FD 103 and the photoelectric conversion elements 101a and 101b to a reference state (reference potential, or reset level).

The clamp capacitor 107 is a capacitor that clamps (fixes) a voltage level of the amplified signal which is output from the first amplifying transistor 105. The sampling transistors 108a and 108b sample and hold a voltage level of the other end of the clamp capacitor 107, and accumulate the voltage level in the analog memories 110a and 110b. ON/OFF of the sampling transistor 108a are controlled by the sampling pulse ΦSH1 from the vertical scanning circuit 3. ON/OFF of the sampling transistor 108b are controlled by the sampling pulse ΦSH2 from the vertical scanning circuit 3.

The analog memory reset transistors 109a and 109b reset the analog memories 110a and 110b. ON/OFF of the analog memory reset transistors 109a and 109b are controlled by the clamp & memory reset pulses ΦCL1 and ΦCL2 from the vertical scanning circuit 3. The reset of the analog memories 110a and 110b is an operation for controlling the amount of electric charge accumulated in the analog memories 110a and 110b and setting the state (potential) of the analog memories 110a and 110b to a reference state (reference potential, or reset level). The analog memories 110a and 110b hold and accumulate an analog signal sampled and held by the sampling transistors 108a and 108b.

The capacitance of the analog memories 110a and 110b is set to be larger than the capacitance of the FD 103. A MIM (Metal Insulator Metal) capacitor or a MOS (Metal Oxide Semiconductor) capacitor which is a capacitor having a small leakage current (dark current) per unit area is more preferably used in the analog memories 110a and 110b. Thereby, resistance to noise is improved, and a high-quality signal is obtained.

The second amplifying transistors 111a and 111b output an amplified signal, obtained by amplifying a signal based on the signal charge accumulated in the analog memories 110a and 110b which is input to the gate terminal, from the source terminal. The second amplifying transistors 111a and 111b and a current source 4113, connected to the vertical signal line 9, which serves as a load constitute a source-follower circuit. The selection transistors 112a and 112b are transistors that select the pixel 1 and transmit outputs of the second amplifying transistors 111a and 111b to the vertical signal line 9. ON/OFF of the selection transistor 112a are controlled by the selection pulse ΦSEL1 from the vertical scanning circuit 3. ON/OFF of the selection transistor 112b are controlled by the selection pulse ΦSEL2 from the vertical scanning circuit 3.

Among the circuit elements shown in FIG. 13, the photoelectric conversion elements 101a and 101b are disposed in the first substrate 20. The analog memories 110a and 110b are disposed in the second substrate 21. Other circuit elements are disposed in any of the first substrate 20 and the second substrate 21. The broken line D1 shown in FIG. 13 represents a boundary line between the first substrate 20 and the second substrate 21.

The photoelectric conversion elements 101a and 101b, the transfer transistors 102a and 102b, the FD 103, the FD reset transistor 104, and the first amplifying transistor 105 are disposed in the first substrate 20. The current source 1106, the clamp capacitor 107, the sampling transistors 108a and 108b, the analog memory reset transistors 109a and 109b, the analog memories 110a and 110b, the second amplifying transistors 111a and 111b, and the selection transistors 112a and 112b are disposed in the second substrate 21.

The amplified signal which is output from the first amplifying transistor 105 of the first substrate 20 is output to the second substrate 21 through the micro-pad 22, the micro-bump 24, and the micro-pad 23. In addition, the power supply voltage VDD is transferred between the first substrate 20 and the second substrate 21 through the micro-pad 25, the micro-bump 27, and the micro-pad 26.

In FIG. 13, the connection portion including the micro-pad 22, the micro-bump 24, and the micro-pad 23 is disposed in a path between the source terminal of the first amplifying transistor 105, and one end of the current source 1106 and one end of the clamp capacitor 107, but the embodiment of the present invention is not limited thereto. The connection portion may be disposed for each path electrically connected from the photoelectric conversion elements 101a and 101b to the analog memories 110a and 110b.

Figure 14:
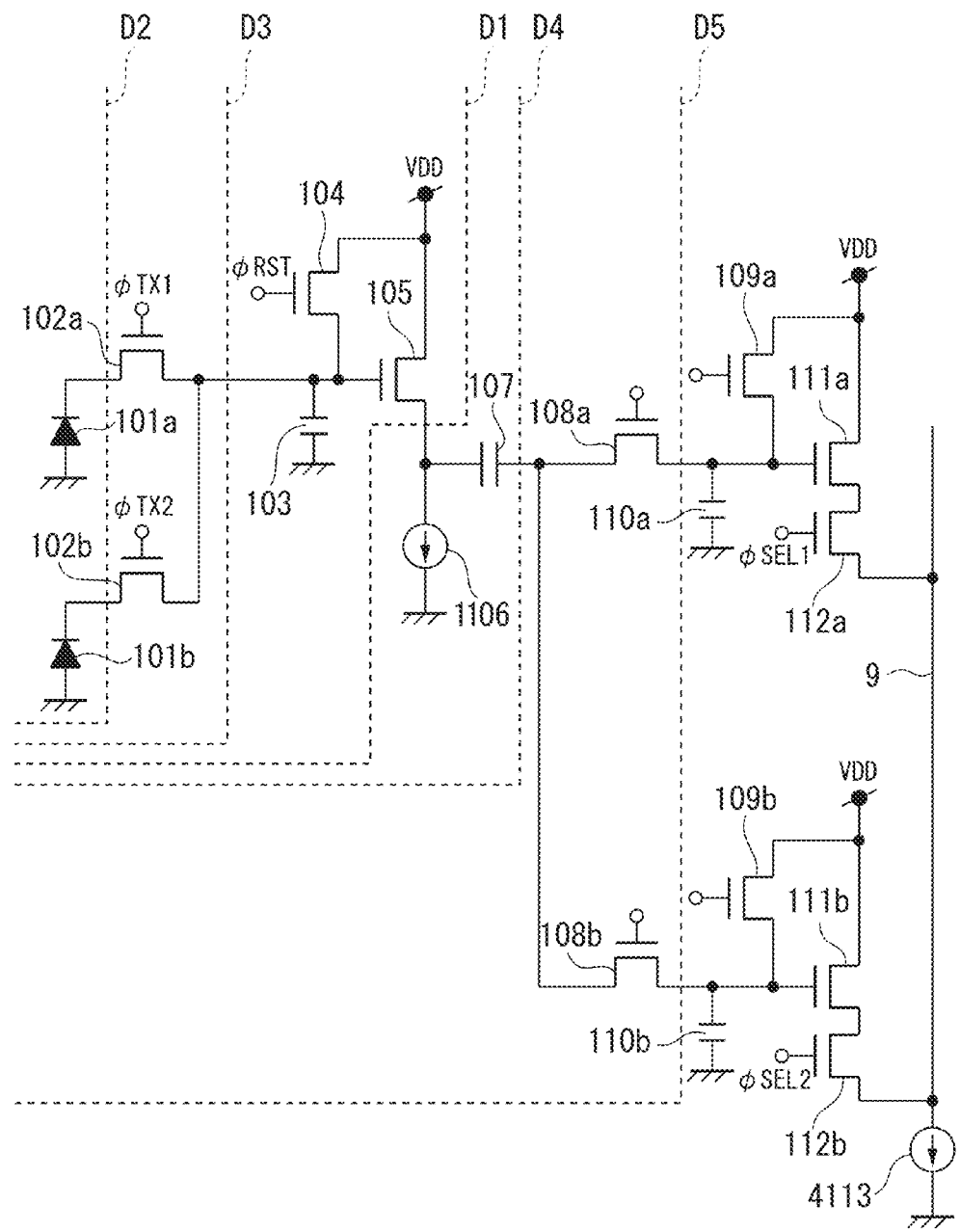
FIG. 14 is a circuit diagram illustrating a circuit configuration of the pixel in the imaging device according to the fourth embodiment of the present invention.

FIG. 14 shows an example of boundary lines between the first substrate 20 and the second substrate 21. The broken lines D1 to D5 show an example in which these lines can be used as the boundary lines between the first substrate 20 and the second substrate 21. The boundary lines between the first substrate 20 and the second substrate 21 may be any of the broken lines D1 to D5, and may be lines other than the above. The broken line D1 is as described above. In the example shown by the broken line D2, the connection portion is disposed in a path between the other ends of the photoelectric conversion elements 101a and 101b and the drain terminals of the transfer transistors 102a and 102b. In the example shown by the broken line D3, the connection portion is disposed in a path between the source terminals of the transfer transistors 102a and 102b, and one end of the FD 103, the source terminal of the FD reset transistor 104, and a gate terminal of the first amplifying transistor 105.

In the example shown by the broken line D4, the connection portion is disposed in a path between the other end of the clamp capacitor 107 and the drain terminals of the sampling transistors 108a and 108b. In the example shown by the broken line D5, the connection portion is disposed in a path between the source terminals of the sampling transistors 108a and 108b, and the source terminals of the analog memory reset transistors 109a and 109b, one set of ends of the analog memories 110a and 110b, and the gate terminals of the second amplifying transistors 111a and 111b.

Figure 15A:
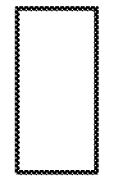
FIG. 15A is a reference diagram illustrating a state where the pixels in the imaging device according to the fourth embodiment of the present invention are classified into a plurality of groups.
Figure 15B:
FIG. 15B is a reference diagram illustrating a state where the pixels in the imaging device according to the fourth embodiment of the present invention are classified into a plurality of groups.

All the pixels 1 having the above-mentioned configuration are classified into a plurality of groups, and each of the pixels 1 belongs to any of the plurality of groups. FIGS. 15A and 15B show a state where sixty-four pixels 1 of 8 rows×8 columns are classified into a plurality of groups as an example. In FIGS. 15A and 15B, each of the pixels 1 is given the number Pnm (n: 1 to 8 and m: 1 to 8) for the sake of convenience. The numeral n of the number Pnm represents the row number, and the numeral m represents the column number.

The pixels 1 are classified into a plurality of groups in accordance with the pixel position. FIG. 15A shows an example in which 1 group is formed by two pixels. Two pixels adjacent to the vertical direction form 1 group.

FIG. 15B shows an example in which 1 group is formed by four pixels. Four pixels which are continuously disposed in the vertical direction form 1 group. Since the driving control of the pixel 1 is performed for each row, a plurality of pixels lined up in the vertical direction form 1 group. Since one photoelectric conversion element corresponds to one pixel 1, a group to which the pixel 1 belongs and a group to which the photoelectric conversion element belongs are equivalent to each other.

A plurality of photoelectric conversion elements (two in the example of FIG. 15A, and four in the example of FIG. 15B) of the pixels 1 within the same group share the FD 103, the FD reset transistor 104, the first amplifying transistor 105, the current source 1106, and the clamp capacitor 107.

Next, operations of the pixel 1 will be described with reference to FIGS. 16 and 17. Hereinafter, two operation examples will be described.

First Operation Example

Figure 17:
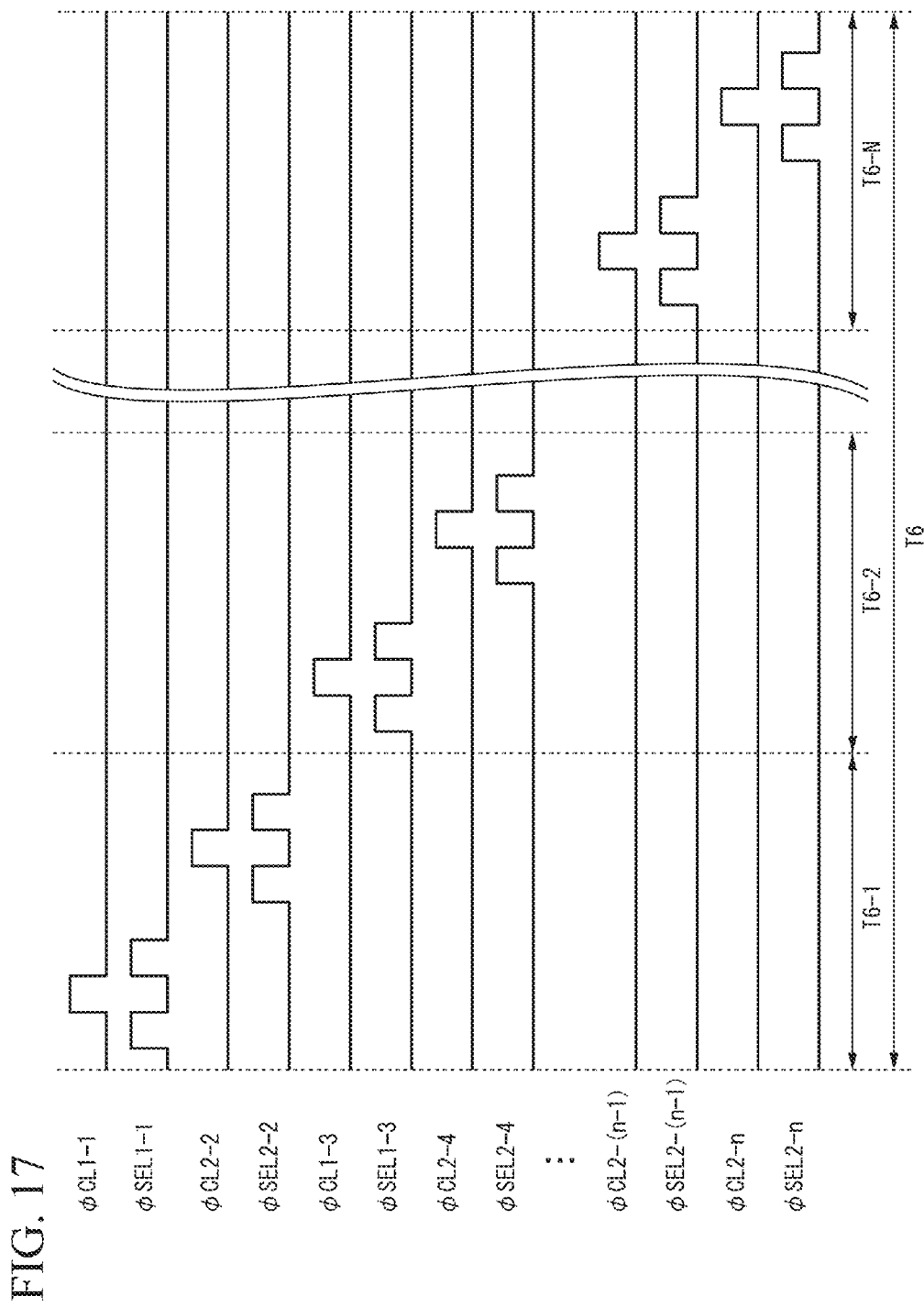
FIG. 17 is a timing diagram illustrating operations of the pixel in the imaging device according to the fourth embodiment of the present invention.

FIG. 17 shows control signals which are supplied from the vertical scanning circuit 3 to the pixels 1 for each row. Hereinafter, operations of the pixels 1 in periods T1 to T6 shown in FIG. 16 will be described in units of two pixels shown in FIG. 13. One pixel 1 out of two pixels 1 belonging to the same group is set to a first pixel, and the other pixel 1 is set to a second pixel. In the plurality of groups mentioned above, the start timings (start timings in the period T1 of FIG. 16) of operations are the same as each other.

[Operation in Period T1]

First, the transfer pulses ΦTX1 and ΦTX2 are changed from an "L" (Low) level to an "H" (High) level, so that the transfer transistors 102a and 102b are turned on. Simultaneously, the FD reset pulse ΦRST is changed from an "L" level to an "H" level, so that the FD reset transistor 104 is turned on. Since the period T1 is a common period in all the pixels 1 (hereinafter, referred to as all the pixels), the photoelectric conversion elements 101a and 101b of all the pixels are reset.

Subsequently, the transfer pulses ΦTX1 and ΦTX2 and the FD reset pulse ΦRST are changed from an "H" level to an "L" level, so that the transfer transistors 102a and 102b and the FD reset transistor 104 are turned off. Thereby, the reset of the photoelectric conversion elements 101a and 101b of all the pixels is terminated, and the exposure (accumulation of signal charge) of all the pixels is collectively (simultaneously) started.

[Operation in Period T2]

The period T2 is a period within the exposure period. First, the clamp & memory reset pulse ΦCL1 is changed from an "L" level to an "H" level, so that the analog memory reset transistor 109a is turned on. Thereby, the analog memory 110a is reset. Simultaneously, the sampling pulse ΦSH1 is changed from an "L" level to an "H" level, so that the sampling transistor 108a is turned on. Thereby, the potential of the other end of the clamp capacitor 107 is reset to the power supply voltage VDD, and the sampling transistor 108a starts sample and hold of the potential of the other end of the clamp capacitor 107.

Subsequently, the FD reset pulse ΦRST is changed from an "L" level to an "H" level, so that the FD reset transistor 104 is turned on. Thereby, the FD 103 is reset. Subsequently, the FD reset pulse ΦRST is changed from an "H" level to an "L" level, so that the FD reset transistor 104 is turned off. Thereby, the reset of the FDs 103 is terminated. The reset of the FD 103 may be performed at the timing during the exposure period, but the reset of the FD 103 is performed at the timing immediately before the termination of the exposure period, thereby allowing noise due to a leakage current of the FD 103 to be further reduced.

Subsequently, the clamp & memory reset pulse ΦCL1 is changed from an "H" level to an "L" level, so that the analog memory reset transistor 109a is turned off. Thereby, the reset of the analog memory 110a is terminated. At this point in time, the clamp capacitor 107 clamps an amplified signal (amplified signal after the reset of the FD 103) which is output from the first amplifying transistor 105.

[Operation in Period T3]

First, the transfer pulse ΦTX1 is changed from an "L" level to an "H" level, so that the transfer transistor 102a is turned on. Thereby, the signal charge accumulated in the photoelectric conversion element 101a is transferred to the FD 103 through the transfer transistor 102a, and is accumulated in the FD 103. Thereby, the exposure (accumulation of signal charge) of the first pixel is terminated. The exposure period 1 of FIG. 16 indicates an exposure period (signal accumulation period) of the first pixel. Subsequently, the transfer pulse ΦTX1 is changed from an "H" level to an "L" level, so that the transfer transistor 102a is turned off.

Subsequently, the sampling pulse ΦSH1 is changed from an "H" level to an "L" level, so that the sampling transistor 108a is turned off. Thereby, the sampling transistor 108a terminates the sample-and-hold of the potential of the other end of the clamp capacitor 107.

[Operation in Periods T4 and T5]

The operations in the periods T2 and T3 mentioned above are operations of the first pixel. Operations in the periods T4 and T5 correspond to the operations in the periods T2 and T3, and are operations of the second pixel. The operation in the period T4 is the same as the operation in the period T2, and the operation in the period T5 is the same as the operation in the period T3. For this reason, a description of the operations in the periods T4 and T5 will be omitted. The exposure period 2 of FIG. 16 shows an exposure period (signal accumulation period) of the second pixel.

Hereinafter, a change in the potential of one end of the analog memory 110a of the first pixel will be described. A change in the potential of one end of the analog memory 110b of the second pixel is similar to the first pixel.

When a change in the potential of one end of the FD 103 by transferring the signal charge from the photoelectric conversion element 101a to the FD 103 after the reset of the FD 103 is terminated is set to $\Delta Vfd$, and a gain of the first amplifying transistor 105 is set to a1, a change $\Delta Vamp1$ of the potential of the source terminal of the first amplifying transistor 105 by transferring the signal charge from the photoelectric conversion element 101a to the FD 103 is equal to $\alpha 1 \times \Delta Vfd$.

When the sum of gains of the analog memory 110a and the sampling transistor 108a is set to $\alpha 2$, a change $\Delta Vmem$ in the potential of one end of the analog memory 110a by the sample-and-hold of the sampling transistor 108a after the signal charge is transferred from the photoelectric conversion element 101a to the FD 103 is equal to $\alpha 2 \times \Delta Vamp1$, that is, $\alpha 1 \times \alpha 2 \times \Delta Vfd$. Here, $\Delta Vfd$ is the amount of change in the potential of one end of the FD 103 due to the transfer of the signal charge, and does not include reset noise generated by resetting the FD 103. Therefore, the sampling transistor 108a performs the sample-and-hold, thereby allowing the influence of noise generated in the photoelectric conversion element 101a to be reduced. The potential of one end of the analog memory 110a at the point in time when the reset of the analog memory 110a is terminated is equal to the power supply voltage VDD. Thus, after the signal charge is transferred from the photoelectric conversion element 101a to the FD 103, a potential Vmem of one end of the analog memory 110a sampled and held by the sampling transistor 108a is expressed as Expression (1) described in the first embodiment.

In addition, $\alpha 2$ is expressed as Expression (2) described in the first embodiment. In Expression (2), CL is a capacitance value of the clamp capacitor 107, and CSH is a capacitance value of the analog memory 110a. Since a decrease in the gain is made smaller, it is more preferable that the capacitance value CL of the clamp capacitor 107 be larger than the capacitance value CSH of the analog memory 110a.

[Operation in Period T6]

In the period T6, a signal based on the signal charge accumulated in the analog memories 110a and 110b is sequentially read for each row. First, the reading of a signal from the first pixel is performed. The selection pulse ΦSEL1 is changed from an "L" level to an "H" level, so that the selection transistor 112a is turned on. Thereby, a signal based on the potential Vmem shown by Expression (1) is output to the vertical signal line 9 through the selection transistor 112a. Subsequently, the selection pulse ΦSEL1 is changed from an "H" level to an "L" level, so that the selection transistor 112a is turned off.

Subsequently, the clamp & memory reset pulse ΦCL1 is changed from an "L" level to an "H" level, so that the analog memory reset transistor 109a is turned on. Thereby, the analog memory 110a is reset. Subsequently, the clamp & memory reset pulse ΦCL1 is changed from an "H" level to an "L" level, so that the analog memory reset transistor 109a is turned off.

Subsequently, the selection pulse ΦSEL1 is changed from an "L" level to an "H" level, so that the selection transistor 112a is turned on. Thereby, a signal based on the potential of one end of the analog memory 110a after the analog memory 110a is reset is output to the vertical signal line 9 through the selection transistor 112a. Subsequently, the selection pulse ΦSEL1 is changed from an "H" level to an "L" level, so that the selection transistor 112a is turned off.

The column processing circuit 4 generates a differential signal obtained by taking the difference between the signal based on the potential Vmem shown in Expression (1) and the signal based on the potential of one end of the analog memory 110a when the analog memory 110a is reset. This differential signal is a signal based on the difference between the potential Vmem shown in Expression (1) and the power supply voltage VDD, and is a signal based on the difference $\Delta Vfd$ between the potential of one end of the FD 103 immediately after the signal charge accumulated in the photoelectric conversion element 101a is transferred to the FD 103 and the potential of the FD 103 immediately after one end of the FD 103 is reset. Therefore, it is possible to obtain signal components based on the signal charge accumulated in the photoelectric conversion element 101a in which noise components due to the reset of the analog memory 110a and noise components due to the reset of the FD 103 are suppressed.

A signal which is output from the column processing circuit 4 is output to the horizontal signal line 10 by the horizontal reading circuit 5. The output amplifier 6 processes a signal which is output to the horizontal signal line 10, and outputs the signal as a pixel signal from the output terminal 11. In this way, the reading of a signal from the first pixel is terminated.

Subsequently, the reading of a signal from the second pixel is performed. The reading of a signal from the second pixel is the same as the reading of a signal from the first pixel, and thus a description of the reading of a signal from the second pixel will be omitted.

The period in which a signal is read from the pixel 1 in the period T6 is different for each row. FIG. 17 shows an operation of each of the pixels 1 in the period T6. In FIG. 17, the clamp & memory reset pulse $\Phi CL1$ of the pixels 1 in an odd row (i row) which are the first pixel is set to $\Phi CL1$-$i$, and the selection pulse $\Phi SEL1$ thereof is set to $\Phi SEL1$-$i$. In addition, in FIG. 17, the clamp & memory reset pulse $\Phi CL2$ of the pixels 1 in an even row (j row) which are the second pixel is set to $\Phi CL2$-$j$, and the selection pulse $\Phi SEL2$ thereof is set to $\Phi SEL2$-$j$. In addition, in FIG. 17, the row number n is even.

The period T6 is constituted by periods T6-1, T6-2, . . . , T6-$n$. In the period T6-1, a signal is read from the pixels 1 in the first row and the second row. The operation of the pixels 1 in the period T6-1 is the same as the operation of the pixels 1 in the period T6 of FIG. 16. In the period T6-2, a signal is read from the pixels 1 in the third row and the fourth row. The operation of the pixels 1 in the period T6-2 is also the same as the operation of the pixels 1 in the period T6 of FIG. 16. A similar operation is also performed for each row with respect to the pixels 1 after the fourth row. In the period T6-N, a signal is read from the pixels 1 in the final row (n-th row). The operation of the pixels 1 in the period T6-N is also the same as the operation of the pixels 1 in the period T6 of FIG. 16. Signals are read from all the pixels through the above-mentioned operations.

In the above-mentioned operations, the signal charge transferred from the photoelectric conversion elements 101a and 101b to the FD 103 has to be held by the FD 103 until the reading timing of each of the pixels 1. When noise is generated during the period in which the FD 103 holds the signal charge, noise is superimposed on the signal charge held by the FD 103, and thus the signal quality (S/N) is deteriorated.

A main factor of the noise generated during the period in which the FD 103 holds the signal charge (hereinafter, referred to as the holding period) is charge due to a leakage current of the FD 103 (hereinafter, referred to as the leakage charge) and charge caused by light which is incident on portions other than the photoelectric conversion elements 101a and 101b (hereinafter, referred to as the photoelectric charge). When the leakage charge and the photoelectric charge which are generated in a unit time are set to qid and qpn, respectively, and the length of the holding period is set to tc, noise charge Qn generated during the holding period is equal to (qid+qpn)tc.

The capacitance of the FD 103 is set to Cfd, the capacitance of the analog memories 110a and 110b is set to Cmem, and the ratio of Cfd to Cmem (Cmem/Cfd) is set to A. In addition, as mentioned above, the gain of the first amplifying transistor 105 is set to a1, and the sum of the gains of the analog memories 110a and 110b and the sampling transistors 108a and 108b is set to $\alpha 2$. When the signal charge generated in the photoelectric conversion elements 101a and 101b during the exposure period is set to Qph, the signal charge held by the analog memories 110a and 110b after the termination of the exposure period is equal to $A \times \alpha 1 \times \alpha 2 \times Qph$.

The signal based on the signal charge transferred from the photoelectric conversion elements 101a and 101b to the FD 103 is sampled and held by the sampling transistors 108a and 108b in the period T3 or the period T5, and is stored in the analog memories 110a and 110b. Therefore, the time until the signal charge is stored in the analog memories 110a and 110b while the signal charge is transferred to the FD 103 is shortened, and thus noise generated in the FD 103 can be ignored. When the noise generated in the period in which the analog memories 110a and 110b hold the signal charge is assumed to be Qn as stated above, the S/N is equal to $A \times \alpha 1 \times \alpha 2 \times Qph/Qn$.

On the other hand, as the related art disclosed in Japanese Unexamined Patent Application, First Publication No. 2010-219339, the S/N in the case where the signal charge held by the accumulation capacitance section is read from the pixel through the amplifying transistor is equal to Qph/Qn. Therefore, the S/N of the present embodiment is equal to $A \times \alpha 1 \times \alpha 2$ times the S/N of the related art. The capacitance value of the analog memories 110a and 110b is set so that $A \times \alpha 1 \times \alpha 2$ becomes larger than 1 (for example, the capacitance value of the analog memories 110a and 110b is set to be sufficiently larger than the capacitance value of the FD 103), thereby allowing the deterioration of the signal quality to be reduced.

In the first operation example mentioned above, the start timings of the exposure in all the pixels are the same as each other, but the termination timings of the exposure of the pixels 1 within the same group are different from each other, as shown in the exposure periods 1 and 2 of FIG. 16. However, the difference between the exposure periods is minor.

Second Operation Example

Figure 18:
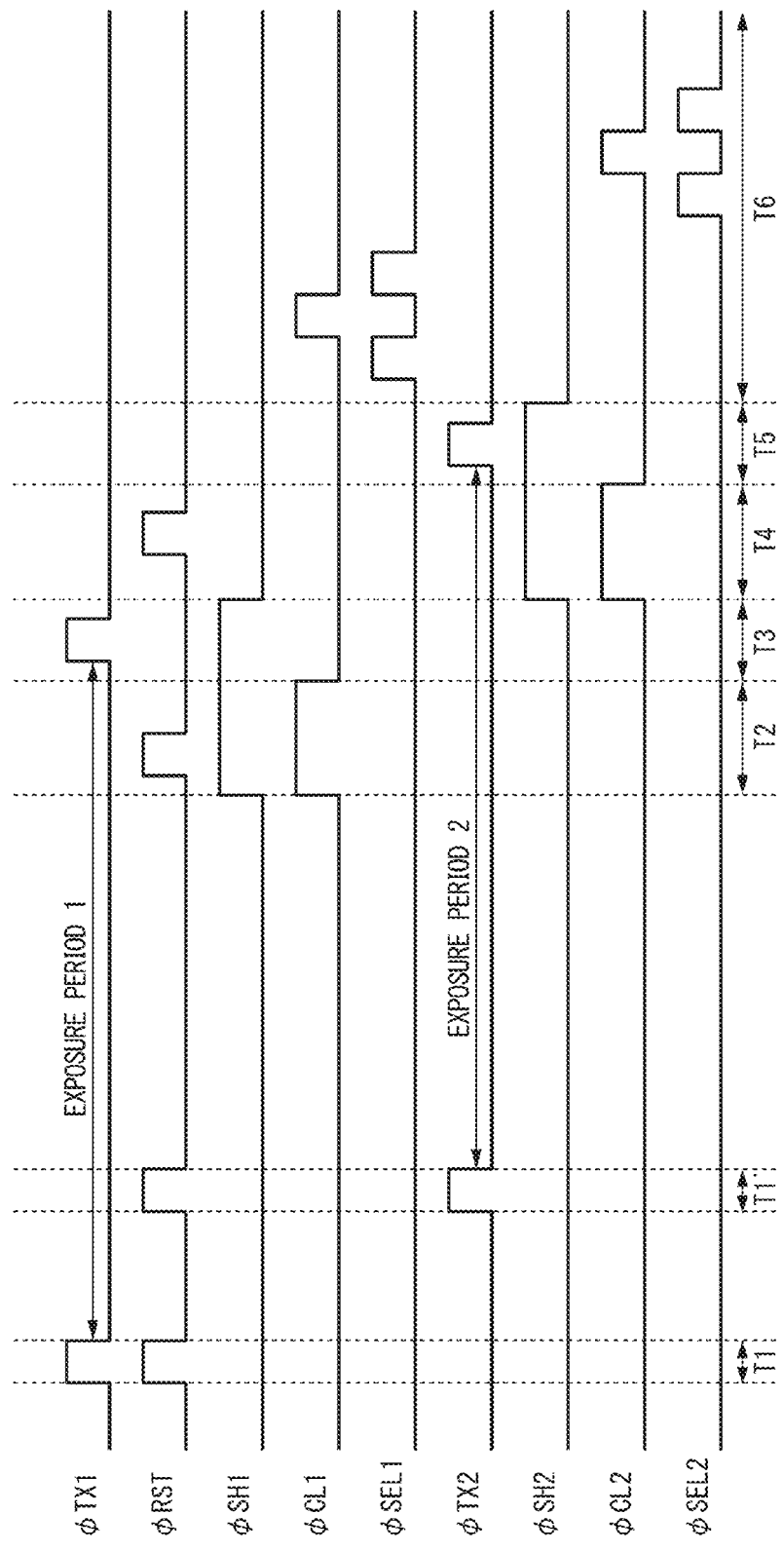
FIG. 18 is a timing diagram illustrating operations of the pixel in the imaging device according to the fourth embodiment of the present invention.

FIG. 18 shows control signals which are supplied from the vertical scanning circuit 3 to the pixels 1 for each row. Hereinafter, operations of the pixels 1 in periods T1 to T6 shown in FIG. 18 will be described in units of two pixels shown in FIG. 13. One pixel 1 out of two pixels 1 belonging to the same group is set to a first pixel, and the other pixel 1 is set to a second pixel. In a plurality of groups, the start timings of operations (start timings in the period T1 of FIG. 18) are the same as each other. Hereinafter, only portions different from those of the first operation example will be described.

The operations shown in FIG. 16 are different from the operations in the periods T1 and T1'. In the period T1, the reset of the photoelectric conversion element 101a is performed only on the first pixel. In addition, in the period T1', the reset of the photoelectric conversion element 101b is performed only on the second pixel. The exposure period 1 of FIG. 18 indicates an exposure period (signal accumulation period) of the first pixel. The exposure period 2 of FIG. 18 indicates an exposure period (signal accumulation period) of the second pixel.

The start timing of the period T1' is set so that the lengths of the exposure period 1 and the exposure period 2 are the same as each other. Thereby, in the second operation example, the lengths of the exposure periods of all the pixels are the same as each other, and thus a higher-quality signal can be obtained. In addition, in the second operation example, the deterioration of the signal quality can also be reduced similarly to the first operation example.

As mentioned above, according to the present embodiment, circuit elements constituting a pixel are disposed in each of two substrates, and an amplified signal which is output from the amplifier circuit (first amplifying transistor 105) is accumulated in the signal accumulation circuit (analog memories 110a and 110b) without digitization thereof, thereby allowing an increase in the chip area to be suppressed (multi-pixel formation can also be easily made). Further, it is possible to reduce the deterioration of the signal quality by providing the signal accumulation circuit (analog memories 110a and 110b).

In addition, since some circuit elements are shared between a plurality of pixels, it is possible to reduce the chip area as compared with the case where circuit elements are not shared between a plurality of pixels. Further, since the first amplifying transistor 105 and the current source 1106 are shared between a plurality of pixels, it is possible to suppress the number of current sources which are simultaneously operated. For this reason, it is possible to reduce occurrence such as a voltage drop in a power supply voltage or a rise in a GND (ground) voltage due to the simultaneous operations of a large number of current sources.

In the first operation example shown in FIG. 16, although there is a minor difference in the lengths of the exposure periods between the pixels within the same group, the photoelectric conversion elements 101a and 101b of all the pixels start the exposure (accumulation of signal charge) collectively, thereby allowing the distortion of a subject within an image to be reduced. In addition, in the second operation example shown in FIG. 18, since the lengths of the exposure periods between the pixels within the same group are the same as each other, a higher-quality signal can be obtained.

In addition, the area of the photoelectric conversion element of the first substrate can be increased as compared with the case where all the circuit elements of a pixel are disposed in one substrate. For this reason, sensitivity is improved. Further, the analog memory is used, thereby allowing the area of a region for signal accumulation provided in the second substrate to be reduced.

In addition, the capacitance value of the analog memories 110a and 110b is set to larger than the capacitance value of the FD 103 (for example, the capacitance value of the analog memories 110a and 110b is set to be five times or more the capacitance value of the FD 103), and thus the signal charge held by the analog memories 110a and 110b becomes larger than the signal charge held by the FD 103. For this reason, it is possible to reduce the influence of signal deterioration due to the leakage current of the analog memories 110a and 110b.

In addition, it is possible to reduce noise generated in the first substrate 20 by providing the clamp capacitor 107 and the sampling transistors 108a and 108b. The noise generated in the first substrate 20 includes noise (for example, reset noise) generated in the input section of the first amplifying transistor 105 resulting from an operation of the circuit (for example, FD reset transistor 104) connected to the first amplifying transistor 105, noise resulting from the operating characteristics of the first amplifying transistor 105 (for example, noise due to the variation of a circuit threshold of the first amplifying transistor 105), and the like.

In addition, a signal when the analog memories 110a and 110b are reset and a signal corresponding to a fluctuation in the output of the first amplifying transistor 105 which is generated by transferring the signal charge from the photoelectric conversion elements 101a and 101b to the FD 103 are output from the pixel 1 in a time-division manner, and differential processing of each signal is performed in the outside of the pixel 1, thereby allowing noise generated in the second substrate 21 to be reduced. The noise generated in the second substrate 21 includes noise (for example, reset noise) generated in the input sections of the second amplifying transistors 111a and 111b resulting from an operation of the circuit (for example, analog memory reset transistors 109a and 109b) connected to the second amplifying transistors 111a and 111b, and the like.

Fifth Embodiment

Next, a fifth embodiment of the present invention will be described. A configuration of the present embodiment is the same as the configuration of the first to forth embodiments, and thus a description of the configuration will be omitted. Hereinafter, operations of the pixel 1 will be described with reference to FIGS. 19 to 21. Hereinafter, two operation examples will be described.

First Operation Example

Figure 19:
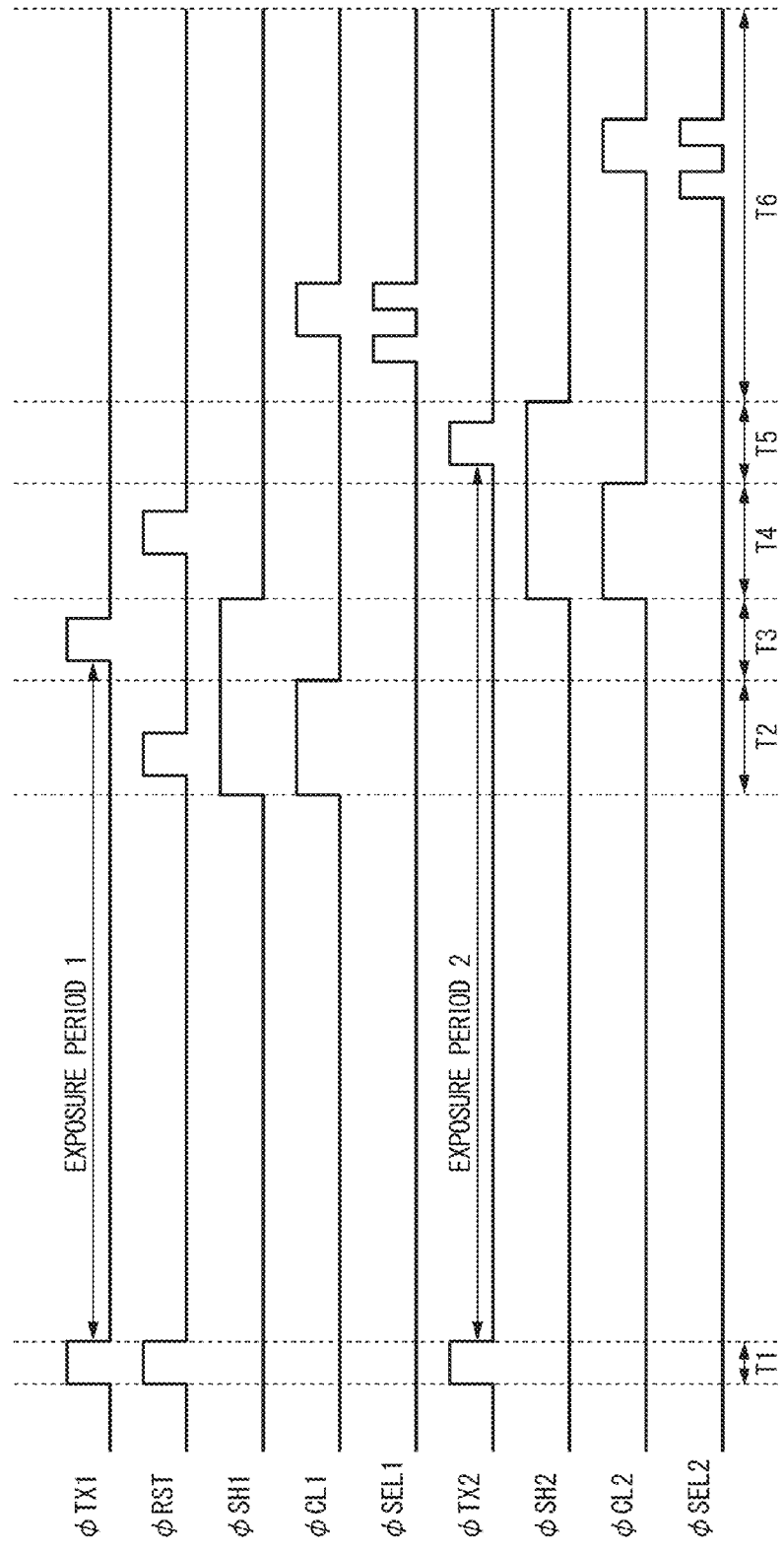
FIG. 19 is a timing diagram illustrating operations of a pixel in an imaging device according to a fifth embodiment of the present invention.

FIG. 19 shows control signals which are supplied from the vertical scanning circuit 3 to the pixels 1 for each row. Hereinafter, operations of the pixel 1 in periods T1 to T6 shown in FIG. 19 will be described in units of two pixels shown in FIG. 13.

One pixel 1 out of two pixels 1 belonging to the same group is set to a first pixel, and the other pixel 1 is set to a second pixel. In a plurality of groups, the start timing of operations (start timings in the period T1 of FIG. 19) are the same as each other.

The difference from FIG. 16 is driving timings of the clamp & memory reset pulses ΦCL1 and ΦCL2 in the period T6. Hereinafter, only an operation in the period T6 will be described.

In the period T6, a signal based on the signal charge accumulated in the analog memories 110a and 110b is sequentially read for each row. First, the reading of a signal is from the first pixel is performed. The selection pulse ΦSEL1 is changed from an "L" level to an "H" level, so that the selection transistor 112a is turned on. Thereby, a signal based on the potential Vmem shown in Expression (1) is output to the vertical signal line 9 through the selection transistor 112a. Subsequently, the selection pulse ΦSEL1 is changed from an "H" level to an "L" level, so that the selection transistor 112a is turned off.

Subsequently, the clamp & memory reset pulse ΦCL1 is changed from an "L" level to an "H" level, so that the analog memory reset transistor 109a is turned on. Thereby, the analog memory 110a is reset.

The selection pulse ΦSEL1 is changed from an "L" level to an "H" level in the state where the analog memory 110a is reset, so that the selection transistor 112a is turned on. Thereby, a signal based on the potential of one end of the analog memory 110a when the analog memory 110a is reset is output to the vertical signal line 9 through the selection transistor 112a. Subsequently, the selection pulse ΦSEL1 is changed from an "H" level to an "L" level, so that the selection transistor 112a is turned off.

Subsequently, the clamp & memory reset pulse ΦCL1 is changed from an "H" level to an "L" level, so that the analog memory reset transistor 109a is turned off.

Figure 20:
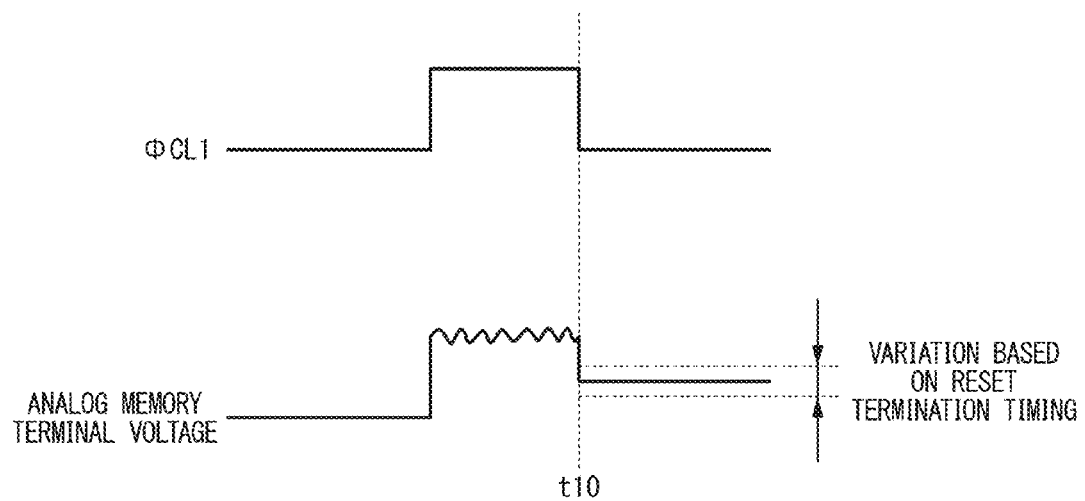
FIG. 20 is a timing diagram illustrating a noise reduction effect according to the sixth embodiment of the present invention.

FIG. 20 shows the clamp & memory reset pulse ΦCL1 in the period T6 and the potential (analog memory terminal voltage) of one end of the analog memory 110a. The clamp & memory reset pulse ΦCL1 is changed to an "H" level, and reset noise is superimposed on the potential of one end of the analog memory 110a while the analog memory 110a is reset by the analog memory reset transistor 109a. When the clamp & memory reset pulse ΦCL1 is changed to an "L" level, and the reset of the analog memory 110a is terminated, the potential of one end of the analog memory 110a is changed due to the influence of parasitic capacitance or the like.

The potential of one end of the analog memory 110a is changed with reference to the potential at the time (time t10 in FIG. 20) of the reset termination of the analog memory 110a. The potential of one end of the analog memory 110a during the reset fluctuates due to reset noise. Thus, the potential of one end of the analog memory 110a after the reset termination varies in accordance with the reset timing of the analog memory 110a. When a signal based on the potential of one end of the analog memory 110a after the reset termination is output to the vertical signal line 9 as in the operations of FIG. 16, a signal including components based on the above-mentioned variation is output to the vertical signal line 9.

On the other hand, in the operations of FIG. 19, a signal based on the potential of one end of the analog memory 110a during the reset is output to the vertical signal line 9. The potential of one end of the analog memory 110a during the reset fluctuates due to reset noise. However, since the second amplifying transistor 111a has also a function as a so-called low-pass filter in addition to the amplification function, the variation in the signal based on the potential of one end of the analog memory 110a during the reset is limited by the band of the second amplifying transistor 111a. For this reason, noise in the signal can be further reduced as compared with the operations of FIG. 16.

Subsequently, the reading of a signal from the second pixel is performed. The reading of a signal from the second pixel is the same as the reading of a signal from the first pixel, and thus a description of the reading of a signal from the second pixel will be omitted.

Second Operation Example

Figure 21:
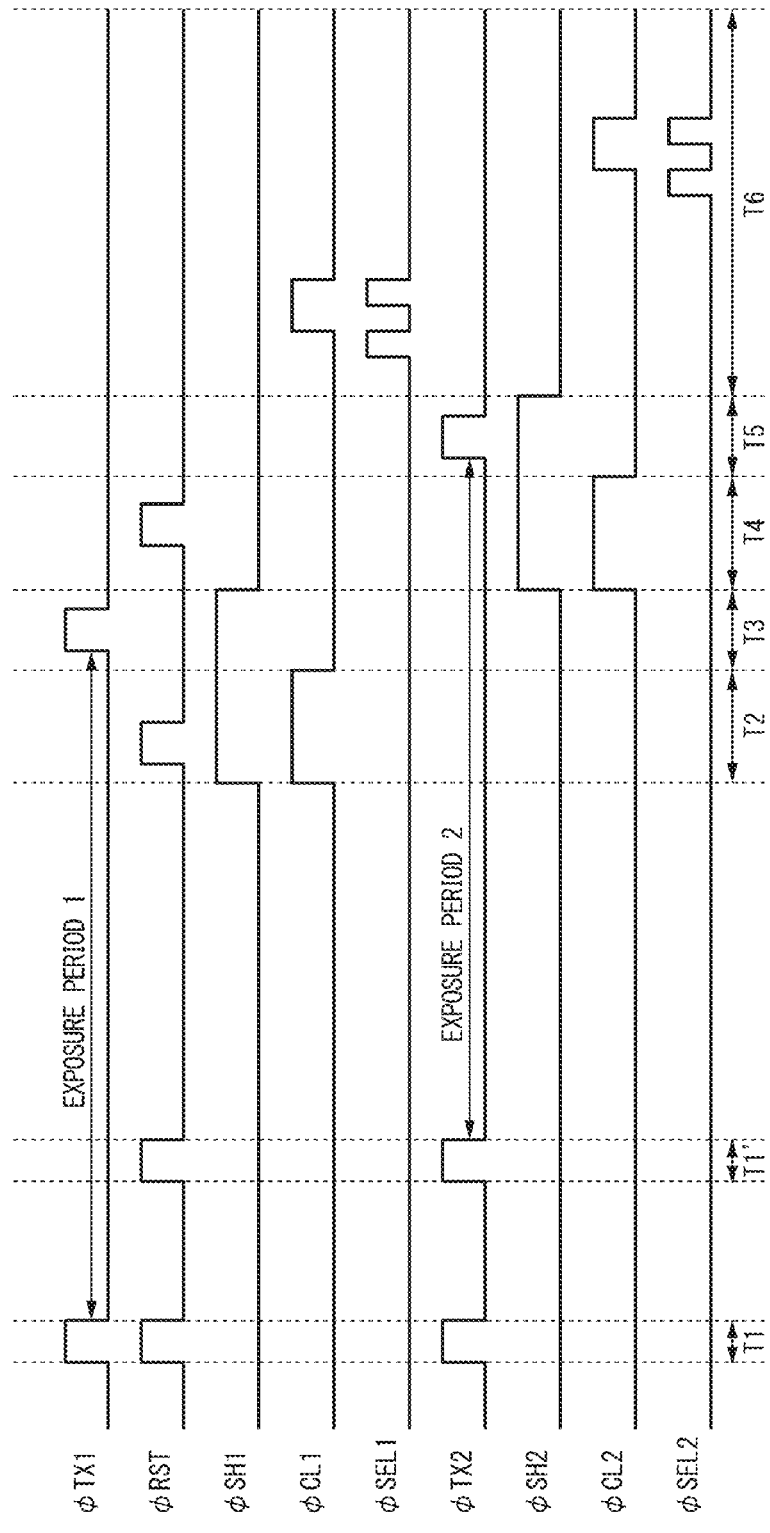
FIG. 21 is a timing diagram illustrating operations of the pixel in the imaging device according to the sixth embodiment of the present invention.

FIG. 21 shows control signals which are supplied from the vertical scanning circuit 3 to the pixels 1 for each row. The difference from FIG. 18 is driving timings of the clamp & memory reset pulses ΦCL1 and ΦCL2 in the period T6. An operation in this period T6 is the same as the operation in the period T6 of FIG. 19. Therefore, in the operations of FIG. 21, noise in the signal is capable of being further reduced as compared with the operations of FIG. 18.

Sixth Embodiment

Figure 22:
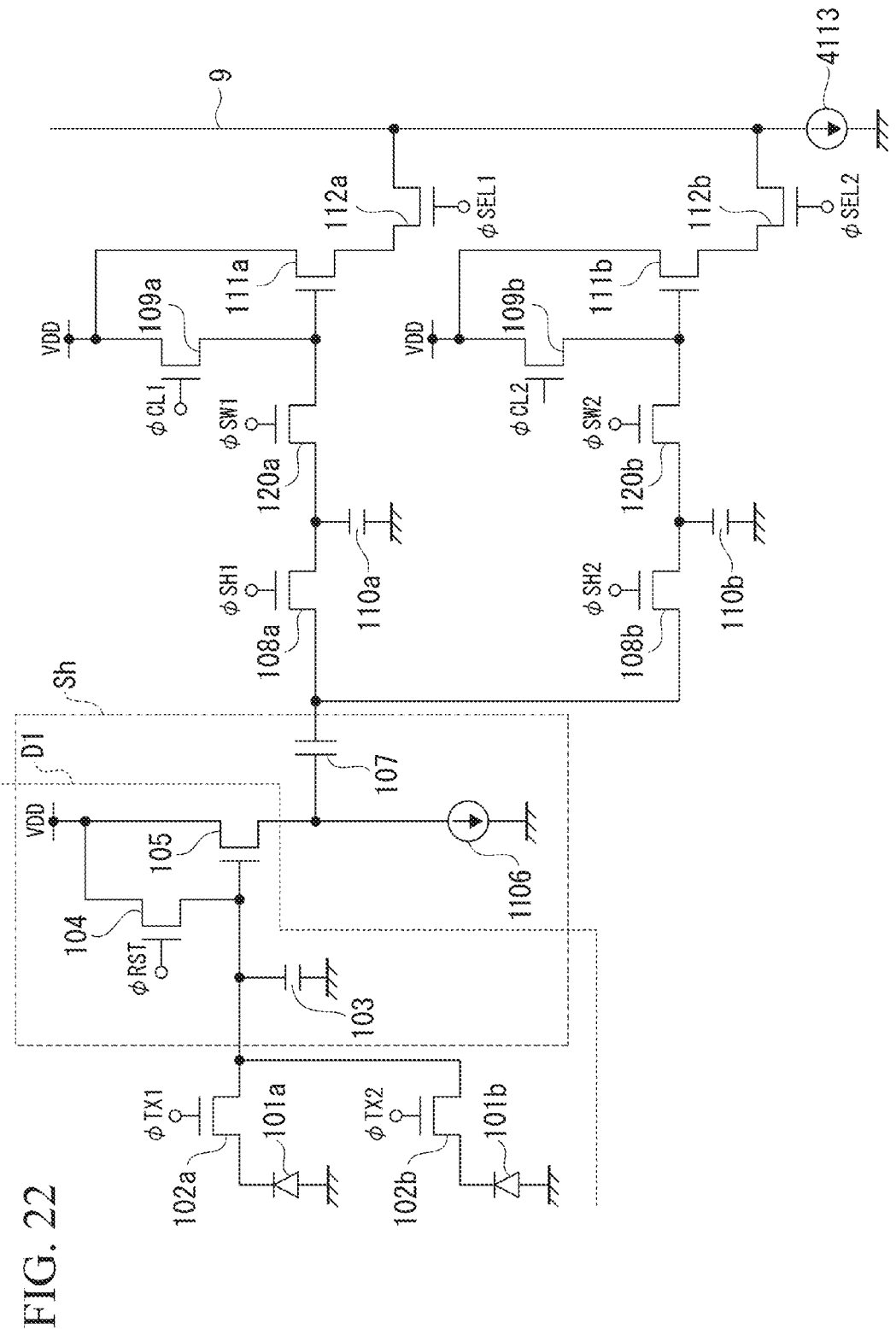
FIG. 22 is a circuit diagram illustrating a circuit configuration of a pixel in an imaging device according to a sixth embodiment of the present invention.

Next, a sixth embodiment of the present invention will be described. A configuration of the present embodiment is the same as the configuration of the forth embodiment except for the configuration of the pixel 1. FIG. 22 shows a circuit configuration of the pixel 1 according to the present embodiment. The difference from the configuration of FIG. 13 is that switching transistors 120a and 120b are provided between the sampling transistors 108a and 108b and the second amplifying transistors 111a and 111b. Other configurations are the same as those in FIG. 13, and thus a description thereof will be omitted.

Drain terminals of the switching transistors 120a and 120b are connected to source terminals of the sampling transistors 108a and 108b and one set of ends of the analog memories 110a and 110b. Source terminals of the switching transistors 120a and 120b are connected to gate terminals constituting input sections of the second amplifying transistors 111a and 111b and source terminals of the analog memory reset transistors 109a and 109b. Gate terminals of the switching transistors 120a and 120b are connected to the vertical scanning circuit 3, and are supplied with switching pulses ΦSW1 and ΦSW2. The switching transistors 120a and 120b may have a reverse polarity, and the source terminals and the drain terminals thereof may be set to be reverse to the above.

The switching transistors 120a and 120b are transistors that transmit signals of the analog memories 110a and 110b to the second amplifying transistors 111a and 111b, and ON/OFF of the switching transistors 120a and 120b are controlled by the switching pulses ΦSW1 and ΦSW2 from the vertical scanning circuit 3. In the drawing, the switching transistors 120a and 120b are disposed in the second substrate 21.

Figure 23:
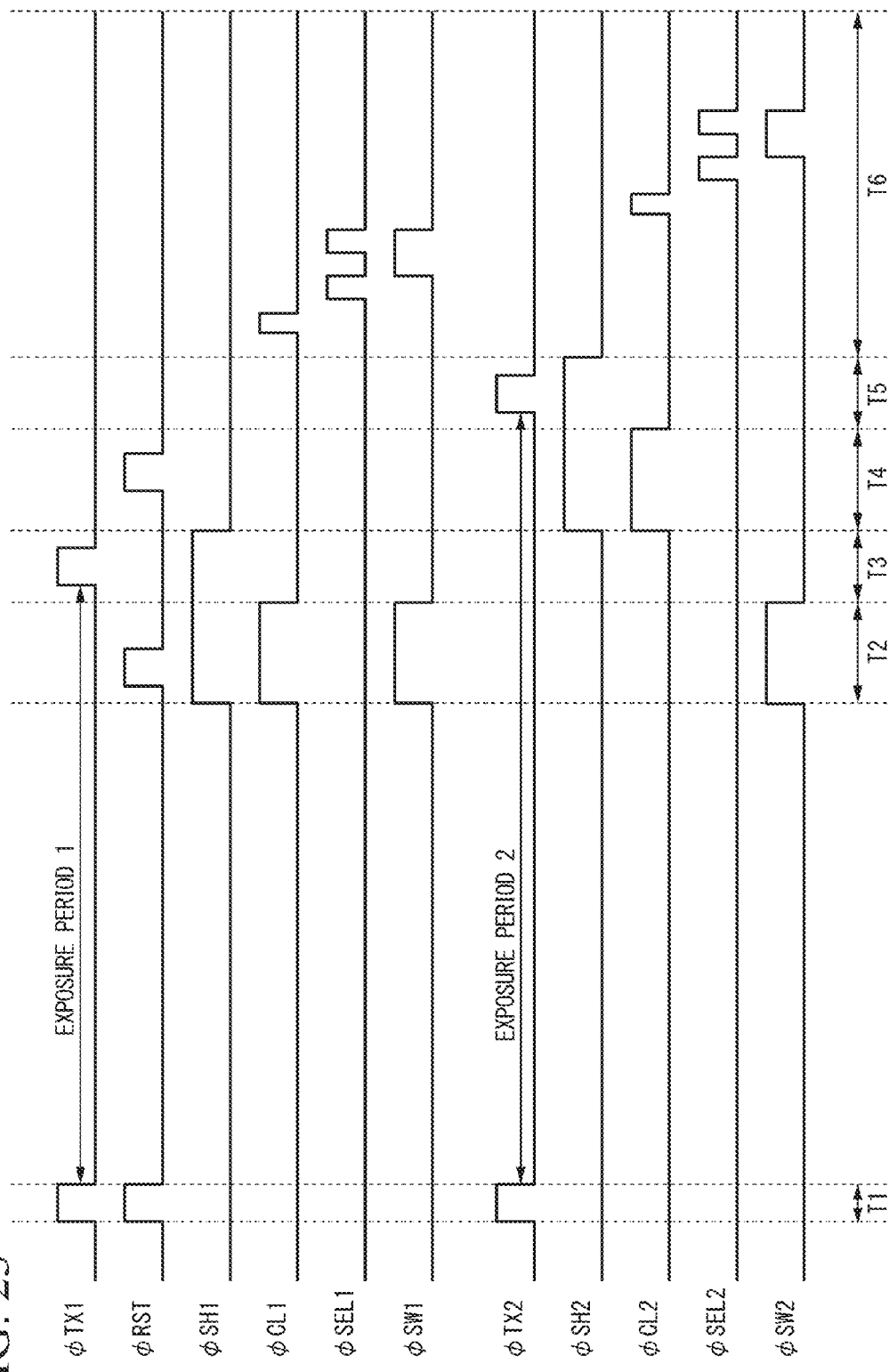
FIG. 23 is a timing diagram illustrating operations of the pixel included in the imaging device according to the sixth embodiment of the present invention.

Hereinafter, operations of the pixel 1 will be described with reference to FIG. 23. FIG. 23 shows control signals supplied from the vertical scanning circuit 3 to the pixels 1 for each row. The difference from FIG. 16 is an addition of the switching pulses ΦSW1 and ΦSW2 for controlling ON/OFF of the switching transistors 120a and 120b, and driving timings of the clamp & memory reset pulses ΦCL1 and ΦCL2 and the selection pulses ΦSEL1 and ΦSEL2 in the period T6.

In the period T2 within the exposure period, the clamp & memory reset pulse ΦCL1 and the switching pulse ΦSW1 are changed from an "L" level to an "H" level, so that the analog memory reset transistor 109a and the switching transistor 120a are turned on. Thereby, the analog memory 110a is reset. Other operations are the same as the operations of FIG. 16 except that the clamp & memory reset pulse ΦCL1 is changed to an "H" level to an "L" level and simultaneously the switching pulse ΦSW1 is changed to an "H" level to an "L" level, and thus a description thereof will be omitted.

In the period T6, a signal based on the signal charge accumulated in the analog memories 110a and 110b is sequentially read for each row. First, the reading of a signal from the first pixel is performed. The clamp & memory reset pulse ΦCL1 is changed from an "L" level to an "H" level, so that the analog memory reset transistor 109a is turned on. Thereby, the input section of the second amplifying transistor 111a is reset. At this time, since the switching transistor 120a is turned off, the analog memory 110a is not reset.

Subsequently, the selection pulse ΦSEL1 is changed from an "L" level to an "H" level, so that the selection transistor 112a is turned on. Thereby, a signal when the input section of the second amplifying transistor 111a is reset is output to the vertical signal line 9 through the selection transistor 112a. Subsequently, the selection pulse ΦSEL1 is changed from an "H" level to an "L" level, so that the selection transistor 112a is turned off.

Subsequently, the switching pulse ΦSW1 is changed from an "L" level to an "H" level, so that the switching transistor 120a is turned on. Subsequently, the selection pulse ΦSEL1 is changed from an "L" level to an "H" level, so that the selection transistor 112a is turned on. Thereby, a signal based on the potential Vmem shown in Expression (1) is output to the vertical signal line 9 through the selection transistor 112a. Subsequently, the selection pulse ΦSEL1 is changed from an "H" level to an "L" level, so that the selection transistor 112a is turned off.

Figure 24:
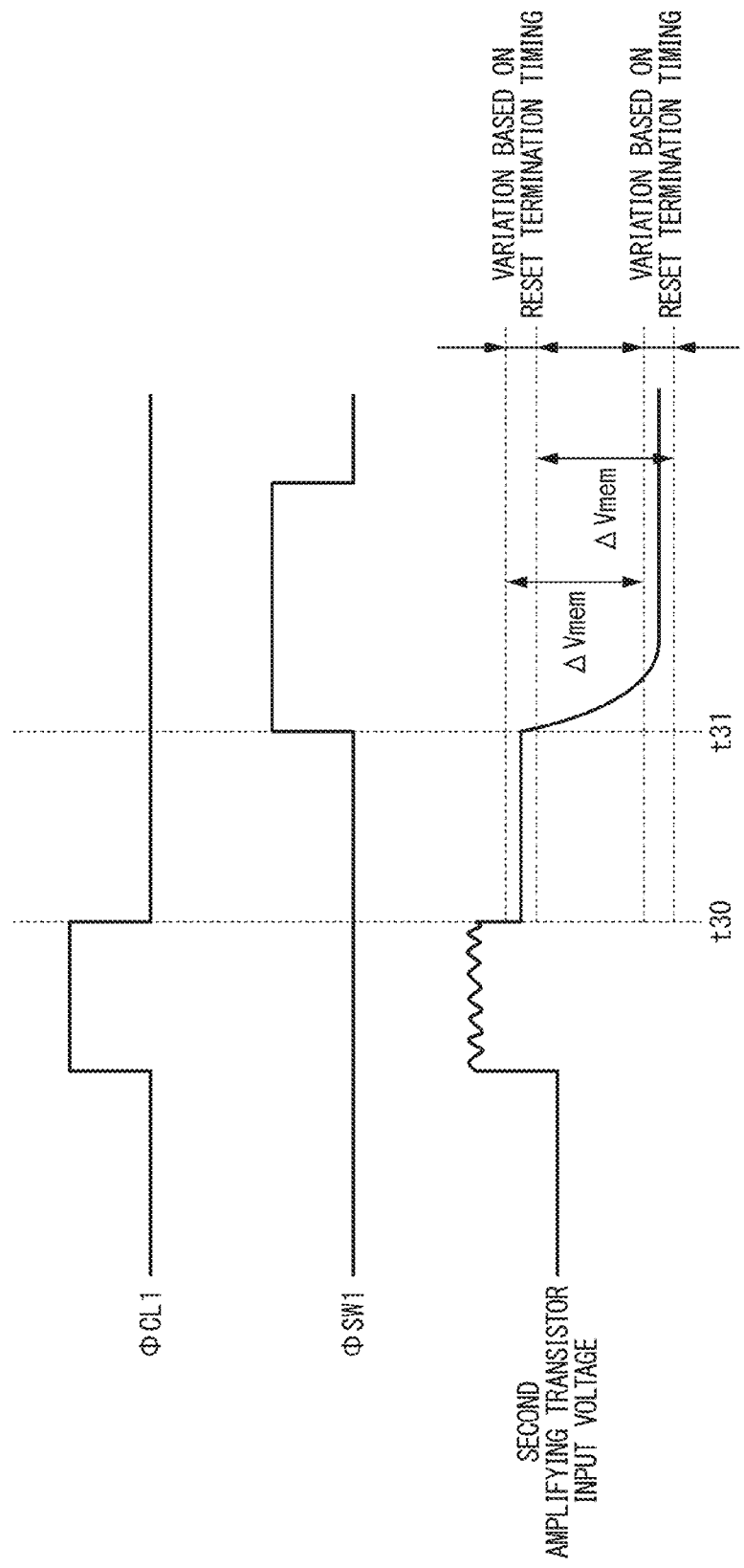
FIG. 24 is a timing diagram illustrating a noise reduction effect according to the sixth embodiment of the present invention.

FIG. 24 shows the clamp & memory reset pulse ΦCL1 and the switching pulse ΦSW1 in the period T6, and the potential of the input section of the second amplifying transistor 111a (input voltage of the second amplifying transistor). The clamp & memory reset pulse ΦCL1 is changed to an "H" level, and reset noise is superimposed on the potential of the input section of the second amplifying transistor 111a while the input section of the second amplifying transistor 111a is reset by the analog memory reset transistor 109a. When the clamp & memory reset pulse ΦCL1 is changed to an "L" level, and the reset of the input section of the second amplifying transistor 111a is terminated, the potential of the input section of the second amplifying transistor 111a is changed due to the influence of parasitic capacitance or the like.

The potential of the input section of the second amplifying transistor 111a is changed with reference to the potential at the time (time t30 in FIG. 24) of the reset termination of the input section of the second amplifying transistor 111a. The potential of the input section of the second amplifying transistor 111a during the reset fluctuates due to reset noise. Thus, the potential of the input section of the second amplifying transistor 111a after the reset termination varies in accordance with the reset timing of the input section of the second amplifying transistor 111a. Further, when the switching pulse ΦSW1 is changed to an "H" level, and one end of the analog memory 110a and the input section of the second amplifying transistor 111a are connected to each other, the potential of the input section of the second amplifying transistor 111a is changed.

The potential of the input section of the second amplifying transistor 111a is changed by $\Delta Vmem$ ($=\alpha 1 \times \alpha 2 \times \Delta Vfd$) with reference to the potential at time t31 of FIG. 24. The potential of the input section of the second amplifying transistor 111a at time t31 fluctuates due to reset noise. However, in a signal after taking the difference between the signal based on the potential of the input section of the second amplifying transistor 111a when the input section of the second amplifying transistor 111a is reset and the signal based on the potential of the input section of the second amplifying transistor 111a after one end of the analog memory 110a and the input section of the second amplifying transistor 111a are connected to each other, the variation in the potential of the input section of the second amplifying transistor 111a based on the reset timing is canceled.

In the operations of FIG. 16 using the configuration of FIG. 13, after the signal charge is transferred from the photoelectric conversion element 101a to the FD 103, a signal based on the potential of one end of the analog memory 110a sampled and held by the sampling transistor 108a is output to the vertical signal line 9. Thereafter, a signal based on the potential of one end of the analog memory 110a when the analog memory 110a is reset is output to the vertical signal line 9. The potential of one end of the analog memory 110a when the analog memory 110a is reset fluctuates due to reset noise. Thus, the variation due to reset noise is included in a signal obtained by taking the difference between two kinds of signals which are output to the vertical signal line 9.

On the other hand, in the operations of FIG. 23 using the configuration of FIG. 22, a signal based on the potential of the input section of the second amplifying transistor 111a when the input section of the second amplifying transistor 111a is reset is output to the vertical signal line 9. Thereafter, a signal based on the potential of the input section of the second amplifying transistor 111a after one end of the analog memory 110a and the input section of the second amplifying transistor 111a are connected to each other is output to the vertical signal line 9. In the signal obtained by taking the difference between two kinds of signals which are output to the vertical signal line 9, as mentioned above, the variation in the potential of the input section of the second amplifying transistor 111a based on the reset timing is reduced. For this reason, noise in the signal can be further reduced as compared with the operations of FIG. 16 using the configuration of FIG. 13.

Subsequently, the reading of a signal from the second pixel is performed. The reading of a signal from the second pixel is the same as the reading of a signal from the first pixel, and thus a description of the reading of a signal from the second pixel will be omitted.

Seventh Embodiment

Figure 25:
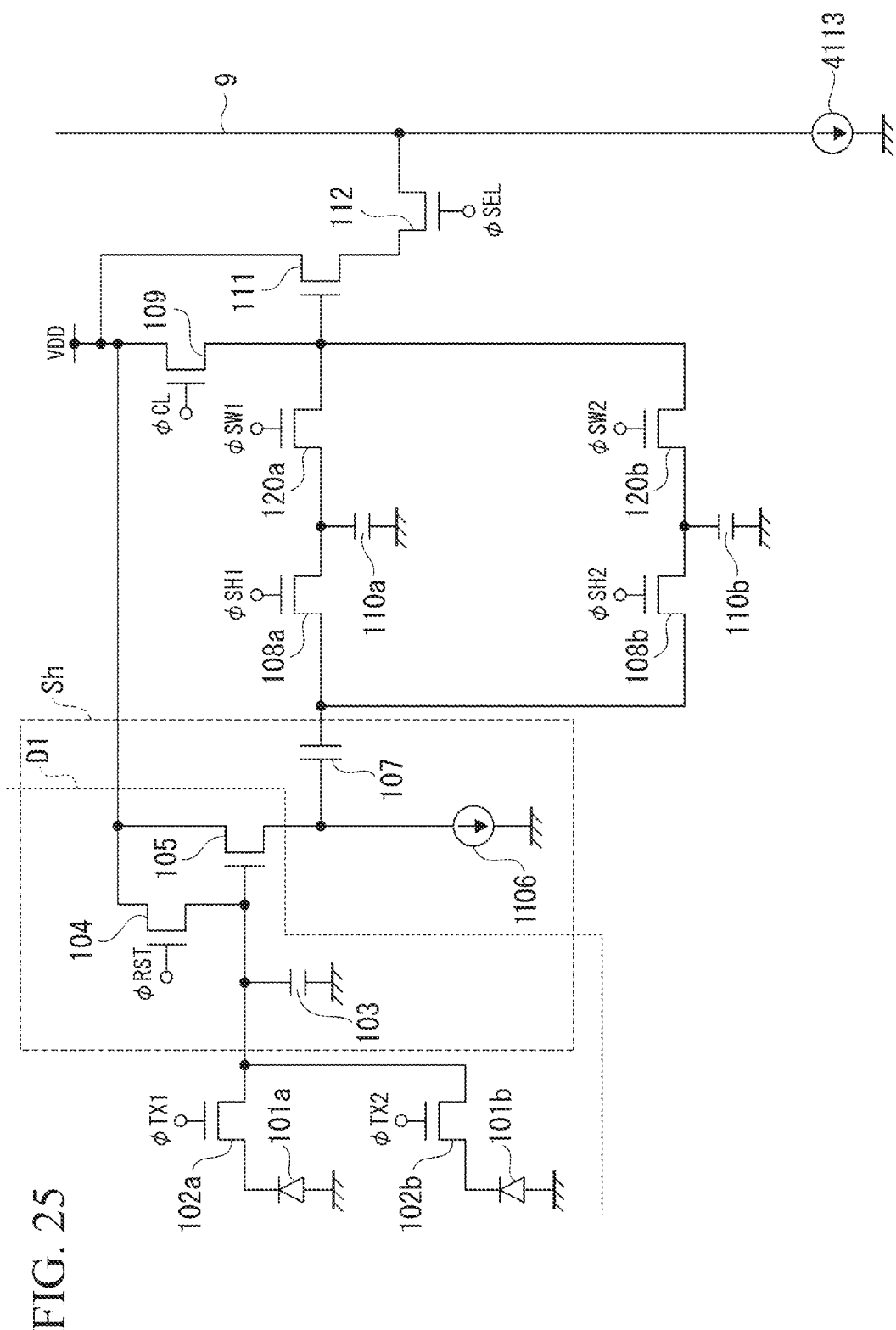
FIG. 25 is a circuit diagram illustrating a circuit configuration of a pixel in an imaging device according to a seventh embodiment of the present invention.

Next, seventh embodiment of the present invention will be described. A configuration of the present embodiment is the same as the configuration of the forth embodiment, except for the configuration of the pixel 1. FIG. 25 shows a circuit configuration of the pixel 1 according to the present embodiment. The difference from the configuration of FIG. 25 is that the analog memory reset transistor 109, the second amplifying transistor 111 and the selection transistor 112 are shared by each of the first pixel and the second pixel. Other configurations are the same as those in FIG. 25, and thus a description thereof will be omitted.

A drain terminal of the analog memory reset transistor 109 is connected to the power supply voltage VDD. A source terminal of the analog memory reset transistor 109 is connected to source terminals of the switching transistors 120a and 120b. A gate terminal of the analog memory reset transistor 109 is connected to the vertical scanning circuit 3, and is supplied with a clamp & memory reset pulse ΦCL.

A drain terminal of the second amplifying transistor 111 is connected to the power supply voltage VDD. A gate terminal constituting an input section of the second amplifying transistor 111 is connected to the source terminal of the switching transistors 120a and 120b. A drain terminal of the selection transistor 112 is connected to a source terminal of the second amplifying transistor 111. A source terminal of the selection transistor 112 is connected to the vertical signal line 9. A gate terminal of the selection transistor 112 is connected to the vertical scanning circuit 3, and is supplied with a selection pulse ΦSEL. The analog memory reset transistor 109, the second amplifying transistor 111, and the selection transistor 112 may have a reverse polarity, and the source terminals and the drain terminals thereof may be set to be reverse to the above.

Figure 26:
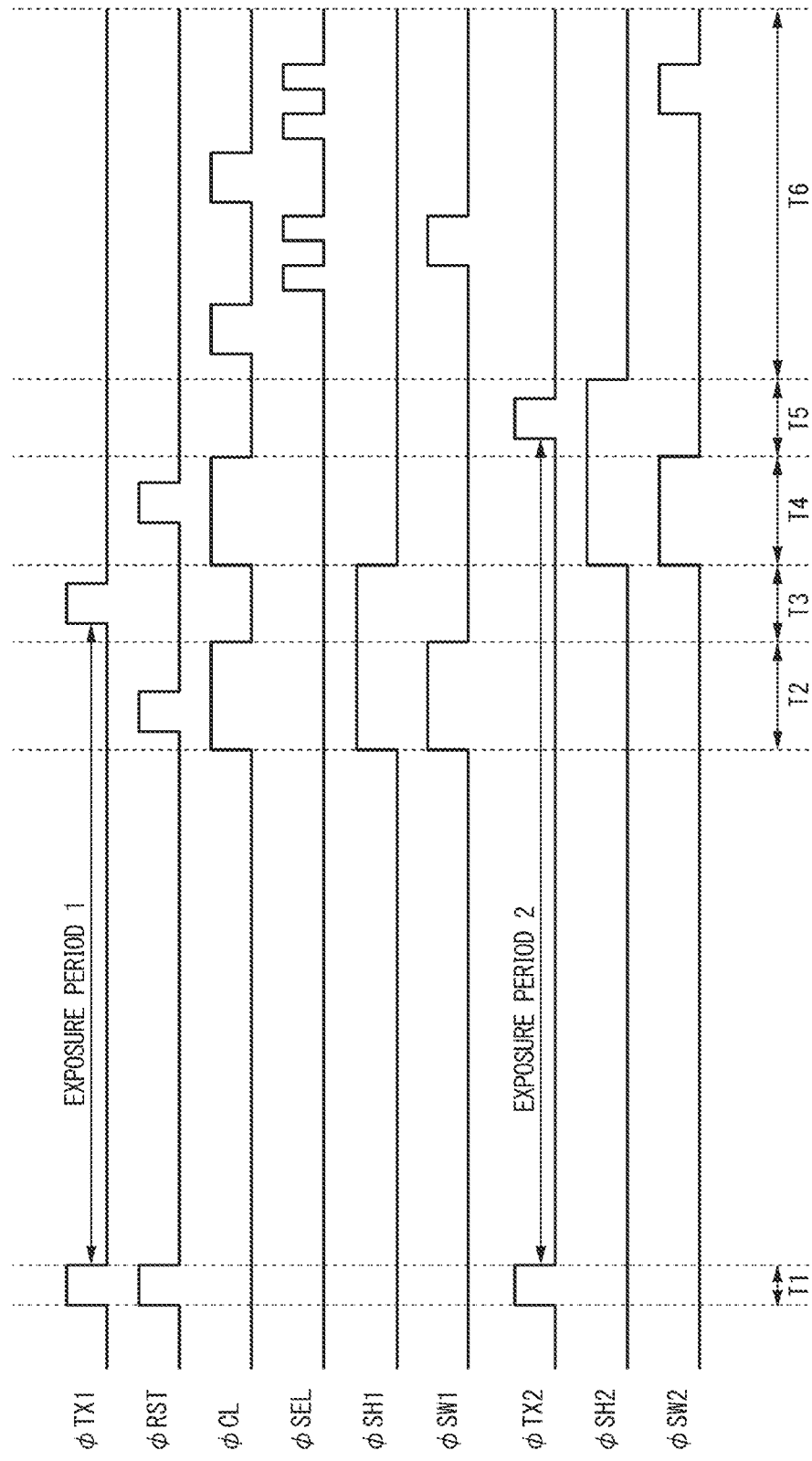
FIG. 26 is a timing diagram illustrating operations of the pixel in the imaging device according to the seventh embodiment of the present invention.

Hereinafter, operations of the pixel 1 will be described with reference to FIG. 26. FIG. 26 shows control signals which are supplied from the vertical scanning circuit 3 to the pixels 1 for each row. The difference from FIG. 16 is an addition of the switching pulses ΦSW1 and ΦSW2 for controlling ON/OFF of the switching transistors 120a and 120*b*, and driving timings of the clamp & memory reset pulse ΦCL and the selection pulse ΦSEL in the period T6.

In the period T2 within the exposure period, the clamp & memory reset pulse ΦCL and the switching pulse ΦSW1 are changed from an "L" level to an "H" level, so that the analog memory reset transistor 109 and the switching transistor 120*a* are turned on. Thereby, the analog memory 110*a* is reset. Other operations are the same as the operations of FIG. 16 except that the clamp & memory reset pulse ΦCL is changed from an "H" level to an "L" level and simultaneously the switching pulse ΦSW1 is changed from an "H" level to an "L" level, and thus a description thereof will be omitted.

In the period T6, a signal based on the signal charge accumulated in the analog memories 110*a* and 110*b* is sequentially read for each row. First, the reading of a signal from the first pixel is performed. The clamp & memory reset pulse ΦCL is changed from an "L" level to an "H" level, so that the analog memory reset transistor 109 is turned on. Thereby, the input section of the second amplifying transistor 111 is reset. At this time, the switching transistors 120*a* and 120*b* are turned off, and thus the analog memories 110*a* and 110*b* are not reset.

Subsequently, the selection pulse ΦSEL is changed from an "L" level to an "H" level, so that the selection transistor 112 is turned on. Thereby, a signal when the input section of the second amplifying transistor 111 is reset is output to the vertical signal line 9 through the selection transistor 112. Subsequently, the selection pulse ΦSEL is changed from an "H" level to an "L" level, so that the selection transistor 112 is turned off.

Subsequently, the switching pulse ΦSW1 is changed from an "L" level to an "H" level, so that the switching transistor 120*a* is turned on. Subsequently, the pulse ΦSEL is changed from an "L" level to an "H" level, so that the selection transistor 112*a* is turned on. Thereby, a signal based on the potential Vmem shown in Expression (1) is output to the vertical signal line 9 through the selection transistor 112. Subsequently, the selection pulse ΦSEL is changed from an "H" level to an "L" level, so that the selection transistor 112 is turned off.

Subsequently, the reading of a signal from the second pixel is performed. The reading of a signal from the second pixel is the same as the reading of a signal from the first pixel, and thus a description of the reading of a signal from the second pixel will be omitted.

In the operations of FIG. 26 using the configuration of FIG. 25, the variation in the potential of the input section of the second amplifying transistor 111 based on the reset timing is reduced similarly to the operations of FIG. 23 using the configuration of FIG. 22. In addition, it is possible to reduce the number of transistors further in the configuration of FIG. 25 than in the configuration of FIG. 33.

An amplifier circuit (amplifying transistor) according to the present invention corresponds to, for example, the first amplifying transistor 105. A signal accumulation circuit (memory section or memory circuit) according to the present invention corresponds to, for example, the analog memories 110*a* and 110*b*. An output circuit (output transistor) according to the present invention corresponds to, for example, the selection transistors 112*a* and 112*b*. In addition, a reset circuit according to the present invention corresponds to, for example, the FD reset transistor 104. A noise reduction circuit according to the present invention corresponds to, for example, the clamp capacitor 107 and the sampling transistors 108*a* and 108*b*. A clamp section (clamp capacitor) according to the present invention corresponds to, for example, the clamp capacitor 107. A sample-and-hold section (transistor) according to the present invention corresponds to, for example, the sampling transistors 108*a* and 108*b*.

In addition, a first reset circuit according to the present invention corresponds to, for example, the transfer transistors 102*a* and 102*b* and the FD reset transistor 104. A second reset circuit according to the present invention corresponds to, for example, the FD reset transistor 104. A transfer circuit according to the present invention corresponds to, for example, the transfer transistors 102*a* and 102*b*. A second amplifier circuit according to the present invention corresponds to, for example, the second amplifying transistors 111*a* and 111*b*. A third reset circuit according to the present invention corresponds to, for example, the analog memory reset transistors 109*a* and 109*b*. A differential processing circuit according to the present invention corresponds to, for example, the column processing circuit 4. A switching circuit according to the present invention corresponds to, for example, the switching transistors 120*a* and 120*b*.

Eighth Embodiment

Next, an eighth embodiment of the present invention will be described. A configuration of an imaging section according to the present embodiment is the same as the configuration of the first embodiment.

In the pixel section 2, the plurality of pixels 1 is arrayed in a two-dimensional matrix. In FIG. 2, 120 pixels 1 of 10 rows×12 columns are arrayed, but the array of pixels shown in FIG. 2 is illustrative of an example, and the row number and the column number may be equal to or greater than 2. In addition, FIG. 2 is a diagram schematically illustrating a state where each of the pixels 1 is arrayed in a matrix, and it is not meant that the pixels 1 shown in FIG. 2 are disposed so as to be separated from each other. As described later, some circuit elements are shared between a plurality of pixels in reality.

Figure 27:
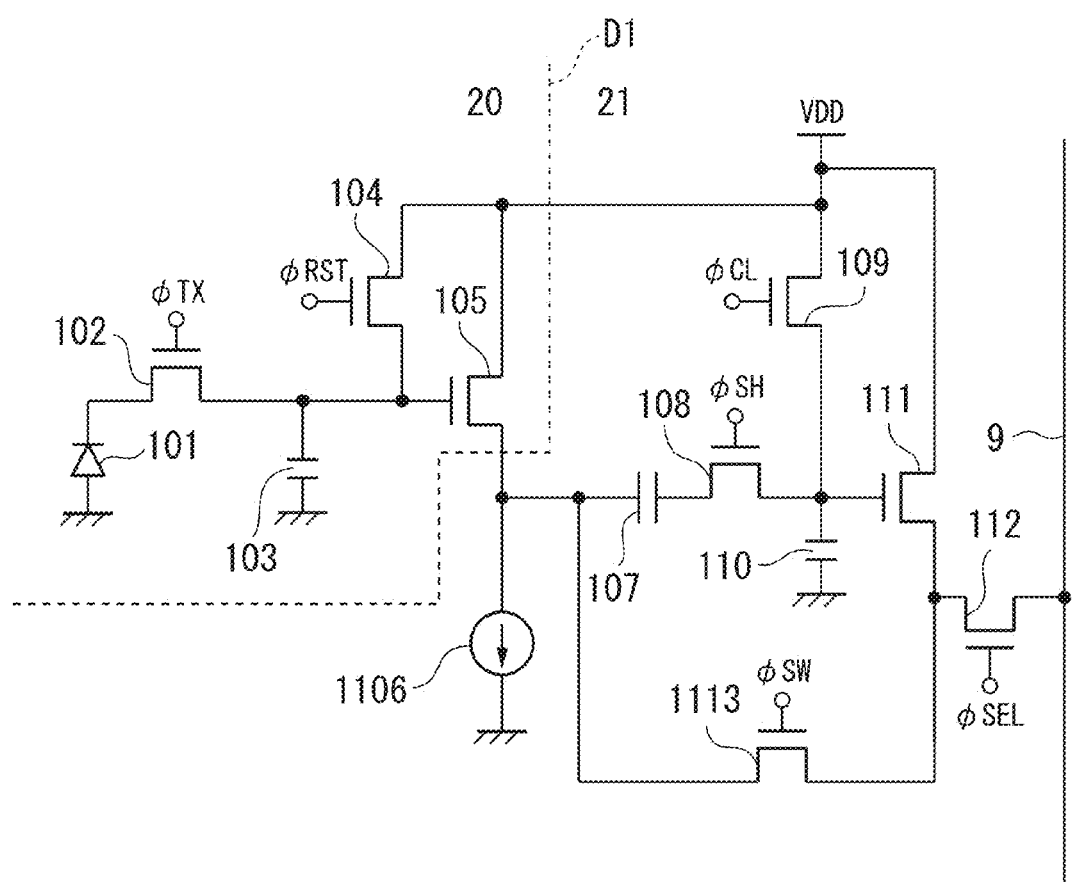
FIG. 27 is a circuit diagram illustrating a circuit configuration of a pixel in the imaging device according to the eighth embodiment of the present invention.

FIG. 27 shows a circuit configuration of the pixel 1. The difference of the configuration of the pixel 1 shown in FIG. 27 from the configuration of the pixel 1 shown in FIG. 4 is that a current source 1106 is provided instead of the load transistor 4106. A description of the same other components as those in FIG. 4 will be omitted.

A drain terminal of the first amplifying transistor 105 is connected to the power supply voltage VDD. A gate terminal which is an input section of the first amplifying transistor 105 is connected to the source terminal of the transfer transistor 102. One end of the current source 1106 is connected to a source terminal of the first amplifying transistor 105. The other end of the current source 1106 is grounded. As an example, the current source 1106 may be constituted by a transistor in which a drain terminal is connected to the source terminal of the first amplifying transistor 105, a source terminal is grounded, and a gate terminal is connected to the vertical scanning circuit 3.

One end of the clamp capacitor 107 is connected to the source terminal of the first amplifying transistor 105 and one end of the current source 1106. A drain terminal of the sampling transistor 108 is connected to the other end of the clamp capacitor 107. A gate terminal of the sampling transistor 108 is connected to the vertical scanning circuit 3, and is supplied with a sampling pulse ΦSH.

One end of the analog memory 110 is connected to the source terminal of the sampling transistor 108. The other end of the analog memory 110 is grounded. A drain terminal of the second amplifying transistor 111 is connected to the power supply voltage VDD. A gate terminal constituting an input section of the second amplifying transistor 111 is connected to the source terminal of the sampling transistor 108. A drain terminal of the selection transistor 112 is connected to a source terminal of the second amplifying transistor 111. A source terminal of the selection transistor 112 is connected to the vertical signal line 9. A gate terminal of the selection transistor 112 is connected to the vertical scanning circuit 3, and is supplied with a selection pulse ΦSEL.

A drain terminal of the switching transistor 113 is connected to the source terminal of the first amplifying transistor 105, one end of the current source 1106, and one end of the clamp capacitor 107. A source terminal of the switching transistor 113 is connected to the source terminal of the second amplifying transistor 111 and the drain terminal of the selection transistor 112. A gate terminal of the switching transistor 113 is connected to the vertical scanning circuit 3, and is supplied with a switching pulse ΦSW. Each transistor mentioned above may have a reverse polarity, and the source terminal and the drain terminal may be set to be reverse to the above.

The first amplifying transistor 105 outputs an amplified signal, obtained by amplifying a signal which is based on the signal charge accumulated in the FD 103 and is input to the gate terminal, from the source terminal. The current source 1106 functions as a load of the first amplifying transistor 105, and supplies a current for driving the first amplifying transistor 105 to the first amplifying transistor 105. The first amplifying transistor 105 and the current source 106 constitute a source-follower circuit.

The switching transistor 113 switches an output path (reading path) for outputting a signal of the pixel 1. The pixel 1 of the present embodiment has two output paths. A first output path is a path for outputting a signal based on the signal charge accumulated in the analog memory 110. The first output path includes a path electrically connected from one end of the analog memory 110 connected to the source terminal of the sampling transistor 108 through the second amplifying transistor 111 and the selection transistor 112 to the vertical signal line 9. A second output path is a path for outputting an amplified signal, which is output from the first amplifying transistor 105, from the pixel 1 without passing through the analog memory 110. The second output path includes a path electrically connected from the source terminal of the first amplifying transistor 105 through the switching transistor 113 and the selection transistor 112 to the vertical signal line 9. The first output path and the second output path are switched by ON/OFF of the switching transistor 113. The first output path is selected at the period in which the switching transistor 113 is turned off. The second output path is selected at the period in which the switching transistor 113 is turned on.

During the period in which the FD 103 holds signal charge, noise that causes the deterioration of the signal quality is superimposed on the signal charge. A main factor of the noise is charge due to a leakage current of the FD 103 and charge caused by light which is incident on portions other than the photoelectric conversion element 101. When the first output path is selected, a signal based on the signal charge accumulated in the analog memory 110 is output from the pixel 1, and thus it is possible to obtain a signal in which the deterioration of the signal quality is reduced. The reason for why the deterioration of the signal quality can be reduced by accumulating the signal charge in the analog memory 110 will be described later.

Since the operation (global shutter operation) using the above-mentioned global shutter function allows the simultaneity of accumulation of the signal charge to be realized and the distortion of a subject to be reduced, the operation is mainly used for reading a still image signal. In the global shutter operation, all the pixels are simultaneously exposed, after that, signal charge generated by each photoelectric conversion element is simultaneously transferred to the FD in all the pixels to temporarily accumulate the signal charge, and a signal based on the signal charge is sequentially read for each row. For this reason, when pixels are scanned for each row, for example, from the row on the upper side of the pixel array toward the row on the lower side and signals are read, the period in which the FD 103 holds the signal charge becomes longer in the pixels located further below the lower side. As this period is longer, noise superimposed on the signal charge becomes larger. In order to reduce the deterioration of the signal quality due to the noise, a still image signal is output through the first output path in the present embodiment.

However, the sum of gains of the clamp capacitor 107 and the sampling transistor 108 is smaller than 1, and a gain of the second amplifying transistor 111 is smaller than 1. Therefore, when a signal is output through the first output path, the signal gain decreases. On the other hand, regarding the reading of a moving image signal, the period in which the FD 103 holds signal charge is shortened by a reading operation (so-called rolling shutter operation) described later, and thus an influence of noise superimposed on the signal charge in this period can be ignored. For this reason, regarding the moving image signal, it is not necessary to use the first output path for reducing the deterioration of the signal quality due to noise. From such a reason, in the present embodiment, the moving image signal is read through the second output path. Therefore, it is possible to reduce a decrease in the gain of the moving image signal.

Among the circuit elements shown in FIG. 27, the photoelectric conversion element 101 is disposed in the first substrate 20. The analog memory 110 is disposed in the second substrate 21. Other circuit elements are disposed in any of the first substrate 20 and the second substrate 21. The broken line D1 of FIG. 27 represents a boundary line between the first substrate 20 and the second substrate 21. The photoelectric conversion element 101, the transfer transistor 102, the FD 103, the FD reset transistor 104, and the first amplifying transistor 105 are disposed in the first substrate 20. The current source 1106, the clamp capacitor 107, the sampling transistor 108, the analog memory reset transistor 109, the analog memory 110, the second amplifying transistor 111, the selection transistor 112, and the switching transistor 113 are disposed in the second substrate 21.

In FIG. 27, the connection portion including the micropad 22, the micro-bump 24, and the micro-pad 23 is disposed in a path between the source terminal of the first amplifying transistor 105, and one end of the current source 1106, one end of the clamp capacitor 107, and the drain terminal of the switching transistor 113, but the embodiment of the present invention is not limited thereto. The connection portion may be disposed for each path electrically connected from the photoelectric conversion element 101 to the analog memory 110.

Figure 28:
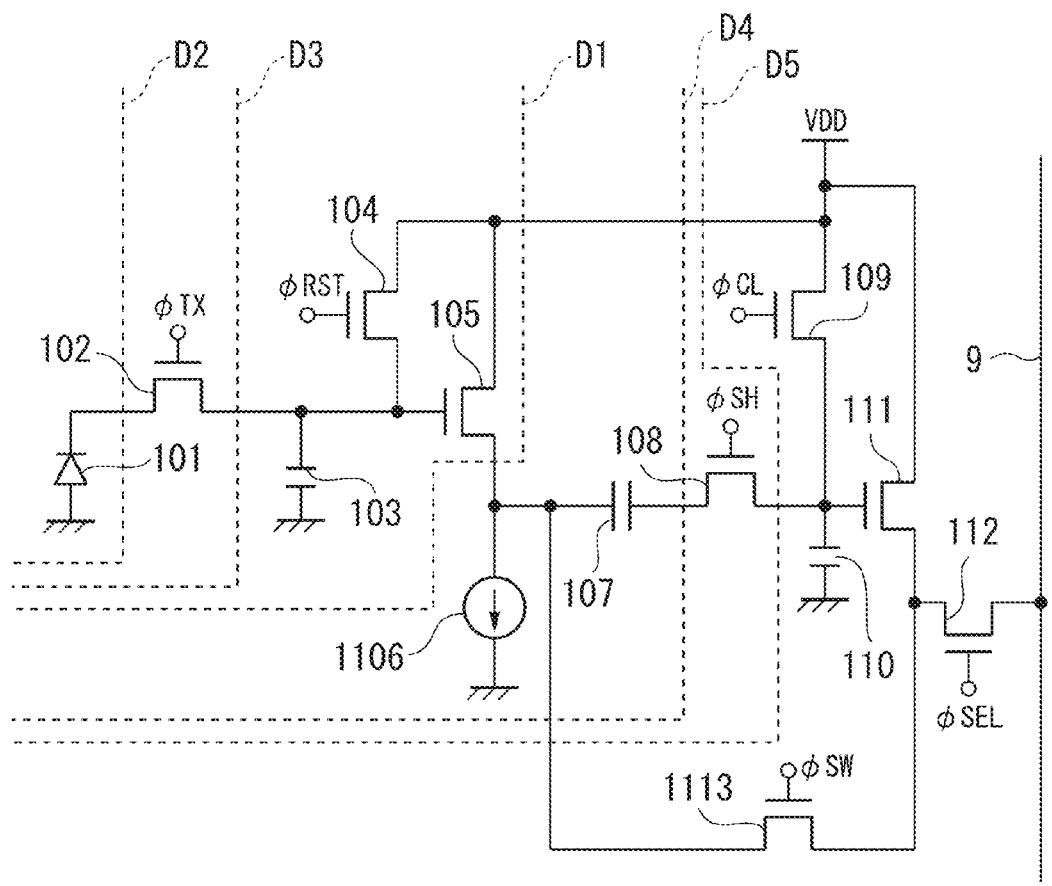
FIG. 28 is a circuit diagram illustrating a circuit configuration of the pixel in the imaging device according to the eighth embodiment of the present invention.

FIG. 28 shows an example of boundary lines between the first substrate 20 and the second substrate 21. The broken lines D1 to D5 show an example in which these lines are capable of being used as the boundary lines between the first substrate 20 and the second substrate 21. The boundary lines between the first substrate 20 and the second substrate 21 may be any of the broken lines D1 to D5, and may be lines other than the above. The broken line D1 is as described above. In the example shown by the broken line D2, the connection portion is disposed in a path between the other end of the photoelectric conversion element 101 and the drain terminal of the transfer transistor 102. In the example shown by the broken line D3, the connection portion is disposed in a path between the source terminal of the transfer transistor 102, and one end of the FD 103, the source terminal of the FD reset transistor 104, and a gate terminal of the first amplifying transistor 105.

In the example shown by the broken line D4, the connection portion is disposed in a path between the other end of the clamp capacitor 107 and the drain terminal of the sampling transistor 108, and the connection portion is disposed in a path between the source terminal of the first amplifying transistor 105; one end of the current source 1106; and one end of the clamp capacitor 107; and the drain terminal of the switching transistor 113. In the example shown by the broken line D5, the connection portion is disposed in a path between the source terminal of the sampling transistor 108; and the source terminal of the analog memory reset transistor 109; one end of the analog memory 110; and a gate terminal of the second amplifying transistor 111; and the connection portion is disposed in a path between the source terminal of the first amplifying transistor 105; one end of the current source 1106; and one end of the clamp capacitor 107; and the drain terminal of the switching transistor 113.

Next, operations of the pixel 1 will be described. Hereinafter, first of all, a global shutter operation and a rolling shutter operation used as the basis of the operation of the present embodiment will be described. Thereafter, operations during continuous shooting will be described in which a still image signal for recording is acquired over a plurality of frames using the global shutter operation while acquiring a moving image signal for live view display using the rolling shutter operation.

<Global Shutter Operation>

Figure 29:
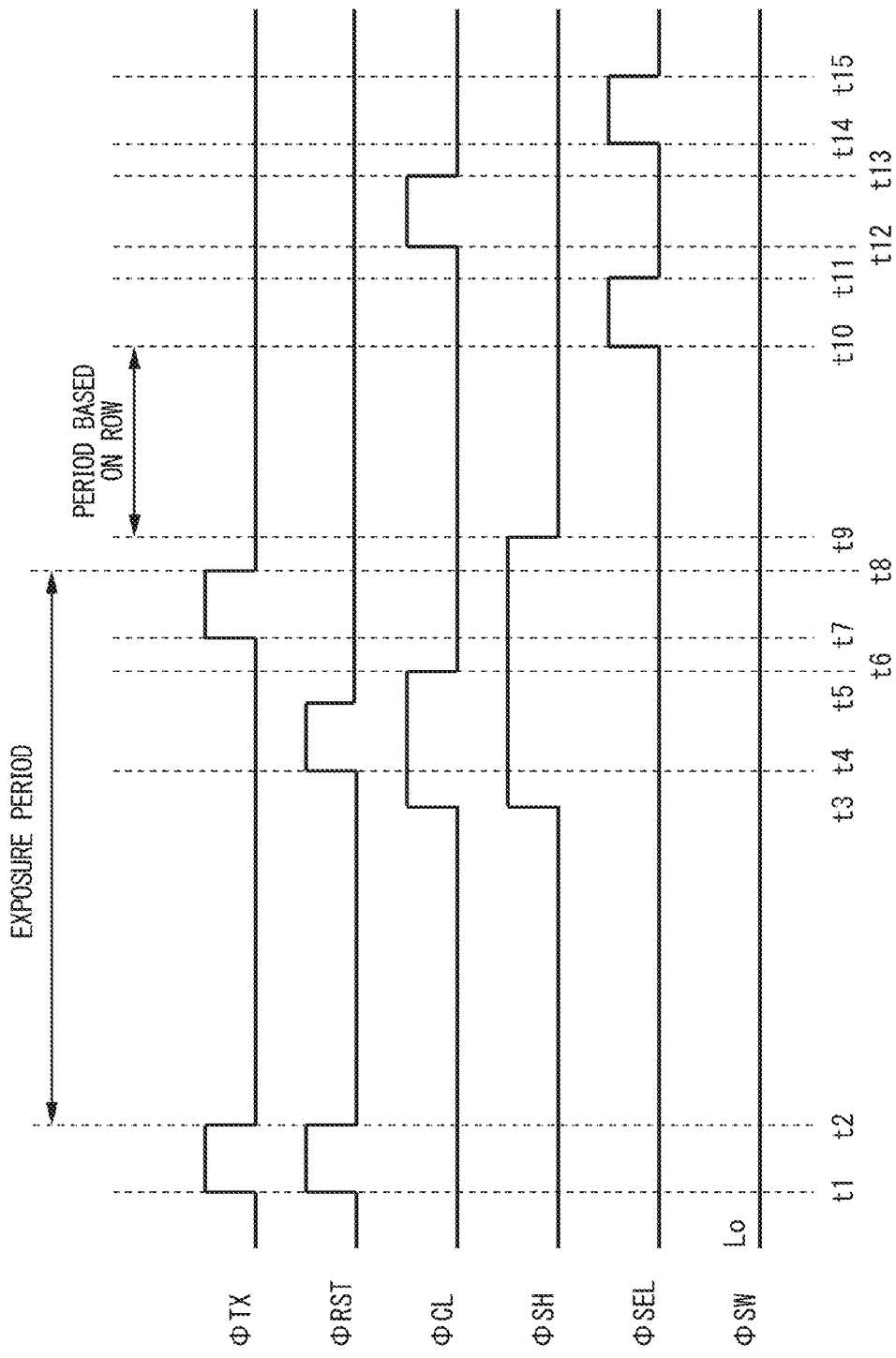
FIG. 29 is a timing diagram illustrating operations of the pixel in the imaging device according to the eighth embodiment of the present invention.

FIG. 29 shows control signals which are supplied from the vertical scanning circuit 3 to the pixels 1 in one arbitrary row when the global shutter operation. The global shutter operation will be described with reference to FIG. 29. In the global shutter operation, the switching pulse ΦSW is held to an "L" (Low) level, and thus the switching transistor 113 is turned off. For this reason, in the global shutter operation, a signal is output from the pixels 1 through the first output path.

At time t1, the transfer pulse ΦTX which is output to all the pixels 1 (hereinafter, referred to as all the pixels) is changed from an "L" (Low) level to an "H" (High) level, so that the transfer transistors 102 of all the pixels are turned on. Simultaneously, the FD reset pulse ΦRST which is output to all the pixels is changed from an "L" level to an "H" level, so that the FD reset transistors 104 of all the pixels are turned on. Thereby, the photoelectric conversion elements 101 are reset.

Subsequently, at time t2, the transfer pulse ΦTX and the FD reset pulse ΦRST which are output to all the pixels are changed from an "H" level to an "L" level, so that the transfer transistors 102 and the FD reset transistors 104 of all the pixels are turned off. Thereby, the reset of the photoelectric conversion elements 101 of all the pixels is terminated, and the exposure (accumulation of signal charge) of all the pixels is collectively (simultaneously) started.

At time t3 within the exposure period, the clamp & memory reset pulse ΦCL which is output to all the pixels is changed from an "L" level to an "H" level, so that the analog memory reset transistors 109 of all the pixels are turned on. Thereby, the analog memories 110 of all the pixels are reset. Simultaneously, the sampling pulse ΦSH which is output to all the pixels is changed from an "L" level to an "H" level, so that the sampling transistors 108 of all the pixels are turned on. Thereby, the potential of the other end of the clamp capacitor 107 is reset to the power supply voltage VDD, and the sampling transistor 108 starts sample and hold of the potential of the other end of the clamp capacitor 107.

Subsequently, at time t4 within the exposure period, the FD reset pulse ΦRST which is output to all the pixels is changed from an "L" level to an "H" level, so that the FD reset transistors 104 of all the pixels are turned on. Thereby, the FDs 103 of all the pixels are reset.

Subsequently, at time t5 within the exposure period, the FD reset pulse ΦRST which is output to all the pixels is changed from an "H" level to an "L" level, so that the FD reset transistors 104 of all the pixels are turned off. Thereby, the reset of the FDs 103 of all the pixels are terminated. The reset of the FDs 103 may be performed at the timing during the exposure period, but the reset of the FD 103 is performed at the timing immediately before the termination of the exposure period, thereby allowing noise due to a leakage current of the FD 103 to be further reduced.

Subsequently, at time t6 during the exposure period, the clamp & memory reset pulse ΦCL which is output to all the pixels is changed from an "H" level to an "L" level, so that the analog memory reset transistors 109 of all the pixels are turned off. Thereby, the reset of the analog memories 110 of all the pixels is terminated. At this point in time, the clamp capacitor 107 clamps an amplified signal (amplified signal after the reset of the FD 103) which is output from the first amplifying transistor 105.

Subsequently, at time t7, the transfer pulse ΦTX which is output to all the pixels is changed from an "L" level to an "H" level, so that the transfer transistors 102 of all the pixels are turned on. Thereby, signal charge accumulated in the photoelectric conversion elements 101 of all the pixels is transferred to the FD 103 through the transfer transistor 102, and is accumulated in the FD 103.

Subsequently, at time t8, the transfer pulse ΦTX which is output to all the pixels is changed from an "H" level to an "L" level, so that the transfer transistors 102 of all the pixels are turned off. Thereby, the exposure (accumulation of signal charge) of all the pixels is collectively (simultaneously) terminated. Further, at time t9, the sampling pulse ΦSH which is output to all the pixels is changed from an "H" level to an "L" level, so that the sampling transistors 108 of all the pixels are turned off. Thereby, the sampling transistor 108 terminates the sampling and holding of the potential of the other end of the clamp capacitor 107.

After time t9, a signal corresponding to the signal charge accumulated in the analog memory 110 is sequentially read for each row. In the present embodiment, a signal is read for each row from the pixels 1 in order of the first row, the second row, the third row, . . . the n-th row (final row) (rolling reading).

At the time t10 when the period based on the row elapses from time t9, the selection pulse ΦSEL which is output to the pixels 1 in a row to be read is changed from an "L" level to an "H" level, so that the selection transistors 112 of the pixels 1 in the row to be read are turned on. Thereby, a signal based on the potential Vmem shown in Expression (1) is output to the vertical signal line 9 through the selection transistor 112. Subsequently, at time t11, the selection pulse ΦSEL which is output to the pixels 1 in the row to be read is changed from an "H" level to an "L" level, so that the selection transistors 112 of the pixels 1 in the row to be read are turned off.

Subsequently, at time t12, the clamp & memory reset pulse ΦCL which is output to the pixels 1 in the row to be read is changed from an "L" level to an "H" level, so that the analog memory reset transistors 109 of the pixels 1 in the row to be read are turned on. Thereby, the analog memories 110 of the pixels 1 in the row to be read are reset. Subsequently, at time t13, the clamp & memory reset pulse ΦCL which is output to the pixels 1 in the row to be read is changed from an "H" level to an "L" level, so that the analog memory reset transistors 109 of the pixels 1 in the row to be read are turned off.

Subsequently, at time t14, the selection pulse ΦSEL which is output to the pixels 1 in the row to be read is changed from an "L" level to an "H" level, so that the selection transistors 112 of the pixels 1 in the row to be read are turned on. Thereby, a signal based on the potential of one end of the analog memory 110 when the analog memory 110 is reset is output to the vertical signal line 9 through the selection transistor 112. Subsequently, at time t15, the selection pulse ΦSEL which is output to the pixels 1 in the row to be read is changed from an "H" level to an "L" level, so that the selection transistors 112 of the pixels 1 in the row to be read are turned off.

A signal which is output from the column processing circuit 4 is output to the horizontal signal line 10 by the horizontal reading circuit 5. The output amplifier 6 processes a signal which is output to the horizontal signal line 10, and outputs the signal as a pixel signal from the output terminal 11. In this way, the reading of signals from the pixels 1 in the row to be read is terminated. In the period after time t9, signals are read from the pixels 1 by the same operation as the above, while sequentially selecting the row to be read.

In the global shutter operation, the signal charge transferred from the photoelectric conversion element 101 to the FD 103 collectively with respect to all the pixels has to be held by the FD 103 until the reading timing of each of the pixels 1. When noise is generated during the period in which the FD 103 holds the signal charge, noise is superimposed on the signal charge held by the FD 103, and thus the signal quality (S/N) is deteriorated.

A main factor of the noise generated during the period in which the FD 103 holds the signal charge is charge due to a leakage current of the FD 103 (hereinafter, referred to as the leakage charge) and charge caused by light which is incident on portions other than the photoelectric conversion elements 101a and 101b (hereinafter, referred to as the photoelectric charge). When the leakage charge and the photoelectric charge which are generated in a unit time are set to qid and qpn, respectively, and the length of the holding period is set to tc, noise charge Qn generated during the holding period is equal to (qid+qpn)tc.

The capacitance of the FD 103 is set to Cfd, the capacitance of the analog memories 110a and 110b is set to Cmem, and the ratio of Cfd to Cmem (Cmem/Cfd) is set to A. In addition, as mentioned above, the gain of the first amplifying transistor 105 is set to α1, and the sum of the gains of the analog memories 110a and 110b and the sampling transistors 108a and 108b is set to α2. When the signal charge generated in the photoelectric conversion elements 101a and 101b during the exposure period is set to Qph, the signal charge held by the analog memories 110a and 110b after the termination of the exposure period is equal to A×α1×α2×Qph.

The signal based on the signal charge transferred from the photoelectric conversion element 101 to the FD 103 is sampled and held until time t9 by the sampling transistor 108, and is stored in the analog memory 110. Therefore, the time until the signal charge is stored in the analog memory 110 after the signal charge is transferred to the FD 103 is shortened, and thus noise generated in the FD 103 can be ignored. When the noise generated in the period in which the analog memory 110 holds the signal charge is assumed to be Qn as stated above, the S/N is equal to A×α1×α2×Qph/Qn.

<Rolling Shutter Operation>

FIG. 7 shows control signals which are supplied from the vertical scanning circuit 3 to the pixels 1 in one arbitrary row during the rolling shutter operation. The rolling shutter operation will be described with reference to FIG. 7. In the rolling shutter operation, a signal is output from the pixels 1 through the second output path. For this reason, the clamp & memory reset pulse ΦCL and the sampling pulse ΦSH relevant to the output of a signal through the first output path are held to an "L" level.

At time t21, the switching pulse ΦSW which is output to the pixels 1 in the row to be read is changed from an "L" level to an "H" level, so that the switching transistors 113 of the pixels 1 in the row to be read are turned on. Thereby, the second output path is selected.

Subsequently, at time t22, the transfer pulse ΦTX which is output to the pixels 1 in the row to be read is changed from an "L" level to an "H" level, so that the transfer transistors 102 of the pixels 1 in the row to be read are turned on. Simultaneously, the FD reset pulse ΦRST which is output to the pixels 1 in the row to be read is changed from an "L" level to an "H" level, so that the FD reset transistors 104 of the pixels 1 in the row to be read are turned on. Thereby, the photoelectric conversion elements 101 of the pixels 1 in the row to be read are reset.

Subsequently, at time t23, the transfer pulse ΦTX and the FD reset pulse ΦRST which are output to the pixels 1 in the row to be read are changed from an "H" level to an "L" level, so that the transfer transistors 102 and the FD reset transistors 104 of the pixels 1 in the row to be read are turned off. Thereby, the reset of the photoelectric conversion elements 101 of the pixels 1 in the row to be read is terminated, and the exposure (accumulation of signal charge) of the pixels 1 in the row to be read is started.

At time t24 within the exposure period, the selection pulse ΦSEL which is output to the pixels 1 in the row to be read is changed from an "L" level to an "H" level, so that the selection transistors 112 of the pixels 1 in the row to be read are turned on. Subsequently, at time t25 within the exposure period, the FD reset pulse ΦRST which is output to the pixels 1 in the row to be read is changed from an "L" level to an "H" level, so that the FD reset transistors 104 of the pixels 1 in the row to be read are turned on. Thereby, the FDs 103 of the pixels 1 in the row to be read are reset. In addition, a signal (reset signal) based on the potential of one end of the FD 103 after the reset is output from the first amplifying transistor 105, and is output to the vertical signal line 9 through the switching transistor 113 and the selection transistor 112.

Subsequently, at time t26 within the exposure period, the FD reset pulse ΦRST which is output to the pixels 1 in the row to be read is changed from an "H" level to an "L" level, so that the FD reset transistors 104 of the pixels 1 in the row to be read are turned off.

Subsequently, at time t27, the transfer pulse ΦTX which is output to the pixels 1 in the row to be read is changed from an "L" level to an "H" level, so that the transfer transistors 102 of the pixels 1 in the row to be read are turned on. Thereby, the signal charge accumulated in the photoelectric conversion elements 101 of the pixels 1 in the row to be read is transferred to the FD 103 through the transfer transistor 102, and is accumulated in the FD 103. Subsequently, at time t28, the transfer pulse ΦTX which is output to the pixels 1 in the row to be read is changed from an "H" level to an "L" level, the transfer transistors 102 of the pixels 1 in the row to be read are turned off. Thereby, the exposure (accumulation of signal charge) of the pixels 1 in the row to be read is terminated.

At the point in time when the signal charge accumulated in the photoelectric conversion element 101 is transferred to the FD 103, the switching transistor 113 and the selection transistor 112 are turned on. For this reason, a signal (optical signal) based on the potential of one end of the FD 103 in which the signal charge transferred from the photoelectric conversion element 101 is accumulated is output from the first amplifying transistor 105, and is output to the vertical signal line 9 through the switching transistor 113 and the selection transistor 112.

The column processing circuit 4 generates a differential signal obtained by taking the difference between the reset signal based on the potential of one end of the FD 103 after the reset and the optical signal based on of the potential of one end of the FD 103 in which the signal charge transferred from the photoelectric conversion element 101 is accumulated. Since the optical signal includes noise components due to the reset of the FD 103, the column processing circuit 4 generates the differential signal, and thus it is possible to obtain signal components based on the signal charge accumulated in the photoelectric conversion element 101 in which noise components due to the reset of the FD 103 are suppressed.

A signal which is output from the column processing circuit 4 is output to the horizontal signal line 10 by the horizontal reading circuit 5. The output amplifier 6 processes a signal which is output to the horizontal signal line 10, and outputs the signal as a pixel signal from the output terminal 11.

Figure 30:
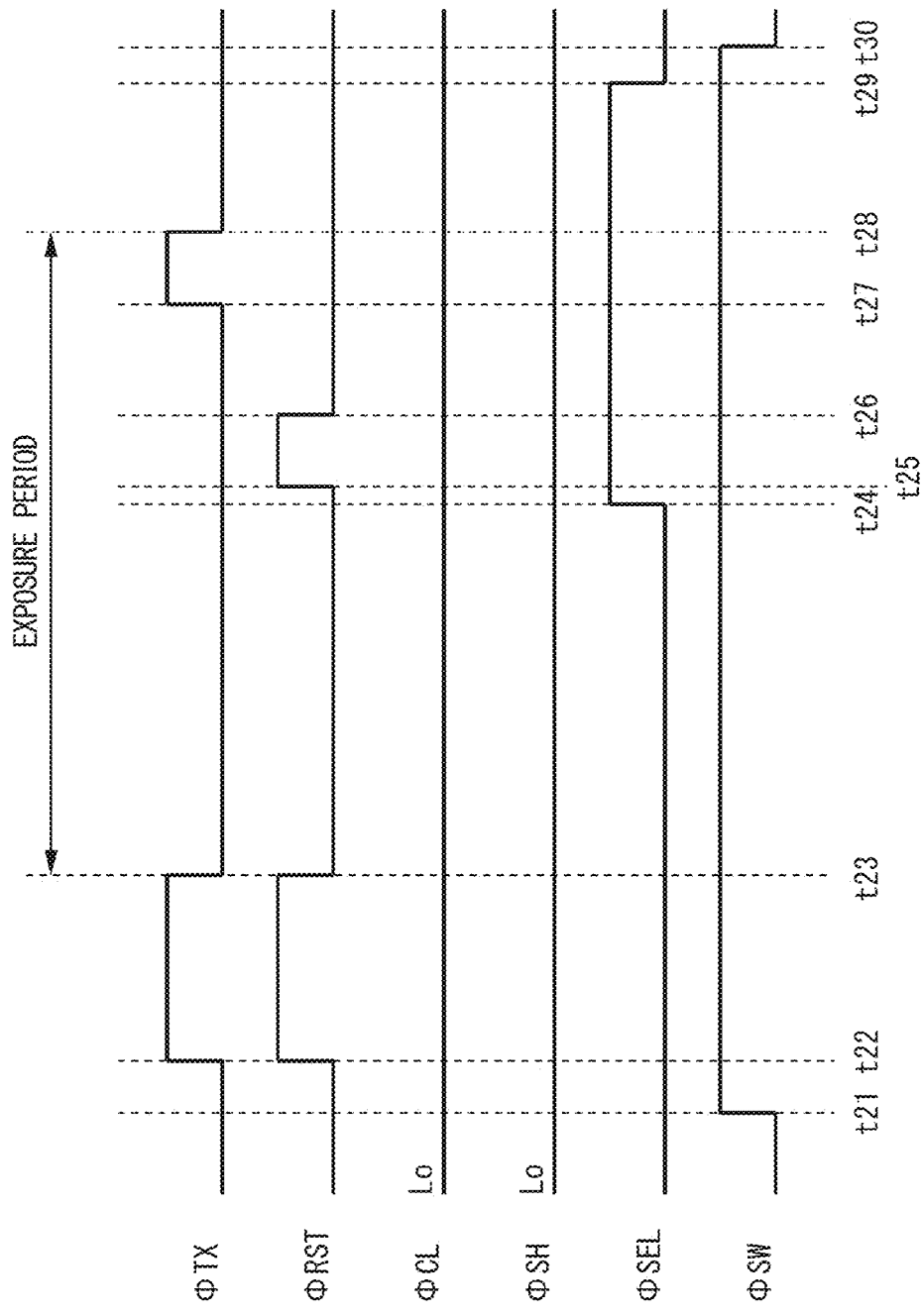
FIG. 30 is a timing diagram illustrating operations of the pixel in the imaging device according to the eighth embodiment of the present invention.

Subsequently, at time t29, the selection pulse ΦSEL which is output to the pixels 1 in the row to be read is changed from an "H" level to an "L" level, so that the selection transistors 112 of the pixels 1 in the row to be read are turned off. Subsequently, at time t30, the switching pulse ΦSW which is output to the pixels 1 in the row to be read is changed from an "H" level to an "L" level, so that the switching transistors 113 of the pixels 1 in the row to be read are turned off. In this way, the reading of signals of the pixels 1 in the row to be read is terminated. In the rolling shutter operation, signals are read from the pixels 1 by the similar operation as the above, while sequentially selecting the row to be read in terms of the operations shown in FIG. 30.

In the global shutter operation, the timing (time t10 in FIG. 30) at which the output of a signal from the pixel 1 is started is different for each row. For this reason, in the row having a late timing at which the output of a signal from the pixel 1 is started, noise is superimposed on the signal charge held by the FD 103, and thus the signal quality (S/N) is deteriorated. On the other hand, in the rolling shutter operation, an optical signal is output from the pixels 1 immediately after the termination of the exposure period with respect to the pixels 1 in any of the rows. For this reason, the influence of noise superimposed on the signal charge held by the FD 103 can be ignored. Therefore, in the rolling shutter operation, a signal is read from the pixel 1 through the second output path, thereby allowing a decrease in the gain to be reduced.

<Operation During Continuous Shooting>

Figure 31:
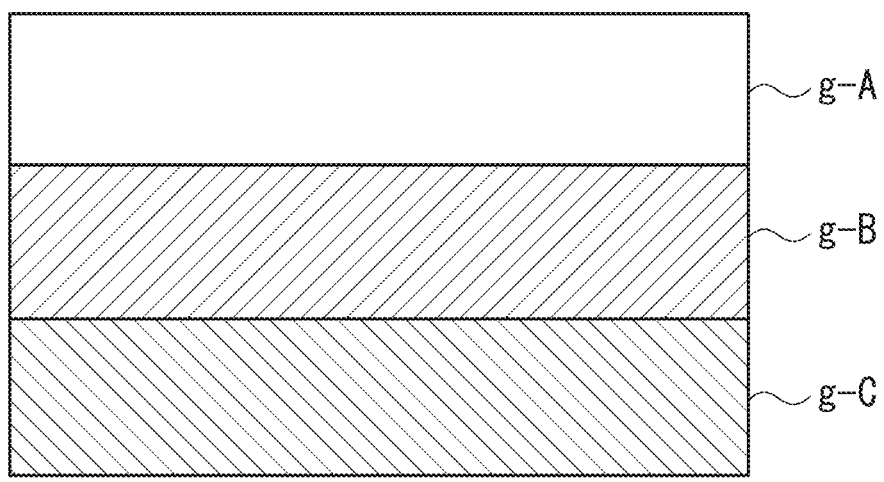
FIG. 31 is a reference diagram illustrating a state where the pixels in the imaging device according to the eighth embodiment of the present invention are classified into three groups.

Operations during continuous shooting will be described in which a still image signal for recording is acquired over a plurality of frames using the global shutter operation while acquiring a moving image signal for live view display using the rolling shutter operation. In the operations during continuous shooting, all the pixels are classified into three groups (read row groups). FIG. 31 shows an example in which all the pixels are classified into three groups. Approximately one third of the pixels 1 on the upper side of all the pixels are classified into a first read row group (g-A). Approximately one third of the pixels 1 on the lower side of all the pixels are classified into a third read row group (g-C). The pixels 1 located between the first read row group and the third read row group are classified into a second read row group (g-B).

In the example shown in FIG. 31, the positions of the pixels 1 in each group are biased toward the regions occupied by all the pixels, but the pixels 1 in each group may be equally distributed. For example, the pixels 1 of the first read row group, the second read row group, and the third read row group may be alternately repeatedly arrayed in row units.

Figure 32:
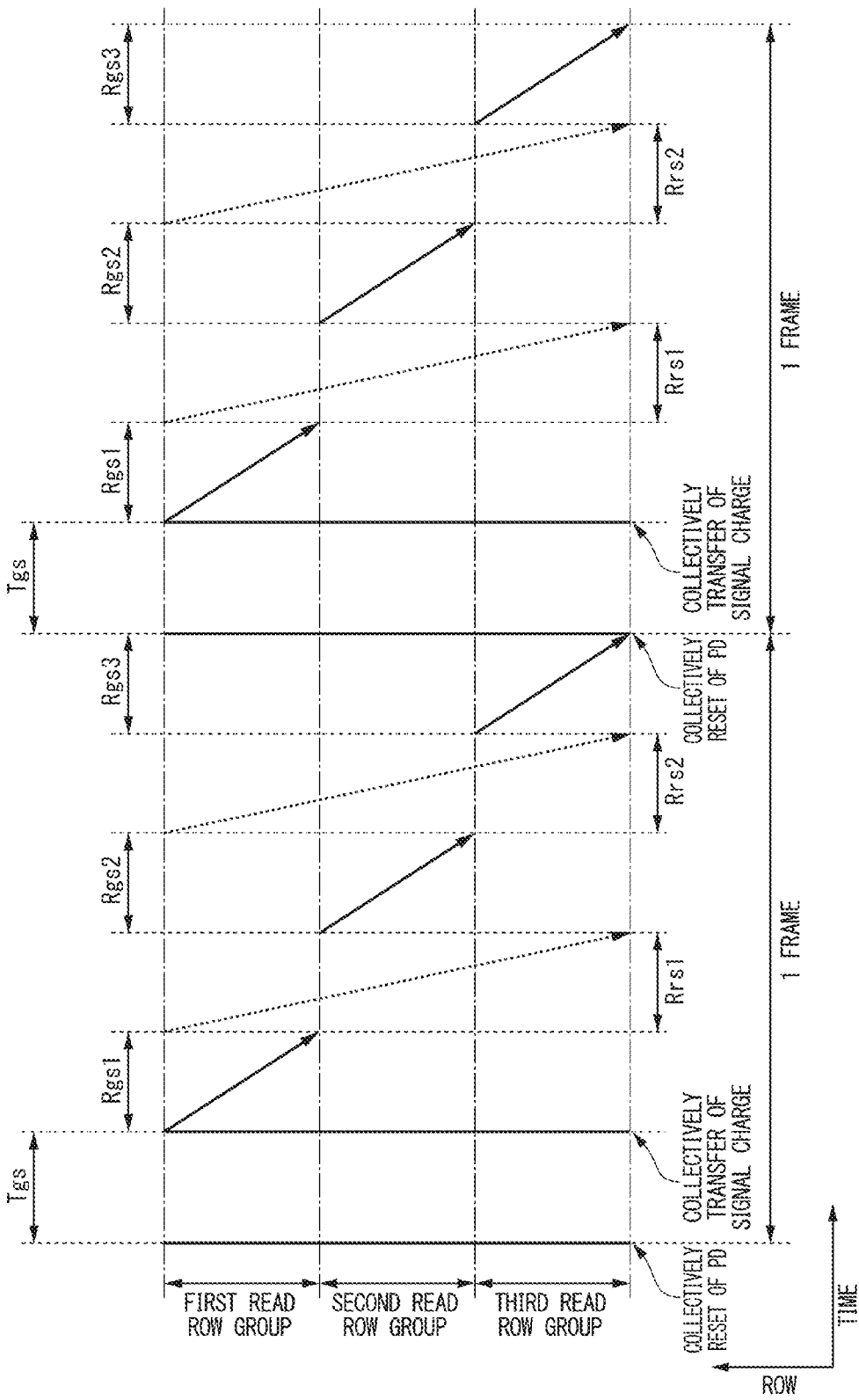
FIG. 32 is a timing diagram illustrating operations of the pixel in the imaging device according to the eighth embodiment of the present invention.

FIG. 32 schematically shows operations during continuous shooting. The vertical direction in FIG. 32 indicates the row position, and the horizontal direction indicates the time. During continuous shooting, exposure is performed collectively in all the pixels, and then a moving image signal is read during the reading of a still image signal for each read row group. The reading of the moving image signal is performed in the pixels 1 obtained by decimating a portion of all the pixels. For example, the moving image signal is read from the pixels 1 at a ratio of one row in three rows.

First, the photoelectric conversion elements 101 of all the pixels are reset (collectively reset of PD), and the exposure of all the pixels is collectively started. Subsequently, when a predetermined exposure period Tgs elapses from the start of the exposure, the signal charge is transferred from the photoelectric conversion elements 101 of all the pixels to the FD 103 (collective transfer of signal charge), and the exposure of all the pixels is collectively terminated. The above-mentioned operations correspond to operations from time t1 of FIG. 6 to time t9.

After the exposure of all the pixels is terminated, an operation of reading a still image signal from the pixels 1 in the first read row group is performed in a reading period Rgs1. The operation in the reading period Rgs1 corresponds to the operation after time t9 of FIG. 6. After the operation of reading the still image signal from the pixels 1 in the first read row group is terminated, an operation of reading a moving image signal from the pixels 1 obtained by excepting a portion of all the pixels is performed in a reading period Rrs1. The operation in the reading period Rrs1 corresponds to the operation of FIG. 7. The second image processing section 203b of the image processing section 203 processes a moving image signal which is output from the imaging section 202 for the purpose of display. The display section 204 displays an image (live view image) on the basis of the moving image signal processed by the second image processing section 203b.

After the operation of reading the moving image signal from the pixels 1 obtained by excepting a portion of all the pixels is terminated, an operation of reading a still image signal from the pixels 1 in the second read row group is performed in a reading period Rgs2. The operation in the reading period Rgs2 corresponds to the operation after time t9 of FIG. 29. After the operation of reading the still image signal from the pixels 1 in the second read row group is terminated, an operation of reading a moving image signal from the pixels 1 obtained by decimating a portion of all the pixels is performed in the reading period Rrs2. The operation in the reading period Rrs2 corresponds to the operation of FIG. 30. The second image processing section 203b of the image processing section 203 processes the moving image signal which is output from the imaging section 202 for the purpose of display. The display section 204 displays an image (live view image) on the basis of the moving image signal processed by the second image processing section 203b.

After the operation of reading the moving image signal from the pixels 1 obtained by decimating a portion of all the pixels is terminated, an operation of reading a still image signal from the pixels 1 in the third read row group is performed in a reading period Rgs3. The operation in the reading period Rgs3 corresponds to the operation after time t9 of FIG. 6. When the operation of reading the still image signal from the pixels 1 in the third read row group is terminated, the operations in one frame are terminated. The first image processing section 203a of the image processing section 203 processes the still image signal which is read from each of the pixels 1 of the first read row group, the second read row group, and the third read row group for the purpose of recording, and records a piece (one frame) of still image data in the memory card 209.

After the operations in one frame are terminated, operations in the next frame are performed similarly to the above. It is possible to read still image signals in a plurality of frames by repeatedly performing the above-mentioned operations in one frame, and to acquire a moving image signal during the reading of the still image signals.

Figure 33:
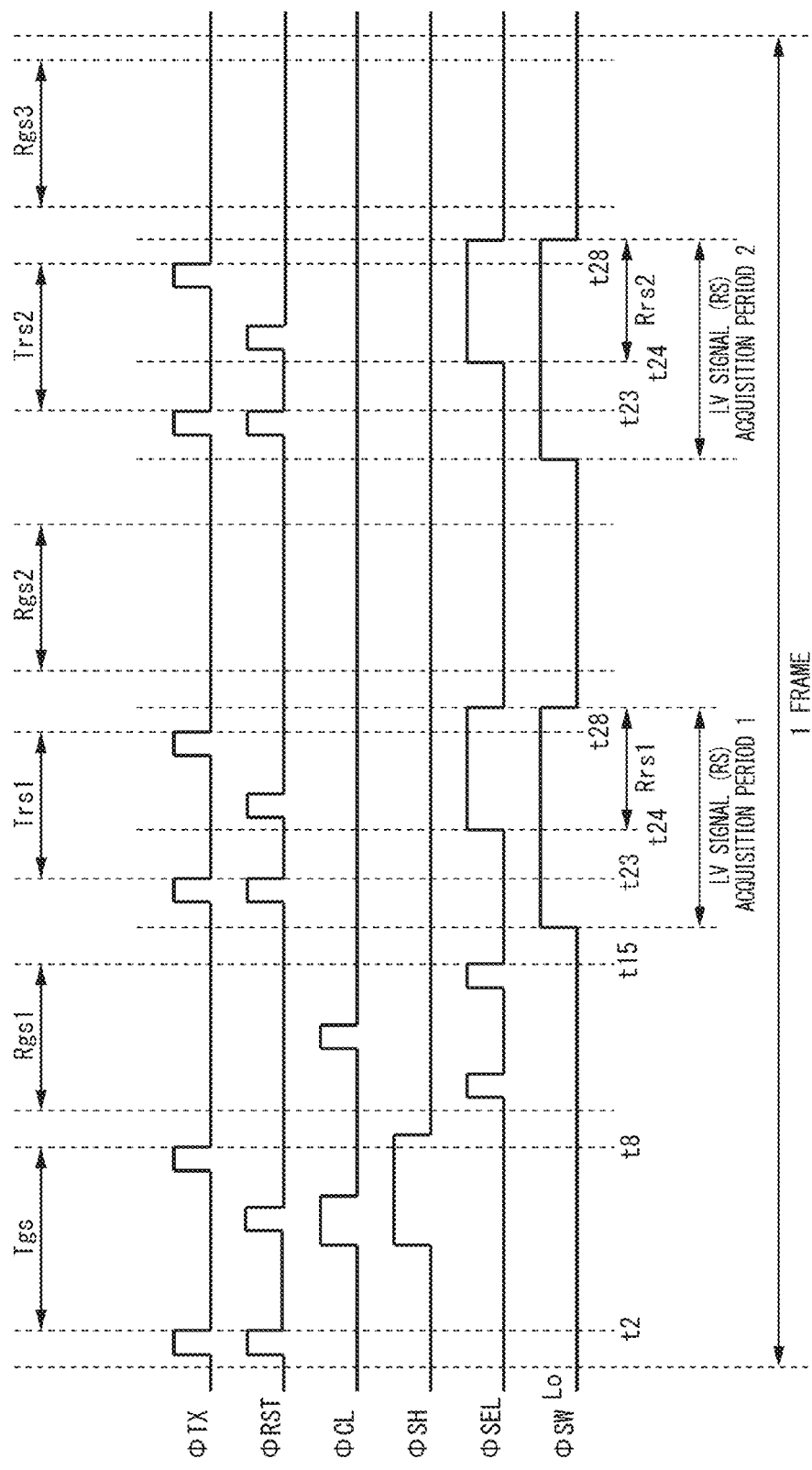
FIG. 33 is a timing diagram illustrating operations of the pixel in the imaging device according to the eighth embodiment of the present invention.
Figure 34:
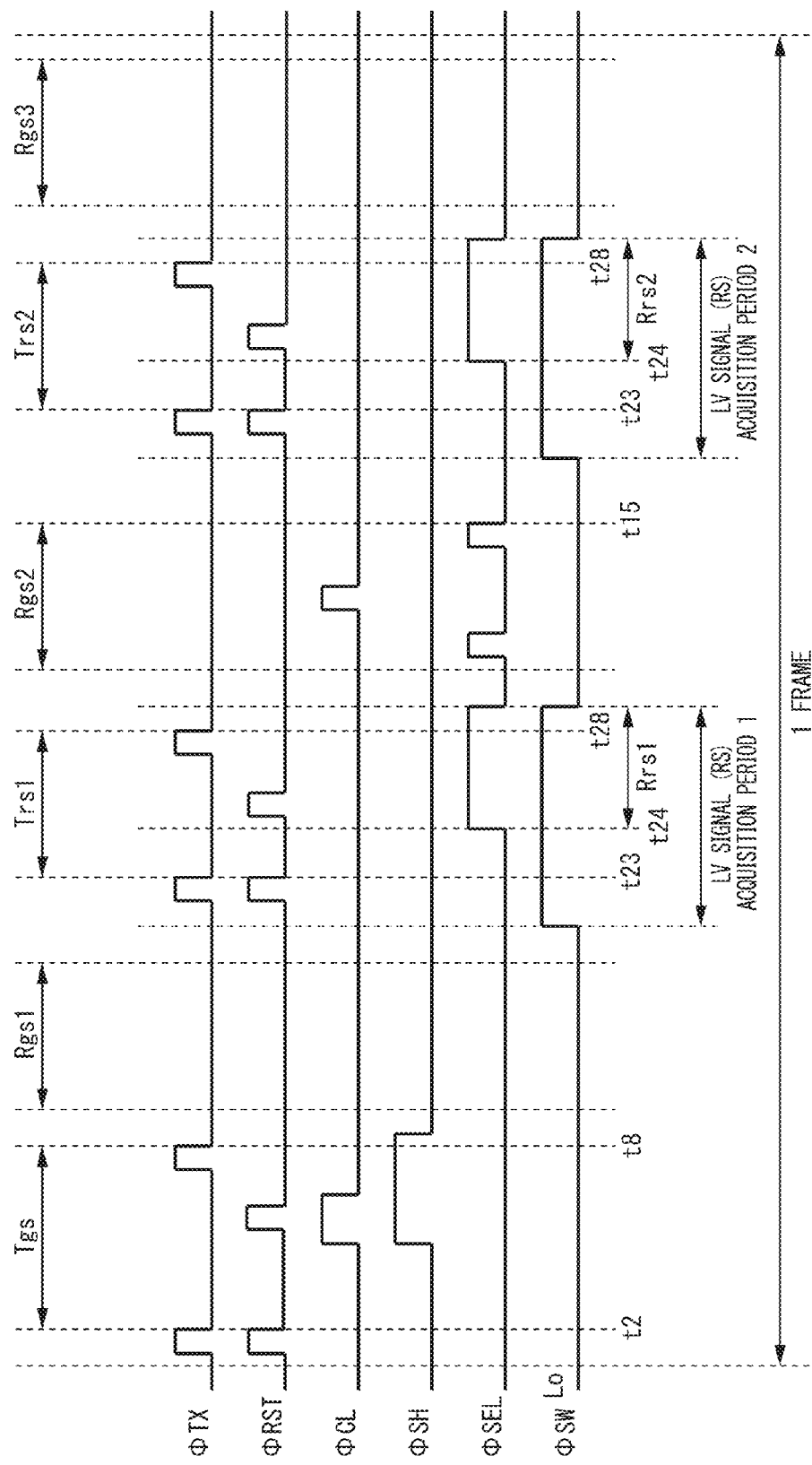
FIG. 34 is a timing diagram illustrating operations of the pixel in the imaging device according to the eighth embodiment of the present invention.
Figure 35:
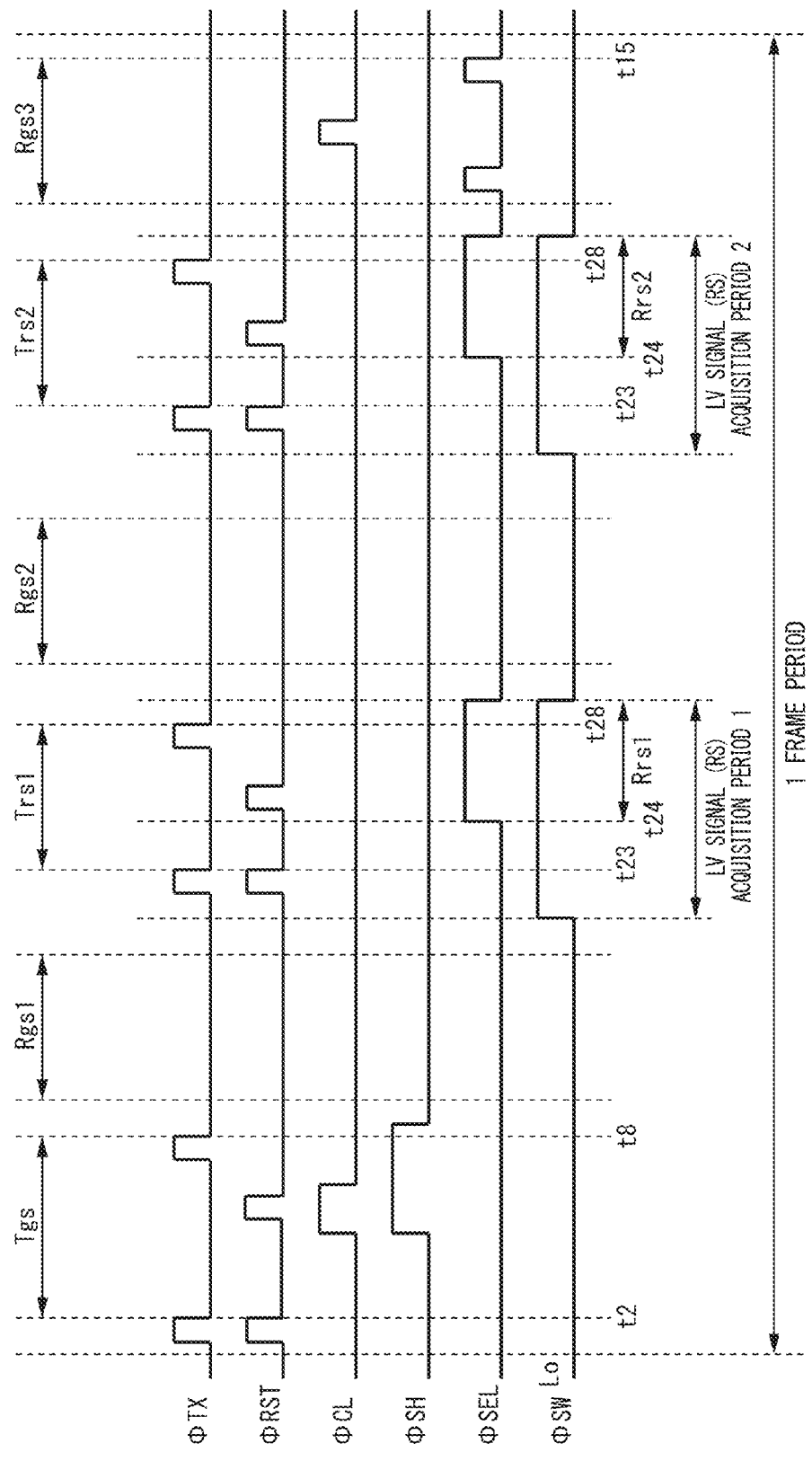
FIG. 35 is a timing diagram illustrating operations of the pixel in the imaging device according to the eighth embodiment of the present invention.

FIGS. 33, 34, and 35 show operations of each of the pixels 1 in the first read row group, the second read row group, and the third read row group in the operations in one frame shown in FIG. 32. FIG. 33 shows operations of the pixels 1 in one row belonging to the first read row group.

The operations until the exposure period Tgs for a still image elapses after the start of the operations in one frame and then the still image signal is read in the reading period Rgs1 correspond to the operations shown in FIG. 29. Times t2, t8, and t15 shown in FIG. 33 correspond to times t2, t8, and t15 shown in FIG. 29, respectively. After the reading of the still image signal is terminated, the moving image signal is read (LV signal (RS) acquisition period 1 of FIG. 33). The signal charge is accumulated in the photoelectric conversion element 101 in an exposure period Trs1 for a moving image, and a reset signal and an optical signal are read in the reading period Rrs1. Times t23, t24, and t28 shown in FIG. 33 correspond to times t23, t24, and t28 shown in FIG. 30, respectively.

After the reading of the moving image signal is terminated and the reading period Rgs2 for reading the still image signal in the second read row group elapses, the moving image signal is read (LV signal (RS) acquisition period 2 of FIG. 33). The signal charge is accumulated in the photoelectric conversion element 101 in an exposure period Trs2 for a moving image, and the reset signal and the optical signal are read in the reading period Rrs2. Times t23, t24, and t28 shown in FIG. 33 correspond to times t23, t24, and t28 of FIG. 30. When the reading of the moving image signal is terminated and the reading period Rgs3 for reading the still image signal in the third read row group elapses, the operations in one frame are terminated.

FIG. 34 shows operations of the pixels 1 in one row belonging to the second read row group. The operations until the exposure period Tgs for a still image elapses after the start of the operations in one frame correspond to the operations shown in FIG. 29. Times t2 and t8 shown in FIG. 34, correspond to times t2 and t8 shown in FIG. 29, respectively. After the exposure period Tgs for a still image is terminated and the reading period Rgs1 for reading the still image signal in the first read row group elapses, the moving image signal is read (LV signal (RS) acquisition period 1 of FIG. 34). The signal charge is accumulated in the photoelectric conversion element 101 in the exposure period Trs1 for a moving image, and the reset signal and the optical signal are read in the reading period Rrs1. Times t23, t24, and t28 shown in FIG. 34 correspond to times t23, t24, and t28 of FIG. 30, respectively.

After the reading of the moving image signal is terminated, the still image signal is read from the pixels 1 in the second read row group in the reading period Rgs2. Time t15 shown in FIG. 34 corresponds to time t15 of FIG. 29. After the reading of the still image signal in the second read row group is terminated, the moving image signal is read (LV signal (RS) acquisition period 2 of FIG. 33). The signal charge is accumulated in the photoelectric conversion element 101 in the exposure period Trs2 for a moving image, and the reset signal and the optical signal are read in the reading period Rrs2. Times t23, t24, and t28 shown in FIG. 33 correspond to times t23, t24, and t28 of FIG. 30, respectively. When the reading of the moving image signal is terminated and the reading period Rgs3 for reading the still image signal in the third read row group elapses, the operations in one frame are terminated.

FIG. 35 shows operations of the pixels 1 in one row belonging to the third read row group. The operations until the exposure period Tgs for a still image elapses after the start of the operations in one frame correspond to the operations shown in FIG. 29. Times t2 and t8 shown in FIG. 35, correspond to times t2 and t8 of FIG. 29, respectively. After the exposure period Tgs for a still image is terminated and the reading period Rgs1 for reading the still image signal in the first read row group elapses, the moving image signal is read (LV signal (RS) acquisition period 1 of FIG. 35). The signal charge is accumulated in the photoelectric conversion element 101 in the exposure period Trs1 for a moving image, and the reset signal and the optical signal are read in the reading period Rrs1. Times t23, t24, and t28 shown in FIG. 35 correspond to times t23, t24, and t28 of FIG. 30, respectively.

After the reading of the moving image signal is terminated and the reading period Rgs2 for reading the still image signal in the second read row group elapses, the moving image signal is read (LV signal (RS) acquisition period 2 of FIG. 33). The signal charge is accumulated in the photoelectric conversion element 101 in the exposure period Trs2 for a moving image, and the reset signal and the optical signal are read in the reading period Rrs2. Times t23, t24, and t28 shown in FIG. 35 correspond to times t23, t24, and t28 of FIG. 30, respectively.

After the reading of the moving image signal is terminated, the still image signal is read from the pixels 1 in the third read row group in the reading period Rgs3. Time t15 shown in FIG. 35 corresponds to time t15 of FIG. 29. When the reading of the still image signal in the third read row group is terminated, the operations in one frame are terminated.

In the present embodiment, the reading of the moving image signal using the rolling shutter operation is capable of being performed in the arbitrary pixels 1. Therefore, for example, an enlarged display is capable of being performed using the moving image signal which is read from only the pixels 1 in an arbitrary block region. In addition, in order to obtain an evaluation value (for example, contrast value of an image) for performing focus control of the lens 201, the moving image signal which is read as mentioned above can also be used.

In the present embodiment, it is possible to select the first output path for outputting a signal based on the signal charge accumulated in the analog memory 110 and the second output path for outputting an amplified signal, which is output from the first amplifying transistor 105 from the pixel 1 without passing through the analog memory 110. The still image signal is output from the pixel 1 through the first output path during the global shutter operation, thereby allowing the deterioration of the signal quality to be reduced. In addition, the moving image signal is output from the pixel 1 through the second output path during the rolling shutter operation, thereby allowing a decrease in a gain to be reduced.

An amplifier circuit (amplifying transistor) according to the present invention corresponds to, for example, the first amplifying transistor 105. A signal accumulation circuit (memory circuit) according to the present invention corresponds to, for example, the analog memory 110. A switching circuit (switch) according to the present invention corresponds to, for example, the switching transistor 113. In addition, a reset circuit according to the present invention corresponds to, for example, the FD reset transistor 104. A noise reduction circuit according to the present invention corresponds to, for example, the clamp capacitor 107 and the sampling transistor 108, and a clamp section (clamp capacitor) according to the present invention corresponds to, for example, the clamp capacitor 107. A sample-and-hold section (transistor) according to the present invention corresponds to, for example, the sampling transistor 108.

In addition, a first reset circuit according to the present invention corresponds to, for example, the transfer transistor 102 and the FD reset transistor 104. A second reset circuit according to the present invention corresponds to, for example, the FD reset transistor 104. A transfer circuit according to the present invention corresponds to, for example, the transfer transistor 102.

In addition, a second amplifier circuit according to the present invention corresponds to, for example, the second amplifying transistor 111, and a third reset circuit according to the present invention corresponds to, for example, the analog memory reset transistor 109, and an output transistor according to the present invention corresponds to, for example, the selection transistor 112, and a differential processing circuit according to the present invention corresponds to, for example, the column processing circuit 4.

The other components are the same as those of the first embodiment, and thus a description thereof will omitted.

Ninth Embodiment

Hereinafter, a ninth embodiment of the present invention will be described with reference to the accompanying drawings. Meanwhile, in the following description, components in common with other embodiments are denoted by the same reference numerals and signs, and a description thereof will be omitted.

Figure 36:
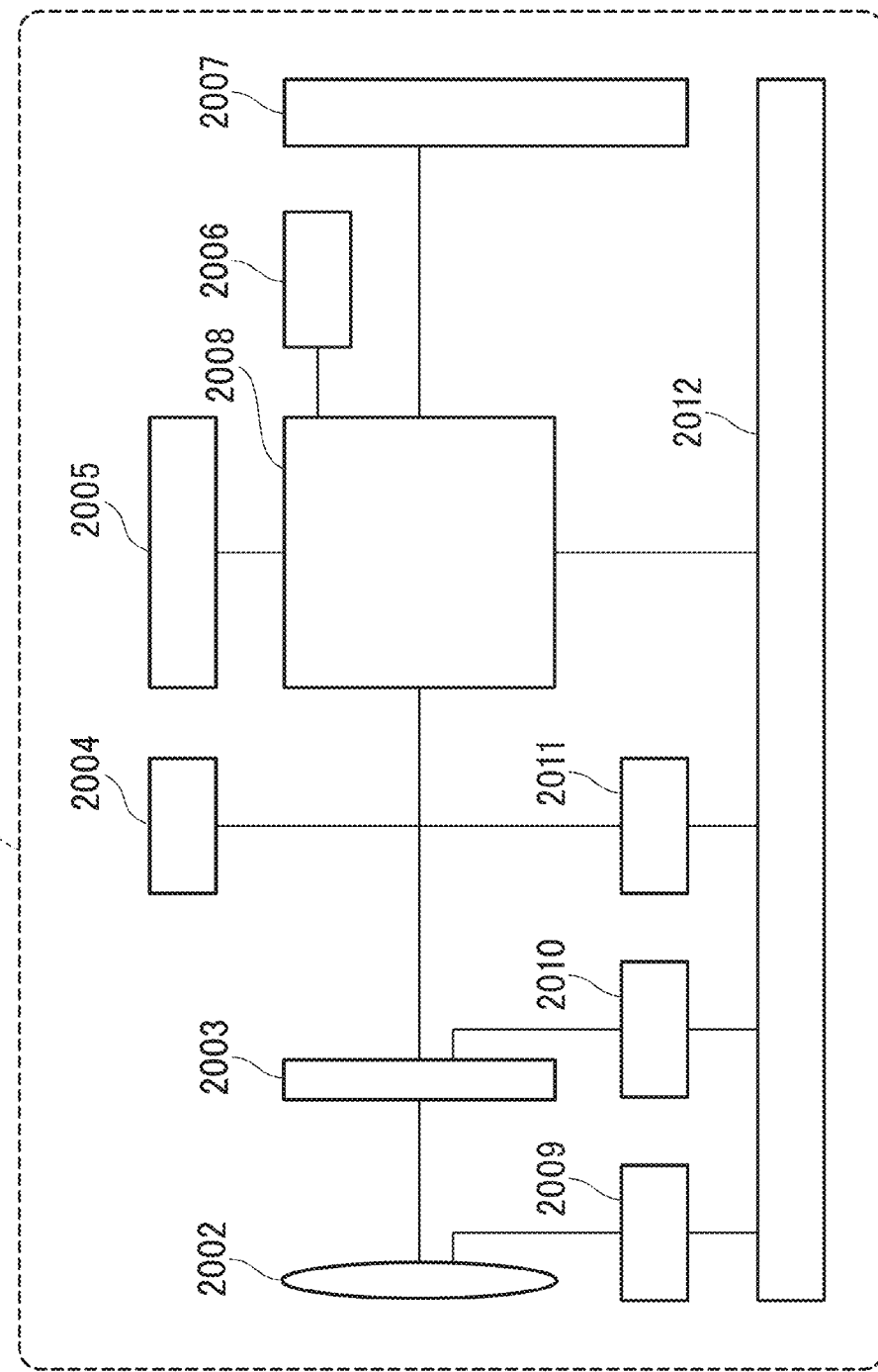
FIG. 36 is a block diagram illustrating a schematic configuration of a digital camera according to a ninth embodiment of the present invention.

FIG. 36 is a block diagram illustrating a schematic configuration of a digital camera (for example, single-lens reflex digital camera) according to the present embodiment. Each component shown herein can be realized by elements including a CPU and a memory of a computer in a hardware manner. In addition, each component shown in FIG. 36 can be realized by a computer program or the like in a software manner. In the present embodiment, the components are depicted as functional blocks realized by cooperation thereof. Therefore, these functional blocks can be realized in various forms by a combination of hardware and software.

A digital camera 2001 shown in FIG. 36 includes a lens unit section 2002, an image sensor 2003, a light-emitting device 2004, a memory 2005, a recording device 2006, a display device 2007, an image signal processing circuit 2008, a lens control device 2009, an image sensor control device 2010, a light-emission control device 2011, and a camera control device 2012. Meanwhile, the digital camera 2001 shown in FIG. 36 is a digital camera in which global exposure for simultaneously exposing all the pixels is performed without mounting a mechanical shutter for light-shielding the image sensor 2003.

The lens unit section 2002 drives and controls zooming, a focus, an aperture diaphragm, and the like using the lens control device 2009, and forms a subject image on the image sensor 2003.

The image sensor 2003 is driven and controlled by the image sensor control device 2010. The image sensor 2003 is a MOS-type solid-state imaging device that converts a subject light incident on the image sensor 3 through the lens unit section 2002 into an image signal. In the following description, that called the image sensor herein means a MOS-type solid-state imaging device. Meanwhile, a detailed description of the image sensor 2003 will be described later.

The light-emitting device 2004 is a device, driven and controlled by the light-emission control device 2011, such as a stroboscope or a flash that hits light emitted from the light-emitting device 4 at a subject to thereby adjust light reflected from the subject.

The image signal processing circuit 2008 performs processes such as the amplification of a signal, the conversion and various types of corrections of image data, and the compression of image data, with respect to an image signal which is output from the image sensor 2003. Meanwhile, the image signal processing circuit 2008 uses the memory 2005 as means for temporarily storing image data in each process.

The recording device 2006 is a removable recording medium such as a semiconductor memory. The recording device 2006 records or reads image data.

The display device 2007 is a display device, such as a liquid crystal, which displays an image, formed in the image sensor 2003, which is based on image data processed by the image signal processing circuit 2008 or image data read from the recording device 2006.

The camera control device 2012 is a control device that controls the entire digital camera 2001. In addition, the camera control device 2012 cooperatively controls the image sensor 2003 and the light-emitting device 2004 by controlling the image sensor control device 2010 and the light-emission control device 2011.

Figure 37:
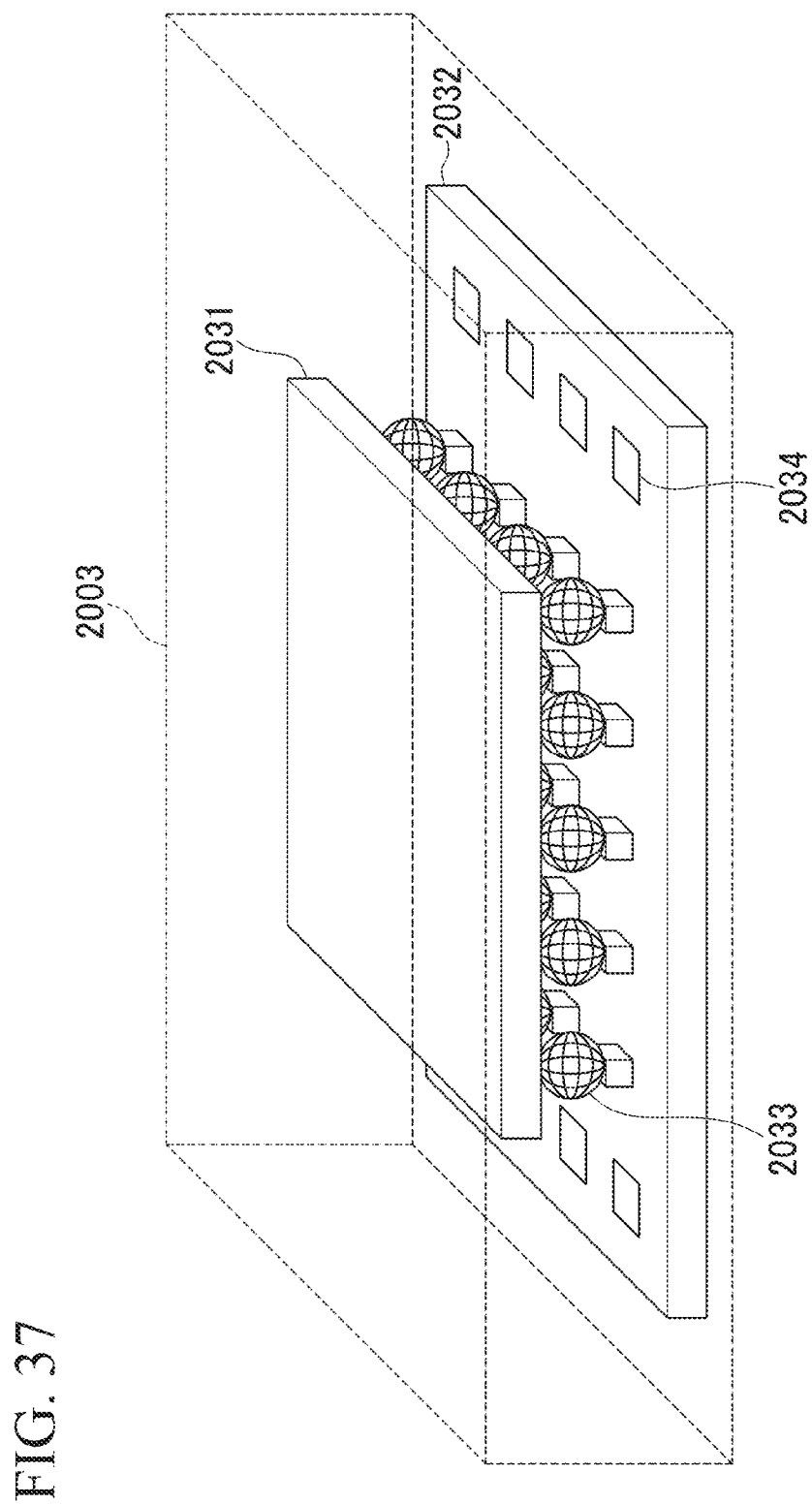
FIG. 37 is an overview diagram illustrating a schematic configuration of an image sensor according to the ninth embodiment of the present invention.

Next, the image sensor 2003 according to the present embodiment will be described. FIG. 37 is an overview diagram illustrating a schematic configuration of the image sensor 2003 according to the present embodiment. In FIG. 37, the image sensor 2003 includes a pixel chip 2031, a pixel signal processing chip 2032, a chip connection portion 2033, and an external wiring connection portion 2034.

The pixel chip 2031 is a chip in which pixels including a photoelectric conversion section described later are two-dimensionally arrayed, and which converts incident subject light into an electrical signal. The pixel chip 2031 is driven and controlled by a signal transmitted from the pixel signal processing chip 2032. The pixel chip 2031 then transmits the converted electrical signal to the pixel signal processing chip 2032.

The pixel signal processing chip 2032 is a chip that temporarily stores the electrical signal transmitted from the pixel chip 2031, or performs a process such as a simple arithmetic operation on the electrical signal. In addition, the pixel signal processing chip 2032 transmits a signal for driving and controlling the pixel chip 2031 to the pixel chip 2031.

The chip connection portion 2033 is a connection portion for electrically connecting the pixel chip 2031 and the pixel signal processing chip 2032. In the chip connection portion 2033, a bump or the like created by, for example, an evaporation method or a plating method is used. An insulating member such as an adhesive may be filled in a space existing between the pixel chip 2031 and the pixel signal processing chip 2032. The pixel chip 2031 and pixel signal processing chip 2032 transmit and receive a signal through the chip connection portion 2033.

The external wiring connection portion 2034 is a connection portion for electrically connecting the image sensor 2003 and other blocks. Input and output signals of the image sensor 2003 are transmitted and received to and from other components (blocks) within the digital camera 2001 through the external wiring connection portion 2034. For example, a configuration is considered in which a package (not shown) for protecting the image sensor 2003 and the external wiring connection portion 2034 are connected to each other by wires, and input and output signals of the image sensor 2003 are transmitted and received to and from the outside of the package.

In the image sensor 2003 according to the present embodiment a global exposure for simultaneously exposing all the pixels within the pixel chip 2031 is performed, and an electrical signal obtained by converting incident subject light is transmitted to the pixel signal processing chip 2032. The pixel signal processing chip 2032 then temporarily stores an electrical signal transmitted from the pixel chip 2031, and sequentially outputs the signal from the external wiring connection portion 2034 to the outside of the image sensor 2003.

Figure 38:
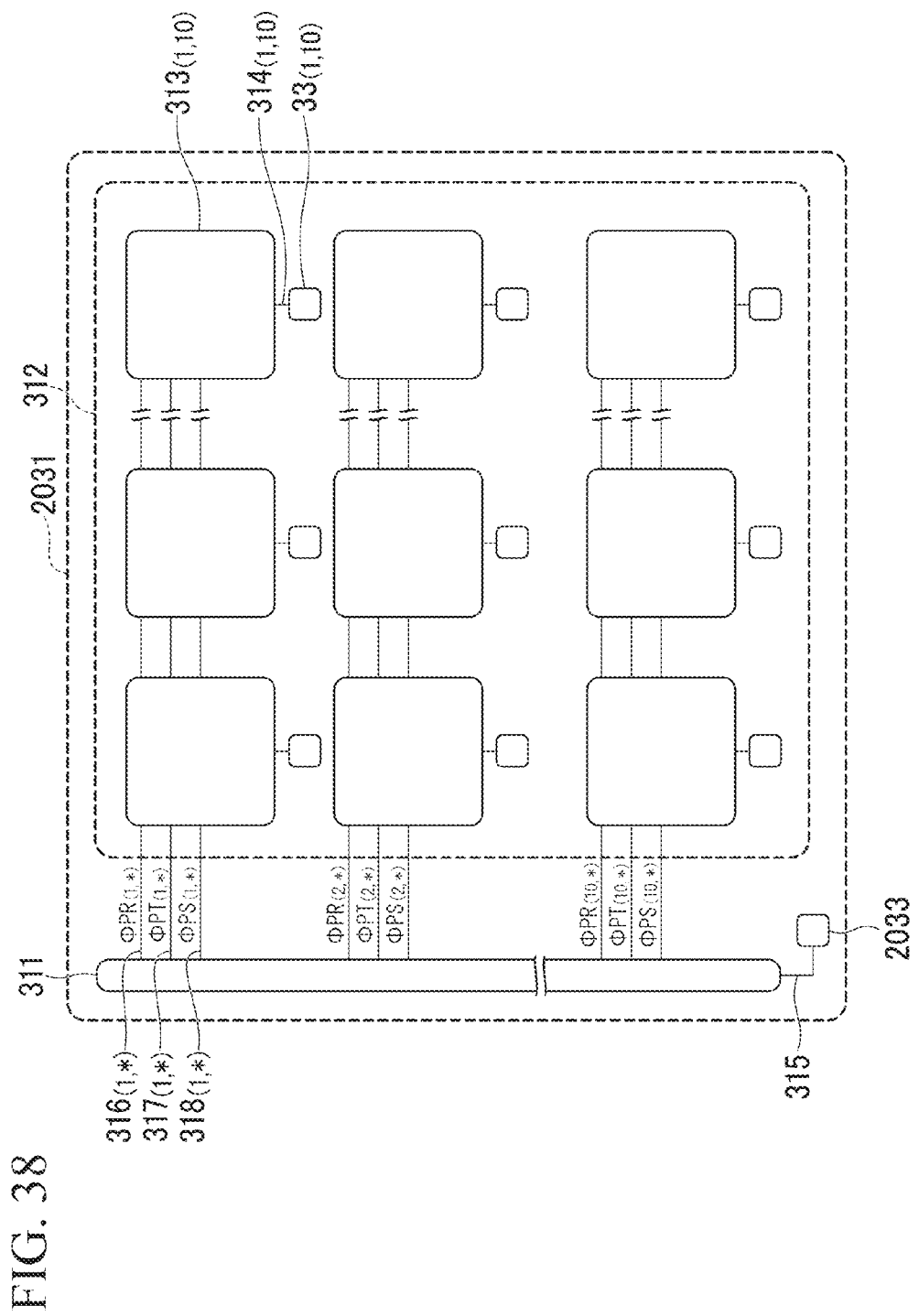
FIG. 38 is a circuit diagram illustrating a schematic configuration of a pixel chip within the image sensor according to the ninth embodiment of the present invention.

Next, the pixel chip 2031 according to the present embodiment will be described. FIG. 38 is a circuit diagram illustrating a schematic configuration of the pixel chip 2031 within the image sensor 2003 according to the present embodiment. In FIG. 38, the pixel chip 2031 includes a pixel chip vertical scanning circuit 311, a pixel array section 312, unit pixels 313, pixel signal lines 314, a pixel chip vertical scanning circuit signal line 315, pixel reset lines 316, pixel transfer lines 317, and pixel selection lines 318. In the pixel chip 2031 shown in FIG. 38, an example of the pixel array section 312 is shown in which a plurality of unit pixels 313 is two-dimensionally disposed in 10 rows by 10 columns. Operations in the reading timing described later are performed using the configuration of the pixel chip 2031.

In the pixel chip 2031 shown in FIG. 38, a numeral and a symbol within "parentheses ( )" indicated after each sign indicates the row number and the column number corresponding to the unit pixel 313 disposed within the pixel chip 2031. An initial numeral within "parentheses ( )" indicates the row number, and a final numeral indicates the column number. For example, the unit pixel 313 in the second row and the third column is denoted by the unit pixel 313 (2, 3). In addition, when only either the row number or the column number, that is, the same row number or column number is indicated, the same row number or column number is denoted by a numeral, and the row number or the column number which is not the same is denoted by an "asterisk *". For example, the pixel reset line 316 in the third row is denoted by the pixel reset line 316 (3,*). In addition, when both the row number and the column number are not specified, "parentheses ( )" after each sign is not denoted.

The pixel chip vertical scanning circuit 311 controls each of the unit pixels 313 within the pixel array section 312, and outputs a pixel signal of each unit pixel 313 to the pixel signal line 314. The pixel chip vertical scanning circuit 311 outputs a control signal for controlling the unit pixel 313 to the control signal lines (pixel reset line 316, pixel transfer line 317, and pixel selection line 318) for each row of the unit pixels 313 disposed in the pixel array section 312.

Each of the unit pixels 313 within the pixel array section 312 outputs a reset signal at the time of the reset and an electrical signal based on the amount of light received of the incident subject light to the pixel signal line 314 as a pixel signal.

The pixel signal line 314 and the pixel chip vertical scanning circuit signal line 315 are connected to the pixel signal processing chip 2032 through the chip connection portion 2033. The pixel chip 2031 and the pixel signal processing chip 2032 transmit and receive various types of signals required to drive and control the pixel chip 2031 and the pixel signal which is output by each of the unit pixels 313 within the pixel chip 2031, through the pixel signal line 314 and the pixel chip vertical scanning circuit signal line 315.

Figure 39:
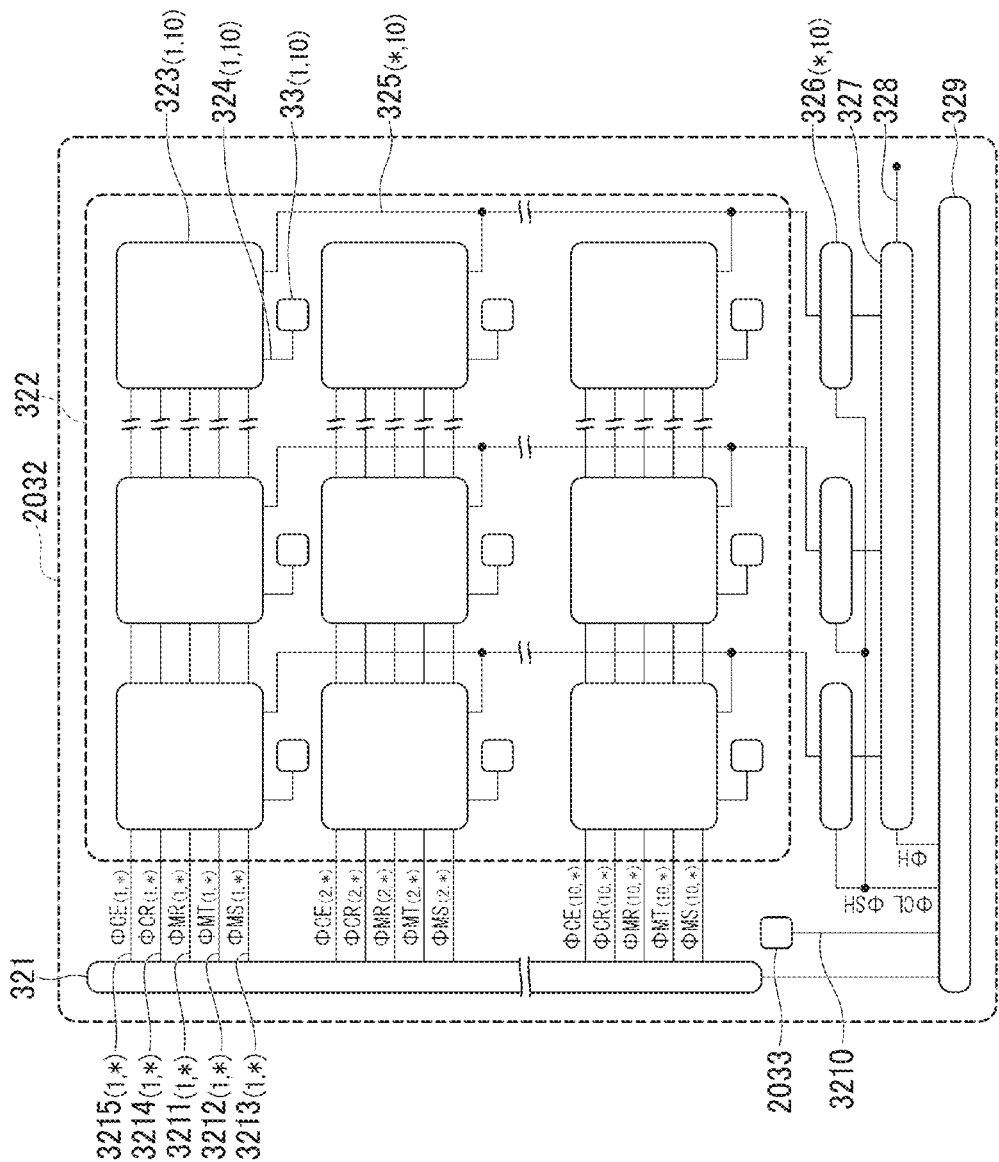
FIG. 39 is a circuit diagram illustrating a schematic configuration of a pixel signal processing chip within the image sensor according to the ninth embodiment of the present invention.

Next, the pixel signal processing chip 2032 according to the present embodiment will be described. FIG. 39 is a circuit diagram illustrating a schematic configuration of the pixel signal processing chip 2032 within the image sensor 2003 according to the present embodiment. In FIG. 39, the pixel signal processing chip 2032 includes a pixel signal processing chip vertical scanning circuit 321, a pixel memory array section 322, unit pixel memories 323, pixel memory signal lines 324, pixel signal processing chip vertical signal lines 325, pixel signal processing chip column processing circuits 326, a pixel signal processing chip horizontal scanning circuit 327, a pixel signal processing chip horizontal scanning circuit signal line 328, an image sensor control circuit 329, an image sensor control circuit signal line 3210, pixel memory reset lines 3211, pixel memory transfer lines 3212, pixel memory selection lines 3213, clip reference lines 3214, and clip enable lines 3215. In the pixel signal processing chip 2032 shown in FIG. 39, an example of the pixel memory array section 322 is shown in which a plurality of unit pixel memories 323 is two-dimensionally disposed in 10 rows by 10 columns. Operations of the reading timing described later are performed using the configuration of the pixel signal processing chip 2032.

In the pixel signal processing chip 2032 shown in FIG. 39, a numeral and a symbol within "parentheses ( )" indicated after each sign indicate the row number and the column number corresponding to the unit pixel memory 323 disposed within the pixel signal processing chip 2032, and the way of indication is the same as that of the pixel chip 2031 shown in FIG. 38.

The pixel signal processing chip vertical scanning circuit 321 controls each of the unit pixel memories 323 within the pixel memory array section 322, and outputs a pixel memory signal of each unit pixel memory 323 to the pixel signal processing chip vertical signal line 325. The pixel signal processing chip vertical scanning circuit 321 outputs a control signal for controlling the unit pixel memory 323 to the control signal lines (pixel memory reset line 3211, pixel memory transfer line 3212, pixel memory selection line 3213, clip reference line 3214, and clip enable line 3215) for each row of the unit pixel memories 323 disposed in the pixel memory array section 322.

A pixel signal transmitted from each of the unit pixels 313 within the pixel array section 312 included in the pixel chip 2031 through a chip connection portion 33 to the pixel memory signal line 324 is input to each of the unit pixel memories 323 within the pixel memory array section 322. Each of the unit pixel memories 323 then outputs an electrical signal based on the input pixel signal to the pixel signal processing chip vertical signal line 325 as a pixel memory signal.

The pixel signal processing chip column processing circuit 326 processes a pixel memory signal transmitted from the unit pixel memory 323. In the processing for the pixel memory signal using the pixel signal processing chip column processing circuit 326, the subtraction (differential processing) of a signal described later is performed on the basis of a clamp pulse ΦCL and a sample-and-hold pulse ΦSH which are input from the image sensor control circuit 329. Further, the processing using the pixel signal processing chip column processing circuit 326 includes processing such as the amplification and comparison of a signal. In addition, the pixel signal processing chip column processing circuit 326 includes a current source load connected to the pixel signal processing chip vertical signal line 325.

The pixel signal processing chip horizontal scanning circuit 327 sequentially reads a signal after processing which is output from the pixel signal processing chip column processing circuit 326, on the basis of a horizontal scanning pulse ΦH which is input from the image sensor control circuit 329.

The image sensor control circuit 329 controls the pixel signal processing chip vertical scanning circuit 321, the pixel signal processing chip column processing circuit 326, the pixel signal processing chip horizontal scanning circuit 327, and the pixel chip vertical scanning circuit 311 within the pixel chip 2031.

The pixel memory signal line 324 and the image sensor control circuit signal line 3210 are connected to the pixel chip 2031 through the chip connection portion 2033. The pixel chip 2031 and the pixel signal processing chip 2032 transmit and receive various types of signals required to drive and control the pixel chip 2031 and the pixel signal which is output by each of the unit pixels 313 within the pixel chip 2031, through the pixel memory signal line 324 and the image sensor control circuit signal line 3210.

The image sensor 2003 outputs an image signal of incident subject light through the control using the image sensor control circuit 329, the pixel signal processing chip vertical scanning circuit 321, the pixel signal processing chip column processing circuit 326, the pixel signal processing chip horizontal scanning circuit 327, and the pixel chip vertical scanning circuit 311.

Figure 40:
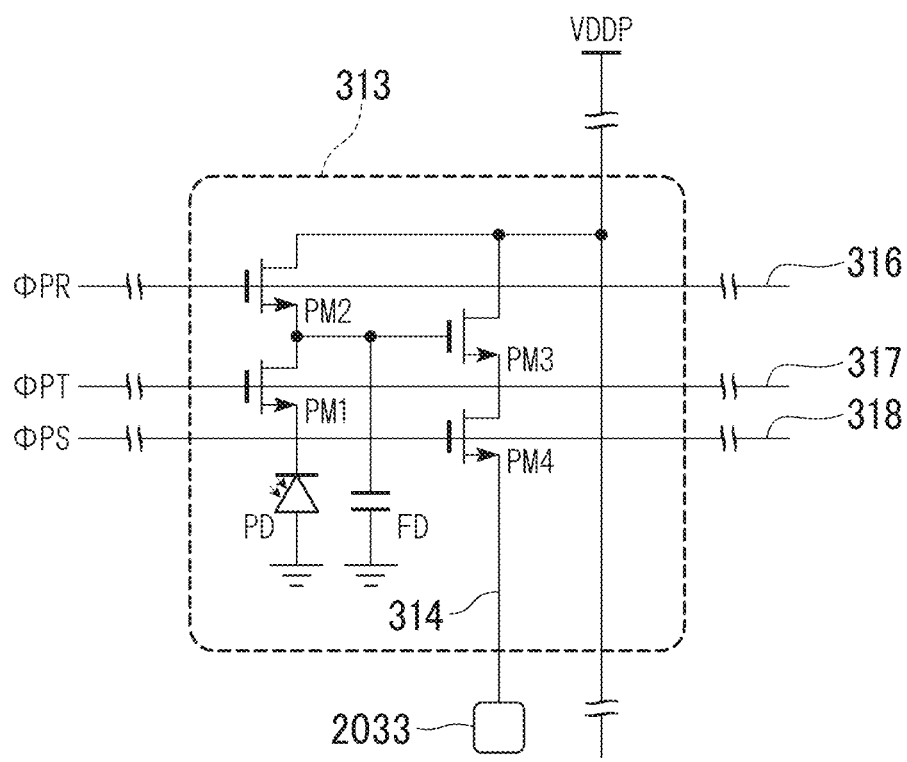
FIG. 40 is a circuit diagram illustrating a schematic configuration of a unit pixel within the pixel chip in the image sensor according to the ninth embodiment of the present invention.

Next, the unit pixel 313 according to the present embodiment will be described. FIG. 40 is a circuit diagram illustrating a schematic configuration of the unit pixel 313 within the pixel chip 2031 included in the image sensor 2003 according to the present embodiment. The unit pixel 313 is a circuit that converts incident light into an electrical signal and outputs the converted signal to the pixel signal line 314. Each of the unit pixels 313 includes a photodiode PD, a pixel charge accumulation section FD, a pixel transfer transistor PM1, a pixel reset transistor PM2, a pixel amplifying transistor PM3, and a pixel selection transistor PM4.

The pixel charge accumulation section FD is a capacitor associated with a node connected to a gate terminal of the pixel amplifying transistor PM3. In the schematic configuration of the unit pixel 313 shown in FIG. 40, the pixel charge accumulation section FD is denoted by a symbol of a capacitor. The schematic configuration of the unit pixel 313 shown in FIG. 40 is the same configuration as a unit pixel of an image sensor in the related art.

The photodiode PD is a photoelectric conversion section that performs a photoelectric conversion on incident light and generates signal charge. The pixel charge accumulation section FD is a capacitor that accumulates signal charge. The pixel transfer transistor PM1 transfers the signal charge generated by the photodiode PD to the pixel charge accumulation section FD connected to the gate terminal of the pixel amplifying transistor PM3, on the basis of a pixel transfer pulse ΦPT which is input from the pixel chip vertical scanning circuit 311. The signal charge transferred by the pixel transfer transistor PM1 is accumulated in the pixel charge accumulation section FD. The pixel amplifying transistor PM3 outputs a voltage based on the signal charge accumulated in the pixel charge accumulation section FD. The pixel reset transistor PM2 resets the pixel charge accumulation section FD to a power supply potential VDDP, on the basis of a pixel reset pulse ΦPR which is input from the pixel chip vertical scanning circuit 311. The pixel selection transistor PM4 outputs the voltage which is output by the pixel amplifying transistor PM3 to the pixel signal line 314 as an output of the unit pixel 313, on the basis of a pixel selection pulse ΦPS which is input from the pixel chip vertical scanning circuit 311. The pixel signal line 314 is connected to the chip connection portion 2033.

Figure 41:
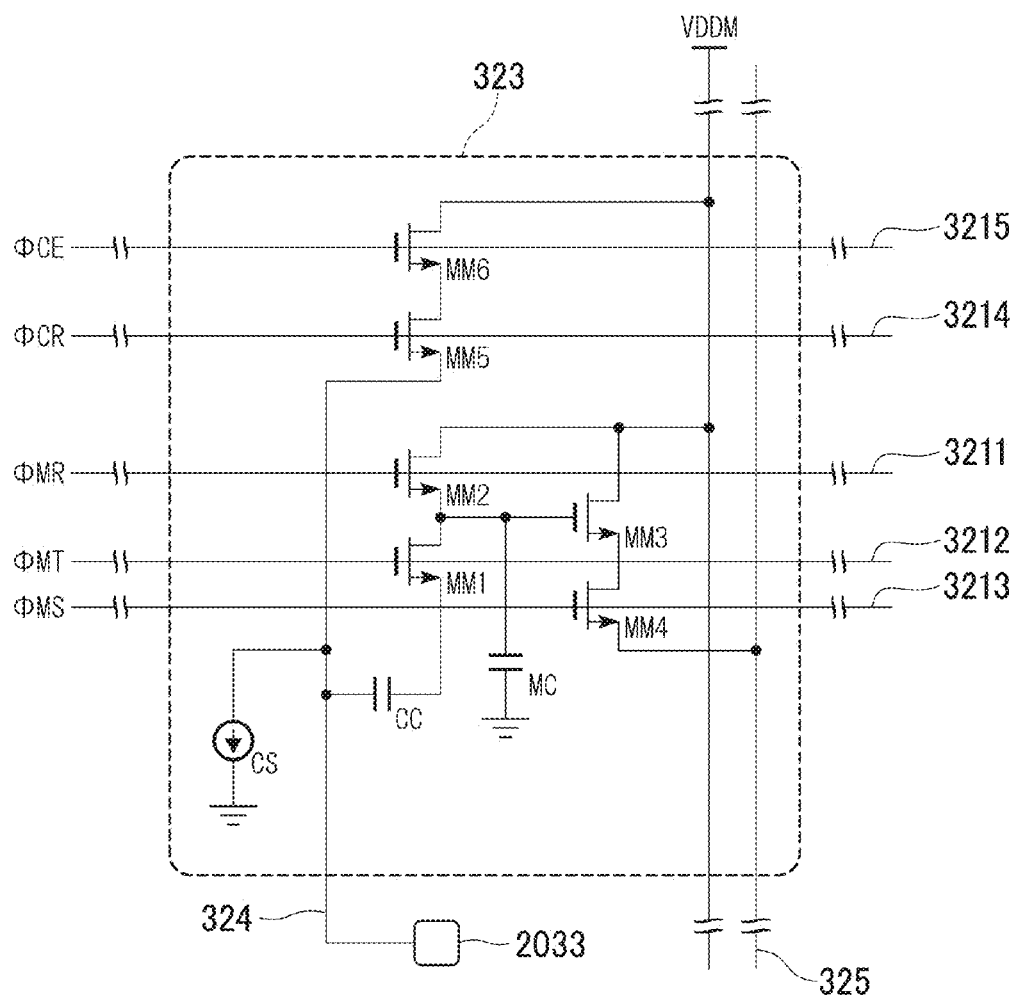
FIG. 41 is a circuit diagram illustrating a schematic configuration of a unit pixel memory within the pixel signal processing chip in the image sensor according to the ninth embodiment of the present invention.

Next, the unit pixel memory 323 according to the present embodiment will be described. FIG. 41 is a circuit diagram illustrating a schematic configuration of the unit pixel memory 323 within the pixel signal processing chip 2032 included in the image sensor 2003 according to the present embodiment. The unit pixel memory 323 is a circuit that holds a signal which inputs from the pixel memory signal line 324 and outputs the signal to the pixel signal processing chip vertical signal line 325. Each of the unit pixel memories 323 includes a pixel memory coupling capacitor CC, a pixel memory charge accumulation section MC, a pixel memory transfer transistor MM1, a pixel memory reset transistor MM2, a pixel memory amplifying transistor MM3, a pixel memory selection transistor MM4, a pixel memory clip reference transistor MINIS, a pixel memory clip enable transistor MM6, and a pixel memory current load CS.

The pixel memory charge accumulation section MC is a capacitor associated with a node connected to a gate terminal of the pixel memory amplifying transistor MM3. In the schematic configuration of the unit pixel memory 323 shown in FIG. 41, the pixel memory charge accumulation section MC is denoted by a symbol of a capacitor.

The pixel memory coupling capacitor CC is a coupling capacitor of which one end is connected to the chip connection portion 2033 and the other end is connected to a source terminal of the pixel memory transfer transistor MM1. The pixel memory charge accumulation section MC is a capacitive load that accumulates signal charge. The pixel memory transfer transistor MM1 transfers signal charge generated in one end of the pixel memory coupling capacitor CC to the pixel memory charge accumulation section MC connected to the gate terminal of the pixel memory amplifying transistor MM3, on the basis of a pixel memory transfer pulse ΦMT which is input from the pixel signal processing chip vertical scanning circuit 321. The signal charge transferred by the pixel memory transfer transistor MM1 is accumulated in the pixel memory charge accumulation section MC. The pixel memory amplifying transistor MM3 outputs a voltage based on the signal charge accumulated in the pixel memory charge accumulation section MC. The pixel memory reset transistor MM2 resets the pixel memory charge accumulation section MC to the power supply potential VDDM, on the basis of a pixel memory reset pulse ΦMR which is input from the pixel signal processing chip vertical scanning circuit 321. The pixel memory selection transistor MM4 outputs the voltage which is output by the pixel memory amplifying transistor MM3 to the pixel signal processing chip vertical signal line 325 as an output of the unit pixel memory 323, on the basis of a pixel memory selection pulse ΦMS which is input from the pixel signal processing chip vertical scanning circuit 321.

The pixel memory clip reference transistor MM5 is connected to the pixel memory signal line 324, and limits a voltage of the pixel memory signal line 324, on the basis of the potential of a pixel memory clip reference pulse ΦCR which is input from the pixel signal processing chip vertical scanning circuit 321. The pixel memory clip enable transistor MM6 is connected to the pixel memory clip reference transistor MM5, and determines the validity or invalidity of a function of the pixel memory clip reference transistor MM5 that limits the voltage of the pixel memory signal line 324, on the basis of a pixel memory clip enable pulse ΦCE which is input from the pixel signal processing chip vertical scanning circuit 321. A black sun effect and a lateral stripe effect due to a pixel on which high-brightness light is incident are suppressed by the pixel memory clip reference transistor MM5 and the pixel memory clip enable transistor MM6.

One end of the pixel memory current load CS is connected to the pixel memory signal line 324, and the other end thereof is connected to a ground of the pixel signal processing chip 2032. The pixel memory current load CS drives the signal line connected to the chip connection portion 2033 with a constant current. The pixel memory signal line 324 is connected to the chip connection portion 2033. Meanwhile, one end of the pixel memory current load CS may be connected to the pixel signal line 314 of the pixel chip 2031, and the other end thereof may be connected to a ground of the pixel chip 2031.

In the image sensor 2003 according to the present embodiment, a global exposure for simultaneously exposing all the unit pixels 313 within the pixel chip 2031 is performed, and a pixel signal based on the signal charge generated in accordance with the incident subject light by the photodiode PD is output to the pixel signal processing chip 2032 through the chip connection portion 2033. The pixel signal processing chip 2032 then temporarily stores a pixel signal which inputs from the pixel chip 2031, performs a process such as differential processing thereon, and sequentially outputs the processed signal. Meanwhile, as shown in FIGS. 37 to 39, in the image sensor 2003, each of the unit pixels 313 within the pixel array section 312 and each of the unit pixel memories 323 within the pixel memory array section 322 are connected to each other through the chip connection portion 2033. That is, the chip connection portion is included for each one pixel. However, the configuration of the image sensor 2003 is not limited to the configuration of the image sensor 2003 shown in FIGS. 37 to 39, but can be a configuration in which the chip connection portion is included for each of pixels of a number set in advance. In this case, after the global exposure is simultaneously performed on all the pixels within the pixel chip, and pixel signals are sequentially outputs in the pixels sharing the chip connection portion.

<Normal Timing>

Next, the driving timing of the image sensor 2003 according to the present embodiment will be described. Meanwhile, the following timing diagram shows timings in the case where the unit pixels 313 and the unit pixel memories 323 in two rows are continuously processed in the configuration of the image sensor 2003 shown in FIGS. 37 to 39. In an actual operation, the row number of the unit pixels 313 and the unit pixel memories 323 continuously processed and the decimation number of the rows of the unit pixels 313 and the unit pixel memories 323 are changed by parameters such as, for example, the number of pixels and the decimation rate in decimation reading of the image sensor 2003. In addition, the timing of each of the control pulses (pixel reset pulse ΦPR, pixel transfer pulse ΦPT, pixel selection pulse ΦPS, pixel memory reset pulse ΦMR, pixel memory transfer pulse ΦMT, pixel memory selection pulse ΦMS, pixel memory clip reference pulse ΦCR, and pixel memory clip enable pulse ΦCE) which are output from the pixel chip vertical scanning circuit 311 and the pixel signal processing chip vertical scanning circuit 321 can be changed depending on driving methods.

In addition, in the following timing diagram, only the control pulses in the first row are denoted for the purpose of facilitating description. In the configuration of the image sensor 2003 according to the present embodiment shown in FIGS. 37 to 39, each of the unit pixels 313 within the pixel array section 312 and each of the unit pixel memories 323 within the pixel memory array section 322 are connected to each other through the chip connection portion 2033. For this reason, for example, when the digital camera 2001 performs a global exposure for simultaneously exposing all the pixels, all the rows are simultaneously controlled by outputting the control pulses from time t1 to time t5, described later, to all the rows of the pixel array section 312 and the pixel memory array section 322. Therefore, in the following description, regarding operations common to all the rows, "parentheses ( )" after each sign are not denoted, but "parentheses ( )" are denoted only when specific control pulses or components are indicated.

In the following timing diagram, a PD-potential $V_{PD}$ indicates a potential due to the signal charge generated by the photodiode PD. An FD-potential $V_{FD}$ indicates a potential of the pixel charge accumulation section FD. A pixel signal line potential $V_{314}$ indicates a potential of the pixel signal line 314. Meanwhile, since the pixel signal line 314 of each unit pixel 313 is connected to the pixel memory signal line 324 of each unit pixel memory 323 through the chip connection portion 2033, the pixel signal line potential $V_{314}$ is also a potential of the pixel memory signal line 324. A pixel memory potential $V_{MC}$ indicates a potential of the pixel memory charge accumulation section MC. The power supply potential VDDP and the power supply potential VDDM indicate power supply potentials of the pixel chip 2031 and the pixel signal processing chip 2032, respectively. An FD reset potential $V_{FDRS}$ indicates a reset potential of the pixel charge accumulation section FD. An FD signal potential $V_{FDSIG}$ indicates a potential of a signal depending on a subject in the pixel charge accumulation section FD. A pixel signal line reset potential $V_{314RS}$ indicates a reset potential of the pixel signal line 314. A pixel signal line signal potential $V_{314SIG}$ indicates a potential of a signal depending on a subject in the pixel signal line 314. A first reference potential VREF1 and a second reference potential VREF2 indicate potentials used for the suppression of a black sun effect and a lateral stripe effect due to high-brightness light described later. A pixel memory reset potential $V_{MCRS}$ indicates a reset potential of the pixel memory charge accumulation section MC. A pixel memory signal potential $V_{MCSIG}$ indicates a potential of a signal depending on a subject in the pixel memory charge accumulation section MC.

Figure 42:
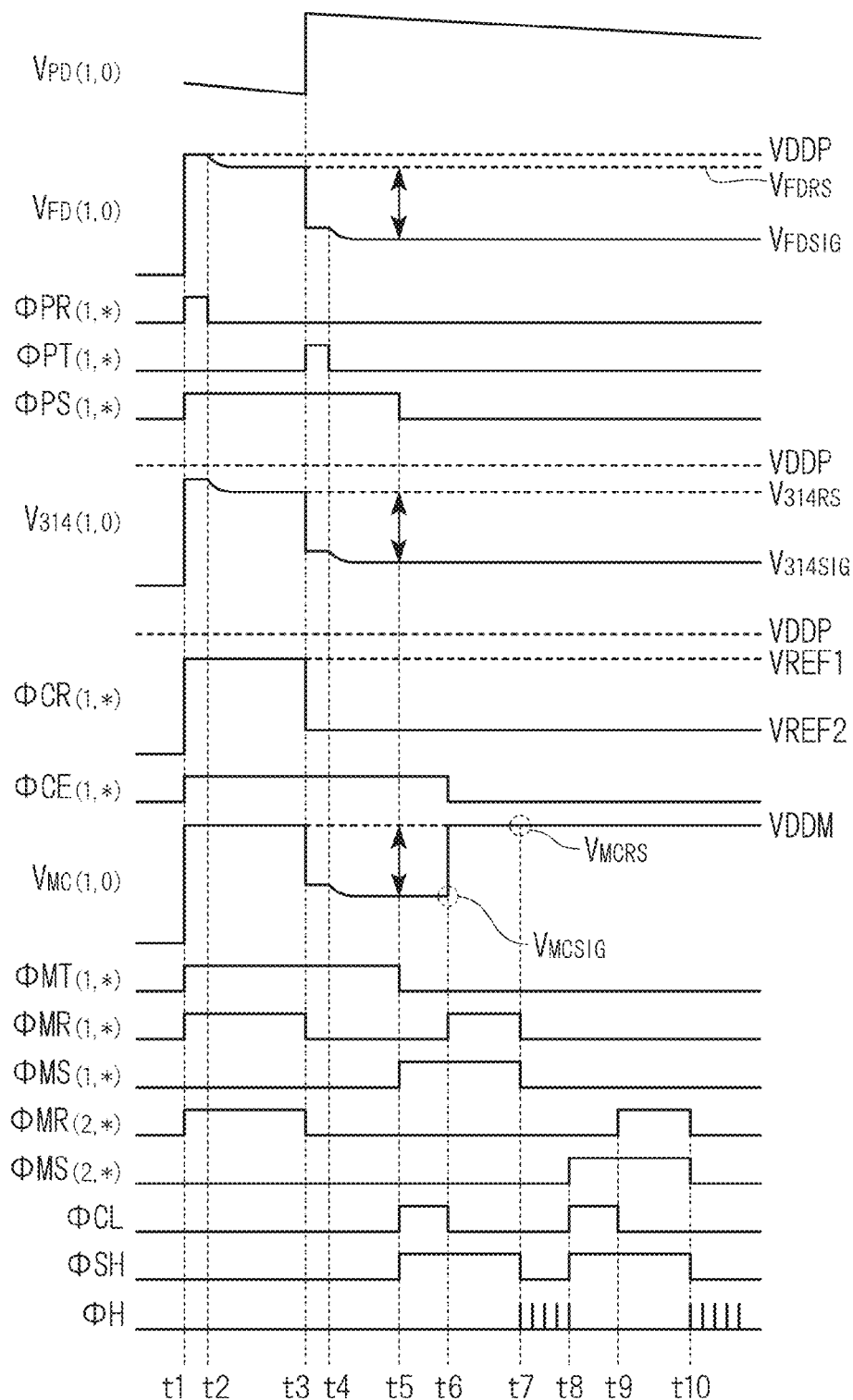
FIG. 42 is a timing diagram illustrating each of driving timing at which high-brightness light is not incident on the image sensor according to the ninth embodiment of the present invention.

First, a description will be made of the driving timing at which high-brightness light is incident on the image sensor 2003, that is, when subject light having a normal level is incident on the image sensor 2003. FIG. 42 is a timing diagram illustrating each driving timing at which high-brightness light is not incident on the image sensor 2003 according to the present embodiment.

At time t1, the pixel chip vertical scanning circuit 311 sets the pixel reset pulse ΦPR to a "High" level, so that the pixel reset transistor PM2 of the unit pixel 313 within the pixel array section 312 is set to be in an ON state. Thereby, the pixel charge accumulation section FD of the unit pixel 313 within the pixel array section 312 is reset, and the FD-potential $V_{FD}$ is changed to a potential of the power supply potential VDDP. In addition, the pixel chip vertical scanning circuit 311 sets the pixel selection pulse ΦPS to a "High" level, so that the pixel selection transistor PM4 of the unit pixel 313 within the pixel array section 312 is set to be in an ON state. Thereby, the pixel signal line potential $V_{314}$ is reset to a potential in the vicinity of the power supply potential VDDP corresponding to the FD-potential $V_{FD}$.

In addition, at time t1, the pixel signal processing chip vertical scanning circuit 321 sets the pixel memory clip reference pulse ΦCR to a level of the first reference potential VREF1, so that the voltage range of the pixel memory signal line 324, that is, the voltage range of the pixel signal line potential $V_{314}$ is limited to a potential corresponding to the first reference potential VREF1. In addition, the pixel signal processing chip vertical scanning circuit 321 sets the pixel memory clip enable pulse ΦCE to a "High" level, so that the pixel memory clip enable transistor MM6 of the unit pixel memory 323 within the pixel memory array section 322 is set to be in an ON state. Thereby, the potential of the pixel memory signal line 324 based on the level of the pixel memory clip reference pulse ΦCR, that is, the clipping function of the pixel signal line potential $V_{314}$ is enabled.

In addition, at time t1, the pixel signal processing chip vertical scanning circuit 321 sets the pixel memory transfer pulse ΦMT to a "High" level, so that the pixel memory transfer transistor MM1 of the unit pixel memory 323 within the pixel memory array section 322 is set to be in an ON state. Thereby, a path from the pixel charge accumulation section FD of the unit pixel 313 within the pixel array section 312 to the pixel memory charge accumulation section MC of the unit pixel memory 323 within the pixel memory array section 322 is allowed to electrically conduct. In addition, the pixel signal processing chip vertical scanning circuit 321 sets the pixel memory reset pulse ΦMR to a "High" level, so that the pixel memory reset transistor MM2 of the unit pixel memory 323 within the pixel memory array section 322 to be in an ON state. Thereby, the pixel memory charge accumulation section MC of the unit pixel memory 323 within the pixel memory array section 322 is reset, and the pixel memory potential $V_{MC}$ is changed to a potential of the power supply potential VDDM.

Subsequently, at time t2, the pixel chip vertical scanning circuit 311 sets the pixel reset pulse ΦPR to a "Low" level, so that the pixel reset transistor PM2 of the unit pixel 313 within the pixel array section 312 is set to be in an OFF state, the reset operation of the FD-potential $V_{FD}$ to a potential of the power supply potential VDDP is terminated. The period (period until time t3 in FIG. 42) in which the FD-potential $V_{FD}$ and the pixel signal line potential $V_{314}$ are stabilized to a reset potential is then started. During the period of the stabilization to the reset potential, the FD-potential $V_{FD}$ and the pixel signal line potential $V_{314}$ drop by a potential equivalent to reset noise of the unit pixel 313. The FD-potential $V_{FD}$ is then stabilizes to a potential of the FD reset potential $V_{FDRS}$, and the pixel signal line potential $V_{314}$ stabilizes to a potential of the pixel signal line reset potential $V_{314RS}$. Meanwhile, the FD reset potential $V_{FDRS}$ and the pixel signal line reset potential $V_{314RS}$ are potentials dropping further by the amount of noise generated in the unit pixel 313 than the power supply potential VDDP.

Subsequently, at time t3, the pixel chip vertical scanning circuit 311 sets the pixel transfer pulse ΦPT to a "High" level, so that the pixel transfer transistor PM1 of the unit pixel 313 within the pixel array section 312 is set to be in an ON state, and the signal charge generated by the photodiode PD is transferred to the pixel charge accumulation section FD. Thereby, the FD-potential $V_{FD}$ is changed to a potential corresponding to the PD-potential $V_{PD}$ at time t3. In this case, since the pixel selection pulse ΦPS is in a "High" level, the pixel signal line potential $V_{314}$ also drops by a potential equivalent to charge corresponding to the signal charge transferred to the pixel charge accumulation section FD.

In addition, at time t3, the pixel signal processing chip vertical scanning circuit 321 sets the pixel memory clip reference pulse ΦCR to a level of the second reference potential VREF2, so that the voltage range of the pixel memory signal line 324, that is, the voltage range of the pixel signal line potential $V_{314}$ is limited to a potential corresponding to the second reference potential VREF2.

In addition, at time t3, the pixel signal processing chip vertical scanning circuit 321 sets the pixel memory reset pulse ΦMR to a "Low" level, so that the pixel memory reset transistor MM2 of the unit pixel memory 323 within the pixel memory array section 322 is set to be in an OFF state, and the reset operation of the pixel memory potential $V_{MC}$ to the power supply potential VDDM is terminated. Thereby, the pixel memory potential $V_{MC}$ is changed to a potential corresponding to the pixel signal line potential $V_{314}$ dropped in accordance with the transfer of the signal charge generated by the photodiode PD to the pixel charge accumulation section FD.

Subsequently, at time t4, the pixel chip vertical scanning circuit 311 sets the pixel transfer pulse ΦPT to a "Low" level, so that the pixel transfer transistor PM1 of the unit pixel 313 within the pixel array section 312 is set to be in an OFF state, and the transfer operation of the signal charge generated by the photodiode PD to the pixel charge accumulation section FD is terminated. The period (period until time t5 in FIG. 42) in which the FD-potential $V_{FD}$ and the pixel signal line potential $V_{314}$ are stabilized to a signal potential is then started. During the period of the stabilization to the signal potential, the FD-potential $V_{FD}$ and the pixel signal line potential $V_{314}$ drop due to an influence of the pixel transfer transistor PM1 being turned OFF. The FD-potential $V_{FD}$ potential $V_{314}$ stabilizes to a potential of the pixel signal line signal potential $V_{314SIG}$. Meanwhile, the FD signal potential $V_{FDSIG}$ and the pixel signal line signal potential $V_{314SIG}$ are potentials depending on parasitic capacitance or the like due to a transmission path of each signal.

At this time, the pixel selection pulse ΦPS and the pixel memory transfer pulse ΦMT are at a "High" level. For this reason, a path from the pixel charge accumulation section FD of the unit pixel 313 within the pixel array section 312 to the pixel memory charge accumulation section MC of the unit pixel memory 323 within the pixel memory array section 322 is allowed to electrically conduct. Therefore, during the period (period until time t5 in FIG. 42) of the stabilization to the signal potential, the pixel memory potential $V_{MC}$ also drops to a potential corresponding to the pixel signal line potential $V_{314}$ dropped depending on parasitic capacitance or the like due to the transmission path. The pixel memory potential $V_{MC}$ then stabilizes to a potential of the pixel memory signal potential $V_{MCSIG}$.

Subsequently, at time t5, the pixel chip vertical scanning circuit 311 sets the pixel selection pulse ΦPS to a "Low" level, so that the pixel selection transistor PM4 of the unit pixel 313 within the pixel array section 312 is set to be in an OFF state. Thereby, the pixel signal line potential $V_{314}$ is changed to a potential which is not dependent on the FD-potential $V_{FD}$.

In addition, at time t5, the pixel signal processing chip vertical scanning circuit 321 sets the pixel memory transfer pulse ΦMT to a "Low" level, so that the pixel memory transfer transistor MM1 of the unit pixel memory 323 within the pixel memory array section 322 is set to be in an OFF state. Thereby, the electrical conduction of the path from the pixel charge accumulation section FD of the unit pixel 313 within the pixel array section 312 to the pixel memory charge accumulation section MC of the unit pixel memory 323 within the pixel memory array section 322 is terminated, that is, the path is blocked.

In addition, the pixel signal processing chip vertical scanning circuit 321 sets the pixel memory selection pulse ΦMS (1, *) to a "High" level, so that the pixel memory selection transistor MM4 of the unit pixel memory 323 in the first row within the pixel memory array section 322 is set to be in an ON state. Thereby, the unit pixel memory 323 in the first row within the pixel memory array section 322 is selected, and a pixel memory signal of a voltage corresponding to the pixel memory potential $V_{MC}$, that is, the pixel memory signal potential $V_{MCSIG}$ is output to the pixel signal processing chip vertical signal line 325 of the selected unit pixel memory 323 in the first row. Meanwhile, herein, the pixel memory signal potential $V_{MCSIG}$ is output as a pixel memory signal to the pixel signal processing chip vertical signal line 325.

In addition, at time t5, the image sensor control circuit 329 sets the clamp pulse ΦCL and the sample-and-hold pulse ΦSH to a "High" level, so that a preparation is performed in which the pixel memory signal potential $V_{MCSIG}$ transmitted from the unit pixel memory 323 in the first row is held by the pixel signal processing chip column processing circuit 326.

Subsequently, at time t6, the image sensor control circuit 329 sets the clamp pulse ΦCL to a "Low" level, so that the pixel memory signal potential $V_{MCSIG}$ transmitted from the unit pixel memory 323 in the first row is clamped (held) by the pixel signal processing chip column processing circuit 326.

In addition, at time t6, the pixel signal processing chip vertical scanning circuit 321 sets the pixel memory clip enable pulse ΦCE to a "Low" level, so that the pixel memory clip enable transistor MM6, of the unit pixel memory 323 within the pixel memory array section 322, is set to be in an OFF state, and the clipping function of the potential of the pixel memory signal line 324 based on the level of the pixel memory clip reference pulse ΦCR is disabled.

In addition, at time t6, the pixel signal processing chip vertical scanning circuit 321 sets the pixel memory reset pulse ΦMR (1, *) to a "High" level, so that the pixel memory charge accumulation section MC of the unit pixel memory 323 in the first row within the pixel memory array section 322 is reset, and the pixel memory potential $V_{MC}$ is set to the potential of the power supply potential VDDM, that is, the pixel memory reset potential $V_{MCRS}$. The pixel memory reset potential $V_{MCRS}$ is output as a pixel memory signal to the pixel signal processing chip vertical signal line 325.

Subsequently, at time t7, the image sensor control circuit 329 sets the sample-and-hold pulse ΦSH to a "Low" level, so that the pixel memory reset potential $V_{MCRS}$ transmitted from the unit pixel memory 323 in the first row is sampled by pixel signal processing chip column processing circuit 326. Thereby, differential processing between the pixel memory signal potential $V_{MCSIG}$ clamped at time t6 and the pixel memory reset potential $V_{MCRS}$ sampled at time t7 is performed by the pixel signal processing chip column processing circuit 326, and thus it is possible to obtain a pixel memory signal of the unit pixel memory 323 in the first row in which noise is removed. The image sensor control circuit 329 repeatedly inputs a "High" level and a "Low" level of the horizontal scanning pulse ΦH, until time t8, to the pixel signal processing chip horizontal scanning circuit 327, and thus a pixel memory signal after noise removal in each column of the unit pixel memory 323 in the first row within the pixel memory array section 322 is sequentially read from the pixel signal processing chip horizontal scanning circuit signal line 328.

In addition, at time t7, the pixel signal processing chip vertical scanning circuit 321 sets the pixel memory reset pulse ΦMR (1, *) to a "Low" level, and opens a reset state of the pixel memory potential $V_{MC}$ to the pixel memory reset potential $V_{MCRS}$. In addition, the pixel signal processing chip vertical scanning circuit 321 sets the pixel memory selection pulse ΦMS (1, *) to a "Low" level, so that the pixel memory selection transistor MM4 of the unit pixel memory 323 in the first row within the pixel memory array section 322 is set to be in an OFF state, and the unit pixel memory 323 in the first row is de-selected. Thereby, the output of a pixel memory signal to the pixel signal processing chip vertical signal line 325 is stopped.

Subsequently, at time t8, the pixel signal processing chip vertical scanning circuit 321 sets the pixel memory selection pulse ΦMS (2, *) to a "High" level, so that the unit pixel memory 323 in the second row within the pixel memory array section 322 is selected, and a pixel memory signal of a voltage corresponding to the pixel memory signal potential $V_{MCSIG}$ of the unit pixel memory 323 in the second row is output to the pixel signal processing chip vertical signal line 325.

In addition, at time t8, the image sensor control circuit 329 sets the clamp pulse ΦCL and the sample-and-hold pulse ΦSH to a "High" level, so that a preparation is performed in which the pixel memory signal (pixel memory signal potential $V_{MCSIG}$) transmitted from the unit pixel memory 323 in the second row is held by the pixel signal processing chip column processing circuit 326.

Subsequently, at time t9, the image sensor control circuit 329 sets the clamp pulse ΦCL to a "Low" level, so that the pixel memory signal potential $V_{MCSIG}$ transmitted from the unit pixel memory 323 in the second row is clamped (held) by the pixel signal processing chip column processing circuit 326.

In addition, at time t9, the pixel signal processing chip vertical scanning circuit 321 sets the pixel memory reset pulse ΦMR (2, *) to a "High" level, so that the pixel memory signal of a voltage corresponding to the pixel memory reset potential $V_{MCRS}$ of the unit pixel memory 323 in the second row within the pixel memory array section 322 is output to the pixel signal processing chip vertical signal line 325.

Subsequently, at time t10, the image sensor control circuit 329 sets the sample-and-hold pulse ΦSH to a "Low" level, so that the pixel memory reset potential $V_{MCRS}$ transmitted from the unit pixel memory 323 in the second row is sampled by the pixel signal processing chip column processing circuit 326. Thereby, a pixel memory signal of the unit pixel memory 323 in the second row in which noise is removed can be obtained from the pixel signal processing chip column processing circuit 326. After time t10, the image sensor control circuit 329 inputs the horizontal scanning pulse ΦH obtained by repeating a "High" level and a "Low" level to the pixel signal processing chip horizontal scanning circuit 327, and a pixel memory signal after noise removal in each column of the unit pixel memory 323 in the second row within the pixel memory array section 322 is sequentially read from the pixel signal processing chip horizontal scanning circuit signal line 328.

In addition, at time t10, the pixel signal processing chip vertical scanning circuit 321 sets the pixel memory reset pulse ΦMR (2, *) to a "Low" level, so that a reset state of the pixel memory potential $V_{MC}$ to the pixel memory reset potential $V_{MCRS}$ is opened. The circuit sets the pixel memory selection pulse ΦMS (2, *) to a "Low" level, so that the unit pixel memory 323 in the second row is de-selected, and the output of a pixel memory signal to the pixel signal processing chip vertical signal line 325 is stopped.

Thereafter, based on the control similar to that at time t5 to time t8, a pixel memory signal after noise removal is sequentially read from the unit pixel memory 323 in all the rows after the third row to the pixel signal processing chip horizontal scanning circuit signal line 328. In this manner, the image sensor 3 can output an image signal on which noise removal is performed with respect to the pixel signal based on the incident subject light.

<Suppression Timing of Black Sun Effect>

Figure 43:
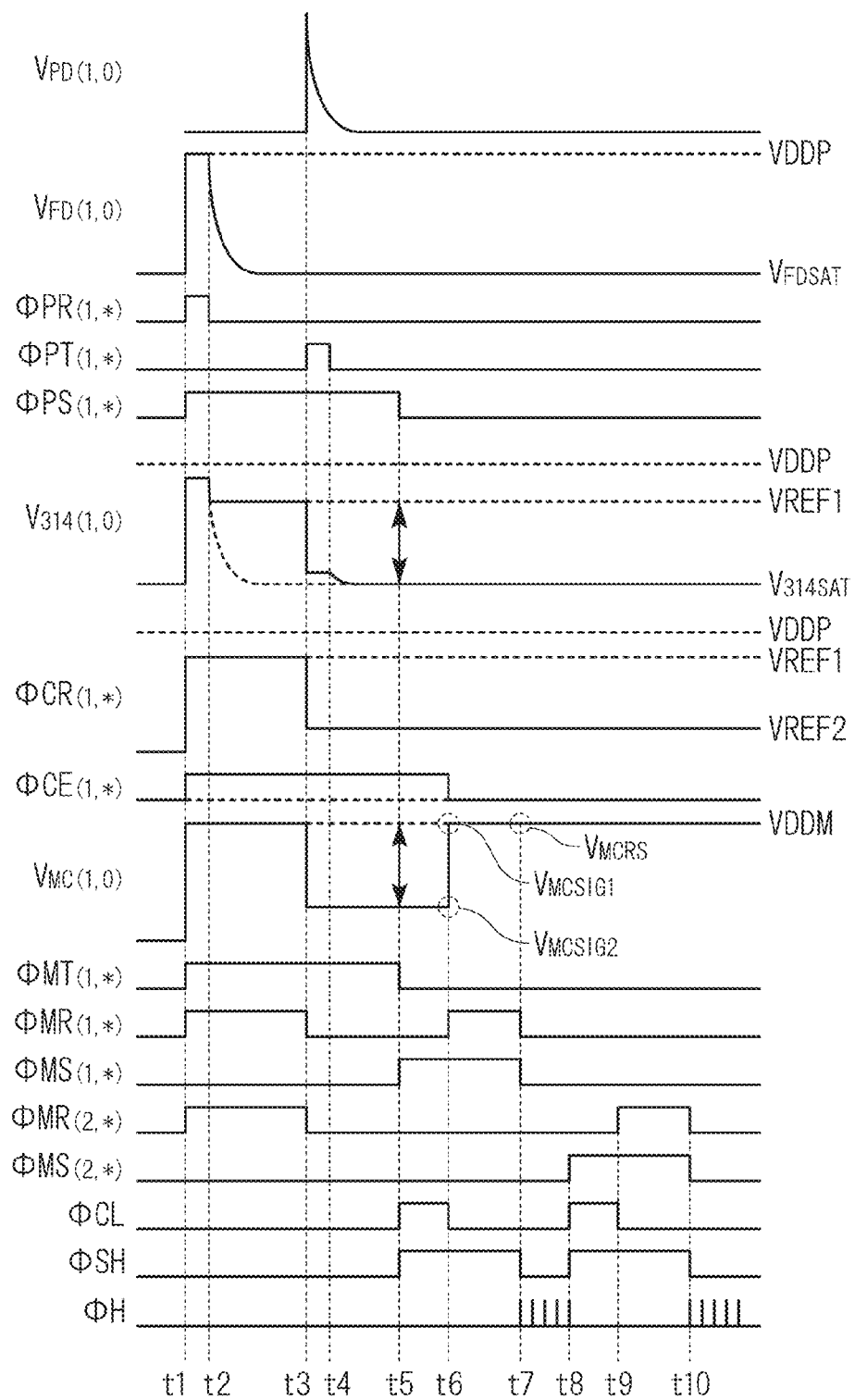
FIG. 43 is a timing diagram illustrating each of driving timing at which the high-brightness light is incident in a reset period of the image sensor according to the ninth embodiment of the present invention.
Figure 44B:
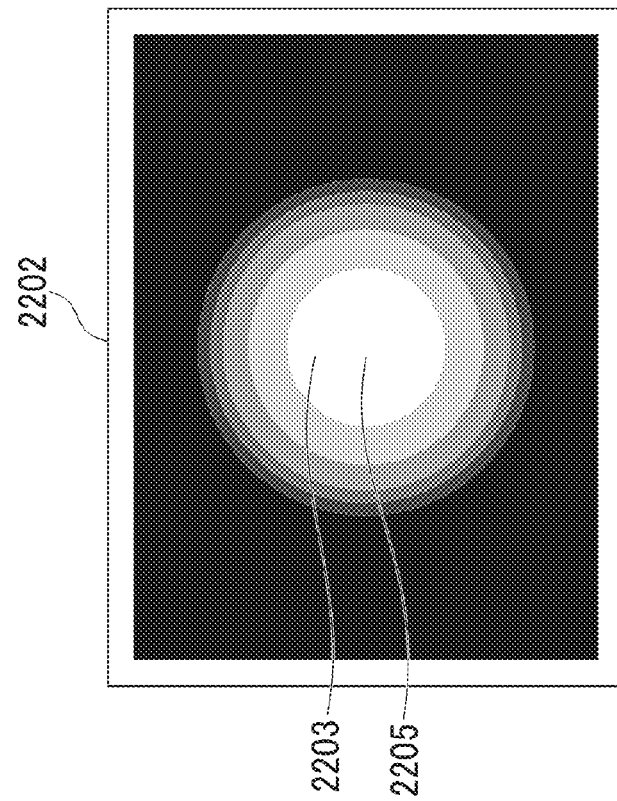
FIG. 44B is a diagram illustrating an effect when the high-brightness light is incident in the reset period of the image sensor according to the ninth embodiment of the present invention.

Next, the driving timing at which high-brightness light is incident in the reset period of the image sensor 2003 will be described. FIG. 43 is a timing diagram illustrating each driving timing at which high-brightness light is incident in the reset period of the image sensor 2003 according to the present embodiment. In addition, FIGS. 44A and 44B are diagrams illustrating an effect when high-brightness light is incident in the reset period of the image sensor 2003 according to the present embodiment.

Normally, in a MOS-type solid-state imaging device, when high-brightness light is incident during the reset period, a black sun effect is generated. In the image sensor 2003 according to the present embodiment, as mentioned above, a black sun effect due to a pixel on which high-brightness light is incident is suppressed by the pixel memory clip reference transistor MM5 and the pixel memory clip enable transistor MM6. In the timing diagram shown in FIG. 43, a potential of each section when the black sun effect is generated is shown by the broken line, and a potential of each section when the black sun effect is suppressed is shown by the solid line. At each driving timing shown in FIG. 43, the image sensor 2003 is controlled similarly to each driving timing shown in FIG. 42. However, since high-brightness light is incident in the reset period of the image sensor 2003, the potentials of signal are different from each other. Therefore, at each driving timing shown in FIG. 43, a detailed description of the same operation as that at each driving timing shown in FIG. 42 will be omitted, and a description will be made focusing on a change in the potential of each signal.

Meanwhile, in the timing diagram shown in FIG. 43, the high-brightness light during the reset period is indicated by the level of the PD-potential $V_{PD}$ until time t3. In addition, in the timing diagram shown in FIG. 43, an FD saturation potential $V_{FDSAT}$ indicates the lowest potential acquired by the pixel charge accumulation section FD. A pixel signal line saturation potential $V_{314SAT}$ indicates the lowest potential acquired by the pixel signal line 314. A pixel memory signal potential $V_{MCSIG1}$ indicates a potential in the pixel memory charge accumulation section MC when the black sun effect arises. A pixel memory signal potential $V_{MCSIG2}$ indicates a potential in the pixel memory charge accumulation section MC when the black sun effect is suppressed using the configuration of the image sensor 2003 according to the present embodiment.

Figure 44A:
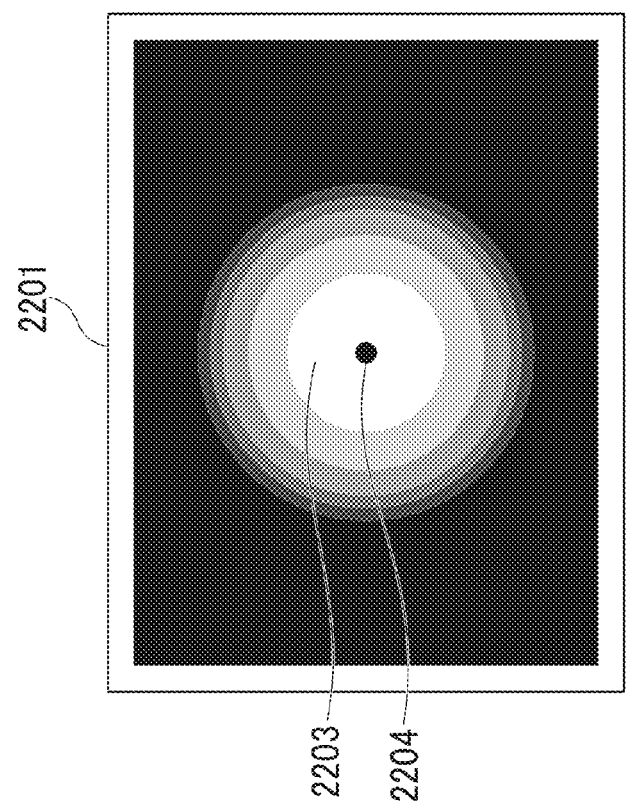
FIG. 44A is a diagram illustrating an effect when the high-brightness light is incident in the reset period of the image sensor according to the ninth embodiment of the present invention.

An image 2201 shown in FIG. 44A indicates an image in which an image of a high-brightness point light source is captured and the black sun effect arises. In an image 2202 shown in FIG. 44B indicates an image in which an image of the high-brightness point light source is captured and the black sun effect is suppressed in the image sensor 2003 according to the present embodiment. In addition, in the image 2201 shown in FIG. 44A and the image 2202 shown in FIG. 44B, image coordinates 2203 are imaged using such high-brightness light that does not cause the black sun effect to arise, but an output of the image sensor 2003 indicates a saturation region. In addition, in the image 2201 shown in FIG. 44A, image coordinates 2204 indicate a region in which a defect due to the black sun effect is generated. In addition, in the image 2202 shown in FIG. 44B, image coordinates 2205 indicate the same region as that of the image coordinates 2204 after the black sun effect is suppressed by the image sensor 2003 according to the present embodiment.

First of all, a description will be made of a case where the black sun effect arises shown by the broken lines in the timing diagram shown in FIG. 43. Meanwhile, in the image sensor 2003 according to the present embodiment, a case where the black sun effect arises similarly to a MOS-type solid-state imaging device in the related art includes a case where the pixel memory clip reference transistor MM5 and the pixel memory clip enable transistor MM6 are not controlled, that is, a case where the pixel memory clip enable pulse ΦCE is set to be in a "Low" level, as shown by the broken lines of FIG. 43, to thereby disable a clipping function.

At time t1, based on the control similar to that at each driving timing shown in FIG. 42, the pixel charge accumulation section FD of the unit pixel 313 within the pixel array section 312 is reset, the FD-potential $V_{FD}$ is changed to a potential of the power supply potential VDDP, and the pixel signal line potential $V_{314}$ is reset to a potential in the vicinity of the power supply potential VDDP corresponding to the FD-potential $V_{FD}$. Meanwhile, the clipping function of the pixel signal line potential $V_{314}$ is disabled. In addition, based on the control similar to that at each driving timing shown in FIG. 42, a path from the pixel charge accumulation section FD of the unit pixel 313 within the pixel array section 312 to the pixel memory charge accumulation section MC of the unit pixel memory 323 within the pixel memory array section 322 is allowed to electrically conduct, and the pixel memory charge accumulation section MC of the unit pixel memory 323 within the pixel memory array section 322 is reset, so that the pixel memory potential $V_{MC}$ is changed to a potential of the power supply potential VDDM.

Subsequently, at time t2, similarly to each driving timing shown in FIG. 42, the pixel chip vertical scanning circuit 311 sets the pixel reset pulse ΦPR to a "Low" level, so that the reset operation of the FD-potential $V_{FD}$ to a potential of the power supply potential VDDP is terminated. At this time, when high-brightness light is incident on the image sensor 2003, as shown in the PD-potential $V_{PD}$, a phenomenon arises in which a large amount of charge is generated in the photodiode PD and the charge generated by the photodiode PD leaks into the pixel charge accumulation section FD, or a phenomenon arises in which light is incident directly on the pixel charge accumulation section FD and thus a large amount of charge is generated in the pixel charge accumulation section FD. When such a phenomenon arises, in the pixel charge accumulation section FD after the pixel reset pulse ΦPR is set to a "Low" level, the potential thereof cannot be maintained to a reset potential, and the FD-potential $V_{FD}$ starts to drop as shown after time t2 of FIG. 43. In addition, in association with a drop in the FD-potential $V_{FD}$, the pixel signal line potential $V_{314}$ also drops as shown by the broken lines after time t2 of FIG. 43.

At time t3, the FD-potential $V_{FD}$ then drops up to the FD saturation potential $V_{FDSAT}$. In addition, the pixel signal line potential $V_{314}$ also drops up to the pixel signal line saturation potential $V_{314SAT}$. At time t3 in a state where the pixel memory clip enable pulse ΦCE is set to a "Low" level, that is, a state where the clipping function is disabled, even when the pixel chip vertical scanning circuit 311 sets the pixel transfer pulse ΦPT to a "High" level, the pixel signal line potential $V_{314}$ does not change. This is because the FD-potential $V_{FD}$ does not change to a potential lower than the FD saturation potential $V_{FDSAT}$.

In addition, at time t3, even when the pixel signal processing chip vertical scanning circuit 321 sets the pixel memory reset pulse ΦMR to a "Low" level, and terminates the reset operation of the pixel memory potential $V_{MC}$ to the power supply potential VDDM, the pixel signal line potential $V_{314}$ does not change, and thus the pixel memory potential $V_{MC}$ also does not change. That is, as shown by the broken lines after time t3 of FIG. 43, the pixel memory potential $V_{MC}$ is changed to the pixel memory signal potential $V_{MCSIG1}$ having the same potential as the pixel memory reset potential $V_{MCRS}$.

Meanwhile, regarding the PD-potential $V_{PD}$, at time t3, the pixel chip vertical scanning circuit 311 sets the pixel transfer pulse ΦPT to a "High" level, so that the signal charge generated by the photodiode PD is transferred to the pixel charge accumulation section FD, and the signal charge temporarily accumulated in the photodiode PD is discharged. However, when high-brightness light is continuously incident, a large amount of charge is generated in the photodiode PD again, and thus the potential changes like the PD-potential $V_{PD}$ after time t3 of FIG. 43.

In such a state, similarly to each driving timing shown in FIG. 42, even when control after time t4 is performed, and the clamping (holding) of the pixel memory signal potential $V_{MCSIG1}$ at time t6 and the sampling of the pixel memory reset potential $V_{MCRS}$ at time t7 are performed, a pixel memory signal after noise removal which is obtained by the differential processing using the pixel signal processing chip column processing circuit 326 is equal to approximately "0". For this reason, in the obtained image, an image having a black sun effect in which the region of the image coordinates 2204 irradiated with the high-brightness light becomes black is captured like the image 2201 shown in FIG. 44A. Meanwhile, the region in which the pixel memory signal after noise removal is equal to "0" is indicated by the image coordinates 2204 shown in FIG. 44A.

Next, a case where the black sun effect shown by the solid lines in the timing diagram shown in FIG. 43 is suppressed will be described. Meanwhile, in the image sensor 2003 according to the present embodiment, a case where the black sun effect is suppressed includes a case where the pixel memory clip reference transistor MM5 and the pixel memory clip enable transistor MM6 are controlled similarly to each driving timing shown in FIG. 42, that is, as shown by the solid lines of FIG. 43, to thereby enable the clipping function. In the suppression of the black sun effect in the image sensor 2003 according to the present embodiment, the pixel memory clip enable pulse ΦCE is set to a "High" level for a predetermined time, and the pixel memory clip reference pulse ΦCR is controlled by a predetermined voltage.

At time t1, based on the control similar to that at each driving timing shown in FIG. 42, the pixel charge accumulation section FD of the unit pixel 313 within the pixel array section 312 is reset, the FD-potential $V_{FD}$ is changed to a potential of the power supply potential VDDP, and the pixel signal line potential $V_{314}$ is reset to a potential in the vicinity of the power supply potential VDDP corresponding to the FD-potential $V_{FD}$. In addition, the clipping function of the pixel signal line potential $V_{314}$ is enabled, and the voltage range of the pixel signal line potential $V_{314}$ is limited to a potential corresponding to the first reference potential VREF1. In addition, a path from the pixel charge accumulation section FD of the unit pixel 313 within the pixel array section 312 to the pixel memory charge accumulation section MC of the unit pixel memory 323 within the pixel memory array section 322 is allowed to electrically conduct, and the pixel memory charge accumulation section MC of the unit pixel memory 323 within the pixel memory array section 322 is reset, so that the pixel memory potential $V_{MC}$ is changed to a potential of the power supply potential VDDM.

Subsequently, at time t2, similarly to each driving timing shown in FIG. 42, the pixel chip vertical scanning circuit 311 sets the pixel reset pulse ΦPR to a "Low" level, so that the reset operation of the FD-potential $V_{FD}$ to a potential of the power supply potential VDDP is terminated. At this time, since the high-brightness light is incident on the image sensor 2003, similarly to the case where the above-mentioned black sun effect arises, a phenomenon arises in which the charge generated by the photodiode PD leaks into the pixel charge accumulation section FD, or a phenomenon arises in which light is incident directly on the pixel charge accumulation section FD and thus a large amount of charge is generated in the pixel charge accumulation section FD. Thereby, at time t3 after the pixel reset pulse ΦPR is set to a "Low" level, similarly to the case where the above-mentioned black sun effect arises, the FD-potential $V_{FD}$ drops up to the FD saturation potential $V_{FDSAT}$.

However, the voltage range of the pixel signal line potential $V_{314}$ is limited to a potential corresponding to the first reference potential VREF1 by the pixel memory clip reference transistor MM5 and the pixel memory clip enable transistor MM6 which are controlled by the pixel memory clip reference pulse ΦCR and the pixel memory clip enable pulse ΦCE. For this reason, the pixel signal line potential $V_{314}$ does not drop in association with the drop in the FD-potential $V_{FD}$, and does not drop to a potential or less corresponding to the first reference potential VREF1 as shown by the solid lines after time t2 of FIG. 43. Therefore, at time t3, when the pixel chip vertical scanning circuit 311 sets the pixel transfer pulse ΦPT to a "High" level, the signal charge generated by the photodiode PD is transferred to the pixel charge accumulation section FD, and the pixel signal line potential $V_{314}$ drops by a potential equivalent to charge corresponding to the signal charge transferred to the pixel charge accumulation section FD from a potential corresponding to the first reference potential VREF1. During the period (period until time t5 in FIG. 43) in which the FD-potential $V_{FD}$ and the pixel signal line potential $V_{314}$ from time t4 are stabilized to a signal potential, the pixel signal line potential $V_{314}$ fluctuates up to the pixel signal line saturation potential $V_{314SAT}$.

In addition, at time t3, the pixel signal processing chip vertical scanning circuit 321 sets the pixel memory clip reference pulse ΦCR to a level of the second reference potential VREF2, so that the voltage range of the pixel signal line potential $V_{314}$ is limited to a potential corresponding to the second reference potential VREF2. For this reason, at time t3, when the pixel signal processing chip vertical scanning circuit 321 sets the pixel memory reset pulse ΦMR to a "Low" level, the pixel memory potential $V_{MC}$ is changed to the pixel memory signal potential $V_{MCSIG2}$ in association with a fluctuation in the potential of the pixel signal line potential $V_{314}$.

In such a state, similarly to each driving timing shown in FIG. 42, control after time t5 is performed, and the clamping (holding) of the pixel memory signal potential $V_{MCSIG2}$ at time t6 and the sampling of the pixel memory reset potential $V_{MCRS}$ at time t7 are performed. Thereby, in the pixel signal processing chip column processing circuit 326, since differential processing between the pixel memory signal potential $V_{MCSIG2}$ clamped at time t6 and the pixel memory reset potential $V_{MCRS}$ sampled at time t7 are performed, a pixel memory signal after noise removal does not become approximately "0", and thus a signal of which the signal amount is close to the amount of saturation signals of the photodiode PD can be obtained. For this reason, in the obtained image, a region of the image coordinates 2205 irradiated with the high-brightness light does not become black like the image 2202 shown in FIG. 44B, an image in which the output of the image sensor 2003 is saturated, that is, the black sun effect is suppressed can be captured similarly to the image coordinates 2203. Meanwhile, a region forming a signal of which the signal amount is close to the amount of saturation signals by the suppression of the black sun effect is indicated by the image coordinates 2205 shown in FIG. 44B.

As mentioned above, in the image sensor 2003 according to the present embodiment, the voltage range of the pixel signal line potential $V_{314}$ during the reset period (period until time t1 to time t3 in FIG. 43) of the image sensor 2003 is limited to a potential corresponding to the first reference potential VREF1 by the pixel memory clip reference transistor MM5 and the pixel memory clip enable transistor MM6. Thereby, even when the high-brightness light is incident in the reset period, it is possible to suppress the black sun effect.

In addition, in the image sensor 2003 according to the present embodiment, the pixel memory clip reference transistor MM5 and the pixel memory clip enable transistor MM6 for suppressing the black sun effect in the solid-state imaging device formed by connecting a plurality of chips to each other is included in the pixel signal processing chip 2032, thereby allowing the suppression of the black sun effect to be realized without reducing the area of the unit pixel 313 within the pixel chip 2031. In the digital camera 2001 to which the image sensor 2003 according to the present embodiment is mounted, it is possible to acquire a satisfactory global exposure-type image having less noise in which the black sun effect due to the high-brightness light is suppressed.

<Suppression Timing of Lateral Stripe Effect>

Figure 47:
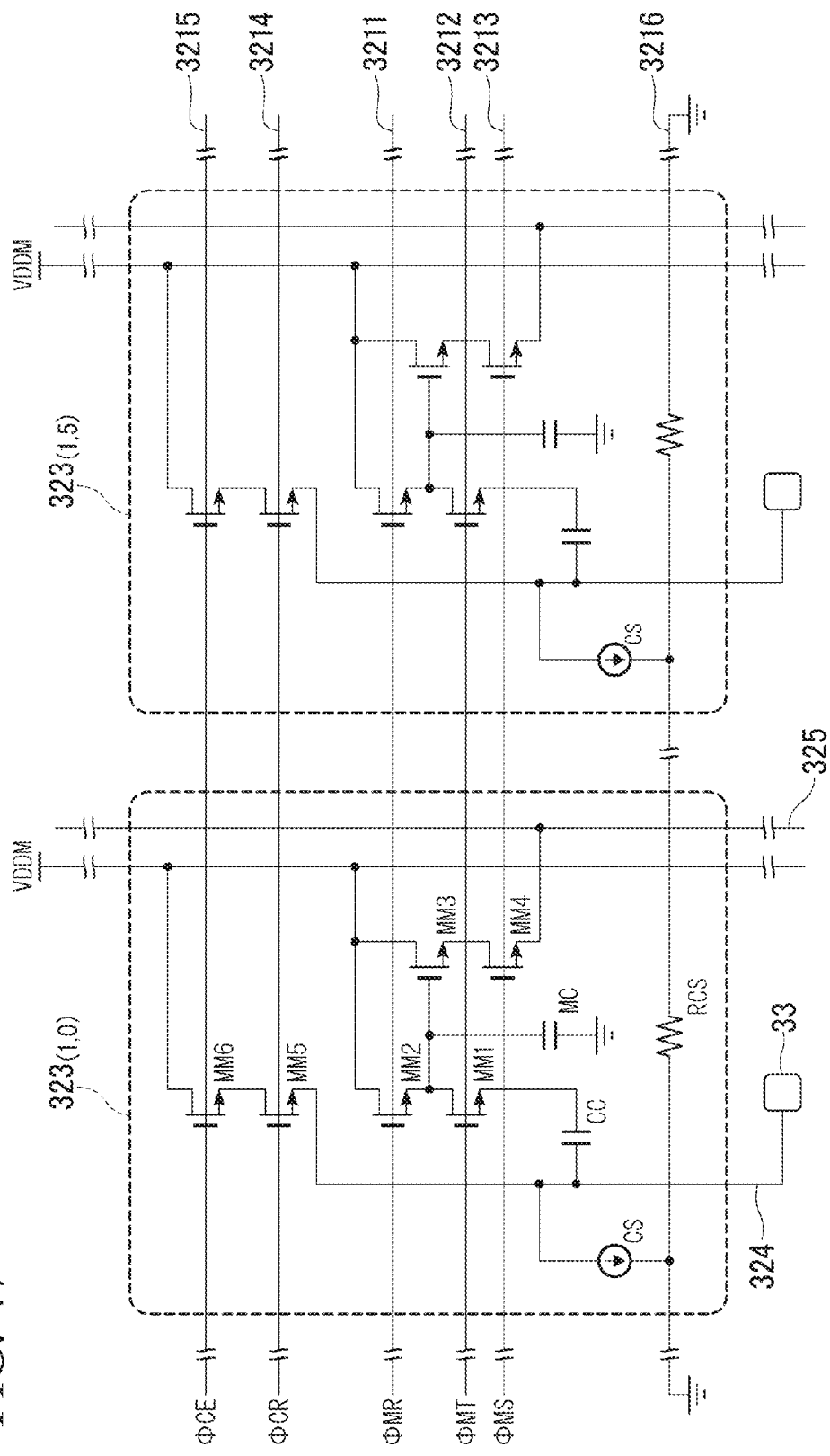
FIG. 47 is a circuit diagram illustrating an example of a schematic configuration of the unit pixel memory within the pixel signal processing chip related with the suppression of a lateral stripe effect due to the high-brightness light in the image sensor according to the ninth embodiment of the present invention.

Next, the driving timing when the high-brightness light is incident in the transfer period of the image sensor 2003 will be described. FIGS. 45A and 45B are timing diagrams illustrating each driving timing when the high-brightness light is incident in the transfer period of the image sensor 2003 according to the present embodiment. In addition, FIGS. 46A and 46B are diagrams illustrating an effect when the high-brightness light is incident in the transfer period of the image sensor 2003 according to the present embodiment. In addition, FIG. 47 is a circuit diagram illustrating an example of a schematic configuration of the unit pixel memory 323 within the pixel signal processing chip 2032 associated with the suppression of a lateral stripe effect due to the high-brightness light in the image sensor 2003 according to the present embodiment.

Normally, in the MOS-type solid-state imaging device, when the high-brightness light is incident during the transfer period, the lateral stripe effect is generated. In the image sensor 2003 according to the present embodiment, as mentioned above, the lateral stripe effect due to a pixel on which the high-brightness light is incident is suppressed by the pixel memory clip reference transistor MM5 and the pixel memory clip enable transistor MM6. In the timing diagrams shown in FIGS. 45A and 45B, a potential of each section when the lateral stripe effect is generated is shown by the broken line, and a potential of each section when the lateral stripe effect is suppressed is shown by the solid line. Meanwhile, at each driving timing shown in FIGS. 45A and 45B, the image sensor 2003 is controlled similarly to each driving timing shown in FIG. 42. However, since the high-brightness light is incident in the transfer period of the image sensor 2003, the potentials of signals are different from each other. Therefore, at the each driving timing shown in FIGS. 45A and 45B, a detailed description of the same operation as that at each driving timing shown in FIG. 42 will be omitted, and a description will be made focusing on a change in the potential of each signal.

An example will be described below in which the high-brightness light which stops short of the occurrence of the black sun effect is incident on the unit pixel 313 (1, 0), and light is barely incident on the unit pixel 313 (1, 5) disposed in the same row as that of the unit pixel 313 (1, 0). In the timing diagrams shown in FIGS. 45A and 45B, the driving timing for the unit pixel 313 (1, 0) is shown in FIG. 45A, and the driving timing for unit pixel 313 (1, 5) is shown in FIG. 45B. In addition, in the timing diagrams shown in FIGS. 45A and 45B, a pixel signal line signal potential $V_{314SIG1}$ indicates a potential in the pixel signal line 314 when the lateral stripe effect arises. A pixel signal line signal potential $V_{314SIG2}$ indicates a potential in the pixel signal line 314 when the lateral stripe effect is suppressed using the configuration of the image sensor 2003 according to the present embodiment. The pixel memory signal potential $V_{MCSIG1}$ indicates a potential in the pixel memory charge accumulation section MC when the lateral stripe effect arises. The pixel memory signal potential $V_{MCSIG2}$ indicates a potential in the pixel memory charge accumulation section MC when the lateral stripe effect is suppressed using the configuration of the image sensor 2003 according to the present embodiment.

An image 2211 shown in FIG. 46A indicates an image when an image of a high-brightness light source having a constant width is captured and the lateral stripe effect arises. An image 2212 shown in FIG. 46B indicates an image when an image of the high-brightness light source having a constant width is captured and the lateral stripe effect is suppressed in the image sensor 2003 according to the present embodiment. In addition, in the image 2211 shown in FIG. 46A and the image 2212 shown in FIG. 46B, image coordinates 2213 indicate a region (for example, a region in which the unit pixel 313 (1, 0) is disposed) in which the output of the image sensor 2003 is saturated by imaging the high-brightness light. In addition, in the image 2211 shown in FIG. 46A, image coordinates 2214 indicate a region (for example, a region in which the unit pixel 313 (1, 5) is disposed) in which a defect due to the lateral stripe effect is generated. In addition, in the image 2212 shown in FIG. 46B, image coordinates 2215 indicate the same region as that of the image coordinates 2214 after the lateral stripe effect is suppressed by the image sensor 2003 according to the present embodiment.

In an example of a schematic configuration of the unit pixel memory 323 shown in FIG. 47, schematic configurations of the unit pixel memory 323 (1, 0) and the unit pixel memory 323 (1, 5) which are associated with the unit pixel 313 (1, 0) and the unit pixel 313 (1, 5) described below are shown, and two unit pixel memories 323 shown in FIG. 41 are formed side by side. In FIG. 47, a wiring resistor RCS is a resistor parasitic in a common ground wiring 3216 connected to the pixel memory current load CS included in each of the unit pixel memories 323 (1, 0) and the unit pixel memory 323 (1, 5). Meanwhile, the configuration of each of the unit pixel memories 323 (1, 0) and the unit pixel memory 323 (1, 5) shown in FIG. 47 is the same as the configuration of the unit pixel memory 323 shown in FIG. 41, and thus a detailed description thereof will be omitted.

First of all, a description will be made of a case where the lateral stripe effect arises shown by the broken lines in the timing diagrams shown in FIGS. 45A and 45B. Meanwhile, in the image sensor 2003 according to the present embodiment, a case where the lateral stripe effect arises similarly to a MOS-type solid-state imaging device in the related art includes a case where the pixel memory clip reference transistor MM5 and the pixel memory clip enable transistor MM6 are not controlled, that is, a case where the pixel memory clip enable pulse ΦCE is set to be in a "Low" level, as shown by the broken lines shown in FIGS. 46A and 46B, to thereby disable a clipping function.

At time t1, based on the control similar to that at each driving timing shown in FIG. 42, the pixel charge accumulation section FD of the unit pixel 313 within the pixel array section 312 is reset, the FD-potential $V_{FD}$ is changed to a potential of the power supply potential VDDP, and the pixel signal line potential $V_{314}$ is reset to a potential in the vicinity of the power supply potential VDDP corresponding to the FD-potential $V_{FD}$. Meanwhile, the clipping function of the pixel signal line potential $V_{314}$ is disabled. In addition, based on the control similar to that at each driving timing shown in FIG. 42, a path from the pixel charge accumulation section FD of the unit pixel 313 within the pixel array section 312 to the pixel memory charge accumulation section MC of the unit pixel memory 323 within the pixel memory array section 322 is allowed to electrically conduct, and the pixel memory charge accumulation section MC of the unit pixel memory 323 within the pixel memory array section 322 is reset, so that the pixel memory potential $V_{MC}$ is changed to a potential of the power supply potential VDDM.

Subsequently, at time t2, similarly to each driving timing shown in FIG. 42, the pixel chip vertical scanning circuit 311 sets the pixel reset pulse ΦPR to a "Low" level, so that the reset operation of the FD-potential $V_{FD}$ to a potential of the power supply potential VDDP is terminated. Thereby, the FD-potential $V_{FD}$ and the pixel signal line potential $V_{314}$ drop by a potential equivalent to reset noise of the unit pixel 313 during the period (period until time t3 in FIGS. 45A and 45B) in which the FD-potential $V_{FD}$ and the pixel signal line potential $V_{314}$ are stabilized to the reset potential. The FD-potential $V_{FD}$ stabilize to a potential of the FD reset potential $V_{FDRS}$, and the pixel signal line potential $V_{314}$ stabilize to a potential of the pixel signal line reset potential $V_{314RS}$.

Subsequently, at time t3, when the pixel chip vertical scanning circuit 311 sets the pixel transfer pulse ΦPT to a "High" level, the signal charge generated by the photodiode PD is transferred to the pixel charge accumulation section FD. Thereby, the FD-potential $V_{FD\,(1,\,0)}$ and the FD-potential $V_{FD\,(1,\,5)}$ are changed to potentials corresponding to the PD-potential $V_{PD\,(1,\,0)}$ and the PD-potential $V_{PD\,(1,\,5)}$ at time t3, respectively. In addition, the pixel signal line potential $V_{314\,(1,\,0)}$ and the pixel signal line potential $V_{314\,(1,\,5)}$ also drop by a potential equivalent to charge corresponding to the signal charge transferred to each of the pixel charge accumulation sections FD.

In addition, at time t3, the pixel signal processing chip vertical scanning circuit 321 sets the pixel memory reset pulse ΦMR to a "Low" level, and the reset operation of the pixel memory potential $V_{MC}$ to the power supply potential VDDM is terminated. Thereby, the pixel memory potential $V_{MC\,(1,\,0)}$ and the pixel memory potential $V_{MC\,(1,\,5)}$ are changed to potentials corresponding to the pixel signal line potential $V_{314\,(1,\,0)}$ and the pixel signal line potential $V_{314\,(1,\,5)}$, respectively, dropped in accordance with the transfer of the signal charge generated by the photodiode PD to the pixel charge accumulation section FD.

Meanwhile, regarding the PD-potential $V_{PD}$, at time t3, the pixel chip vertical scanning circuit 311 sets the pixel transfer pulse ΦPT to a "High" level, so that the signal charge generated by the photodiode PD is transferred to the pixel charge accumulation section FD, and the signal charge temporarily accumulated in the photodiode PD is discharged. However, in the photodiode PD of the unit pixel 313 (1, 0) on which the high-brightness light is continuously incident, a large amount of charge is generated again, and thus the potential changes like the PD-potential $V_{PD\,(1,\,0)}$ after time t3 of FIG. 45A. Meanwhile, in the photodiode PD of the unit pixel 313 (1, 5) on which light is barely incident, a large amount of charge is not generated, and thus the potential changes like the PD-potential $V_{PD\,(1,\,5)}$ after time t3 of FIG. 45B.

During the period (period until time t5 in FIGS. 45A and 45B) in which the FD-potential $V_{FD}$ and the pixel signal line potential $V_{314}$ from time t4 are stabilized to a signal potential, the FD-potential $V_{FD\,(1,\,0)}$ of the unit pixel 313 (1, 0) on which the high-brightness light is incident drops up to the FD saturation potential $V_{FDSAT}$. In addition, the pixel signal line potential $V_{314\,(1,\,0)}$ also drops up to the pixel signal line saturation potential $V_{314SAT}$ in association with the drop in the FD-potential $V_{FD\,(1,\,0)}$, as shown by the broken lines after time t4 of FIG. 45A. In addition, the FD-potential $V_{FD\,(1,\,5)}$ of the unit pixel 313 (1, 5) on which light is barely incident stabilizes to a potential of the FD signal potential $V_{FDSIG}$, and the pixel signal line potential $V_{314\,(1,\,5)}$ is also once changed to a potential of the pixel signal line signal potential $V_{314SIG2}$ in association therewith. In addition, the pixel memory potential $V_{MC\,(1,5)}$ is also once changed to a potential of the pixel memory signal potential $V_{MCSIG2}$.

However, the pixel signal line potential $V_{314\,(1,\,0)}$ drops to the pixel signal line saturation potential $V_{314SAT}$, so that a transistor included in the pixel memory current load $CS_{(1,\,0)}$ within the unit pixel memory 323 (1, 0) connected to the unit pixel 313 (1, 0) is plunged into a non-saturation region, and thus the amount of current flowing to the pixel memory current load $CS_{(1,\,0)}$ is reduced. The amount of the voltage drop due to the wiring resistor RCS shown in FIG. 47 is reduced by the reduction in the amount of current of the pixel memory current load $CS_{(1,0)}$.

For this reason, in the unit pixel 313 (1, 5) disposed in the same row as that of the unit pixel 313 (1, 0), the amount of current flowing through the pixel memory current load $CS_{(1,\,5)}$ within the unit pixel memory 323 (1, 5) connected to the unit pixel 313 (1, 5) increases. The amount of current flowing to the pixel signal line 314 (1, 5) of the unit pixel 313 (1, 5) also increases due to the increase in the amount of current of the pixel memory current load $CS_{(1,\,5)}$. A voltage between the gate and the source of the pixel amplifying transistor PM3 within the unit pixel 313 (1, 5) increases due to the increase in the amount of current flowing to the pixel signal line 314 (1, 5), and thus the potential of the pixel signal line potential $V_{314\,(1,\,5)}$ drops. At time t5, the pixel signal line potential $V_{314\,(1,\,5)}$ is changed to a potential of the pixel signal line signal potential $V_{314SIG1}$ as shown by the broken lines after time t4 of FIG. 45B. In addition, the pixel memory potential $V_{MC\,(1,\,5)}$ is changed to a potential of the pixel memory signal potential $V_{MCSIG1}$ in association with a fluctuation in a potential of the pixel signal line potential $V_{314\,(1,\,5)}$, as shown by the broken lines after time t4 of FIG. 45B.

In such a state, similarly to each driving timing shown in FIG. 42, even when control after time t5 is performed, and the clamping (holding) of the pixel memory signal potential $V_{MCSIG1}$ at time t6 and the sampling of the pixel memory reset potential $V_{MCRS}$ at time t7 are performed, a correct pixel memory signal after noise removal cannot be obtained in the differential processing using the pixel signal processing chip column processing circuit 326. More specifically, the pixel memory signal becomes a pixel memory signal increased by an increase in a voltage between the gate and the source (pixel memory signal potential $V_{MCSIG2}$-pixel memory signal potential $V_{MCSIG1}$). Meanwhile, the unit pixel 313 disposed in a row different from that of the unit pixel 313 (1, 0) is not set to be in the above-mentioned state. For this reason, in the obtained image, an image having a lateral stripe effect in which the regions of the image coordinates 2214 located at the right and left of the region of the image coordinates 2213 irradiated with the high-brightness light become bright stripes is captured like the image 2211 shown in FIG. 46A.

Meanwhile, the region of a pixel memory signal increased by an increase in the voltage between the gate and the source after noise removal is indicated by the image coordinates 2214 shown in FIG. 46B.

As shown by the broken lines after time t3 of FIG. 45A, the pixel signal line potential $V_{314\,(1,\,0)}$ drops up to the pixel signal line saturation potential $V_{314SAT}$, and thus the potential of the pixel memory potential $V_{MC\,(1,\,0)}$ also drops. However, the high-brightness light incident on the unit pixel 313 (1, 0) is high-brightness light which stops short of the occurrence of the black sun effect.

For this reason, the pixel memory signal in the region of the image coordinates 2213 irradiated with the high-brightness light is a signal of which the signal amount is close to the amount of saturation signals of the photodiode PD, but the black sun effect is not generated in the region of the image coordinates 2213.

Next, a case where the lateral stripe effect shown by the solid lines in the timing diagrams shown in FIGS. 45A and 45B is suppressed will be described. Meanwhile, in the image sensor 2003 according to the present embodiment, the case where the lateral stripe effect is suppressed includes a case where the pixel memory clip reference transistor MM5 and the pixel memory clip enable transistor MM6 are controlled similarly to each driving timing shown in FIG. 42, that is, as shown by the solid lines shown in FIGS. 45A and 45B, to thereby enable a clipping function. In the suppression of the lateral stripe effect in the image sensor 2003 according to the present embodiment, the pixel memory clip enable pulse ΦCE is set to a "High" level for a predetermined time, and the pixel memory clip reference pulse ΦCR is controlled to a predetermined voltage.

At time t1, based on the control similar to that at each driving timing shown in FIG. 42, the pixel charge accumulation section FD of the unit pixel 313 within the pixel array section 312 is reset, the FD-potential $V_{FD}$ is changed to a potential of the power supply potential VDDP, and the pixel signal line potential $V_{314}$ is reset to a potential in the vicinity of the power supply potential VDDP corresponding to the FD-potential $V_{FD}$. In addition, the clipping function of the pixel signal line potential $V_{314}$ is enabled, and the voltage range of the pixel signal line potential $V_{314}$ is limited to a potential corresponding to the first reference potential VREF1. In addition, a path from the pixel charge accumulation section FD of the unit pixel 313 within the pixel array section 312 to the pixel memory charge accumulation section MC of the unit pixel memory 323 within the pixel memory array section 322 is allowed to electrically conduct, and the pixel memory charge accumulation section MC of the unit pixel memory 323 within the pixel memory array section 322 is reset, so that the pixel memory potential $V_{MC}$ is changed to a potential of the power supply potential VDDM.

Subsequently, at time t2, similarly to each driving timing shown in FIG. 42, the pixel chip vertical scanning circuit 311 sets the pixel reset pulse ΦPR to a "Low" level, so that the reset operation of the FD-potential $V_{FD}$ to a potential of the power supply potential VDDP is terminated. Thereby, the FD-potential $V_{FD}$ and the pixel signal line potential $V_{314}$ drop by a potential equivalent to reset noise of the unit pixel 313 during the period (period until time t3 in FIGS. 45A and 45B) in which the FD-potential $V_{FD}$ and the pixel signal line potential $V_{314}$ are stabilized to the reset potential. The FD-potential $V_{FD}$ stabilizes to a potential of the FD reset potential $V_{FDRS}$, and the pixel signal line potential $V_{314}$ stabilizes to a potential of the pixel signal line reset potential $V_{314RS}$.

Subsequently, at time t3, when the pixel chip vertical scanning circuit 311 sets the pixel transfer pulse ΦPT to a "High" level, the signal charge generated by the photodiode PD is transferred to the pixel charge accumulation section FD. Thereby, the FD-potential $V_{FD\,(1,\,0)}$ and the FD-potential $V_{FD\,(1,\,5)}$ are changed to potentials corresponding to the PD-potential $V_{PD\,(1,\,0)}$ and the PD-potential $V_{PD\,(1,\,5)}$ at time t3, respectively. In addition, the pixel signal line potential $V_{314\,(1,\,0)}$ and the pixel signal line potential $V_{314\,(1,\,5)}$ also drop by a potential equivalent to charge corresponding to the signal charge transferred to each of the pixel charge accumulation sections FD.

In addition, at time t3, the pixel signal processing chip vertical scanning circuit 321 sets the pixel memory reset pulse ΦMR to a "Low" level, and the reset operation of the pixel memory potential $V_{MC}$ to the power supply potential VDDM is terminated. Thereby, the pixel memory potential $V_{MC\ (1,\ 0)}$ and the pixel memory potential $V_{MC\ (1,\ 5)}$ are changed to potentials corresponding to the pixel signal line potential $V_{314\ (1,\ 0)}$ and the pixel signal line potential $V_{314\ (1,\ 5)}$, respectively, dropped in accordance with the transfer of the signal charge generated by the photodiode PD to the pixel charge accumulation section FD.

During the period (period until time t5 in FIGS. 45A and 45B) in which the FD-potential $V_{FD}$ and the pixel signal line potential $V_{314}$ from time t4 are stabilized to a signal potential, the FD-potential $V_{FD\ (1,\ 0)}$ of the unit pixel 313 (1, 0) on which the high-brightness light is incident drops up to the FD saturation potential $V_{FDSAT}$.

However, the voltage ranges of the pixel signal line potential $V_{314\ (1,\ 0)}$ and the pixel signal line potential $V_{314\ (1,\ 5)}$, respectively, are limited to a potential corresponding to the second reference potential VREF2 by the pixel memory clip reference transistor MM5 and the pixel memory clip enable transistor MM6 which are controlled by the pixel memory clip reference pulse ΦCR and the pixel memory clip enable pulse ΦCE. For this reason, the pixel signal line potential $V_{314\ (1,\ 0)}$ does not drop in association with the drop in the FD-potential $V_{FD\ (1,\ 0)}$, and does not drop to a potential or less corresponding to the second reference potential VREF2 as shown by the solid lines after time t4 of FIGS. 45A and 45B. This is to prevent a transistor within the pixel memory current load $CS_{(1,\ 0)}$ from being plunged into a non-saturation region by setting the second reference potential VREF2 to a potential by which the transistor included in the pixel memory current load $CS_{(1,\ 0)}$ within the unit pixel memory 323 (1, 0) connected to the unit pixel 313 (1, 0) is not plunged into the non-saturation region. Thereby, the amount of current flowing to the pixel memory current load $CS_{(1,\ 0)}$ does not change, and the amount of the voltage drop due to the wiring resistor RCS shown in FIG. 47 also does not change.

For this reason, even in the unit pixel 313 (1, 5) disposed in the same row as that of the unit pixel 313 (1, 0), the amount of current flowing through the pixel memory current load $CS_{(1,\ 5)}$ within the unit pixel memory 323 (1, 5) connected to the unit pixel 313 (1, 5) does not change, and the amount of current flowing to the pixel signal line 314 (1, 5) of the unit pixel 313 (1, 5) also does not change. Thereby, the voltage between the gate and the source of the pixel amplifying transistor PM3 within the unit pixel 313 (1, 5) does not increase.

Therefore, at time t5, the potential of the pixel signal line potential $V_{314\ (1,\ 5)}$ does not drop up to the potential of the pixel signal line signal potential $V_{314SIG1}$ as shown by the broken lines after time t4 of FIG. 45B, but is changed to the potential of the pixel signal line signal potential $V_{314SIG2}$. Similarly, the pixel memory potential $V_{MC\ (1,\ 5)}$ does not drop up to the potential of the pixel memory signal potential $V_{MCSIG1}$ as shown by the broken lines after time t4 of FIG. 45B, but is changed to the potential of the pixel memory signal potential $V_{MCSIG2}$.

In such a state, similarly to each driving timing shown in FIG. 42, control after time t5 is performed, and the clamping (holding) of the pixel memory signal potential $V_{MCSIG2}$ at time t6 and the sampling of the pixel memory reset potential $V_{MCRS}$ at time t7 are performed. Thereby, in the differential processing using the pixel signal processing chip column processing circuit 326, a correct pixel memory signal after noise removal can be obtained. More specifically, it is possible to obtain a pixel memory signal similar to a case where the high-brightness light is not incident (pixel memory reset potential $V_{MCRS}$-pixel memory signal potential $V_{MCSIG2}$). For this reason, in the obtained image, it is possible to capture an image in which the regions of the image coordinates 2215 located at the right and left of the region of the image coordinates 2213 irradiated with the high-brightness light do not become bright stripes, that is, the lateral stripe effect is suppressed, like the image 2212 shown in FIG. 46B. Meanwhile, a region forming a signal similar to a case where the high-brightness light is not incident due to the suppression of the lateral stripe effect is indicated by the image coordinates 2215 shown in FIG. 46B.

As mentioned above, in the image sensor 2003 according to the present embodiment, the voltage range of the pixel signal line potential $V_{314}$ during the transfer period (period until time t3 to time t6 in FIGS. 45A and 45B) of the image sensor 2003 is limited to a potential corresponding to the second reference potential VREF2 by the pixel memory clip reference transistor MM5 and the pixel memory clip enable transistor MM6. Thereby, even when the high-brightness light is incident in the transfer period, it is possible to suppress the lateral stripe effect.

In addition, in the image sensor 2003 according to the present embodiment, the pixel memory clip reference transistor MM5 and the pixel memory clip enable transistor MM6 for suppressing the lateral stripe effect in the solid-state imaging device formed by connecting a plurality of chips to each other is included within the pixel signal processing chip 2032, thereby allowing the suppression of the lateral stripe effect to be realized without reducing the area of the unit pixel 313 within the pixel chip 2031. In the digital camera 2001 to which the image sensor 2003 according to the present embodiment is mounted, it is possible to acquire a satisfactory global exposure-type image having less noise in which the lateral stripe effect due to the high-brightness light is suppressed.

As mentioned above, according to the embodiment of the present invention, the pixel signal processing chip includes a pixel memory clip reference transistor that limits a voltage of the pixel memory signal line and a pixel memory clip enable transistor that determines the validity or invalidity of a function of the pixel memory clip reference transistor. The voltage range of the pixel signal line (pixel memory signal line) in a predetermined period is limit to a potential which is set in advance. Thereby, it is possible to suppress the black sun effect and the lateral stripe effect due to the high-brightness light which is input to the solid-state imaging device.

In addition, according to the embodiment of the present invention, the solid-state imaging device is formed by connecting a plurality of chips to each other, and the pixel memory clip reference transistor and the pixel memory clip enable transistor are included within the pixel signal processing chip, thereby allowing the solid-state imaging device capable of suppressing the black sun effect and the lateral stripe effect due to the high-brightness light to be realized without reducing the area of the unit pixel within the pixel chip. Thereby, in the imaging device to which the solid-state imaging device according to the present embodiment is mounted, it is possible to acquire a satisfactory global exposure-type image having less noise in which the black sun effect and the lateral stripe effect due to the high-brightness light are suppressed.

Meanwhile, a solid-state imaging device according to a certain aspect of the present invention corresponds to, for example, the image sensor 2003 in the present embodiment. An imaging device corresponds to, for example, the digital camera 2001. In addition, a first substrate according to a certain aspect of the present invention corresponds to, for example, the pixel chip 2031 in the present embodiment. A second substrate corresponds to, for example, the pixel signal processing chip 2032. A connection portion corresponds to, for example, the chip connection portion 2033. A pixel section corresponds to, for example, the pixel array section 312 and the pixel memory array section 322. In addition, a pixel according to a certain aspect of the present invention corresponds to, for example, the unit pixel 313 in the present embodiment. A signal line corresponds to, for example, the pixel signal line 314 and the pixel memory signal line 324. A signal accumulation circuit corresponds to, for example, the pixel memory charge accumulation section MC. An output circuit corresponds to, for example, the pixel memory amplifying transistor MM3 and the pixel memory selection transistor MM4. A clipping circuit corresponds to, for example, the pixel memory clip reference transistor MM5 and the pixel memory clip enable transistor MM6. An output signal line corresponds to, for example, the pixel signal processing chip vertical signal line 325.

In addition, a current source load according to a certain aspect of the present invention corresponds to, for example, the pixel memory current load CS in the present embodiment. A storage section corresponds to, for example, the pixel memory charge accumulation section MC. A storage section signal reset section corresponds to, for example, the pixel memory reset transistor MM2. A storage section signal selection section corresponds to, for example, the pixel memory selection transistor MM4. A storage section signal amplification section corresponds to, for example, the pixel memory amplifying transistor MM3. A coupling capacitor corresponds to, for example, the pixel memory coupling capacitor CC. In addition, a subtraction section according to a certain aspect of the present invention corresponds to, for example, the pixel signal processing chip column processing circuit 326 in the present embodiment.

In addition, a transfer circuit and the transfer transistor according to a certain aspect of the present invention correspond to, for example, the pixel transfer transistor PM1 in the present embodiment. A first amplifier circuit and first amplifying transistor corresponds to, for example, the pixel amplifying transistor PM3. A first reset circuit and a first reset transistor correspond to, for example, the pixel reset transistor PM2. In addition, an analog memory circuit according to a certain aspect of the present invention corresponds to, for example, the pixel memory coupling capacitor CC, the pixel memory charge accumulation section MC, and the pixel memory transfer transistor MM1 in the present embodiment. A second amplifier circuit and the second amplifying transistor correspond to, for example, the pixel memory amplifying transistor MM3. A second reset circuit and a second reset transistor correspond to, for example, the pixel memory reset transistor MM2.

In addition, a first signal line according to a certain aspect of the present invention corresponds to, for example, the pixel signal line 314 and the pixel memory signal line 324 in the present embodiment. A transistor corresponds to, for example, the pixel memory clip reference transistor MM5. A capacitor corresponds to, for example, the pixel memory coupling capacitor CC. A second signal line corresponds to, for example, the pixel signal processing chip vertical signal line 325.

Meanwhile, the circuit configuration and the specific configuration of the driving method according to the present invention are not limited to the embodiments of the present invention, but various modifications thereof can be made without departing from the scope of the present invention. For example, even when the components of the pixel and the driving method thereof are changed, it is possible to cope with the above points by changing the driving method in accordance with, for example, the components and the circuit configuration within the image sensor 2003 and the unit pixel 313.

In addition, the arrangement of the pixels in the row direction and the column direction is not limited to the embodiments of the present invention, but the numbers of row directions and column directions in which the pixels are arranged can be changed without departing from the scope of the present invention.

As described above, although the embodiments of the present invention have been set forth with reference to the accompanying drawings, the specific configuration is not limited to the above-mentioned embodiments, but it is also possible to perform a change of design and the like without departing from the scope of the present invention. In the above description, although the configuration of the solid-state imaging device is illustrated in which two substrates are connected to each other through the connection portion, three or more substrates may be connected to each other through the connection portion. In the case of a solid-state imaging device in which three or more substrates are connected to each other through the connection portion, two substrates out of the three or more substrates are equivalent to the first substrate and the second substrate.

For example, a solid-state imaging device according to an aspect of the present invention may have the following configuration:

"a solid-state imaging device in which a first substrate and a second substrate which have circuit elements constituting pixels disposed therein are electrically connected to each other, wherein the pixels includes:

photoelectric conversion device disposed in the first substrate;

amplifier device for amplifying a signal generated in the photoelectric conversion device to output the amplified signal;

signal accumulation device, disposed in the second substrate, for accumulating the amplified signal which is output from the amplifier circuit; and switching device for switching a first output path for outputting the amplified signal accumulated in the signal accumulation device from the pixel and a second output path for outputting the amplified signal, which is output from the amplifier device, from the pixel without passing through the signal accumulation device".

For example, an imaging device according to an aspect of the present invention may have the following configuration:

"an imaging device in which a first substrate and a second substrate which have circuit elements constituting pixels disposed therein are electrically connected, wherein the pixels includes:

photoelectric conversion device disposed in the first substrate;

amplifier device for amplifying a signal generated in the photoelectric conversion device to output the amplified signal;

signal accumulation device which is disposed in the second substrate and accumulates the amplified signal which is output from the amplifier device; and switching device for switching a first output path for outputting the amplified signal accumulated in the signal accumulation device from the pixel and a second output path for outputting the amplified signal, which is output from the amplifier device, from the pixel without passing through the signal accumulation device".

For example, a solid-state imaging device according to an aspect of the present invention may have the following configuration:

"a solid-state imaging device in which a first substrate and a second substrate which have circuit elements constituting pixels disposed therein are electrically connected to each other, wherein each of the pixels includes:

photoelectric conversion device disposed in the first substrate;

amplifier device for amplifying a signal generated in the photoelectric conversion device to output the amplified signal;

signal accumulation device, disposed in the second substrate, for accumulating the amplified signal which is output from the amplifier device; and output device for outputting the amplified signal accumulated in the signal accumulation device from the pixel".

For example, an imaging device according to an aspect of the present invention may have the following configuration:

"an imaging device in which a first substrate and a second substrate which have circuit elements constituting pixels disposed therein are electrically connected to each other, wherein each of the pixels includes:

photoelectric conversion device disposed in the first substrate;

amplifier device for amplifying a signal generated in the photoelectric conversion device to output the amplified signal;

signal accumulation device, disposed in the second substrate, for accumulating the amplified signal which is output from the amplifier device; and output device for outputting the amplified signal accumulated in the signal accumulation device from the pixel".

For example, a solid-state imaging device according to an aspect of the present invention may have the following configuration:

"a solid-state imaging device in which a first substrate and a second substrate which have circuit elements constituting pixels disposed therein are electrically connected to each other, wherein each of the pixels includes:

a plurality of photoelectric conversion device disposed in the first substrate;

amplifier device for amplifying signals generated in the plurality of photoelectric conversion device to output the amplified signals;

signal accumulation device, disposed in the second substrate, for accumulating the amplified signals which are output from the amplifier device; and output device for outputting the amplified signals accumulated in the signal accumulation device from the pixel, wherein the plurality of photoelectric conversion device is classified into any of one or more groups, and first to n-th (n is an integer equal to or greater than 2) photoelectric conversion device within the same group share one amplifier device".

For example, an imaging device according to an aspect of the present invention may have the following configuration:

"an imaging device in which a first substrate and a second substrate which have circuit elements constituting pixels disposed therein are electrically connected, wherein each of the pixels includes:

a plurality of photoelectric conversion device disposed in the first substrate;

amplifier device for amplifying signals generated in the plurality of photoelectric conversion device to output the amplified signals;

signal accumulation device, disposed in the second substrate, for accumulating the amplified signals which are output from the amplifier device; and output device for outputting the amplified signals accumulated in the signal accumulation device from the pixel, wherein the plurality of photoelectric conversion device is classified into any of one or more groups, and first to n-th (n is an integer equal to or greater than 2) photoelectric conversion device within the same group share one amplifier device".

In addition, a solid-state imaging device according to a certain aspect of the present invention may have the following configuration: a solid-state imaging device in which a first substrate and a second substrate are electrically connected to each other by connection device for electrically connecting the first substrate and the second substrate, wherein pixel device included in the solid-state imaging device includes: a pixel, included in the first substrate, which is provided with a photoelectric conversion element; a signal line that supplies a signal generated in the pixel to the second substrate; signal accumulation device, included in the second substrate, for accumulating a signal supplied via the signal line; and output device, included in the second substrate, for outputting the signal accumulated in the signal accumulation device, and wherein the solid-state imaging device further includes clipping device for performing clipping so that a voltage of the amplified signal does not become a predetermined voltage or less.

In addition, an imaging device according to a certain aspect of the present invention may have the following configuration: an imaging device in which a first substrate and a second substrate are electrically connected to each other by connection device for electrically connecting the first substrate and the second substrate, wherein pixel device included in the imaging device includes: a pixel, included in the first substrate, which is provided with a photoelectric conversion element; a signal line that supplies a signal generated in the pixel to the second substrate; signal accumulation device, included in the second substrate, for accumulating a signal supplied via the signal line; and output device, included in the second substrate, for outputting the signal accumulated in the signal accumulation device, and the imaging device further includes clipping device for performing clipping so that a voltage of an amplified signal of the signal line does not become a predetermined voltage or less.

In addition, a solid-state imaging device according to a certain aspect of the present invention may have the following configuration:

a solid-state imaging device in which a first substrate and a second substrate are electrically connected to each other by connection device for electrically connecting the first substrate and the second substrate, wherein pixel device included in the solid-state imaging device includes: a pixel, included in the first substrate, which is provided with a photoelectric conversion element; a first signal line connected to the pixel; a transistor of which one end is connected to the first signal line; a capacitor, included in the second substrate, which is connected to the first signal line; and a second signal line connected to the capacitor, and the transistor performs clipping so that a voltage of an first amplified signal of the signal line does not become a predetermined voltage or less.

In addition, an imaging device according to a certain aspect of the present invention may have the following configuration: an imaging device in which a first substrate and a second substrate are electrically connected to each other by connection device for electrically connecting the first substrate and the second substrate, wherein pixel device included in the imaging device includes: a pixel, included in the first substrate, which is provided with a photoelectric conversion element; a first signal line connected to the pixel; a transistor of which one end is connected to the first signal line; a capacitor, included in the second substrate, which is connected to the first signal line; and a second signal line connected to the capacitor, and the transistor performs clipping so that a voltage of an amplified signal of the first signal line does not become a predetermined voltage or less.

A computer program product capable of realizing an arbitrary combination each component and each process mentioned above is also effective as an aspect of the present invention. The term "computer program product" herein device a recording medium, a device, equipment, or a system, into which a program code is incorporated, such as a recording medium DVD medium, hard disk medium, memory medium, or the like) having a program code recorded thereon, a computer having a program code recorded thereon, and an Internet system (for example, system including a server and a client terminal) having a program code recorded thereon. In this case, each component and each process are mounted to each module, and the program code constituted by the mounted modules is recorded in the computer program product.

For example, a computer program product according to an aspect of the present invention may have the following configuration:

"a computer program product having a program code recorded thereon, the program code causing a computer to execute a process of reading a signal from pixels of a solid-state imaging device in which a first substrate and a second substrate which have circuit elements constituting the pixels disposed therein are electrically connected to each other, including:

a module of amplifying a signal generated in a photoelectric conversion element disposed in the first substrate using an amplifier circuit to output the amplified signal;

a module of accumulating the amplified signal which is output from the amplifier circuit in a signal accumulation circuit disposed in the second substrate; and a module of selecting any of a first output path that outputs the amplified signal accumulated in the signal accumulation circuit from the pixel and a second output path that outputs the amplified signal, which is output from the amplifier circuit, from the pixel without passing through the signal accumulation circuit to output the amplified signal from the pixel".

For example, a computer program product according to an aspect of the present invention may have the following configuration:

"a computer program product having a program code recorded thereon, the program code causing a computer to execute a process of reading a signal from pixels of a solid-state imaging device in which a first substrate and a second substrate which have circuit elements constituting the pixels disposed therein are electrically connected to each other, including:

a module of amplifying a signal generated in a photoelectric conversion element disposed in the first substrate using an amplifier circuit to output the amplified signal;

a module of accumulating the amplified signal which is output from the amplifier circuit in a signal accumulation circuit disposed in the second substrate; and a module of outputting the amplified signal accumulated in the signal accumulation circuit from the pixel".

For example, a computer program product according to an aspect of the present invention may have the following configuration:

"a computer program product having a program code recorded thereon, the program code causing a computer to execute a process of reading a signal from pixels of a solid-state imaging device in which a first substrate and a second substrate which have circuit elements constituting the pixels disposed therein are electrically connected to each other, including:

a module of amplifying signals generated in a plurality of photoelectric conversion elements disposed in the first substrate using an amplifier circuit to output the amplified signals;

a module of accumulating the amplified signals which is output from the amplifier circuit in a signal accumulation circuit disposed in the second substrate; and a module of outputting the amplified signals accumulated in the signal accumulation circuit from the pixel, wherein the plurality of photoelectric conversion elements disposed in the first substrate is classified into any of one or more groups, and first to n-th (n is an integer equal to or greater than 2) photoelectric conversion elements within the same group share one amplifier circuit".

For example, a computer program product according to a certain aspect of the present invention may have the following configuration: a computer program product having a program code recorded thereon, the program code causing a computer to execute a process of a solid-state imaging device in which a first substrate and a second substrate are electrically connected to each other by a connection portion that electrically connects the first substrate and the second substrate, including: a module of outputting a signal, generated in a pixel which is included in the first substrate of a pixel section included in the solid-state imaging device and is provided with a photoelectric conversion element, to a signal line for supplying the signal to the second substrate; a module of accumulating the signal supplied via the signal line in a signal accumulation circuit included in the second substrate; and a module of outputting the signal accumulated in the signal accumulation circuit from an output circuit included in the second substrate, wherein the computer program product further includes a module of causing a clipping circuit to perform clipping so that a voltage of an amplified signal of the signal line does not become a predetermined voltage or less.

In addition, for example, various processes mentioned above relevant to the digital camera 2001 may be performed by recording a program for realizing a process using each component of the digital camera 2001 shown in FIG. 36 in a computer readable recording medium and causing a computer system to read and execute the program recorded on the recording medium. Meanwhile, the "computer system" herein may include OS or hardware such as peripheral equipment. In addition, the "computer system" also includes a homepage providing environment (or a display environment) when a WWW system is used. In addition, the "computer readable recording medium" includes writable non-volatile memories such as a flexible disk, a magneto-optical disc, a ROM, and a flash memory, portable mediums such as a CD-ROM, and storage devices such a hard disk built in a computer system.

Further, the "computer readable recording medium" includes mediums on which a program is held for a given period of time, such as a volatile memory (for example, DRAM Dynamic Random Access Memory)) inside of a computer system serving as a server or a client when a program is transmitted through networks such as the Internet or communication channels such as a telephone line. In addition, the above-mentioned program may be transmitted from a computer system having the program stored on a storage device or the like, through a transmission medium or transmitted waves in the transmission medium, to other computer systems. Herein, the "transmission medium" for transmitting a program includes mediums having a function of transmitting information, like networks (communication networks) such as the Internet or communication channels (communication lines) such as a telephone line. In addition, the above-mentioned program may be a program for realizing a portion of the above-mentioned functions. Further, the program may be a program capable of being realized by a combination with a program having the above-mentioned functions previously recorded in a computer system, or a so-called differential file (differential program).

A program for realizing an arbitrary combination of each component and each process according to the above-mentioned embodiments is also effective as an aspect of the present invention. An object of the present invention can be achieved by recording this program on a computer readable recording medium and causing a computer to read and execute the program recorded on the recording medium.

Herein, the "computer" includes a homepage providing environment (or a display environment) when a WWW system is used. In addition, the "computer readable recording medium" includes portable mediums such as a flexible disk, a magneto-optical disc, a ROM, and a CD-ROM, and storage devices such as hard disk built in a computer. Further, the "computer readable recording medium" includes mediums on which a program is held for a given period of time, such as a volatile memory (RAM) inside of a computer system serving as a server or a client when a program is transmitted through networks such as the Internet or communication channel such as a telephone line.

In addition, the above-mentioned program may be transmitted from a computer which having the program stored on a storage device or the like, through a transmission medium or transmitted waves in the transmission medium, to other computers. Herein, the "transmission medium" for transmitting a program includes mediums having a function of transmitting information, like networks (communication networks) such as the Internet or communication channels (communication lines) such as telephone line. In addition, the above-mentioned program may be a program for realizing a portion of the above-mentioned functions. Further, the program may be a program capable of being realized by a combination with a program having the above-mentioned functions previously recorded in a computer, or a so-called differential file (differential program).

As described above, although preferred embodiments of the present invention have been set forth, various substitutions, modifications, and equivalents can be used as each component and each process mentioned above. In the embodiments disclosed in the present specification, in order to execute one or a plurality of functions, one component may be substituted with a plurality of components, and a plurality of components may be substituted with one component. Except that such a substitution does not function properly in achieving an object of the present invention, such a substitution is within the scope of the present invention. Therefore, the scope of the present invention should be determined not with reference to the above description, but should, instead, be determined with reference to the appended claims, along with their full scope of equivalents. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for".

The terms used in the present specification are merely used to describe the specific embodiments and are not intended to limit the present invention. In the present specification, even when the term is used in a singular form, the form of the term used also includes a plural form unless the exclusion of a plural form is explicitly described in the context.

As described above, although the embodiments of the present invention have been described with reference to the accompanying drawings, the specific configuration is not limited to the embodiments, but various modifications can be made without departing from the spirit or scope of the present invention. The present invention is not limited by the foregoing description, but is only limited by the claims appended hereto.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

Supplemental item 1. A solid-state imaging device in which a first substrate and a second substrate which have circuit elements constituting pixels disposed therein are electrically connected to each other, wherein
  the pixels includes:
    a photoelectric conversion element disposed in the first substrate;
    an amplifier circuit that amplifies a signal generated in the photoelectric conversion element and outputs the amplified signal;
    a signal accumulation circuit which is disposed in the second substrate and accumulates the amplified signal which is output from the amplifier circuit.

Supplemental item 2. The solid-state imaging device according to Supplemental item 1, wherein
  the photoelectric conversion elements start exposure collectively in all the pixels.

Supplemental item 3. The solid-state imaging device according to Supplemental item 1, wherein
  the pixels further includes a reset circuit that resets the photoelectric conversion element, wherein
  the amplifier circuits amplify signals generated in the photoelectric conversion elements of all the pixels to output the amplified signals after elapsing a predetermined period the reset circuits reset the photoelectric conversion elements of all the pixels collectively, the signal accumulation circuit accumulates the amplified signal which is output from the amplifier circuit, and the amplified signal accumulated in the signal accumulation circuit is output from the pixel when the switching circuit selects the first output path.

Supplemental item 4. The solid-state imaging device according to Supplemental item 1, further comprising a noise reduction circuit that reduces noise in the amplified signal which is output from the amplifier circuit.

Supplemental item 5. The solid-state imaging device according to Supplemental item 4, wherein the noise reduction circuit comprising:
- a clamp section that clamps the amplified signal which is output from the amplifier circuit; and
- a sample-and-hold section that samples and holds a signal corresponding to the amplified signal clamped in the clamp section to accumulate the sampled and held signal in the signal accumulation circuit.

Supplemental item 6. The solid-state imaging device according to Supplemental item 5, further includes:
- a first reset circuit that resets the photoelectric conversion element;
- a second reset circuit that resets an input section of the amplifier circuit;
- a transfer circuit that transfers a signal generated in the photoelectric conversion element to the input section of the amplifier circuit;
- a second amplifier circuit that amplifies the amplified signal accumulated in the signal accumulation circuit to output a second amplified signal; and
- a third reset circuit that resets an input section of the second amplifier circuit.

Supplemental item 7. The solid-state imaging device according to Supplemental item 6, wherein the second reset circuits reset the input sections of the amplifier circuits of all the pixels collectively, after the first reset circuits reset the photoelectric conversion elements of all the pixels collectively, the clamp section clamps the amplified signal which is output from the amplifier circuit after the input section of the amplifier circuit is reset, the transfer circuit transfers signals generated in the photoelectric conversion elements of all the pixels collectively to the input section of the amplifier circuit after elapsing a predetermined period until the first reset circuits reset the photoelectric conversion element of all the pixels collectively, the sample-and-hold section samples and holds a signal corresponding to a fluctuation in the amplified signal generated by transferring the signal by the transfer circuit and accumulates the sampled and held signal in the signal accumulation circuit, and then, when the switching circuit selects the first output path, a signal after the sample-and-hold section samples and holds the signal corresponding to the fluctuation in the amplified signal generated by transferring the signal by the transfer circuit and accumulates the sampled and held signal in the signal accumulation circuit and a signal after the third reset circuit resets the input section of the second amplifier circuit are output from the pixel in a time-division manner.

Supplemental item 8. The solid-state imaging device according to Supplemental item 7, further comprising a differential processing circuit that performs differential processing on two kinds of signals which are output through the first output path.

Supplemental item 9. The solid-state imaging device according to Supplemental item 1, wherein the switching circuit includes a switch which disposed in the second substrate and switches the first output path and the second output path.

Supplemental item 10. The solid-state imaging device according Supplemental item 1, wherein the switching circuit selects the first output path when the amplified signal is output as a still image signal, and selects the second output path when the amplified signal is output as a moving image signal.

Supplemental item 11. The solid-state imaging device according to Supplemental item 1, wherein the second substrate is connected to a surface on the opposite side to a surface of the first substrate which is irradiated with light incident on the photoelectric conversion element.

Supplemental item 12. A solid-state imaging device in which a first substrate and a second substrate which have circuit elements constituting pixels disposed therein are electrically connected to each other, wherein the pixels includes:
- a photoelectric conversion element disposed in the first substrate;
- an amplifying transistor that receives a signal generated in the photoelectric conversion element in a gate; amplifies the signal received in the gate; and outputs the amplified signal from one of a source and a drain;
- a memory circuit, disposed in the second substrate, which accumulates the amplified signal which is output from the amplifying transistor;
- an output transistor that receives the amplified signal accumulated in the memory circuit in one of the source and the drain, and outputs the amplified signal which received in the one of the source and the drain, from the other of the source and the drain to a signal line outside of the pixel; and
- a switch disposed in a path electrically connected between the amplifying transistor and the memory circuit, the switch switching a first output path that outputs the amplified signal accumulated in the signal accumulation circuit from the pixel and a second output path that outputs the amplified signal, which is output from the amplifier circuit, from the pixel without passing through the signal accumulation circuit.

Supplemental item 13. The solid-state imaging device according to Supplemental item 12, further comprising:
- a clamp capacitor that clamps the amplified signal which is output from the amplifying transistor; and
- a transistor that receives a signal corresponding to the amplified signal clamped in the clamp capacitor in one of the source and the drain, and samples and holds the signal received in the one of the source and the drain to accumulate the sampled and held signal in the memory circuit.

Supplemental item 14. The solid-state imaging device according to Supplemental item 13, wherein the first substrate and the second substrate are electrically connected to each other through a connection portion.

Supplemental item 15. The solid-state imaging device according to Supplemental item 14, wherein the connection portion is disposed in a path electrically connected from the photoelectric conversion element to the memory circuit, between the photoelectric conversion element and the amplifying transistor; between the amplifying transistor and the clamp capacitor; between the clamp capacitor and the transistor; or between the transistor and the memory circuit.

Supplemental item 16. The solid-state imaging device according to Supplemental item 15, wherein
the connection portion is a bump.

Supplemental item 17. The solid-state imaging device according to Supplemental item 16, wherein
the connection portion includes a first electrode formed on a surface of the first substrate and a second electrode which is formed on a surface of the second substrate and is bonded to the first electrode.

Supplemental item 18. An imaging device in which a first substrate and a second substrate which have circuit elements constituting pixels disposed therein are electrically connected, wherein
the pixels includes:
a photoelectric conversion element disposed in the first substrate;
an amplifier circuit that amplifies a signal generated in the photoelectric conversion element to output the amplified signal;
a signal accumulation circuit, disposed in the second substrate, which accumulates the amplified signal which is output from the amplifier circuit; and
a switching circuit that switches a first output path for outputting the amplified signal accumulated in the signal accumulation circuit from the pixel and a second output path for outputting the amplified signal, which is output from the amplifier circuit, from the pixel without passing through the signal accumulation circuit.

Supplemental item 19. An imaging device in which a first substrate and a second substrate which have circuit elements constituting pixels disposed therein are electrically connected, wherein
the pixels includes:
a photoelectric conversion element disposed in the first substrate;
an amplifying transistor that receives a signal generated in the photoelectric conversion element in a gate; amplifies the signal received in the gate; and outputs the amplified signal from one of a source and a drain;
a memory circuit, disposed in the second substrate, which accumulates the amplified signal which is output from the amplifying transistor;
an output transistor that receives the amplified signal accumulated in the memory circuit in one of the source and the drain, and outputs the amplified signal which received in the one of the source and the drain, from the other of the source and the drain to a signal line outside of the pixel; and
a switch disposed in a path electrically connected between the amplifying transistor and the memory circuit, the switch switching a first output path that outputs the amplified signal accumulated in the signal accumulation circuit from the pixel and a second output path that outputs the amplified signal, which is output from the amplifier circuit, from the pixel without passing through the signal accumulation circuit.

Supplemental item 20. A signal reading method of reading a signal from pixels of a solid-state imaging device in which a first substrate and a second substrate which have circuit elements constituting the pixels disposed therein are electrically connected to each other, comprising:
a step of amplifying a signal generated in a photoelectric conversion element disposed in the first substrate using an amplifier circuit and outputs the amplified signal;
a step of accumulating the amplified signal which is output from the amplifier circuit in a signal accumulation circuit disposed in the second substrate; and
a step of selecting any of a first output path that outputs the amplified signal accumulated in the signal accumulation circuit from the pixel and a second output path that outputs the amplified signal, which is output from the amplifier circuit, from the pixel without passing through the signal accumulation circuit to output the amplified signal from the pixel.

Supplemental item 21. A solid-state imaging device in which a first substrate and a second substrate which have circuit elements constituting pixels disposed therein are electrically connected, wherein
the pixels comprising:
a photoelectric conversion element disposed in the first substrate;
an amplifying transistor that receives a signal generated in the photoelectric conversion element in a gate; amplifies the signal received in the gate; outputs the amplified signal from one of a source and a drain;
a memory circuit, disposed in the second substrate, which accumulates the amplified signal which is output from the amplifying transistor; and
an output transistor that receives the amplified signal accumulated in the memory circuit in one of the source and the drain, and outputs the signal which received in the one of the source and the drain, from the other of the source and the drain to a signal line outside of the pixel
a clamp capacitor that clamps the amplified signal which is output from the amplifying transistor; and
a transistor that receives a signal corresponding the amplified signal clamped in the clamp capacitor in one of the source and the drain; samples and holds the signal received in the one of the source and the drain; and accumulates the sampled and held signal in the memory circuit, wherein
the first substrate and the second substrate are electrically connected to each other through a connection portion;
the connection portion is disposed in a path electrically connected from the photoelectric conversion element to the memory circuit, between the photoelectric conversion element and the amplifying transistor; between the amplifying transistor and the clamp capacitor; between the clamp capacitor and the transistor; or between the transistor and the memory circuit;
the connection portion is a bump.

Supplemental item 22. A solid-state imaging device in which a first substrate and a second substrate which have circuit elements constituting pixels disposed therein are electrically connected, wherein
the pixels comprising:
a photoelectric conversion element disposed in the first substrate;
an amplifying transistor that receives a signal generated in the photoelectric conversion element in a gate; amplifies the signal received in the gate; and outputs the amplified signal from one of a source and a drain;
a memory circuit, disposed in the second substrate, which accumulates the amplified signal which is output from the amplifying transistor; and
an output transistor that receives the amplified signal accumulated in the memory circuit in one of the source and the drain, and outputs the signal which received in the one of the source and the drain, from the other of the source and the drain to a signal line outside of the pixel.
a clamp capacitor that clamps the amplified signal which is output from the amplifying transistor; and a transistor that receives a signal corresponding the amplified signal clamped in the clamp capacitor in one of the source and the drain; samples and holds the signal received in the one of the source and the drain; and accumulates the sampled and held signal in the memory circuit, wherein the first substrate and the second substrate are electrically connected to each other through a connection portion;

the connection portion is disposed in a path electrically connected from the photoelectric conversion element to the memory circuit, between the photoelectric conversion element and the amplifying transistor; between the amplifying transistor and the clamp capacitor; between the clamp capacitor and the transistor; or between the transistor and the memory circuit;

the connection portion includes a first electrode formed on a surface of the first substrate and a second electrode, formed on a surface of the second substrate, which is bonded to the first electrode.

Supplemental item 24. The solid-state imaging device according to claim Supplemental item 23, further comprising a reset circuit that resets the plurality of photoelectric conversion elements, a noise reduction circuit that reduces noise in the amplified signals which are output from the amplifier circuit; and wherein the noise reduction circuit included:
a clamp section that clamps the amplified signals which are output from the amplifier circuit; and
a sample-and-hold section that samples and holds signals based on the amplified signals clamped in the clamp section and accumulate the sampled and held signals in the signal accumulation circuit,
wherein after the reset circuit resets all the photoelectric conversion elements collectively, the noise reduction circuit performs such that in a first period, the clamp section clamps the amplified signal based on a reset level of the first photoelectric conversion element within the same group, and a signal based on a fluctuation in the amplified signal generated by a transfer of the signal generated in the first photoelectric conversion element to an input section of the amplifier circuit is sampled and held by the sample-and-hold section and is accumulated in the signal accumulation circuit; and in a second period different from the first period, the clamp section clamps the amplified signal based on a reset level of the second photoelectric conversion element within the same group, and a signal based on a fluctuation in the amplified signal generated by the signal generated in the second photoelectric conversion element is sampled and held by the sample-and-hold section and is accumulated in the signal accumulation circuit, the reset circuit resets all the photoelectric conversion elements collectively, and then the signal accumulation circuit sequentially accumulates the amplified signals corresponding to signals generated in the first to n-th photoelectric conversion elements within the same group.

Supplemental item 25. The solid-state imaging device according to Supplemental item 23, further comprising:

a reset circuit that resets the plurality of photoelectric conversion elements, and a noise reduction circuit that reduces noise in the amplified signals which are output from the amplifier circuit, wherein the noise reduction circuit includes:
a clamp section that clamps the amplified signals which are output from the amplifier circuit; and
a sample-and-hold section that samples and holds signals based on the amplified signals clamped in the clamp section, and accumulates the sampled and held signals in the signal accumulation circuit, wherein after the reset circuit sequentially resets the first to n-th photoelectric conversion elements within the same group, the amplifier circuit performs such that, in a first period, the clamp section clamps the amplified signal based on a reset level of the first photoelectric conversion element within the same group, and a signal based on a fluctuation in the amplified signal generated by a transfer of the signal generated in the first photoelectric conversion element to an input section of the amplifier circuit is sampled and held by the sample-and-hold section and is accumulated in the signal accumulation circuit, and in second period different from the first period, the clamp section clamps the amplified signal based on a reset level of the second photoelectric conversion element within the same group, and a signal based on a fluctuation in the amplified signal generated by the signal generated in the second photoelectric conversion element is sampled and held by the sample-and-hold section and is accumulated in the signal accumulation circuit, the reset circuit sequentially resets the first to n-th photoelectric conversion elements within the same group, and then the signal accumulation circuit sequentially accumulates the amplified signals corresponding to the signals generated in the first to n-th photoelectric conversion elements within the same group.

Supplemental item 26. The solid-state imaging device according to Supplemental item 25, wherein a length of a period from the reset circuit resets the first photoelectric conversion element within the same group until the signal generated in the first photoelectric conversion element is transferred to the input section of the amplifier circuit and a length of a period from the reset circuit resets the second photoelectric conversion element within the same group until the signal generated in the second photoelectric conversion element is transferred to the input section of the amplifier circuit are same.

Supplemental item 27. The solid-state imaging device according to Supplemental item 23, further comprising a noise reduction circuit that reduce noise in the amplified signals which are output from the amplifier circuit, wherein the noise reduction circuit removes noise generated in an input section of the amplifier circuit resulting from an operation of a circuit connected to the amplifier circuit or noise resulting from the operating characteristics of the amplifier circuit.

Supplemental item 28. The solid-state imaging device according to Supplemental item 27, wherein the noise reduction circuit includes:
a clamp section that clamps the amplified signals which are output from the amplifier circuit; and
a sample-and-hold section that samples and holds signals based on the amplified signals clamped in the clamp section to accumulate the sample-and-hold signals in the signal accumulation circuit.

Supplemental item 29. The solid-state imaging device according to Supplemental item 28, further comprising:

a first reset circuit that resets the plurality of photoelectric conversion elements;

a second reset circuit that resets an input section of the amplifier circuit;

a transfer circuit that sequentially transfers a signal generated in each of the plurality of photoelectric conversion elements to the input section of the amplifier circuit;

a second amplifier circuit that amplifies the amplified signal accumulated in the signal accumulation circuit to output a second amplified signal; and a third reset circuit that resets an input section of the second amplifier circuit.

Supplemental item 30. The solid-state imaging device according to Supplemental item 29, wherein in a period corresponding to each of the photoelectric conversion elements after the first reset circuit resets all the photoelectric conversion element collectively, the second reset circuit resets the input section of the amplifier circuit, the clamp section clamps the amplified signal which is output from the amplifier circuit after the input section of the amplifier circuit is reset, the transfer circuit transfers signals generated in the photoelectric conversion elements to the input section of the amplifier circuit, after elapsing a predetermined period until the first reset circuit resets all the photoelectric conversion elements collectively, wherein the sample-and-hold section samples and holds a signal corresponding to a fluctuation in the amplified signal generated by transferring the signal by the transfer circuit and accumulates the sampled and held signal in the signal accumulation circuit, and then, the output circuit outputs the second amplified signal after the sample-and-hold section samples and holds the signal corresponding to the fluctuation in the amplified signal generated by transferring the signal by the transfer circuit and accumulates the sampled and held signal in the signal accumulation circuit and the second amplified signal after the third reset circuit resets the input section of the second amplifier circuit are output, from the pixel in a time-division manner.

Supplemental item 31. A solid-state imaging device according to Supplemental item 30, further comprising a differential processing circuit that performs differential processing on two kinds of signals which are output by the output circuit.

Supplemental item 32. The solid-state imaging device according to claim 62, wherein in a period corresponding to each of the photoelectric conversion elements after the first reset circuit resets all the photoelectric conversion element collectively, the second reset circuit resets the input section of the amplifier circuit, the clamp section clamps the amplified signal which is output from the amplifier circuit after the input section of the amplifier circuit is reset, the transfer circuit transfers signals generated in the photoelectric conversion elements to the input section of the amplifier circuit, after elapsing a predetermined period until the first reset circuit resets all the photoelectric conversion elements collectively, the sample-and-hold section samples and holds a signal corresponding to a fluctuation in the amplified signal generated by transferring the signal by the transfer circuit and accumulates the sampled and held signal in the signal accumulation circuit, and then, the output circuit output the second amplified signal after the sample-and-hold section samples and holds the signal corresponding to the fluctuation in the amplified signal generated by transferring the signal by the transfer circuit and accumulates the sampled and held signal in the signal accumulation circuit and the second amplified signal when the third reset circuit resets the input section of the second amplifier circuit are output from the pixel in a time-division manner.

Supplemental item 33. The solid-state imaging device according to Supplemental item 29, further comprising a switching circuit that connects the signal accumulation circuit and the input section of the second amplifier circuit and is capable of switching an on-state and an off-state, wherein in a period corresponding to each of the photoelectric conversion elements after the first reset circuit resets all the photoelectric conversion element collectively, the second reset circuit resets the input section of the amplifier circuit, the clamp section clamps the amplified signal which is output from the amplifier circuit after the input section of the amplifier circuit is reset, the transfer circuit transfers signals generated in the photoelectric conversion elements to the input section of the amplifier circuit, after elapsing a predetermined period until the first reset circuit resets all the photoelectric conversion elements collectively, wherein the sample-and-hold section samples and holds a signal corresponding to a fluctuation in the amplified signal generated by transferring the signal by the transfer circuit and accumulates the sampled and held signal in the signal accumulation circuit, and then, the output circuit outputs the second amplified signal after the third reset circuit reset the input section of the second amplifier circuit when the switching circuit is turned off and the second amplified signal after the sample-and-hold section samples and holds the signal corresponding to the fluctuation in the amplified signal generated by transferring the signal by the transfer circuit and accumulates the sampled and held signal in the signal accumulation circuit and when the switching circuit is turned on are output, from the pixel in a time-division manner.

Supplemental item 34. The solid-state imaging device according to Supplemental item 23, wherein a capacitance of the signal accumulation circuit is larger than a capacitance of the input section of the amplifier circuit.

Supplemental item 35. The solid-state imaging device according to Supplemental item 23, wherein the second substrate is connected to a surface on the opposite side to a surface of the first substrate which is irradiated with light incident on the plurality of photoelectric conversion elements.

Supplemental item 36. A solid-state imaging device in which a first substrate and a second substrate which have circuit elements constituting pixels disposed therein are electrically connected to each other, wherein the pixels includes:
 a plurality of photoelectric conversion elements disposed in the first substrate;
 an amplifying transistor that receives signals generated in the plurality of photoelectric conversion elements in a gate; amplifies the signals received in the gate; and outputs the amplified signals from one of a source and a drain;
 a memory circuit, disposed in the second substrate, which accumulates the amplified signal which is output from the amplifying transistor; and
an output transistor that receives the amplified signal accumulated in the memory circuit in one of the source and the drain, and outputs the signal received in the one of the source and the drain from the other of the source and the drain to a signal line outside of the pixel, wherein the plurality of photoelectric conversion elements is classified into any of one or more groups, and first to n-th (n is an integer equal to or greater than 2) photoelectric conversion elements within the same group share one amplifying transistor.

Supplemental item 37. The solid-state imaging device according to Supplemental item 36, further comprising:
a clamp capacitor that clamps the amplified signal which is output from the amplifying transistor; and
a transistor that receives a signal based on the amplified signal clamped in the clamp capacitor in one of the source and the drain, and samples and holds the signal received in the one of the source and the drain to accumulate the sampled and held signal in the memory circuit.

Supplemental item 38. The solid-state imaging device according to Supplemental item 37, wherein
the first substrate and the second substrate are electrically connected to each other through a connection portion.

Supplemental item 39. The solid-state imaging device according to Supplemental item 38, wherein
the connection portion is disposed in a path electrically connected from the photoelectric conversion element to the memory circuit, between the photoelectric conversion element and the amplifying transistor, between the amplifying transistor and the clamp capacitor, between the clamp capacitor and the transistor, or between the transistor and the memory circuit.

Supplemental item 40. The solid-state imaging device according to Supplemental item 39, wherein
the connection portion is a bump.

Supplemental item 41. The solid-state imaging device according to Supplemental item 39, wherein
the connection portion includes
a first electrode formed on a surface of the first substrate; and
a second electrode, formed on a surface of the second substrate, which is bonded to the first electrode.

Supplemental item 42. An imaging device in which a first substrate and a second substrate which have circuit elements constituting pixels disposed therein are electrically connected, wherein
the pixels includes:
a plurality of photoelectric conversion elements disposed in the first substrate;
an amplifier circuit that amplifies signals generated in the plurality of photoelectric conversion elements to output the amplified signals;
a signal accumulation circuit, disposed in the second substrate, which accumulates the amplified signals which are output from the amplifier circuit; and
an output circuit that outputs the amplified signals accumulated in the signal accumulation circuit from the pixel,
wherein the plurality of photoelectric conversion elements is classified into any of one or more groups, and first to n-th (n is an integer equal to or greater than 2) photoelectric conversion elements within the same group share one amplifier circuit.

Supplemental item 43. An imaging device in which a first substrate and a second substrate which have circuit elements constituting pixels disposed therein are electrically connected, wherein
the pixels includes:
a plurality of photoelectric conversion elements disposed in the first substrate;
an amplifying transistor that receives signals generated in the plurality of photoelectric conversion elements in a gate; amplifies the signals received in the gate; and outputs the amplified signals from one of a source and a drain;
a memory circuit, which is disposed in the second substrate and accumulates the amplified signal which is output from the amplifying transistor; and
an output transistor that receives the amplified signal, which is accumulated in the memory circuit, in one of the source and the drain, and outputs the signal received in the one of the source and the drain from the other of the source and the drain to a signal line outside of the pixel, wherein
the plurality of photoelectric conversion elements is classified into any of one or more groups, and first to n-th (n is an integer equal to or greater than 2) photoelectric conversion elements within the same group share one amplifying transistor.

Supplemental item 44. A signal reading method of reading a signal from pixels of a solid-state imaging device in which a first substrate and a second substrate which have circuit elements constituting the pixels disposed therein are electrically connected to each other, comprising:
a step of amplifying signals generated in a plurality of photoelectric conversion elements which is disposed in the first substrate by using an amplifier circuit and outputting the amplified signals;
a step of accumulating the amplified signals which is output from the amplifier circuit in a signal accumulation circuit which is disposed in the second substrate; and
a step of outputting the amplified signals accumulated in the signal accumulation circuit from the pixel,
wherein the plurality of photoelectric conversion elements is classified into any of one or more groups, and first to n-th (n is an integer equal to or greater than 2) photoelectric conversion elements within the same group share one amplifier circuit.

Supplemental item 45. A solid-state imaging device in which a first substrate and a second substrate are electrically connected to each other by a connection portion that electrically connects the first substrate and the second substrate, wherein
a pixel section included in the solid-state imaging device includes:
a pixel which is included in the first substrate and is provided with a photoelectric conversion element;
a signal line that supplies a signal generated in the pixel to the second substrate;
a signal accumulation circuit which is included in the second substrate and accumulates a signal supplied via the signal line; and
an output circuit which is included in the second substrate and outputs the signal accumulated in the signal accumulation circuit, wherein
the solid-state imaging device further includes a clipping circuit that performs clipping so that a voltage of the amplified signal does not become a predetermined voltage or less.

Supplemental item 46. The solid-state imaging device according to Supplemental item 45, wherein
the pixel includes:
the photoelectric conversion element that generates signal charge corresponding to the amount of incident light;
an accumulation section that accumulates the signal charge generated by the photoelectric conversion element;
a reset section that resets charge stored in the accumulation section;
a transfer section that transfers the signal charge to the accumulation section; and
an amplification section that amplifies the charge accumulated in the accumulation section to output the amplified charge as a pixel signal, wherein the pixel signal is output to the signal line,
wherein the second substrate includes
the signal accumulation circuit that accumulates the pixel signal,
an output signal line that outputs the pixel signal accumulated in the signal accumulation circuit, and
the clipping circuit that performs clipping so that a voltage of the pixel signal supplied via the signal line does not become the predetermined voltage or less, and
wherein the pixel signal which is output from the first substrate to the signal line is supplied to the second substrate through the connection portion.

Supplemental item 47. The solid-state imaging device according to Supplemental item 46, wherein
a current source load is connected to the connection portion.

Supplemental item 48. The solid-state imaging device according to Supplemental item 47, wherein
a level of the predetermined voltage clipped by the clipping circuit differ between a reset period in which a reset signal which is the pixel signal output from the amplification section in accordance with the charge of the accumulation section when reset by the reset section is output to the signal line, and a signal period in which a subject signal which is the pixel signal output from the amplification section in accordance with the signal charge transferred to the accumulation section by the transfer section is output to the signal line.

Supplemental item 49. The solid-state imaging device according to Supplemental item 48, wherein
the signal accumulation circuit includes:
a storage section that stores the pixel signal;
a storage section signal reset section that resets a voltage of the pixel signal stored in the storage section;
a storage section signal selection section that selects the storage section;
a storage section signal amplification section that amplifies and outputs the voltage of the pixel signal stored in the storage section; and
a coupling capacitor of which one end is connected to a signal line of the pixel signal supplied via the signal line and the other end is connected to the storage section.

Supplemental item 50. The solid-state imaging device according to Supplemental item 49, wherein
the second substrate further includes a subtraction section that output a signal obtained by subtracting the reset signal from the subject signal.

Supplemental item 51. The solid-state imaging device according to Supplemental item 48, wherein
a function of clipping a voltage of the pixel signal which is supplied via the signal line by using the clipping circuit is enabled during the reset period.

Supplemental item 52. The solid-state imaging device according to Supplemental item 51, wherein
the predetermined voltage is a saturation voltage of the reset signal.

Supplemental item 53. The solid-state imaging device according to Supplemental item 48, wherein
a function of clipping a voltage of the pixel signal which is supplied via the signal line by using the clipping circuit is enabled during the signal period.

Supplemental item 54. The solid-state imaging device according to Supplemental item 53, wherein
the predetermined voltage is a saturation voltage of the subject signal.

Supplemental item 55. The solid-state imaging device according to Supplemental item 45, wherein
the clipping circuit is provided within the second substrate.

Supplemental item 56. The solid-state imaging device according to Supplemental item 45, wherein
the photoelectric conversion elements of all the pixels included in the solid-state imaging device are simultaneously reset.

Supplemental item 57. The solid-state imaging device, according to Supplemental item 45, wherein
the pixel further includes an amplifier circuit that amplifies a signal generated in the photoelectric conversion element, and
the signal accumulation circuit accumulates an amplified signal amplified by the amplifier circuit.

Supplemental item 58. The solid-state imaging device according to Supplemental item 57, wherein
the pixel further includes a noise reduction circuit that reduces noise in the amplified signal which is output from the amplifier circuit, wherein
the signal accumulation circuit accumulates the amplified signal in which noise is reduced by the noise reduction circuit.

Supplemental item 59. The solid-state imaging device according to Supplemental item 57, wherein
the amplifier circuit includes an amplifying transistor that receives the signal generated in the photoelectric conversion element in a gate, and outputs the amplified signal from one of a source and a drain.

Supplemental item 60. The solid-state imaging device according to Supplemental item 59, wherein
the noise reduction circuit includes:
a clamp capacitor which is directly or indirectly connected to one of the source and the drain of the amplifying transistor for clamping the amplified signal which is output; and
a sample-and-hold transistor which is directly or indirectly connected to the clamp capacitor, which samples and holds the amplified signal which is clamped, wherein
the signal accumulation circuit accumulates the amplified signal sampled and held by the sample-and-hold transistor.

Supplemental item 61. The solid-state imaging device according to Supplemental item 46, wherein
a connection point of the connection portion on the first substrate side and a connection point of the connection portion on the second substrate side are disposed at any positions on a path leading from an output terminal of the photoelectric conversion element to an input terminal of the signal accumulation circuit.

Supplemental item 62. The solid-state imaging device according to Supplemental item 46, wherein the connection portion is a bump.

Supplemental item 63. The solid-state imaging device according to Supplemental item 46, wherein
the connection portion includes a first electrode formed on a surface of the first substrate and a second electrode which is formed on a surface of the second substrate and is bonded to the first electrode.

Supplemental item 64. The solid-state imaging device according to Supplemental item 46, wherein
the second substrate is connected to a surface on the opposite side to a surface of the first substrate which is irradiated with light incident on the photoelectric conversion element.

Supplemental item 65. The solid-state imaging device according to Supplemental item 46, wherein
the pixel of the first substrate includes:
the photoelectric conversion element;
a transfer circuit that transfers a signal generated in the photoelectric conversion element;
a first amplifier circuit that amplifies the signal generated in the photoelectric conversion element; and
a first reset circuit that resets an input section of the first amplifier circuit,
the signal accumulation circuit of the second substrate includes
an analog memory circuit,
a second amplifier circuit that amplifies a signal of the analog memory circuit, and
a second reset circuit that resets an input section of the second amplifier circuit.

Supplemental item 66. A method of controlling a solid-state imaging device in which a first substrate and a second substrate are electrically connected to each other by a connection portion that electrically connects the first substrate and the second substrate, comprising:
a step of outputting a signal that is generated in a pixel which is included in the first substrate of a pixel section included in the solid-state imaging device and is provided with a photoelectric conversion element, to a signal line for supplying the signal to the second substrate;
a step of accumulating the signal which is supplied via the signal line, in a signal accumulation circuit included in the second substrate; and
a step of outputting the signal which is accumulated in the signal accumulation circuit, from an output circuit included in the second substrate,
wherein the method of controlling a solid-state imaging device further includes a step of causing a clipping circuit to perform clipping so that a voltage of an amplified signal of the signal line does not become a predetermined voltage or less.

Supplemental item 67. An imaging device in which a first substrate and a second substrate are electrically connected to each other by a connection portion that electrically connects the first substrate and the second substrate, wherein a pixel section included in the imaging device includes:
a pixel which is included in the first substrate and is provided with a photoelectric conversion element;
a signal line that supplies a signal generated in the pixel to the second substrate;
a signal accumulation circuit which is included in the second substrate and accumulates a signal supplied via the signal line; and
an output circuit which is included in the second substrate and outputs the signal accumulated in the signal accumulation circuit, wherein
the imaging device further includes a clipping circuit that performs clipping so that a voltage of an amplified signal of the signal line does not become a predetermined voltage or less.

Supplemental item 68. A solid-state imaging device in which a first substrate and a second substrate are electrically connected to each other by a connection portion that electrically connects the first substrate and the second substrate, wherein a pixel section included in the solid-state imaging device includes:
a pixel which is included in the first substrate and is provided with a photoelectric conversion element;
a first signal line connected to the pixel;
a transistor of which one end is connected to the first signal line;
a capacitor which is included in the second substrate and is connected to the first signal line; and
a second signal line connected to the capacitor, wherein
the transistor performs clipping so that a voltage of an amplified signal of the first signal line does not become a predetermined voltage or less.

Supplemental item 69. The solid-state imaging device according to Supplemental item 68, wherein
the first signal line supplies a signal generated in the pixel to the second substrate;
the capacitor accumulates a signal supplied via the first signal line; and
the second signal line outputs the signal accumulated in the capacitor.

Supplemental item 70. The solid-state imaging device according to Supplemental item 68, wherein
the pixel further includes an amplifier circuit including an amplifying transistor that receives a signal which is generated in the photoelectric conversion element in a gate, and outputs an amplified signal from one of a source and a drain, wherein
the capacitor accumulates the amplified signal amplified by the amplifying transistor.

Supplemental item 71. The solid-state imaging device according to Supplemental item 70, wherein
the pixel further includes a noise reduction circuit, wherein
the noise reduction circuit includes
a clamp capacitor which is directly or indirectly connected to one of the source and the drain of the amplifying transistor for clamping the amplified signal which is output; and
a sample-and-hold transistor which is directly or indirectly connected to the clamp capacitor, which samples and holds the amplified signal which is clamped, wherein
the capacitor accumulates the amplified signal sampled and held by the sample-and-hold transistor.

Supplemental item 72. The solid-state imaging device according to Supplemental item 69, wherein
the pixel of first substrate includes:
the photoelectric conversion element;
a transfer transistor that connects a signal generated in the photoelectric conversion element to one of a source and a drain, and outputs the signal generated in the photoelectric conversion element to the other of the source and the drain;
a first amplifying transistor that receives the signal output by the transfer transistor in a gate, and outputs a first amplified signal from one of a source and a drain; and
a first reset transistor that resets the gate of the first amplifying transistor, wherein
the second substrate includes
an analog memory circuit which is the capacitor;
a second amplifying transistor which is received a signal of the analog memory circuit in a gate, and outputs a second amplified signal from one of a source and a drain; and
a second reset transistor that resets the gate of the second amplifying transistor.

Supplemental item 73. The solid-state imaging device according to Supplemental item 72, wherein
a voltage of an amplified signal of the first signal line is clipped so that the voltage does not become a first voltage or less by the transistor during a reset period in which the first amplifying transistor is reset by the first reset transistor, clipping is performed by the transistor.

Supplemental item 74. The solid-state imaging device according to Supplemental item 72, wherein a voltage of an amplified signal of the first signal line is clipped so that the voltage does not become a second voltage or less by the transistor during the signal period in which the signal generated in the photoelectric conversion element is output from one of the source and the drain of the transfer transistor and the first amplified signal corresponding to the signal generated in the photoelectric conversion element is output from one of the source and the drain of the first amplifying transistor.

Supplemental item 75. A method of controlling a solid-state imaging device in which a first substrate and a second substrate are electrically connected to each other by a connection portion that electrically connects the first substrate and the second substrate, comprising:

a step of outputting a signal which is generated in a pixel which is included in the first substrate of a pixel section included in the solid-state imaging device and is provided with a photoelectric conversion element, to a first signal line connected to the pixel;

a step of accumulating the signal which is output to the first signal line in a capacitor, which is included in the second substrate and is connected to the first signal line; and a step of outputting the signal accumulated in a second signal line connected to the capacitor, wherein the control method further includes a step of causing a transistor of which one end is connected to the first signal line to perform clipping so that a voltage of an amplified signal of the first signal line does not become a predetermined voltage or less.

Supplemental item 76. An imaging device in which a first substrate and a second substrate are electrically connected to each other by a connection portion that electrically connects the first substrate and the second substrate, wherein a pixel section included in the imaging device includes:

a pixel which is included in the first substrate and is provided with a photoelectric conversion element;

a first signal line connected to the pixel;

a transistor of which one end is connected to the first signal line;

a capacitor which is included in the second substrate and is connected to the first signal line; and a second signal line connected to the capacitor, wherein the transistor performs clipping so that a voltage of an amplified signal of the first signal line does not become a predetermined voltage or less.

What is claimed is:

1. A solid-state imaging device comprising:
a first substrate and a second substrate which have circuit elements constituting pixels disposed therein are electrically connected to each other, wherein
the pixels comprise:
a plurality of photoelectric conversion elements disposed in the first substrate;
an amplifier circuit that amplifies a signal generated in the photoelectric conversion element to output an amplified signal;
a signal accumulation circuit which is disposed in the second substrate and accumulates the amplified signal which is output from the amplifier circuit; and
an output circuit that outputs the amplified signal accumulated in the signal accumulation circuit from the pixel,
wherein the plurality of the photoelectric conversion elements is classified into any of one or more groups, and first to n-th (where n is an integer equal to or greater than 2) photoelectric conversion elements within the same group share one amplifier circuit,
wherein the plurality of photoelectric conversion elements are classified into one or more groups on the basis of positions at which the first to n-th photoelectric conversion elements on the first substrate are disposed,
wherein the pixels further comprising a reset circuit that resets the plurality of photoelectric conversion elements,
wherein the reset circuit resets all the photoelectric conversion elements collectively, and then the signal accumulation circuit sequentially accumulates the amplified signals corresponding to signals generated in the first to n-th photoelectric conversion elements within the same group, and
wherein periods in which the amplified signals corresponding to the signals generated in the first to n-th photoelectric conversion elements within the same group are sequentially accumulated by the signal accumulation circuit are different from each other for each of the first to n-th photoelectric conversion elements within the same group.

2. A solid-state imaging device comprising:
a first substrate and a second substrate which have circuit elements constituting pixels disposed therein are electrically connected to each other, wherein
the pixels comprise:
a plurality of photoelectric conversion elements disposed in the first substrate;
an amplifier circuit that amplifies a signal generated in the photoelectric conversion element to output an amplified signal;
a signal accumulation circuit which is disposed in the second substrate and accumulates the amplified signal which is output from the amplifier circuit; and
an output circuit that outputs the amplified signal accumulated in the signal accumulation circuit from the pixel,
wherein the plurality of the photoelectric conversion elements is classified into any of one or more groups, and first to n-th (where n is an integer equal to or greater than 2) photoelectric conversion elements within the same group share one amplifier circuit,
wherein the plurality of photoelectric conversion elements are classified into one or more groups on the basis of positions at which the first to n-th photoelectric conversion elements on the first substrate are disposed,
wherein the pixels further comprising a reset circuit that resets the plurality of photoelectric conversion elements,
wherein the reset circuit resets all the photoelectric conversion elements collectively, and then the signal accumulation circuit sequentially accumulates the amplified signals corresponding to signals generated in the first to n-th photoelectric conversion elements within the same group,
wherein the pixels further comprising a noise reduction circuit that reduces noise in the amplified signals which are output from the amplifier circuit,
wherein the noise reduction circuit includes:
a clamp section that clamps the amplified signals being output from the amplifier circuit; and
a sample-and-hold section that samples and holds signals based on the amplified signals clamped in the clamp section and accumulates a sampled and held signals in the signal accumulation circuit, wherein periods in which the signals based on the amplified signals clamped in the clamp section are sampled and held by the sample-and-hold section and sequentially accumulated by the signal accumulation circuit are different from each other for each of the first to n-th photoelectric conversion elements within the same group.

3. A solid-state imaging device comprising;

a first substrate and a second substrate which have circuit elements constituting pixels disposed therein are electrically connected to each other, wherein the pixels comprise:
- a plurality of photoelectric conversion elements disposed in the first substrate;
- an amplifier circuit that amplifies a signal generated in the photoelectric conversion element to output an amplified signal;
- a signal accumulation circuit which is disposed in the second substrate and accumulates the amplified signal which is output from the amplifier circuit; and
- an output circuit that outputs the amplified signal accumulated in the signal accumulation circuit from the pixel, wherein the plurality of the photoelectric conversion elements is classified into any of one or more groups, and first to n-th (where n is an integer equal to or greater than 2) photoelectric conversion elements within the same group share one amplifier circuit, wherein the plurality of photoelectric conversion elements are classified into one or more groups on the basis of positions at which the first to n-th photoelectric conversion elements on the first substrate are disposed, wherein the pixels further comprising a reset circuit that resets the plurality of photoelectric conversion elements, the reset circuit sequentially resets the first to n-th photoelectric conversion elements within the same group, and then the signal accumulation circuit sequentially accumulates the amplified signals corresponding to the signals generated in the first to n-th photoelectric conversion elements within the same group, wherein periods in which the amplified signals corresponding to the signals generated in the first to n-th photoelectric conversion elements within the same group are sequentially accumulated by the signal accumulation circuit, are different from each other for each of the first to n-th photoelectric conversion elements within the same group.

4. A solid-state imaging device comprising:

a first substrate and a second substrate which have circuit elements constituting pixels disposed therein are electrically connected to each other, wherein the pixels comprise:
- a plurality of photoelectric conversion elements disposed in the first substrate;
- an amplifier circuit that amplifies a signal generated in the photoelectric conversion element to output an amplified signal;
- a signal accumulation circuit which is disposed in the second substrate and accumulates the amplified signal which is output from the amplifier circuit; and
- an output circuit that outputs the amplified signal accumulated in the signal accumulation circuit from the pixel, wherein the plurality of the photoelectric conversion elements is classified into any of one or more groups, and first to n-th (where n is an integer equal to or greater than 2) photoelectric conversion elements within the same group share one amplifier circuit, wherein the plurality of photoelectric conversion elements are classified into one or more groups on the basis of positions at which the first to n-th photoelectric conversion elements on the first substrate are disposed, wherein the pixels further comprising a reset circuit that resets the plurality of photoelectric conversion elements, the reset circuit sequentially resets the first to n-th photoelectric conversion elements within the same group, and then the signal accumulation circuit sequentially accumulates the amplified signals corresponding to the signals generated in the first to n-th photoelectric conversion elements within the same group, wherein the pixels further comprising a noise reduction circuit that reduces noise in the amplified signals which are output from the amplifier circuit, wherein the noise reduction circuit includes:
- a clamp section that clamps the amplified signals which are output from the amplifier circuit; and
- a sample-and-hold section that samples and holds signals based on the amplified signals clamped in the clamp section to accumulate the sampled and held signals in the signal accumulation circuit, wherein periods in which the signals based on the amplified signals clamped in the clamp section are sampled and held by the sample-and-hold section and sequentially accumulated by the signal accumulation circuit are different from each other for each of the first to n-th photoelectric conversion elements within the same group.

* * * * *